(12) United States Patent
Yamamoto et al.

(10) Patent No.: US 9,000,421 B2
(45) Date of Patent: Apr. 7, 2015

(54) ORGANIC ELECTROLUMINESCENT ELEMENT, MATERIALS FOR ORGANIC ELECTROLUMINESCENT ELEMENT, AND LIGHT EMITTING DEVICE, DISPLAY DEVICE, OR ILLUMINATION DEVICE, EACH USING THE ELEMENT, AND COMPOUNDS USED IN THE ELEMENT

(71) Applicant: UDC Ireland Limited, Dublin (IE)

(72) Inventors: Yosuke Yamamoto, Kanagawa (JP); Kousuke Watanabe, Kanagawa (JP); Yuichiro Itai, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 45 days.

(21) Appl. No.: 13/778,086

(22) Filed: Feb. 26, 2013

(65) Prior Publication Data

US 2013/0320310 A1 Dec. 5, 2013

(30) Foreign Application Priority Data

Mar. 1, 2012 (JP) ................ 2012-045644

(51) Int. Cl.
*H01L 51/54* (2006.01)
*H01L 51/00* (2006.01)

(52) U.S. Cl.
CPC ................. *H01L 51/0072* (2013.01)

(58) Field of Classification Search
USPC ........................................................ 257/40
See application file for complete search history.

(56) References Cited

U.S. PATENT DOCUMENTS

| | | |
|---|---|---|
| 2001/0053462 A1 | 12/2001 | Mishima |
| 2003/0064248 A1 | 4/2003 | Wolk et al. |
| 2005/0121666 A1 | 6/2005 | Kondakova et al. |
| 2006/0214568 A1 | 9/2006 | Yamazaki et al. |
| 2007/0059551 A1 | 3/2007 | Yamazaki |
| 2007/0247061 A1 | 10/2007 | Adamovich et al. |
| 2008/0303415 A1 | 12/2008 | Suzuri et al. |
| 2008/0303421 A1 | 12/2008 | Xu et al. |
| 2009/0121624 A1 | 5/2009 | D'Andrade et al. |
| 2010/0140605 A1 | 6/2010 | Shibata et al. |

FOREIGN PATENT DOCUMENTS

| | | |
|---|---|---|
| EP | 0387715 | 2/1996 |
| EP | 0825804 | 1/2002 |
| JP | 2001-319780 | 11/2001 |
| JP | 2002-100476 | 4/2002 |
| JP | 2007-027092 | 2/2007 |
| JP | 2010-087496 | 4/2010 |
| JP | 2011-254821 | 12/2011 |
| JP | 2012-049523 | 3/2012 |
| JP | 2012-072099 | 4/2012 |
| JP | 2012-191031 | 10/2012 |
| WO | 2011/060867 | 5/2011 |
| WO | 2011/042107 | 6/2011 |
| WO | 2011/088877 | 7/2011 |
| WO | 2011/128017 | 10/2011 |

OTHER PUBLICATIONS

Kowalsky et al., "Organic light emitting diodes," Indium Phosphide and Related Materials, 1996. IPRM '96., Eighth International Conference on, pp. 450-453, Apr. 21-25, 1996 doi: 10.1109/ICIPRM.1996.492279.

Fukagawa et al., "Highly efficient, deep-blue phosphorescent organic light emitting diode with a double-emitting layer structure," Oct. 3, 2008, Applied Physics Letters 93, 133312, DOI:http://dx.doi.org/10.1063/1.2996572.

Tang et al., "Broad band and white phosphorescent polymer light-emitting diodes in multilayer structure," Synthetic Metals, vol. 158, Issue 7, May 2008, pp. 287-291, ISSN 0379-6779, http://dx.doi.org/10.1016/j.synthmet.2008.01.018.

*Primary Examiner* — Marc Armand
*Assistant Examiner* — Tifney Skyles
(74) *Attorney, Agent, or Firm* — Riverside Law LLP

(57) ABSTRACT

An organic electroluminescent element comprising: a substrate; a pair of electrodes including an anode and a cathode, disposed on the substrate; and at least one organic layer including a light emitting layer, disposed between the electrodes. At least one of the organic layer contains a compound of general formula (1): A-(B)$_n$-D, wherein A, D, and B represent groups of the following general formulas (2), (3), and (4) respectively; n represents 0 or 1; and when n is 0, A and D are not symmetrical about a point to each other, including the binding sites:
General Formula (2)
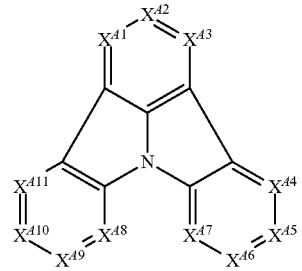
General Formula (3)
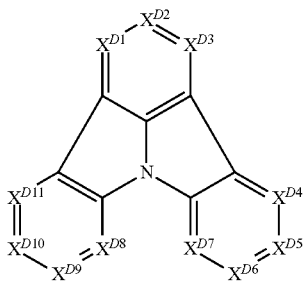
-continued
General Formula (4)
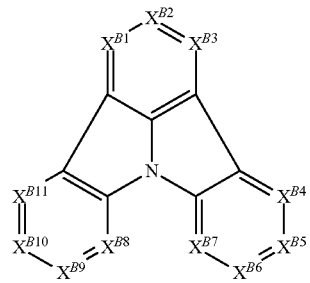
wherein $X^{A1}$ to $X^{A11}$, $X^{D1}$ to $X^{D11}$, and $X^{B1}$ to $X^{B11}$ are as defined in the specification.
27 Claims, 3 Drawing Sheets

ORGANIC ELECTROLUMINESCENT ELEMENT, MATERIALS FOR ORGANIC ELECTROLUMINESCENT ELEMENT, AND LIGHT EMITTING DEVICE, DISPLAY DEVICE, OR ILLUMINATION DEVICE, EACH USING THE ELEMENT, AND COMPOUNDS USED IN THE ELEMENT

CROSS-REFERENCE TO RELATED APPLICATIONS

The present application claims priority benefit from Japanese Patent Application No. 2012-045644, filed 1 Mar. 2012, which is hereby incorporated by reference herein in its entirety.

FIELD OF THE INVENTION

The present invention relates to an organic electroluminescent element and a material for an organic electroluminescent element, and to a light emitting device, a display device, or an illumination device each using the element, and a compound used in the element.

BACKGROUND OF THE INVENTION

Since organic electroluminescent elements (which may hereinafter also be referred to as "elements" or "organic EL elements") are capable of high-luminance light emitting using low voltage driving, they have been actively researched and developed. The organic electroluminescent elements have a pair of electrodes and an organic layer between the pair of electrodes, and utilize, for light emitting, energy of the exciton generated as a result of recombination of the electron injected from the cathode and the hole injected from the anode in the organic layer.

In recent years, by using phosphorescence emitting materials, organic electroluminescent elements are being enhanced in efficiency. For practical use, however, improvements are required in terms of durability and other properties.

On the contrary, an organic electroluminescent element is known using, as a host material of the light emitting layer, a compound having a structure obtained from triphenylamine by allowing the phenyl groups therein to be connected together to undergo ring fusion and thereby forming a carbazole ring.

Patent Document 1 describes an organic electroluminescent element in which a compound of a structure obtained by allowing two or three phenyl groups in triphenylamine to be connected together to undergo ring fusion is used as a host material of the light emitting layer, which is combined with a phosphorescence emitting material, and it can be seen from the examples in this document that the element is superior in driving voltage, luminous efficiency and durability.

Patent Document 2 describes a compound of a structure obtained by allowing two phenyl groups in triphenylamine to be connected to each other to undergo ring fusion. It is described in the document that, by using the compound as a host material of the light emitting layer, it is possible to provide an organic electroluminescent element with a good luminous efficiency and a low driving voltage.

Patent Document 3 describes an organic electroluminescent element in which a compound of a structure obtained by allowing two or three phenyl groups in triphenylamine to be connected together to undergo ring fusion is used as a host material of the light emitting layer, which is combined with a phosphorescence emitting material. It can be seen from the examples in this document that the element is superior in driving voltage, luminous efficiency and durability.

On the other hand, it is known that when driving an organic electroluminescent element, the driving is accompanied by increase in the driving voltage. The increase in the driving voltage associated with the driving is assumed to be caused by partial formation of a quencher, formation of a fine crystal, and the like, and actually has not been able to be avoided up to now. However, it is desirable to suppress the increase in the driving voltage as much as possible.

RELATED ART DOCUMENT

Patent Document

[Patent Document 1] WO 2011/088877
[Patent Document 2] JP-A-2010-087496
[Patent Document 3] WO 2011/042107

SUMMARY OF THE INVENTION

In view of the above description, the present inventors studied about the characteristics of the organic electroluminescent elements described in Patent Documents 1 to 3, and as a result, it was found that the elements were insufficient in the suppression of increase of driving voltage associated with driving as well as in durability.

The problem that the present invention is to solve is to provide an organic electroluminescent element which exhibits suppressed increase in driving voltage associated with driving and is superior in durability.

The present inventors, as a result of the intensive studies, have found that an organic electroluminescent element which exhibits suppressed increase in driving voltage associated with driving and is superior in driving voltage and durability can be provided by using a compound obtained by allowing two or three indolo[3,2,1-jk]carbazole skeletons to be connected together via single bonds, the compound having no symmetry center in its molecular structure.

That is, the present invention which is a specific means for solving the problem described above is as follows.

[1] An organic electroluminescent element comprising: a substrate; a pair of electrodes including an anode and a cathode, disposed on the substrate; and at least one organic layer (s) including a light emitting layer, disposed between the electrodes, characterized in that at least one layer of the organic layer(s) contains a compound represented by the following general formula (1):

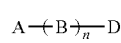

General Formula (1)

(in the general formula (1), A is a monovalent group represented by the following general formula (2); D is a monovalent group represented by the following general formula (3); B is a divalent group represented by the following general formula (4); and n represents 0 or 1, provided that in the case where n is 0, A and D are not symmetrical about a point to each other, including the binding sites)

General Formula (2)

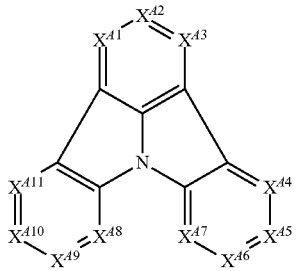

(in the general formula (2), one of $X^{A1}$ to $X^{A11}$ represents C-*, the others of $X^{A1}$ to $X^{A11}$ each independently represent C—$R^A$ or a nitrogen atom; * represents a binding site to D when n is 0, and represents a binding site to B when n is 1; and $R^A$ represents a hydrogen atom or a substituent, and the plural $R^A$s may be the same as or different from one another)

General Formula (3)

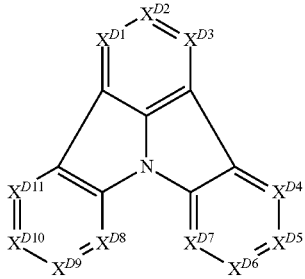

(in the general formula (3), one of $X^{D1}$ to $X^{D11}$ represents C-#, the others of $X^{D1}$ to $X^{D11}$ each independently represent C—$R^D$ or a nitrogen atom; # represents a binding site to A when n is 0 and represents a binding site to B when n is 1; and $R^D$ represents a hydrogen atom or a substituent, and the plural $R^D$s may be the same as or different from one another)

General Formula (4)

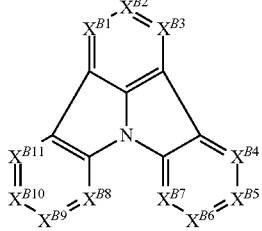

(in the general formula (4), one of $X^{B1}$ to $X^{B11}$ represents C-*, another one of $X^{B1}$ to $X^{B11}$ represents C-#, and the others of $X^{B1}$ to $X^{B11}$ each independently represent C—$R^B$ or a nitrogen atom; * represents a binding site to A; # represents a binding site to D; and $R^B$ represents a hydrogen atom or a substituent, and the plural $R^B$s may be the same as or different from one another).

[2] In the organic electroluminescent element according to [1], it is preferred that in the general formula (2), one of $X^{A1}$ to $X^{A11}$ represents C-*, the others of $X^{A1}$ to $X^{A11}$ each independently represent C—$R^A$, and $R^A$ represents a hydrogen atom or a substituent.

[3] In the organic electroluminescent element according to [1] or [2], it is preferred that in the general formula (3), one of $X^{D1}$ to $X^{D11}$ represents C-#, the others of $X^{D1}$ to $X^{D11}$ each independently represent C—$R^D$, and $R^D$ represents a hydrogen atom or a substituent.

[4] In the organic electroluminescent element according to any one of [1] to [3], it is preferred that in the compound represented by the general formula (1), the A is a group represented by the following general formula (5), the D is a group represented by the following general formula (6), and the B is a group represented by the following general formula (7):

General Formula (5)

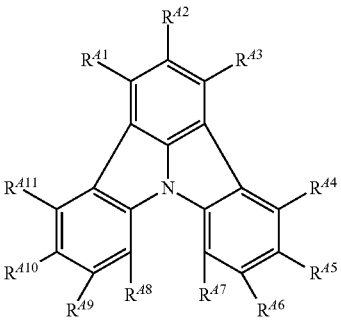

(in the general formula (5), one of $R^{A1}$ to $R^{A11}$ represents a binding site to D when n is 0, and represents a binding site to B when n is 1, $R^{A1}$ to $R^{A11}$ that are not binding sites to B or D each independently represent a hydrogen atom or a substituent)

General Formula (6)

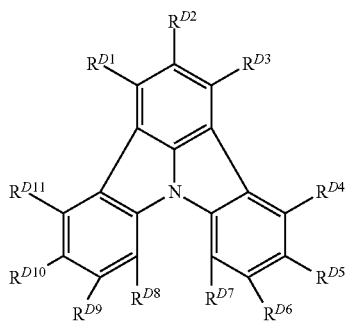

(in the general formula (6), one of $R^{D1}$ to $R^{D11}$ represents a binding site to A when n is 0, and represents a binding site to B when n is 1, and $R^{D1}$ to $R^{D11}$ that are not binding sites to A or B each independently represent a hydrogen atom or a substituent)

General Formula (7)

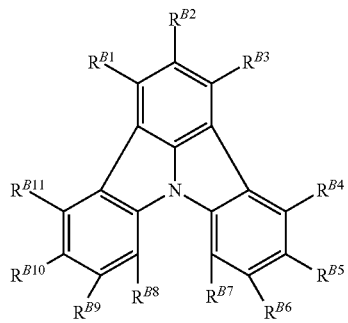

(in the general formula (7), one of $R^{B1}$ to $R^{B11}$ represents a binding site to A, another one represents a binding site to D, $R^{B1}$ to $R^{B11}$ that are not binding sites to A or D each independently represent a hydrogen atom or a substituent).

[5] In the organic electroluminescent element according to [4], it is preferred that in the general formula (5), any one of $R^{A2}$, $R^{A5}$ and $R^{A10}$ represents a binding site to D when n is 0, and represents a binding site to B when n is 1.

[6] In the organic electroluminescent element according to [4] or [5], it is preferred that in the general formula (6), any one of $R^{D2}$, $R^{D5}$ and $R^{D10}$ represents a binding site to A when n is 0, and represents a binding site to B when n is 1.

[7] In the organic electroluminescent element according to any one of [4] to [6], it is preferred that in the general formula (7), $R^{B2}$ represents a binding site to A or a binding site to C, and $R^{B5}$ or $R^{B10}$ represents the remaining one of the binding site to A and the binding site to C.

[8] In the organic electroluminescent element according to any one of [4] to [7], it is preferred that in the general formula (6), at least one of $R^{D2}$, $R^{D5}$ and $R^{D10}$ each independently represents a substituted or unsubstituted aryl group (provided that an aryl group further having an aryl group as a substituent is excluded), a substituted or unsubstituted heteroaryl group, or a substituted or unsubstituted oligoaryl group having 2 to 5 rings.

[9] In the organic electroluminescent element according to any one of [4] to [8], it is preferred that in the general formula (5), all of $R^{A1}$ to $R^{A11}$ that are not binding sites to B or D each represent a hydrogen atom.

[10] In the organic electroluminescent element according to any one of [1] to [9], it is preferred that in the general formula (1), n is 0.

[11] In the organic electroluminescent element according to any one of [1] to [10], it is preferred that the light emitting layer contains at least one kind of phosphorescence emitting material.

[12] In the organic electroluminescent element according to [11], it is preferred that the phosphorescence emitting material is an iridium complex represented by the following general formula (E-1):

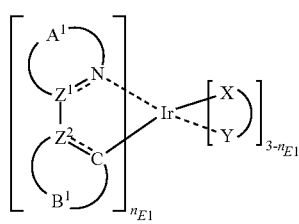

(E-1)

(in the general formula (E-1), $Z^1$ and $Z^2$ each independently represent a carbon atom or a nitrogen atom;
$A^1$ represents an atomic group which together with $Z^1$ and a nitrogen atom forms a 5- or 6-membered hetero ring;
$B^1$ represents an atomic group which together with $Z^2$ and a carbon atom forms a 5- or 6-membered ring;
(X—Y) represents a mono-anionic bidentate ligand; and
$n_{E1}$ represents an integer of 1 to 3).

[13] In the organic electroluminescent element according to [12], it is preferred that the iridium complex represented by the general formula (E-1) is represented by the following general formula (E-2).

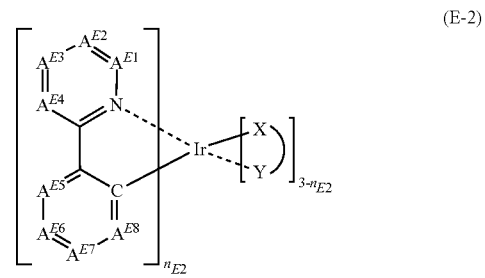

(E-2)

(in the general formula (E-2), $A^{E1}$ to $A^{E8}$ each independently represent a nitrogen atom or C—$R^E$; $R^E$ represents a hydrogen atom or a substituent; (X—Y) represents a mono-anionic bidentate ligand; and $n_{E2}$ represents an integer of 1 to 3).

[14] In the organic electroluminescent element according to any one of [1] to [13], it is preferred that the light emitting layer contains the compound represented by the general formula (1).

[15] A light emitting device using the organic electroluminescent element according to any one of [1] to [14].

[16] A display device using the organic electroluminescent element according to any one of [1] to [14].

[17] An illumination device using the organic electroluminescent element according to any one of [1] to [14].

[18] A compound represented by the following general formula (1):

General Formula (1)

(in the general formula (1), A is a monovalent group represented by the following general formula (2); D is a monovalent group represented by the following general formula (3); B is a divalent group represented by the following general formula (4); and n represents 0 or 1, provided that in the case where n is 0, A and D are not symmetrical about a point to each other, including the binding sites)

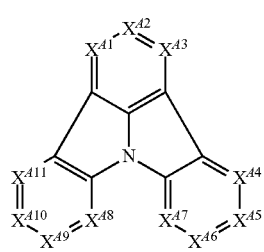

General Formula (2)

(in the general formula (2), one of $X^{A1}$ to $X^{A11}$ represents C-*, the others of $X^{A1}$ to $X^{A11}$ each independently represent C—$R^A$ or a nitrogen atom; * represents a binding site to D when n is 0, and represents a binding site to B when n is 1; and $R^A$ represents a hydrogen atom or a substituent, and the plural $R^A$s may be the same as or different from one another)

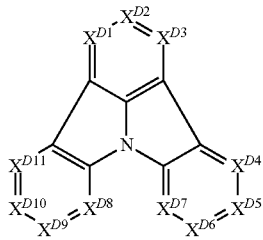

General Formula (3)

(in the general formula (3), one of $X^{D1}$ to $X^{D11}$ represents C-#, the others of $X^{D1}$ to $X^{D11}$ each independently represent C—$R^D$ or a nitrogen atom; # represents a binding site to A when n is 0 and represents a binding site to B when n is 1; and $R^D$ represents a hydrogen atom or a substituent, and the plural $R^D$s may be the same as or different from one another)

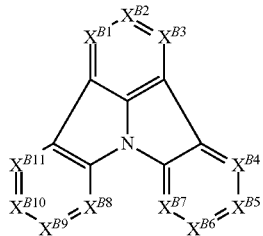

General Formula (4)

(in the general formula (4), one of $X^{B1}$ to $X^{B11}$ represents C-*, another one of $X^{B1}$ to $X^{B11}$ represents C-#, and the others of $X^{B1}$ to $X^{B11}$ each independently represent C—$R^B$ or a nitrogen atom; * represents a binding site to A, # represents a binding site to D; and $R^B$ represents a hydrogen atom or a substituent, and the plural $R^B$s may be the same as or different from one another).

[19] In the compound according to [18], it is preferred that in the general formula (2), one of $X^{41}$ to $X^{411}$ represents C-*, the others of $X^{41}$ to $X^{411}$ each independently represent C—$R^A$, and $R^A$ represents a hydrogen atom or a substituent.

[20] In the compound according to [18] or [19], it is preferred that in the general formula (3), one of $X^{D1}$ to $X^{D11}$ represents C-#, the others of $X^{D1}$ to $X^{D11}$ each independently represent C—$R^D$, and $R^D$ represents a hydrogen atom or a substituent.

[21] In the compound according to any one of [18] to [20], it is preferred that in the compound represented by the general formula (1), the A is a group represented by the following general formula (5), the D is a group represented by the following general formula (6), and the B is a group represented by the following general formula (7):

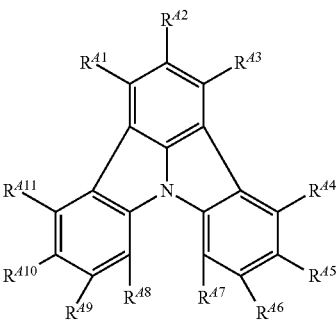

General Formula (5)

(in the general formula (5), one of $R^{A1}$ to $R^{A11}$ represents a binding site to D when n is 0, and represents a binding site to B when n is 1, $R^{A1}$ to $R^{A11}$ that are not binding sites to B or D each independently represent a hydrogen atom or a substituent)

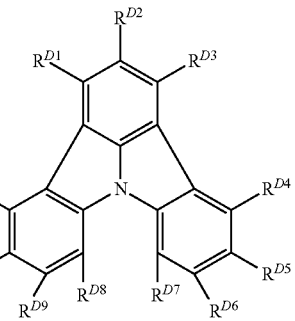

General Formula (6)

(in the general formula (6), one of $R^{D1}$ to $R^{D11}$ represents a binding site to A when n is 0, and represents a binding site to B when n is 1, and $R^{D1}$ to $R^{D11}$ that are not a binding site to A or B each independently represent a hydrogen atom or a substituent)

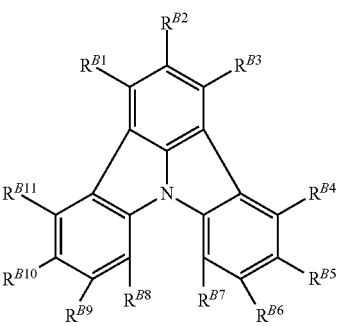

General Formula (7)

(in the general formula (7), one of $R^{B1}$ to $R^{B11}$ represents a binding site to A, another one represents a binding site to D, $R^{B1}$ to $R^{B11}$ that are not binding sites to A or D each independently represent a hydrogen atom or a substituent).

[22] In the compound according to [21], it is preferred that in the general formula (5), any one of $R^{A2}$, $R^{A5}$ and $R^{A10}$ represents a binding site to D when n is 0, and represents a binding site to B when n is 1.

[23] In the compound according to [21] or [22], it is preferred that in the general formula (6), anyone of $R^{D2}$, $R^{D5}$ and $R^{D10}$ represents a binding site to A when n is 0, and represents a binding site to B when n is 1.

[24] In the compound according to any one of [21] to [23], it is preferred that in the general formula (7), $R^{B2}$ represents a binding site to A or a binding site to C, and $R^{B5}$ or $R^{B10}$ represents the remaining one of the binding site to A and the binding site to C.

[25] In the compound according to any one of [21] to [24], it is preferred that in the general formula (6), at least one of $R^{D2}$, $R^{D5}$ and $R^{D10}$ each independently represents a substituted or unsubstituted aryl group (provided that an aryl group further having an aryl group as a substituent is excluded), a substituted or unsubstituted heteroaryl group, or a substituted or unsubstituted oligoaryl group having 2 to 5 rings.

[26] In the compound according to any one of [21] to [25], it is preferred that in the general formula (5), all of $R^{A1}$ to $R^{A11}$ that are not binding sites to B or D each represent a hydrogen atom.

[27] In the compound according to any one of [18] to [26], it is preferred that in the general formula (1), n is 0.

According to the present invention, it is possible to provide an organic electroluminescent element which exhibits suppressed increase in driving voltage associated with driving and is superior in driving voltage and durability.

According to the present invention, it is further possible to provide a light emitting device, a display device and an illumination device using the organic electroluminescent element.

DETAILED DESCRIPTION OF INVENTION

Figure 1:
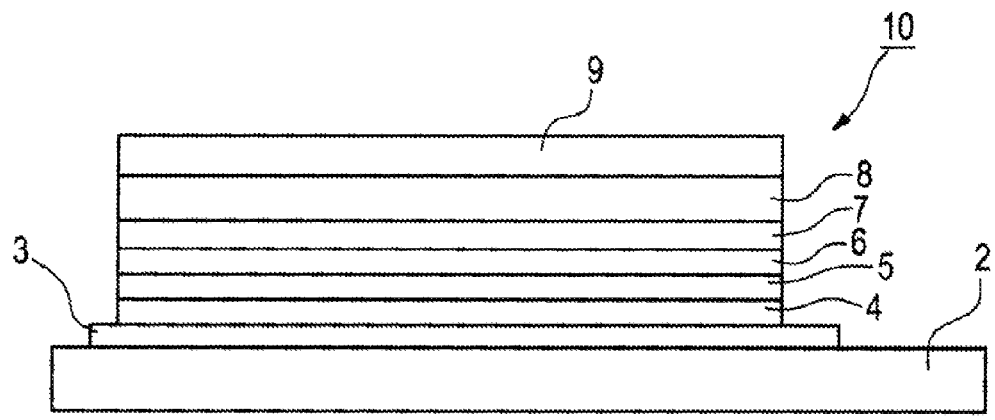
FIG. 1 It is a schematic view showing one example of a configuration of the organic electroluminescent element according to the present invention.
Figure 2:
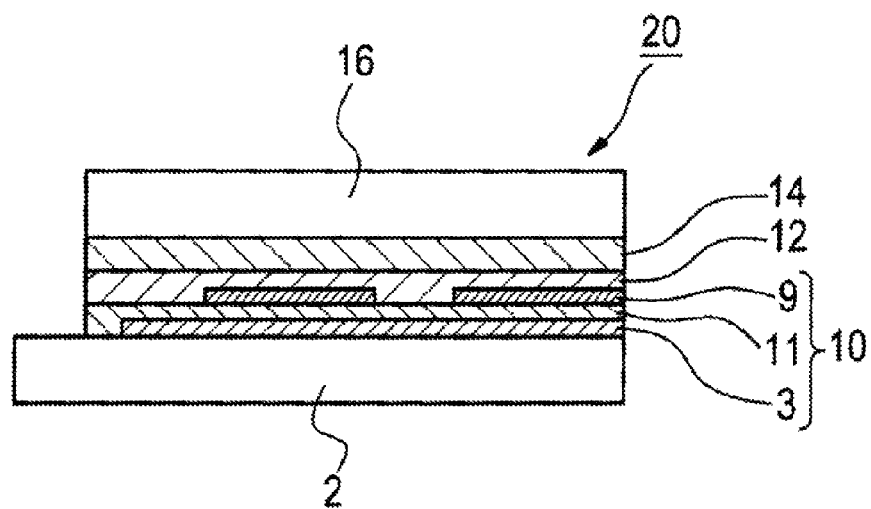
FIG. 2 It is a schematic view showing one example of the light emitting device according to the present invention.
Figure 3:
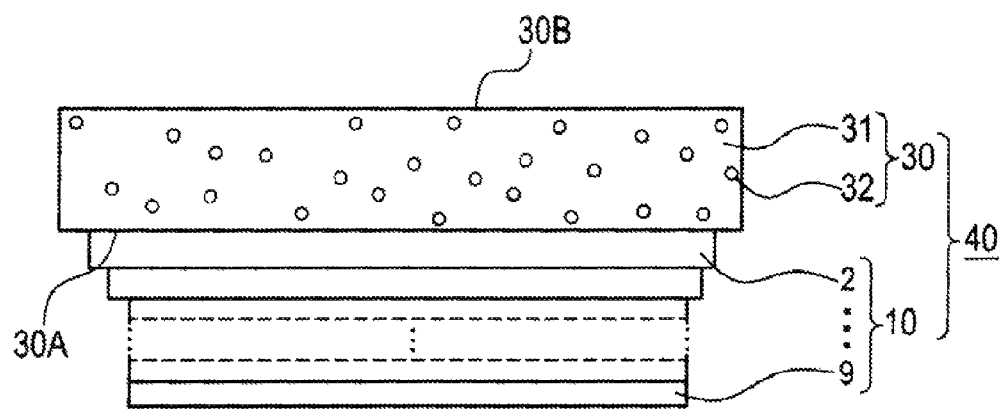
FIG. 3 It is a schematic view showing one example of the illumination device according to the present invention.

The details of the present invention are hereunder described. The description of the configuration requirements below may be based on representative embodiments of the present invention, but the present invention is not limited to these embodiments. Incidentally, in the present specification, the range expressed with "to" means a range including the numerical values before and after "to" as the lower limit and the upper limit, respectively.

[Organic Electroluminescent Element]

The organic electroluminescent element according to the present invention comprises a substrate; a pair of electrodes including an anode and a cathode, disposed on the substrate; and at least one organic layer (s) including a light emitting layer, disposed between the electrodes, and is characterized in that at least one of the organic layer (s) contains a compound represented by the following general formula (1). Due to such a configuration, the organic electroluminescent element according to the present invention exhibits suppressed increase in driving voltage associated with driving, and is superior in driving voltage and durability.

Although not wishing to be bound to any reason, the enhancement of durability is assumed as follows. Now, it has been reported that an analysis of the decomposed matter after degradation of an element revealed that, in the case of phenylcarbazole, a bond between N on the carbazole and C on the phenyl group is cut off (J. Appl. Phys. 2007, 101, 024512). The present inventors predicted that a cause of the deterioration of the durability is the bond cleavage mentioned above. Thus, when a compound containing indolocarbazole or a similar structure was selected as the basic skeleton in order to suppress the bond cleavage or for the purpose of promoting rebinding after the bond cleavage, a greater effect in improving the durability was shown, compared to that in a compound having a phenylcarbazole structure.

In addition, durability was evaluated for the structure in which phenyl carbazole has been cross-linked with dimethylmethylene as described in the Patent Document 1 and Patent Document 3 (such structure as in Comparative Examples 2 and 3 described later), and as a result, it was found that the compound containing indolocarbazole or a similar structure as the basic skeleton represented by the general formula (1) is superior to the above compound in durability. The reason for the forgoing is not elucidated in detail, but it is assumed to be the fact that radicals generated after cutoff of the C—C bond of the crosslinking site are relatively stable and therefore the bond cleavage is easy to occur while rebinding is difficult to occur, which causes a radical chain reaction to produce quencher, resulting in the deterioration of the durability.

Furthermore, an amorphous organic thin film which, immediately after vapor deposition, does not have a regularity as in a crystal structure, may be partially or mostly crystallized in some cases by being stored in a long period of time or under elevated temperature of a certain level or higher. Such crystallization may result in short circuit of the organic electroluminescent element, which may cause generation of dark spots. As a result, the carrier balance changes, leading to decrease in the luminance, that is, deterioration in durability, of the organic electroluminescent element. The present inventors inferred from the experimental results that such crystallization is associated with the symmetry of the molecule and the glass transition temperature. Specifically, they considered that the higher the symmetry of the molecule is, the more the crystallization occurs easily, whereas the lower the symmetry, the less the crystallization occurs easily. In this respect, the compound in the present invention obtained by connecting two or three indolocarbazole skeletons via single bonds has an asymmetrical structure in which the skeletons are not symmetrical about a point to each other, including the binding sites, whereby its crystallization is prevented and thus the durability is enhanced.

Next, although not wishing to be bound to any reason, the suppression of the increase in driving voltage associated with driving is assumed as follows. In the structure obtained by crosslinking phenylcarbazole with dimethylmethylene, for the same reason as in the deterioration of durability, a quencher is produced to cause the change in carrier balance and generation of charge trapping level, resulting in a large increase in the driving voltage.

Also in an element which easily undergoes crystallization, localized crystallization leads to short circuit, and the resulting change in carrier balance and generation of charge trapping level cause increase in the voltage.

The configuration of the organic electroluminescent element according to the present invention is not particularly limited. FIG. 1 shows an example of the configuration of the organic electroluminescent element according to the present invention. The organic electroluminescent element 10 in FIG. 1 includes organic layers between a pair of electrodes (an anode 3, and a cathode 9) on a substrate 2.

The configuration of the element, and the substrate, the anode and the cathode of the organic electroluminescent element are described in detail, for example, in JP-A-2008-270736, and the matters described in the patent publication can be applied to the present invention.

Preferred embodiments of the organic electroluminescent element according to the present invention are hereunder described, in the order of the organic layer, the substrate, the electrode, a protective layer, a sealing enclosure, a driving method, a light emitting wavelength, and an application thereof.

<Organic Layer>

The organic electroluminescent element according to the present invention includes organic layers disposed between the electrodes, and at least one of the organic layers contains the compound represented by the following general formula (1).

The organic layer is not particularly limited, and may be appropriately selected according to the intended use and purpose, but is preferably formed on a transparent electrode or a semi-transparent electrode. In this case, the organic layer is formed on the whole surfaces or one surface of the transparent electrode or the semi-transparent electrode.

The shape, size and thickness of the organic layer are not particularly limited, and may be appropriately selected according to the intended purpose.

Preferred embodiments of the configuration of the organic layers, the method of forming the organic layer, each layer constituting the organic layers and the material used in each layer, in the organic electroluminescent element according to the present invention are explained in turn bellow.

(Configuration of Organic Layers)

In the organic electroluminescent element according to the present invention, the organic layers preferably include a charge transporting layer. The charge transporting layer means a layer in which charge transfer occurs when a voltage is applied to the organic electroluminescent element. Specifically, examples of the charge transporting layer include a hole injecting layer, a hole transporting layer, an electron blocking layer, a light emitting layer, a hole blocking layer, an electron transporting layer and an electron injecting layer.

The organic electroluminescent element according to the present invention include a light emitting layer containing a phosphorescence emitting material and other organic layers, the light emitting layer preferably containing a compound represented by the general formula (1). In this case, the compound represented by the general formula (1) is preferably used as a host compound of the light emitting layer. In addition, in the organic electroluminescent element according to the present invention, the organic layers preferably include a light emitting layer containing the above-mentioned phosphorescence emitting material and other organic layers. In the organic electroluminescent element according to the present invention, however, even when the organic layers include a light emitting layer and other organic layers, the layers are not required to be clearly distinguished from one another.

Each of these organic layers may include a plurality of layers, and in the case of providing plural layers, the layers may be formed from the same material, or may be formed from different materials for respective layers.

(Light Emitting Layer)

The light emitting layer is a layer having a function of, upon application of an electric field, receiving holes from the anode, the hole injecting layer or the hole transporting layer, receiving electrons from the cathode, the electron injecting layer or the electron transporting layer, providing a recombination site of the holes and the electrons, and thereby causing light emitting. However, the light emitting layer in the present invention is not necessarily limited to the light emitting by such a mechanism. The light emitting layer in the organic electroluminescent element according to the present invention preferably contains, in addition to the compound represented by the general formula (1), at least one phosphorescence emitting material.

The light emitting layer in the organic electroluminescent element according to the present invention preferably contains a compound represented by the general formula (1), or may be constituted as a mixed layer of the compound represented by the general formula (1) used as a host material and the phosphorescence emitting material. A single kind of, or two or more kinds of phosphorescence emitting materials may be used. The host material is preferably a charge transporting material. A single kind of, or two or more kinds of materials may be used as the host material. Examples thereof include a configuration in which an electron transporting host material and a hole transporting host material are mixed. Furthermore, the light emitting layer may contain a material which does not have charge transporting property and does not emit light.

In addition, the light emitting layer may be made of a single layer or multiple layers including two or more layers. The layers may include the same light emitting material or host material, or also may include different materials, for the respective layers. In the case where plural light emitting layers are present, the light emitting layers may emit light in different luminous colors from one another.

The thickness of the light emitting layer is not particularly limited, but it is usually from 2 nm to 500 nm, and above all, from the viewpoint of external quantum efficiency, it is more preferably from 3 nm to 200 nm, and still more preferably from 5 nm to 100 nm.

In the organic electroluminescent element according to the present invention, the light emitting layer preferably contains a compound represented by the general formula (1), and it is a preferred embodiment that the compound represented by the general formula (1) is used as a host material of the light emitting layer. Here, the host material as referred to in the present specification is a compound which chiefly plays a role in injecting or transporting charges in the light emitting layer and is also a compound which does not substantially emit light in itself. As used herein, it is meant by the terms "which does not substantially emit light" that the amount of light emission from the compound which does not substantially emit light is preferably not more than 5%, more preferably not more than 3%, and still more preferably not more than 1%, relative to the total amount of light emission in the whole of the element.

The compound represented by the general formula (1), the phosphorescence emitting material, and host materials other than the compound represented by the general formula (1), as the materials for the light emitting layer, are described in turn below. Incidentally, the compound represented by the general formula (1) may be used as a material other than one for the light emitting layer, in the organic electroluminescent element according to the present invention. The compound may be used as, for example, a hole transporting material and an electron blocking material.

(I) Compound Represented by the General Formula (1)

In the organic electroluminescent element according to the present invention, at least one of the organic layers contains a compound represented by the general formula (1).

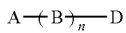
General Formula (1)

(in the general formula (1), A is a monovalent group represented by the following general formula (2); D is a monovalent group represented by the following general formula (3); B is a divalent group represented by the following general formula (4); and n represents 0 or 1, provided that in the case where n is 0, A and D are not symmetrical about a point to each other, including the binding sites)

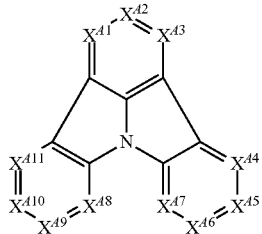
General Formula (2)

(in the general formula (2), one of $X^{A1}$ to $X^{A11}$ represents C-*, the others of $X^{A1}$ to $X^{A11}$ each independently represent C—$R^A$ or a nitrogen atom; * represents a binding site to D when n is 0, and represents a binding site to B when n is 1; and $R^A$ represents a hydrogen atom or a substituent, and the plural $R^A$s may be the same as or different from one another)

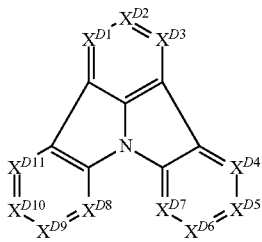
General Formula (3)

(in the general formula (3), one of $X^{D1}$ to $X^{D11}$ represents C-#, the others of $X^{D1}$ to $X^{D11}$ each independently represent C—$R^D$ or a nitrogen atom; # represents a binding site to A when n is 0, and represents a binding site to B when n is 1; and $R^D$ represents a hydrogen atom or a substituent, and the plural $R^D$s may be the same as or different from one another)

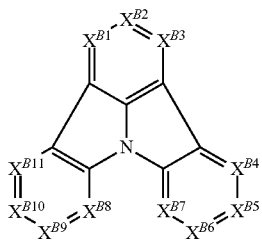
General Formula (4)

(in the general formula (4), one of $X^{B1}$ to $X^{B11}$ represents C-*, another one of $X^{B1}$ to $X^{B11}$ represents C-#, and the others of $X^{B1}$ to $X^{B11}$ each independently represent C—$R^B$ or a nitrogen atom; * represents a binding site to A; # represents a binding site to D; and $R^B$ represents a hydrogen atom or a substituent, and the plural $R^B$s may be the same as or different from one another).

In the general formula (1), n represents 0 or 1, and is preferably 0.

In the general formula (1), when n is 0, A and D are not symmetrical about a point to each other, including the binding sites. As used herein, not symmetrical about a point to each other, "including the binding sites" means that the general formula (1) includes compounds such as, for example, a compound having the following structure.

The compound having the following structure is a compound of the general formula (1) in which n is 0; $X^{A2}$ represents C-*, and $X^{A1}$ and $X^{A3}$ to $X^{A11}$ each are C—H, in A, which is a monovalent group represented by the general formula (2); and $X^{D5}$ represents C-#, and $X^{D1}$ to $X^{D4}$ and $X^{D6}$ to $X^{D9}$ each are C—H, in D, which is a monovalent group represented by the general formula (3). Since in this compound, one of $X^{A1}$ to $X^{A11}$ represents C-*, the others of $X^{A1}$ to $X^{A11}$ each independently represent C—H, one of $X^{D1}$ to $X^{D11}$ represents C-#, and the others of $X^{D1}$ to $X^{D11}$ each independently represent C—H, A and D in this compound have the same structure except for the positions of * and #, but the positions of * and # (i.e., the biding positions) are different from each other, whereby A and D are considered not to be symmetrical about a point to each other, "including the biding sites", in the specification.

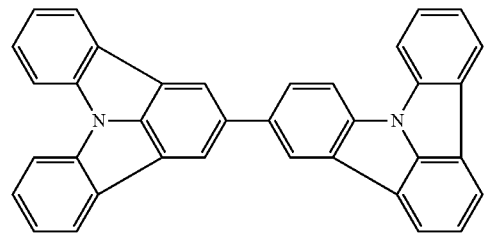 [SMILES: c1ccc2c(c1)c1cccc3c4cc(-c5cc6c7ccccc7n7c8ccccc8c(c5)c67)ccc4n2c13]

A, which is a monovalent group represented by the general formula (2), is hereunder described.

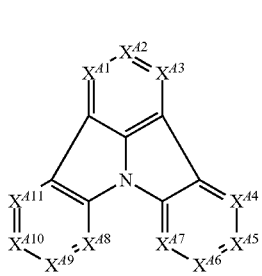
General Formula (2)

In the general formula (2), one of $X^{A1}$ to $X^{A11}$ represents C-*. Any one of $X^{A2}$, $X^{A5}$ and $X^{A10}$ preferably represents C-*.

In the general formula (2), the other $X^{A1}$ to $X^{A11}$ than the one of $X^{A1}$ to $X^{A11}$ that represents C-* each independently represent C—$R^A$ or a nitrogen atom.

$R^A$ represents a hydrogen atom or a substituent, and the plural $R^A$s may be the same as or different from one another.

In the general formula (2), the substituents represented by $R^A$ each independently include the following Substituent Group A, and the substituents each may further have a substituent. As the further substituent, a group selected from the Substituent group A may be exemplified.

<<Substituent Group A>>

An alkyl group (having preferably from 1 to 30 carbon atoms, more preferably from 1 to 20 carbon atoms, and especially preferably from 1 to 10 carbon atoms; for example, methyl, ethyl, n-propyl, isopropyl, t-butyl, n-hexyl, n-octyl, n-decyl, n-hexadecyl, cyclopropyl, cyclopentyl, and cyclohexyl), an alkenyl group (having preferably from 2 to 30 carbon atoms, more preferably from 2 to 20 carbon atoms, and especially preferably from 2 to 10 carbon atoms; for example, vinyl, allyl, 2-butenyl, and 3-pentenyl), an alkynyl group (having preferably from 2 to 30 carbon atoms, more preferably from 2 to 20 carbon atoms, and especially preferably from 2 to 10 carbon atoms; for example, propargyl, and 3-pentynyl), an aryl group (having preferably from 6 to 30 carbon atoms, more preferably from 6 to 20 carbon atoms, and especially preferably from 6 to 14 carbon atoms; for example, phenyl, p-methylphenyl, naphthyl, an m-biphenyl group, a p-biphenyl group, triphenylenyl, an m-terphenyl group, a p-terphenyl group, and anthranyl), an amino group (having preferably from 0 to 30 carbon atoms, more preferably from 0 to 20 carbon atoms, and especially preferably from 0 to 10 carbon atoms; for example, amino, methylamino, dimethylamino, diethylamino, dibenzylamino, phenylamino, diphenylamino, and ditolylamino), an alkoxy group (having preferably from 1 to 30 carbon atoms, more preferably from 1 to 20 carbon atoms, and especially preferably from 1 to 10 carbon atoms; for example, methoxy, ethoxy, butoxy, and 2-ethylhexyloxy), an aryloxy group (having preferably from 6 to 30 carbon atoms, more preferably from 6 to 20 carbon atoms, and especially preferably from 6 to 12 carbon atoms; for example, phenyloxy, 1-naphthyloxy, and 2-naphthyloxy), a heterocyclic oxy group (having preferably from 1 to 30 carbon atoms, more preferably from 1 to 20 carbon atoms, and especially preferably from 1 to 12 carbon atoms; for example, pyridyloxy, pyrazyloxy, pyrimidyloxy, and quinolyloxy), an acyl group (having preferably from 2 to 30 carbon atoms, more preferably from 2 to 20 carbon atoms, and especially preferably from 2 to 12 carbon atoms; for example, acetyl, benzoyl, formyl, and pivaloyl), an alkoxycarbonyl group (having preferably from 2 to 30 carbon atoms, more preferably from 2 to 20 carbon atoms, and especially preferably from 2 to 12 carbon atoms; for example, methoxycarbonyl, and ethoxycarbonyl), an aryloxycarbonyl group (having preferably from 7 to 30 carbon atoms, more preferably from 7 to 20 carbon atoms, and especially preferably from 7 to 12 carbon atoms; for example, phenyloxycarbonyl), an acyloxy group (having preferably from 2 to 30 carbon atoms, more preferably from 2 to 20 carbon atoms, and especially preferably from 2 to 10 carbon atoms; for example, acetoxy and benzoyloxy), an acylamino group (having preferably from 2 to 30 carbon atoms, more preferably from 2 to 20 carbon atoms, and especially preferably from 2 to 10 carbon atoms; for example, acetylamino and benzoylamino), an alkoxycarbonylamino group (having preferably from 2 to 30 carbon atoms, more preferably from 2 to 20 carbon atoms, and especially preferably from 2 to 12 carbon atoms; for example, methoxycarbonylamino), an aryloxycarbonylamino group (having preferably from 7 to 30 carbon atoms, more preferably from 7 to 20 carbon atoms, and especially preferably from 7 to 12 carbon atoms; for example, phenyloxycarbonylamino), a sulfonylamino group (having preferably from 1 to 30 carbon atoms, more preferably from 1 to 20 carbon atoms, and especially preferably from 1 to 12 carbon atoms; for example, methanesulfonylamino and benzenesulfonylamino), a sulfamoyl group (having preferably from 0 to 30 carbon atoms, more preferably from 0 to 20 carbon atoms, and especially preferably from 0 to 12 carbon atoms; for example, sulfamoyl, methylsulfamoyl, dimethylsulfamoyl, and phenylsulfamoyl), a carbamoyl group (having preferably from 1 to 30 carbon atoms, more preferably from 1 to 20 carbon atoms, and especially preferably from 1 to 12 carbon atoms; for example, carbamoyl, methylcarbamoyl, diethylcarbamoyl, and phenylcarbamoyl), an alkylthio group (having preferably from 1 to 30 carbon atoms, more preferably from 1 to 20 carbon atoms, and especially preferably from 1 to 12 carbon atoms; for example, methylthio and ethylthio), an arylthio group (having preferably from 6 to 30 carbon atoms, more preferably from 6 to 20 carbon atoms, and especially preferably from 6 to 12 carbon atoms; for example, phenylthio), a heterocyclic thio group (having preferably from 1 to 30 carbon atoms, more preferably from 1 to 20 carbon atoms, and especially preferably from 1 to 12 carbon atoms; for example, pyridylthio, 2-benzimizolylthio, 2-benzoxazolylthio, and 2-benzthiazolylthio), a sulfonyl group (having preferably from 1 to 30 carbon atoms, more preferably from 1 to 20 carbon atoms, and especially preferably from 1 to 12 carbon atoms; for example, mesyl and tosyl), a sulfinyl group (having preferably from 1 to 30 carbon atoms, more preferably from 1 to 20 carbon atoms, and especially preferably from 1 to 12 carbon atoms; for example, methane sulfinyl and benzene sulfinyl), a ureido group (having preferably from 1 to 30 carbon atoms, more preferably from 1 to 20 carbon atoms, and especially preferably from 1 to 12 carbon atoms; for example, ureido, methylureido, and phenylureido), a phosphoric amide group (having preferably from 1 to 30 carbon atoms, more preferably from 1 to 20 carbon atoms, and especially preferably from 1 to 12 carbon atoms; for example, diethylphosphoric amide and phenylphosphoric amide), a hydroxyl group, a mercapto group, a halogen atom (for example, a fluorine atom, a chlorine atom, a bromine atom, and an iodine atom), a sulfo group, a carboxyl group, a cyano group, a nitro group, a hydroxamic acid group, a sulfino group, a hydrazino group, an imino group, a heterocyclic group (inclusive of an aromatic heterocyclic group, which has preferably from 1 to 30 carbon atoms, and more preferably from 1 to 12 carbon atoms and in which examples of the hetero atom include a nitrogen atom, an oxygen atom, a sulfur atom, a phosphorus atom, a silicon atom, a selenium atom, and a tellurium atom; and specific examples thereof include pyridyl, pyrazinyl, pyrimidyl, pyridazinyl, pyrrolyl, pyrazolyl, triazolyl, imidazolyl, oxazolyl, triazolyl, isoxazolyl, isothiazolyl, quinolyl, furyl, thienyl, selenophenyl, tellurophenyl, piperidyl, piperidino, morpholino, pyrrolidyl, pyrrolidino, benzoxazolyl, benzimidazolyl, benzothiazolyl, a carbazolyl group, an azepinyl group, a silolyl group, dibenzofuranyl and dibenzothiophenyl), a silyl group (having preferably from 3 to 40 carbon atoms, more preferably from 3 to 30 carbon atoms, and especially preferably from 3 to 24 carbon atoms; for example, trimethylsilyl, triphenylsilyl, and the like), a silyloxy group (having preferably from 3 to 40 carbon atoms, more preferably from 3 to 30 carbon atoms, and especially preferably from 3 to 24 carbon atoms; for example, trimethylsilyloxy and triphenylsilyloxy), and a phosphoryl group (for example, a diphenylphosphoryl group and a dimethylphosphoryl group). These substituents may be further substituted, and examples of the further substituent include the groups selected from the Substituent Group A as described above.

The $R^A$s included in $X^{41}$ to $X^{43}$ each independently represent, among the Substituent Group A, preferably a hydrogen atom, an alkyl group, an aryl group, an amino group, a heteroaryl group, a cyano group or an alkoxy group, more preferably a hydrogen atom, an aryl group or a heteroaryl group, and especially preferably a hydrogen atom.

The alkyl group represented by the $R^4$ included in $X^{41}$ to $X^{43}$ preferably has 1 to 30 carbon atoms, more preferably has 1 to 10 carbon atoms, and especially preferably has 1 to 5 carbon atoms, with a methyl group being preferred.

The aryl group represented by the $R^4$ included in $X^{41}$ to $X^{43}$ preferably has 6 to 30 carbon atoms, more preferably has 6 to 20 carbon atoms, and especially preferably has 6 to 18 carbon atoms, and examples thereof include a phenyl group, a xylyl group, a phenanthrenyl group, a triphenylenyl group, etc., with a phenyl group being preferred.

The amino group represented by the $R^4$ included in $X^{41}$ to $X^{43}$ preferably has 1 to 30 carbon atoms, more preferably has 1 to 24 carbon atoms, and especially preferably has 1 to 15 carbon atoms, with a diphenylamino group being preferred.

The heteroaryl group represented by the $R^4$ included in $X^{41}$ to $X^{43}$ preferably has 5 to 30 ring members, more preferably has 5 to 20 ring members, and especially preferably has 5 to 15 ring members, and examples thereof include a pyridyl group, a pyrimidyl group, a triazyl group, a pyrazyl group, a pyridazyl group, a carbazolyl group, a dibenzothiophenyl group, a dibenzofuranyl group, etc., with a pyridyl group, a pyrimidyl group, a triazyl group, a carbazolyl group, and a dibenzothiophenyl group being preferred.

The alkoxy group represented by the $R^4$ included in $X^{41}$ to $X^{43}$ preferably has 1 to 30 carbon atoms, more preferably has 1 to 10 carbon atoms, and especially preferably has 1 to 3 carbon atoms, with a methoxy group being preferred.

The $R^4$ included in $X^{41}$ to $X^{43}$ may further have a substituent represented by the Substituent Group A, as described above. The further substituent which may be on $R^4$ may further have a substituent represented by the Substituent Group A.

The $R^4$s included in $X^{44}$ to $X^{411}$ each independently represent, among the Substituent Group A, preferably a hydrogen atom, an alkyl group, an aryl group, an amino group, a heteroaryl group, a cyano group or an alkoxy group, more preferably a hydrogen atom, an aryl group or a heteroaryl group, with a hydrogen atom being especially preferred.

A preferred range of the alkyl group represented by the $R^4$ included in $X^{44}$ to $X^{411}$ is the same as the preferred range of the alkyl group represented by the $R^4$ included in $X^{41}$ to $X^{43}$.

A preferred range of the aryl group represented by the $R^4$ included in $X^{44}$ to $X^{411}$ is the same as the preferred range of the aryl group represented by the $R^4$ included in $X^{41}$ to $X^{43}$.

A preferred range of the amino group represented by the $R^4$ included in $X^{44}$ to $X^{411}$ is the same as the preferred range of the amino group represented by the $R^4$ included in $X^{41}$ to $X^{43}$.

A preferred range of the heteroaryl group represented by the $R^4$ included in $X^{44}$ to $X^{411}$ is the same as the preferred range of the heteroaryl group represented by the $R^4$ included in $X^{41}$ to $X^{43}$.

A preferred range of the alkoxy group represented by the $R^4$ included in $X^{44}$ to $X^{411}$ is the same as the preferred range of the alkoxy group represented by the $R^4$ included in $X^{41}$ to $X^{43}$.

The $R^4$ included in $X^{44}$ to $X^{411}$ may further have a substituent represented by the Substituent Group A, as described above. The further substituent that may be on the $R^4$ may further have a substituent represented by the Substituent Group A. In particular, when the $R^4$ included in $X^{44}$ to $X^{411}$ represents an aryl group, the $R^4$ may also preferably further have an aryl group (which may also preferably further have an aryl group as a substituent) as the substituent, for example, $R^4$ may have a biphenyl group or a terphenyl group.

Among the other $X^{41}$ to $X^{411}$ than the one of $X^{41}$ to $X^{411}$ that represents C-*, the number of $CR^4$ is preferably 1 to 10, more preferably 5 to 10, especially preferably 8 to 10, more especially preferably 9 to 10, still more especially preferably 9 or 10, and even more especially preferably 10.

Among $X^{41}$ to $X^{411}$, a preferred range of the number of nitrogen atom depends on the number of the $CR^4$. Among $X^{41}$ to $X^{43}$, the number of nitrogen atom is preferably 0 to 2, more preferably 0 or 1, and especially preferably 0. Among $X^{44}$ to $X^{47}$, the number of nitrogen atom is preferably 0 or 1, and more preferably 0. Among $X^{48}$ to $X^{411}$, the number of nitrogen atom is preferably 0 or 1, and more preferably 0.

Among the other $X^{41}$ to $X^{411}$ than the one of $X^{41}$ to $X^{411}$ that represents C-*, the number of $CR^4$ whose $R^4$ is a substituent, is preferably 0 to 8, more preferably 0 to 3, especially preferably 0 or 1, and more especially preferably 0.

The positions of $CR^4$ whose $R^4$ is a substituent, among $X^{41}$ to $X^{411}$, are preferably $X^{42}$, $X^{45}$ and $X^{410}$.

In the organic electroluminescent element according to the present invention, it is preferred that in the general formula (2), one of $X^{41}$ to $X^{411}$ represents C-*, the others of $X^{41}$ to $X^{411}$ each independently represent C—$R^4$, and $R^4$ represents a hydrogen atom or a substituent.

In the organic electroluminescent element according to the present invention, A in the compound represented by the general formula (1) preferably a group represented by the following general formula (5).

General Formula (5)

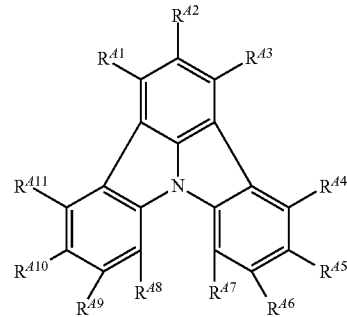

In the general formula (5), one of $R^{41}$ to $R^{411}$ represents a binding site to D when n is 0, and represents a binding site to B when n is 1. $R^{41}$ to $R^{411}$ that are not binding sites to B or D each independently represent a hydrogen atom or a substituent.

A preferred range of $R^{41}$ to $R^{411}$ in the general formula (5) is the same as the preferred range of each $R^4$ in the case where $X^{41}$ to $X^{411}$ in the general formula (2) each represent $CR^4$.

In the organic electroluminescent element according to the present invention, any one of $R^{42}$, $R^{45}$ and $R^{410}$ represents a binding site to D when n is 0, and represents a binding site to B when n is 1.

In the organic electroluminescent element according to the present invention, all of $R^{41}$ to $R^{411}$ that are not binding sites to B or D in the general formula (5) each represent a hydrogen atom.

Specific examples of A, which is a monovalent group represented by the general formula (2) are shown below, but the present invention is not limited thereto.

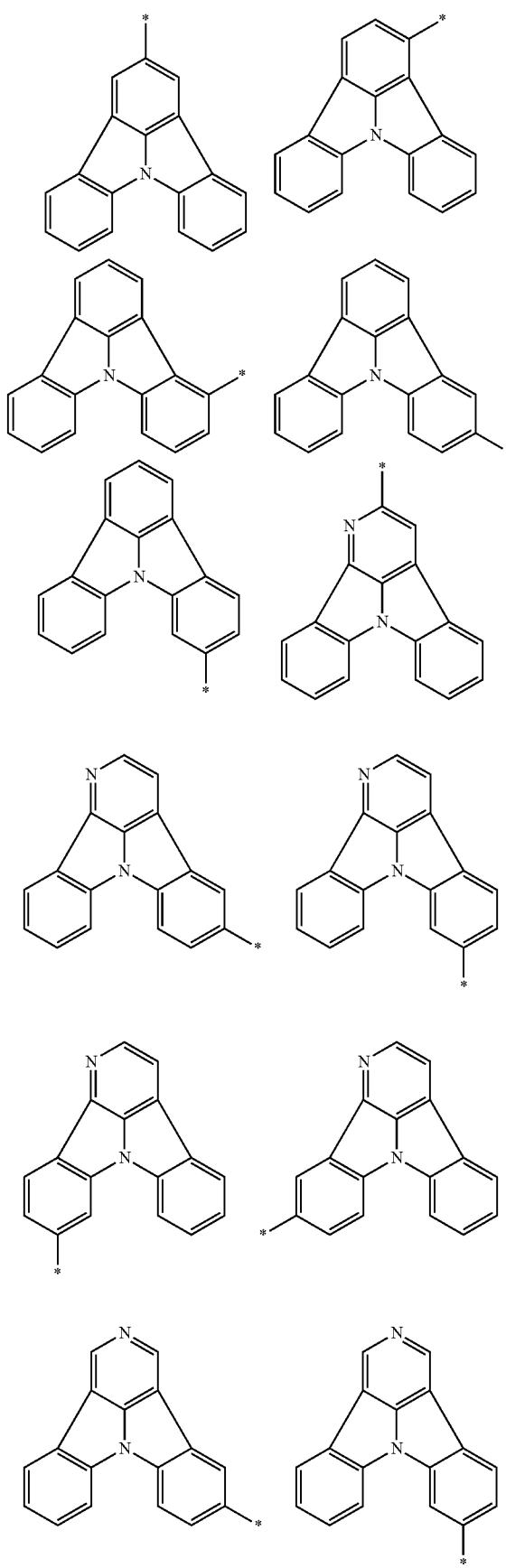
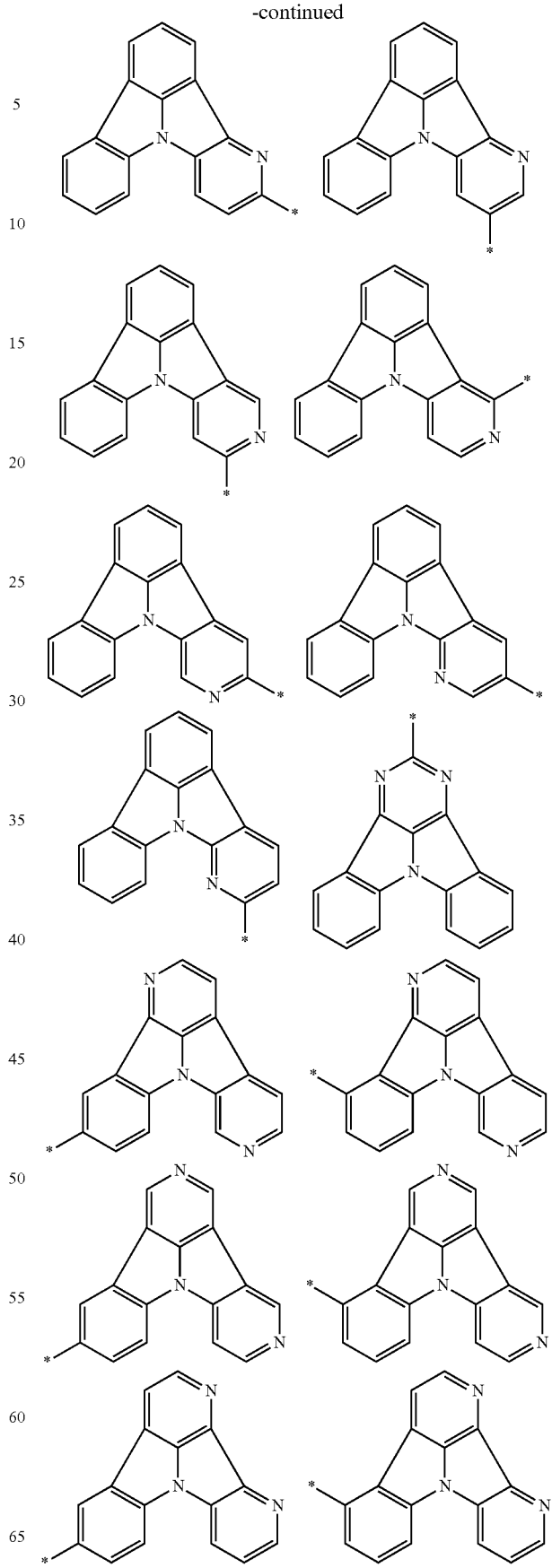
-continued

-continued
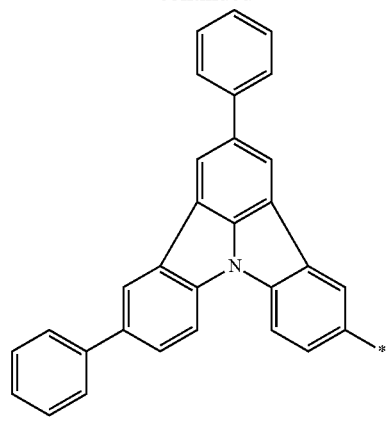
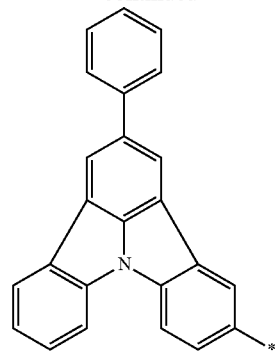
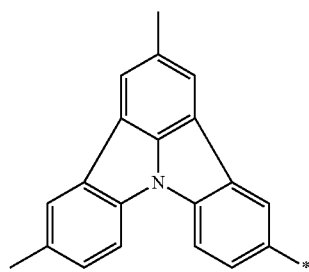
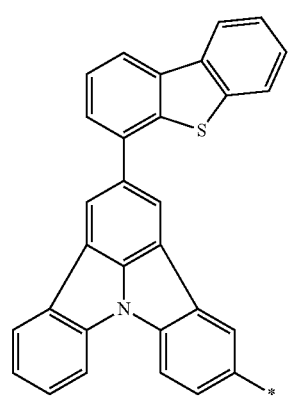
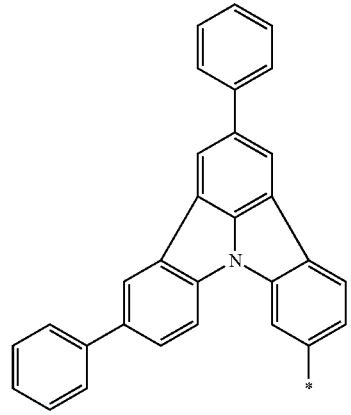
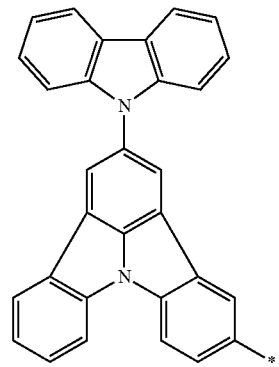
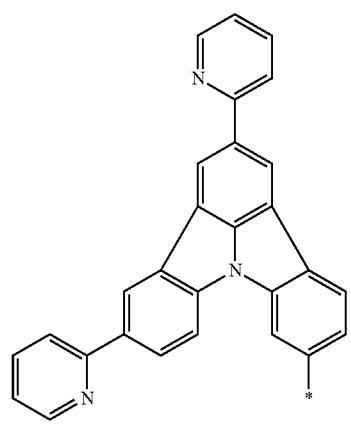
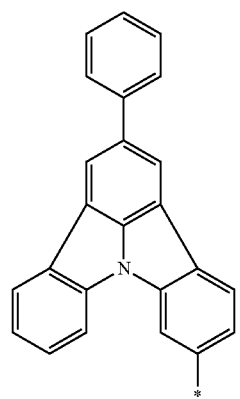

-continued

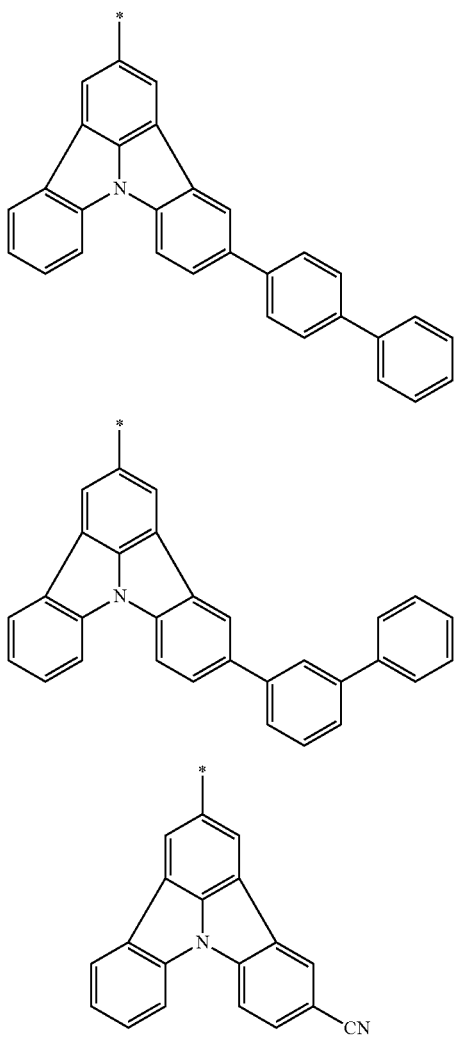

-continued

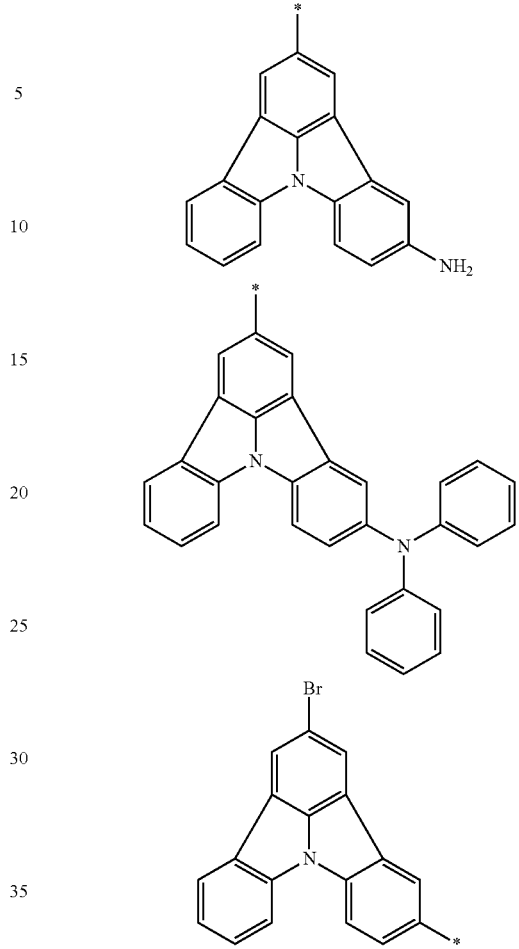

Next, D, which is a monovalent group represented by the general formula (3) is hereunder described.

General Formula (3)

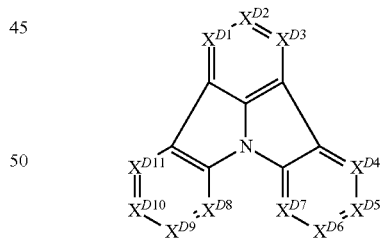

In the general formula (3), one of $X^{D1}$ to $X^{D11}$ represents C-#. Any one of $X^{D2}$, $X^{D5}$ and $X^{D10}$ preferably represents C-#.

In the general formula (3), the other $X^{D1}$ to $X^{D11}$ than the one of $X^{D1}$ to $X^{D11}$ that represents C-# each independently represent C—$R^D$ or a nitrogen atom.

$R^D$ represents a hydrogen atom or a substituent, and the plural $R^D$s may be the same as or different from one another.

In the general formula (3), the substituents represented by $R^D$ may each independently include the Substituent Group A, and the substituents may further have a substituent. The further substituent may be a group selected from the Substituent Group A.

The $R^D$s included in $X^{D1}$ to $X^{D3}$ are each independently, among the Substituent Group A, preferably a hydrogen atom, an alkyl group, an aryl group, an amino group, a heteroaryl group, a cyano group and an alkoxy group, more preferably a hydrogen atom, an aryl group or a heteroaryl group, and especially preferably a hydrogen atom or an aryl group.

The alkyl group represented by the $R^D$ included in $X^{D1}$ to $X^{D3}$ preferably has 1 to 30 carbon atoms, more preferably has 1 to 10 carbon atoms, and especially preferably has 1 to 3 carbon atoms, with a methyl group being preferred.

The aryl group represented by the $R^D$ in $X^{D1}$ to $X^{D3}$ preferably has 6 to 30 carbon atoms, more preferably has 6 to 20 carbon atoms, and especially preferably 6 to 18 carbon atoms, and examples thereof include a phenyl group, a xylyl group, a phenanthrenyl group, a triphenylenyl group, etc., with a phenyl group being preferred.

The amino group represented by the $R^D$ included in $X^{D1}$ to $X^{D3}$ preferably has 1 to 30 carbon atoms, more preferably 1 to 24 carbon atoms, and especially preferably 1 to 15 carbon atoms, with a diphenylamino group being preferred.

The heteroaryl group represented by the $R^D$ included in $X^{D1}$ to $X^{D3}$ preferably has 5 to 30 ring members, more preferably has 5 to 20 ring members, and especially preferably has 5 to 15 ring members, and examples thereof include a pyridyl group, a pyrimidyl group, a triazyl group, a pyrazyl group, a pyridazyl group, a carbazolyl group, a dibenzothiophenyl group, a dibenzofuranyl group, etc., with a pyridyl group, a pyrimidyl group, a triazyl group, a carbazolyl group, and a dibenzothiophenyl group being preferred.

The alkoxy group represented by the $R^D$ included in $X^{D1}$ to $X^{D3}$ preferably has 1 to 30 carbon atoms, more preferably has 1 to 10 carbon atoms, and especially preferably has 1 to 3 carbon atoms, with a methoxy group being preferred.

The $R^D$ included in $X^{D1}$ to $X^{D3}$ may further have a substituent represented by the Substituent Group A, as described above. The further substituent which may be on the $R^D$ may further have a substituent represented by the Substituent Group A. In particular, when the $R^D$ included in $X^{D1}$ to $X^{D3}$ represents an aryl group, or a heteroaryl group having 6 ring members, the $R^D$ may also preferably further have an aryl group (which preferably has 6 to 18 carbon atoms, and examples thereof include a phenyl group and a triphenylenyl group, provided that an aryl group further having a substituent is excluded) or an oligoaryl group, as the substituent. As used herein, the oligoaryl group means a group in which two or more aryl groups are bound via single bonds, preferably a group in which 2 to 7 aryl groups are bound via single bonds, more preferably a group in which 2 to 5 aryl groups are bound via single bonds, and especially preferably a group in which 2 or 3 aryl groups are bound via single bonds. In addition, the aryl group constituting the oligoaryl group represented by the $R^D$ is preferably a phenyl group. The oligoaryl group may further have a substituent, and preferably has, for example, a cyano group as the substituent.

When the $R^D$ included in $X^{D1}$ to $X^{D3}$ is an aryl group having a substituent or a heteroaryl group having 6 ring members having a substituent, $R^D$ more especially preferably has, as the substituent, a substituted or unsubstituted biphenyl group or a substituted or unsubstituted terphenyl group, still more especially preferably a substituted biphenyl group or a substituted or unsubstituted p-terphenyl group.

The $R^D$s included in $X^{D4}$ to $X^{D11}$ are each independently, among the Substituent Group A, preferably a hydrogen atom, an alkyl group, an aryl group, an amino group, a heteroaryl group, a cyano group and an alkoxy group, more preferably a hydrogen atom, an aryl group or a heteroaryl group, especially preferably a hydrogen atom, or an aryl group or a heteroaryl group substituted with an aryl group, and more especially preferably a hydrogen atom or an aryl group substituted with an aryl group.

A preferred range of the alkyl group represented by the $R^D$ included in $X^{D4}$ to $X^{D11}$ is the same as the preferred range of the alkyl group represented by the $R^A$ included in $X^{D1}$ to $X^{D3}$.

A preferred range of the a heteroaryl group represented by the $R^D$ included in $X^{D4}$ to $X^{D11}$ is the same as the preferred range of the aryl group represented by the $R^A$ included in $X^{D1}$ to $X^{D3}$.

A preferred range of the amino group represented by the $R^D$ included in $X^{D4}$ to $X^{D11}$ is the same as the preferred range of the amino group represented by the $R^A$ included in $X^{D1}$ to $X^{D3}$.

A preferred range of the heteroaryl group represented by the $R^D$ included in $X^{D4}$ to $X^{D11}$ is the same as the preferred range of the aryl group represented by the $R^A$ included in $X^{D1}$ to $X^{D3}$.

A preferred range of the alkoxy group represented by the $R^D$ included in $X^{D4}$ to $X^{D11}$ is the same as the preferred range of the alkoxy group represented by the $R^A$ included in $X^{D1}$ to $X^{D3}$.

The $R^D$ included in $X^{D4}$ to $X^{D11}$ may further have a substituent represented by the Substituent Group A, as described above. The further substituent that may be on the $R^D$ may further have a substituent represented by the Substituent Group A. In particular, when the $R^D$ included in $X^{D4}$ to $X^{D11}$ represents an aryl group, or a heteroaryl group having 6 ring members, the $R^D$ may also preferably further have an aryl group (provided that an aryl group having a further substituent is excluded), an oligoaryl group or an acyl group, as the substituent. A preferred range of the aryl group and the oligoaryl group as the substituent, in the case where the $R^D$ in $X^{D4}$ to $X^{D11}$ is an aryl group having a substituent or a heteroaryl group having 6 ring members having a substituent, is the same as in the case where the $R^D$ in $X^{D1}$ to $X^{D3}$ is an aryl group having a substituent or a heteroaryl group having 6 ring members having a substituent. When the aryl group has an acyl group as the further substituent, a preferred range of the acyl group as the substituent is an acyl group having 1 to 30 carbon atoms, more preferably an acyl group having 1 to 18 carbon atoms, especially preferably an acyl group having 6 to 12 carbon atoms, and more especially preferably a benzoyl group.

Among the other $X^{D1}$ to $X^{D11}$ than the one of $X^{D1}$ to $X^{D11}$ that represents C-#, the number of $CR^D$ is preferably 1 to 10, more preferably 5 to 10, especially preferably 8 to 10, more especially preferably 9 to 10, still more especially preferably 9 or 10, and even more especially preferably 10.

Among $X^{D1}$ to $X^{D11}$, a preferred range of the number of nitrogen atom depends on the number of the $CR^D$. Among $X^{D1}$ to $X^{D11}$, a preferred range of the number of nitrogen atom is the same as the preferred range of the number of nitrogen atom among $X^{41}$ to $X^{411}$.

Among the other $X^{D1}$ to $X^{D11}$ than the one of $X^{D1}$ to $X^{D11}$ that represents C-#, the number of $CR^D$ whose $R^D$ is a substituent, is preferably 0 to 8, more preferably 1 to 3, especially preferably 1 or 2, and more especially preferably 1.

The positions of $CR^D$ whose $R^D$ is a substituent, among $X^{D1}$ to $X^{D11}$, are preferably $X^{D2}$, $X^{D5}$ and $X^{D10}$.

In the organic electroluminescent element according to the present invention, it is preferred that in the general formula (3), one of $X^{D1}$ to $X^{D11}$ represents C-#, the others of $X^{D1}$ to $X^{D11}$ each independently represent C—$R^D$, and $R^D$ preferably represents a hydrogen atom or a substituent.

In the organic electroluminescent element according to the present invention, the D in the compound represented by the general formula (1) is preferably a group represented by the following general formula (6).

General Formula (6)

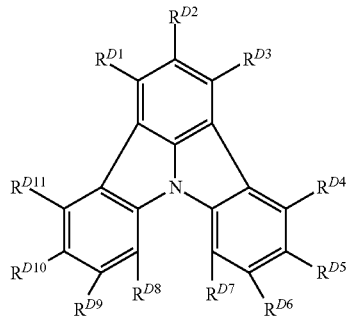

In the general formula (6), one of $R^{D1}$ to $R^{D11}$ represents a binding site to A when n is 0, and represents a binding site to B when n is 1. $R^{D1}$ to $R^{D11}$ that are not binding sites to A or B each independently represent a hydrogen atom or a substituent.

A preferred range of $R^{D1}$ to $R^{D11}$ in the general formula (6) is the same as the preferred range of each $R^D$ in the case where $X^{D1}$ to $X^{D11}$ in the general formula (3) each represent $CR^D$.

In the organic electroluminescent element according to the present invention, any one of $R^{D2}$, $R^{D5}$ and $R^{D10}$ in the general formula (6) represents a binding site to A when n is 0, and represents a binding site to B when n is 1.

In the organic electroluminescent element according to the present invention, it is preferred that at least one of $R^{D2}$, $R^{D5}$ and $R^{D10}$ in the general formula (6) each independently represents an aryl group (provided that an aryl group further having an aryl group as a substituent is excluded), a heteroaryl group, or an oligoaryl group having 2 to 5 rings.

Specific examples of D, which is a monovalent group represented by the general formula (3), are hereunder shown, but the present invention is not limited thereto.

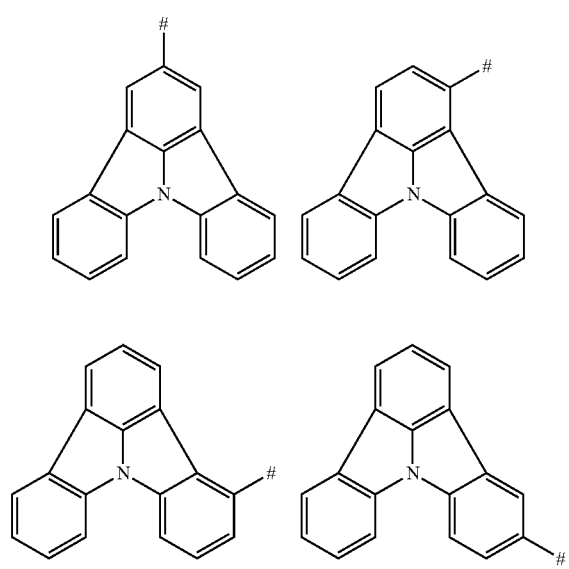

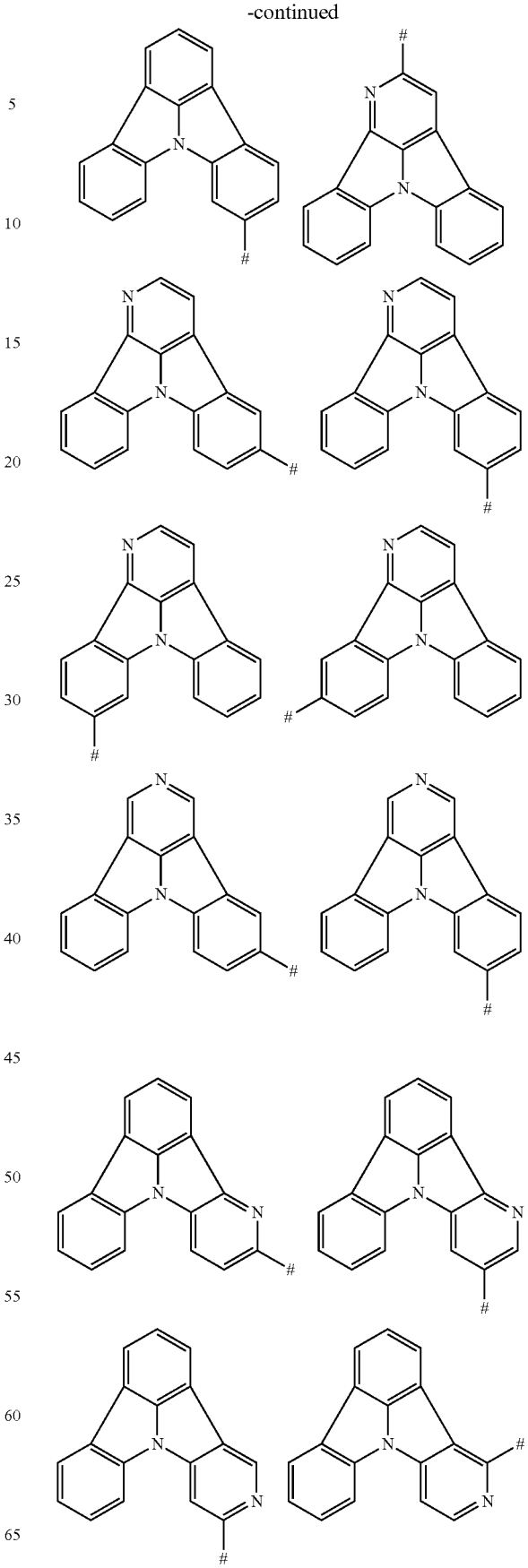

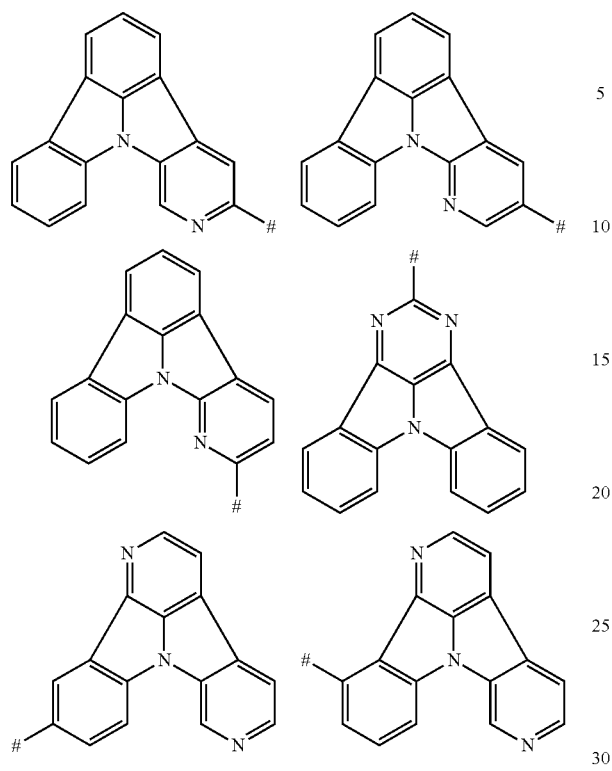
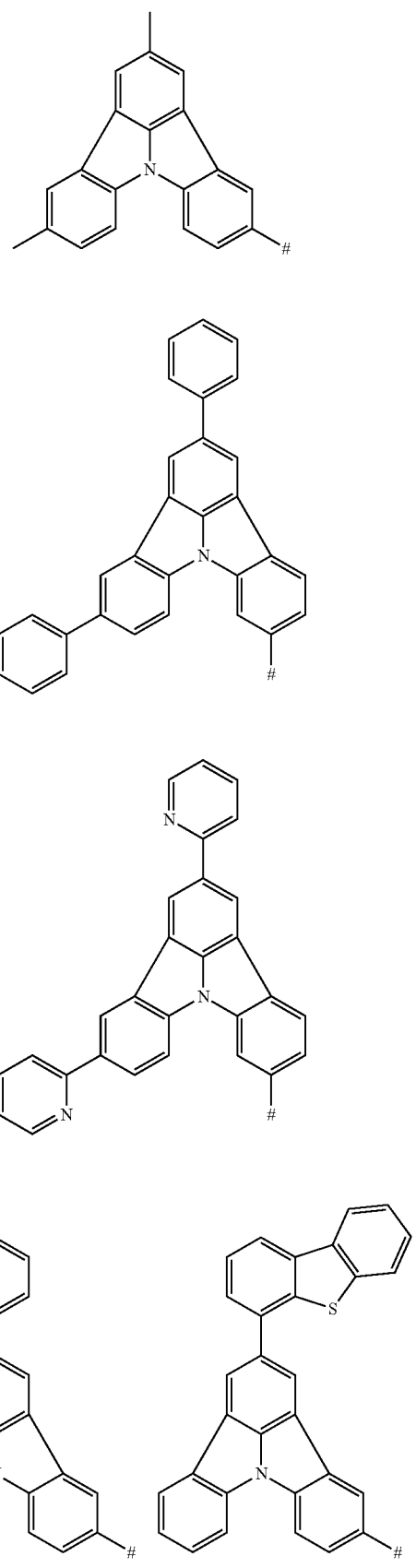

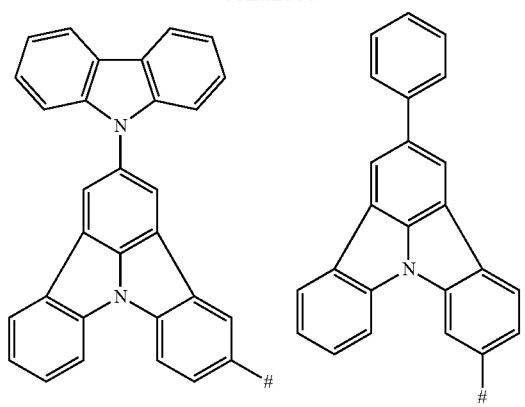
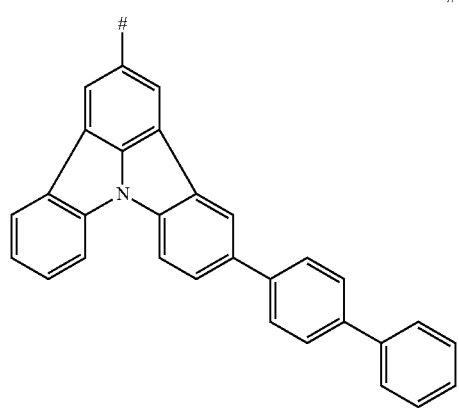
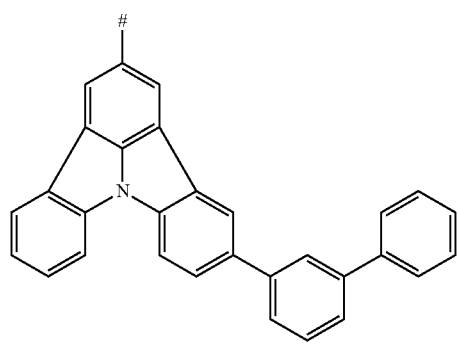
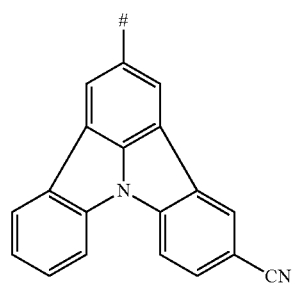
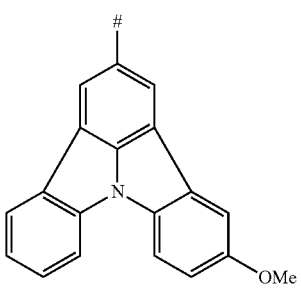
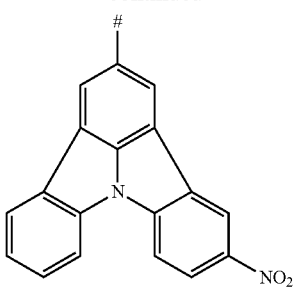
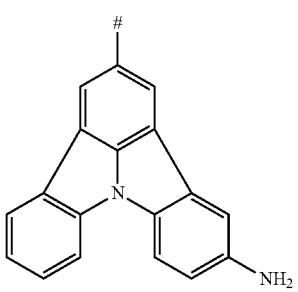
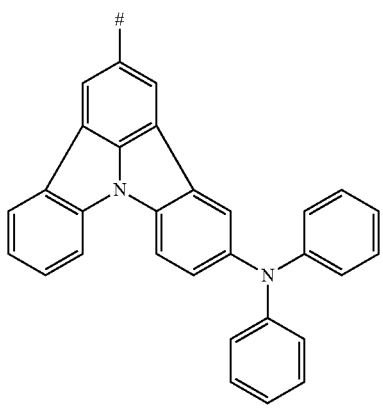
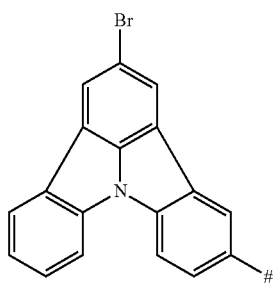

-continued
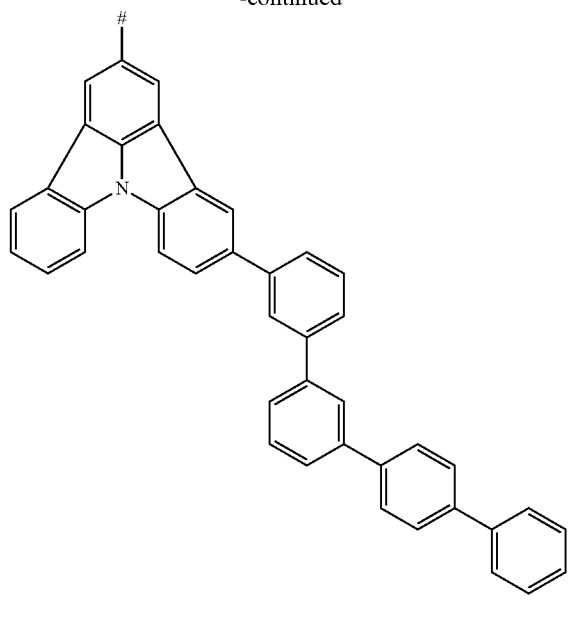
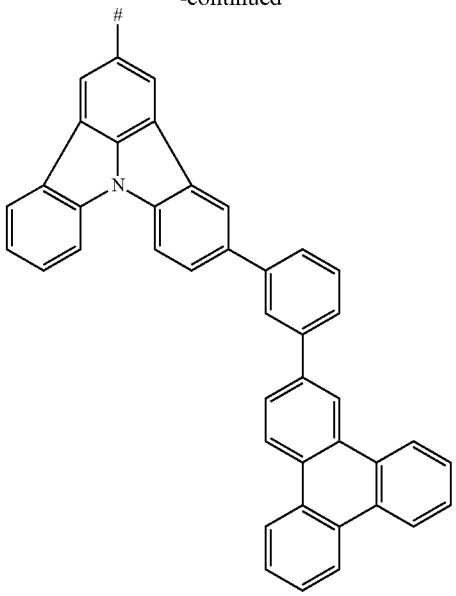
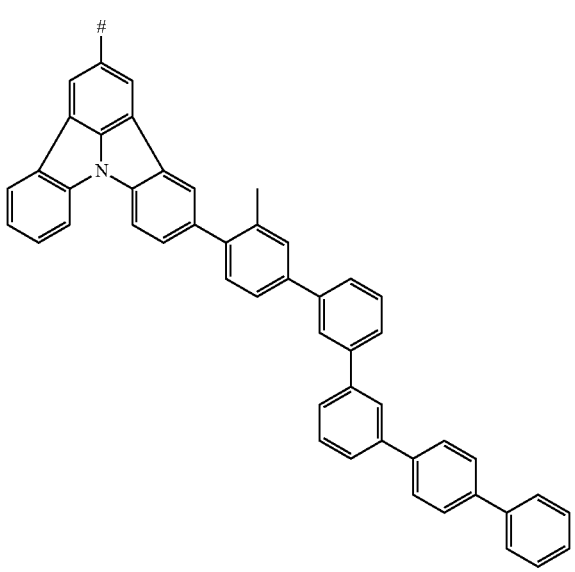
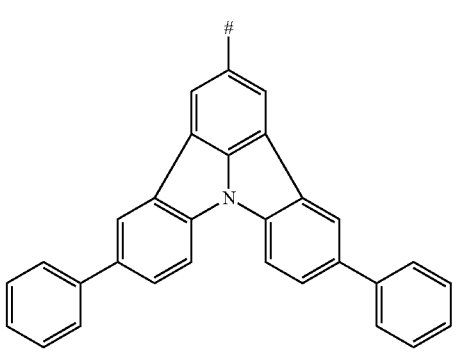
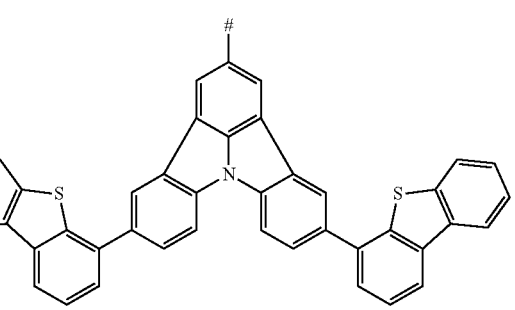
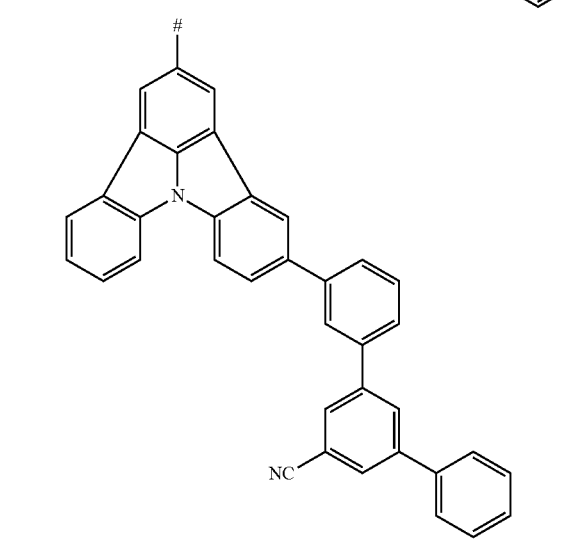
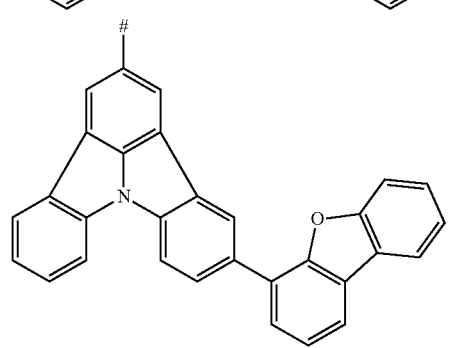

-continued
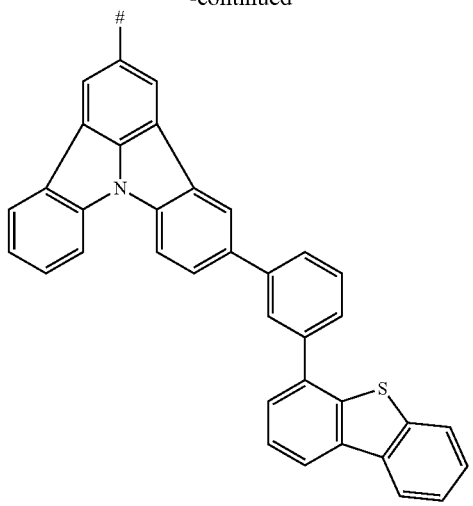
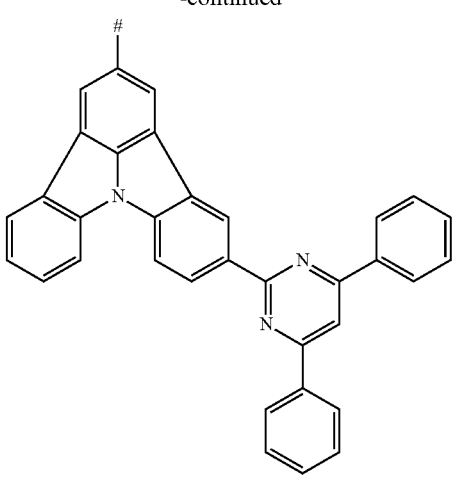
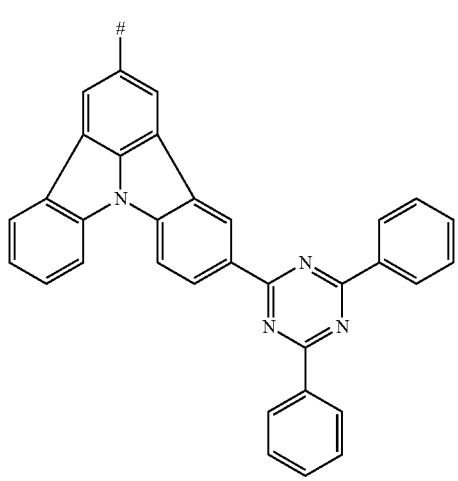
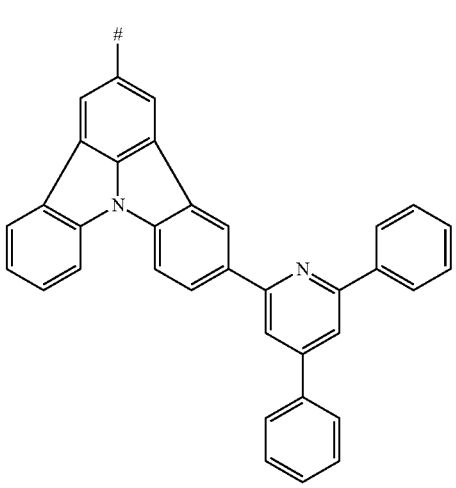
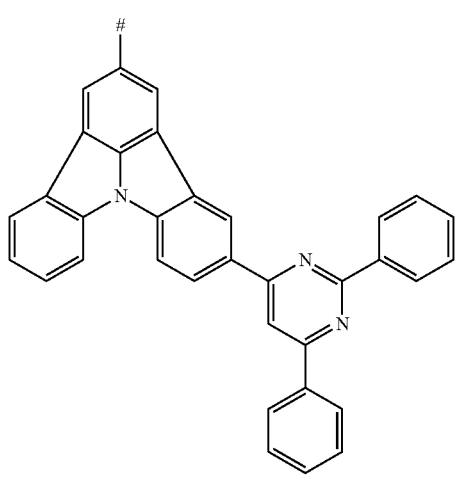
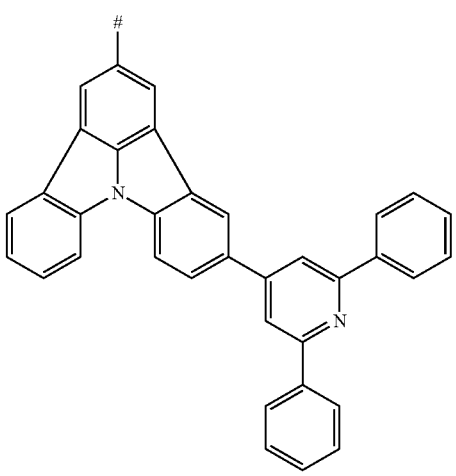

37
-continued
38
-continued
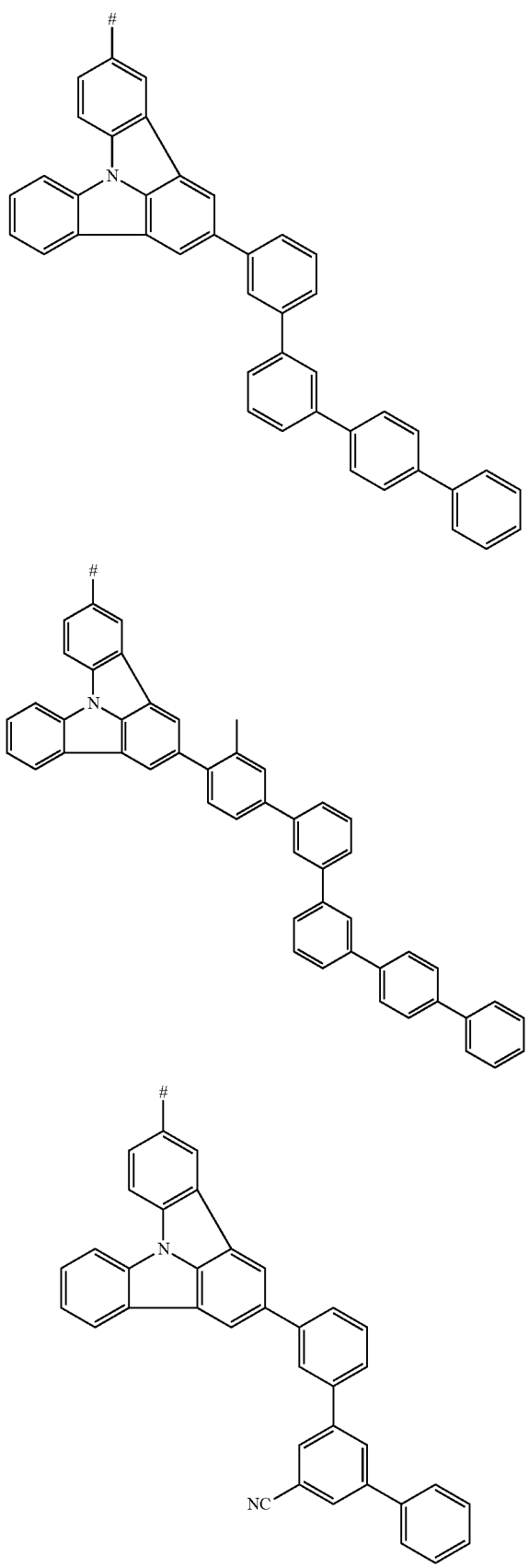
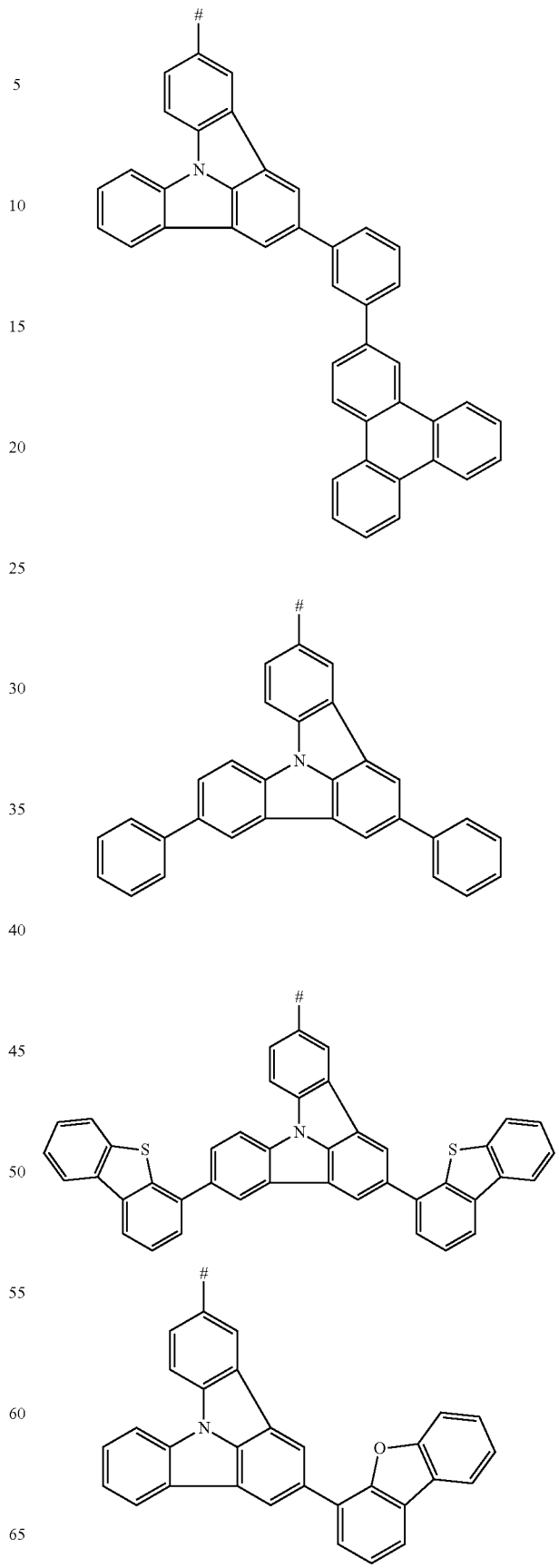

-continued
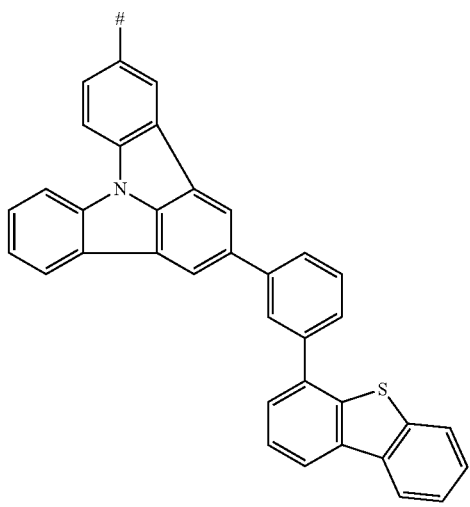
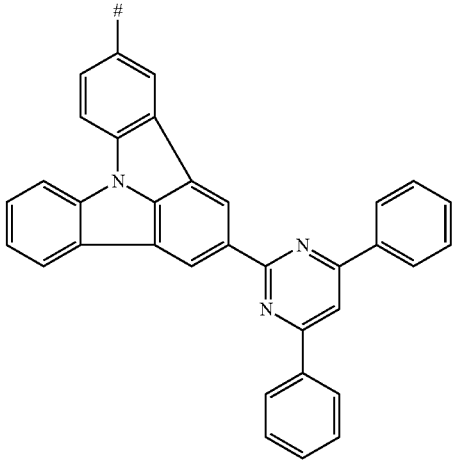
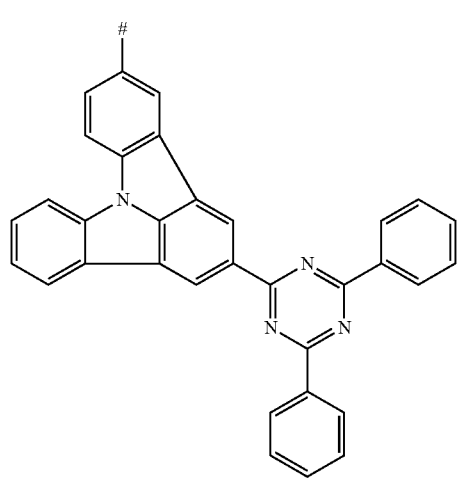
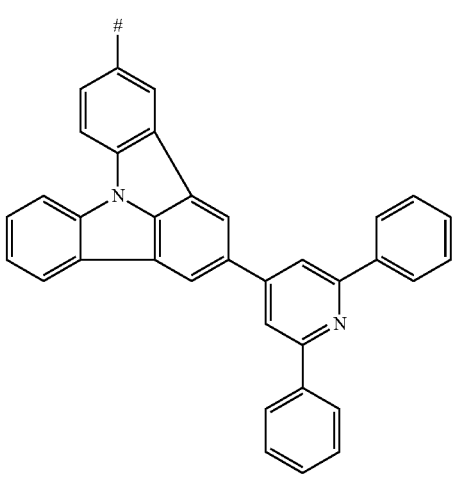
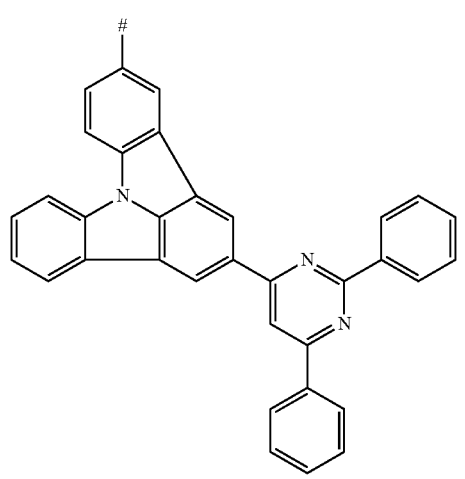
Next, B, which is a divalent group represented by the general formula (4), is described.

General Formula (4)

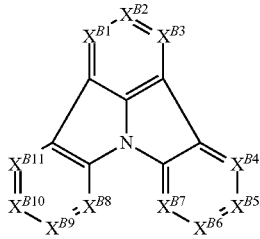

In the general formula (4), one of $X^{B1}$ to $X^{B11}$ represents C-*, and another one of $X^{B1}$ to $X^{B11}$ represents C-#. Any one of $X^{B2}$, $X^{B5}$ and $X^{B10}$ preferably represents C-*, and either one other than the one that represents C-* among $X^{B2}$, $X^{B5}$ and $X^{B10}$ preferably represents C-#.

* represents a binding site to A.
# represents a binding site to D.

In the general formula (4), the other $X^{B1}$ to $X^{B11}$ than the two of $X^{B1}$ to $X^{B11}$ that respectively represent C-* and C-# each independently represent C—$R^B$ or a nitrogen atom.

$R^B$ represents a hydrogen atom or a substituent, and the plural $R^B$s may be the same as or different from one another.

In the general formula (4), the substituents represented by $R^B$ may each independently include the Substituent Group A, and the substituent may further have a substituent. Examples of the further substituent may include a group selected from the Substituent Group A.

The $R^B$s included in $X^{B1}$ to $X^{B3}$ each independently represent, among the Substituent Group A, preferably a hydrogen atom, an alkyl group, an aryl group, an amino group, a heteroaryl group, a cyano group or an alkoxy group, more preferably a hydrogen atom, an aryl group or a heteroaryl group.

The alkyl group represented by the $R^B$ included in $X^{B1}$ to $X^{B3}$ preferably has 1 to 30 carbon atoms, more preferably has 1 to 10 carbon atoms, and especially preferably has 1 to 3 carbon atoms, with a methyl group being preferred.

The aryl group represented by the $R^B$ included in $X^{B1}$ to $X^{B3}$ preferably has 6 to 30 carbon atoms, more preferably has 6 to 20 carbon atoms, and especially preferably has 6 to 18 carbon atoms, and examples thereof include a phenyl group, a xylyl group, a phenanthrenyl group, a triphenylenyl group, etc., with a phenyl group being preferred.

The amino group represented by the $R^B$ included in $X^{B1}$ to $X^{B3}$ preferably has 1 to 30 carbon atoms, more preferably has 1 to 24 carbon atoms, and especially preferably has 1 to 15 carbon atoms, with a diphenylamino group being preferred.

The heteroaryl group represented by the $R^B$ included in $X^{B1}$ to $X^{B3}$ preferably has 5 to 30 ring members, more preferably has 5 to 20 ring members, and especially preferably has 5 to 15 ring members, and examples thereof include a pyridyl group, a pyrimidyl group, a triazyl group, a pyrazyl group, a pyridazyl group, a carbazolyl group, a dibenzothiophenyl group, a dibenzofuranyl group, etc., with a pyridyl group, a pyrimidyl group, a triazyl group, a carbazolyl group, and a dibenzothiophenyl group being preferred.

The alkoxy group represented by the $R^B$ included in $X^{B1}$ to $X^{B3}$ preferably has 1 to 30 carbon atoms, more preferably has 1 to 10 carbon atoms, and especially preferably has 1 to 3 carbon atoms, with a methoxy group being preferred.

The $R^B$ included in $X^{B1}$ to $X^{B3}$ may further have a substituent represented by the Substituent Group A, as described above. The further substituent that may be on $R^B$ may further have a substituent represented by the Substituent Group A.

The $R^B$s included in $X^{B4}$ to $X^{B11}$ each independently represent preferably a hydrogen atom, an alkyl group, an aryl group, an amino group, a heteroaryl group, a cyano group or an alkoxy group, with a hydrogen atom being especially preferred.

A preferred range of the alkyl group represented by the $R^B$ included in $X^{B1}$ to $X^{B3}$ is the same as the preferred range of the alkyl group represented by the $R^B$ included in $X^{B1}$ to $X^{B3}$.

A preferred range of the aryl group represented by the $R^B$ included in $X^{B1}$ to $X^{B3}$ is the same as the preferred range of the aryl group represented by the $R^B$ included in $X^{B1}$ to $X^{B3}$.

A preferred range of the amino group represented by the $R^B$ included in $X^{B1}$ to $X^{B3}$ is the same as the preferred range of the amino group represented by the $R^B$ included in $X^{B1}$ to $X^{B3}$.

A preferred range of the heteroaryl group represented by the $R^B$ included in $X^{B1}$ to $X^{B3}$ is the same as the preferred range of the heteroaryl group represented by the $R^B$ included in $X^{B1}$ to $X^{B3}$.

A preferred range of the alkoxy group represented by the $R^B$ included in $X^{B1}$ to $X^{B3}$ is the same as the preferred range of the alkoxy group represented by the $R^B$ included in $X^{B1}$ to $X^{B3}$.

Among the other $X^{B1}$ to $X^{B11}$ than the two of $X^{B1}$ to $X^{B11}$ that respectively represent C-* and C-#, the number of $CR^B$ is preferably 1 to 9, more preferably 5 to 9, especially preferably 8 to 9, and more especially preferably 9.

Among the other $X^{B1}$ to $X^{B11}$ than the two of $X^{B1}$ to $X^{B11}$ that respectively represent C-* and C-#, a preferred range of the number of nitrogen atom depends on the number of $CR^B$. The number of nitrogen atom among $X^{B1}$ to $X^{B3}$ is preferably 0 to 2, more preferably 0 or 1, and especially preferably 0. The number of nitrogen atom among $X^{B4}$ to $X^{B7}$ is preferably 0 to 1, and especially preferably 0. The number of nitrogen atom among $X^{B8}$ to $X^{B11}$ is preferably 0 or 1, and especially preferably 0.

Among $X^{B1}$ to $X^{B11}$, the number of $CR^B$ whose $R^B$ is a substituent, is preferably 0 to 8, more preferably 0 to 3, especially preferably 0 or 1, and more especially preferably 0.

The positions of $CR^B$ whose $R^B$ is a substituent, among $X^{B1}$ to $X^{B11}$, are preferably $X^{B2}$, $X^{B5}$ and $X^{B10}$.

In the organic electroluminescent element according to the present invention, it is preferred that in the general formula (4), one of $X^{B1}$ to $X^{B11}$ represents C-*, one of $X^{B1}$ to $X^{B11}$ represents C-#, the others of $X^{B1}$ to $X^{B11}$ each independently represent C—$R^B$, and $R^B$ represents a hydrogen atom or a substituent.

In the organic electroluminescent element according to the present invention, the B in the compound represented by the general formula (1) is preferably a group represented by the general formula (7).

General Formula (7)

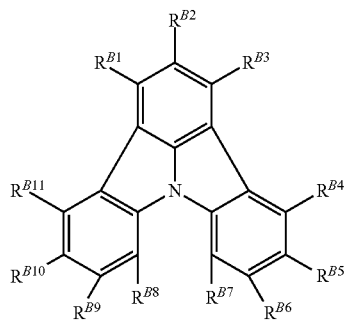

In the general formula (7), one of $R^{B1}$ to $R^{B11}$ represents a binding site to A, another one represents a binding site to D, and $R^{B1}$ to $R^{B11}$ that are not binding sites to A or D each independently represent a hydrogen atom or a substituent.

A preferred range of $R^{B1}$ to $R^{B11}$ in the general formula (7) is the same as the preferred range of each $R^B$ in the case where $X^{B1}$ to $X^{B11}$ in the general formula (4) each represent $CR^B$.

In the organic electroluminescent element according to the present invention, it is preferred that in the general formula (7), $R^{B2}$ represents a binding site to A or a binding site to C, $R^{B5}$ or $R^{B10}$ represents the remaining one of the binding site to A and the binding site to C.

Specific examples of B, which is a divalent group represented by the general formula (4) are shown below, but the present invention is not limited thereto.

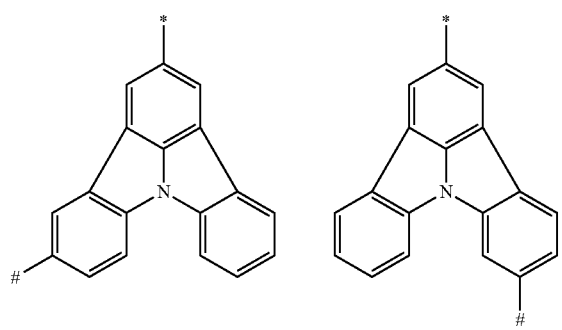

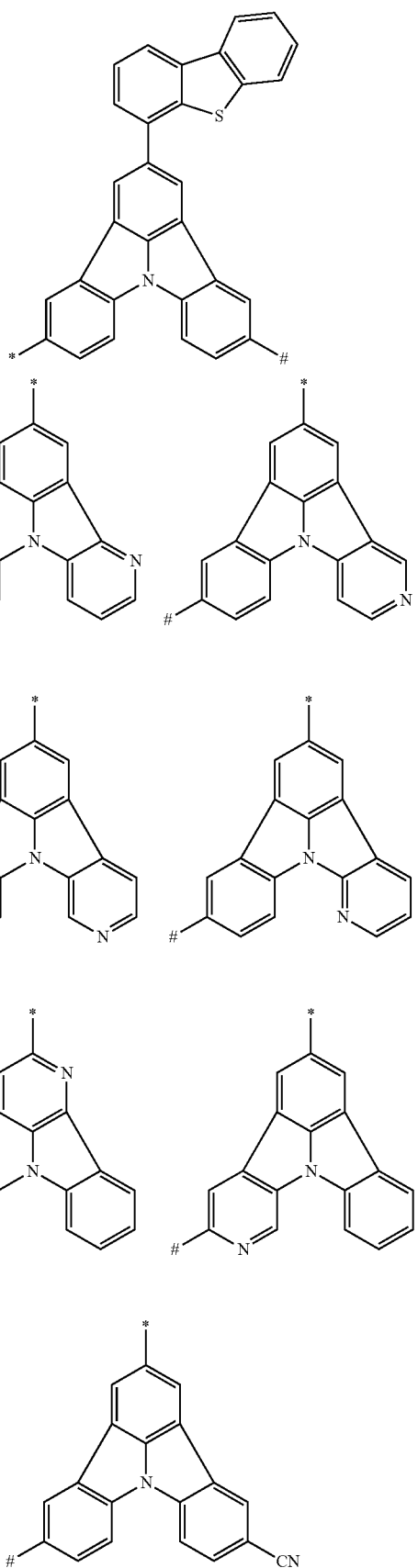

-continued
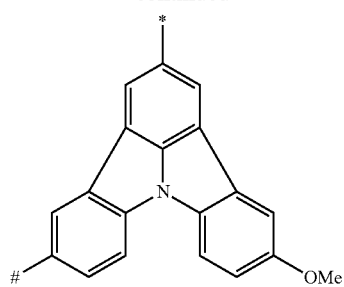
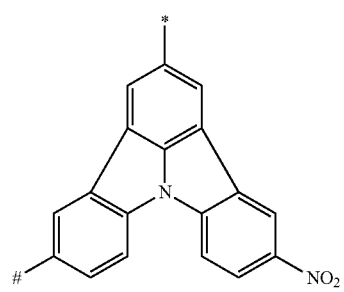
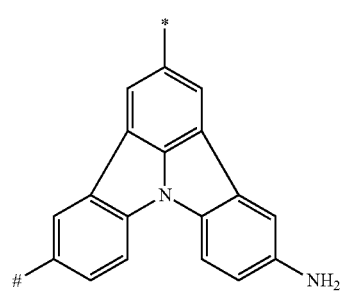
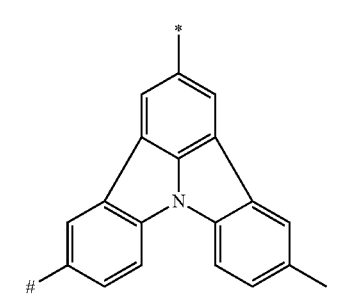
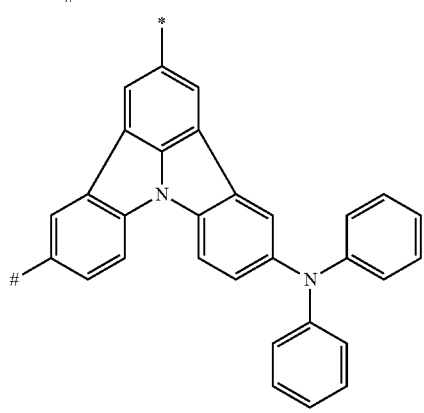
-continued
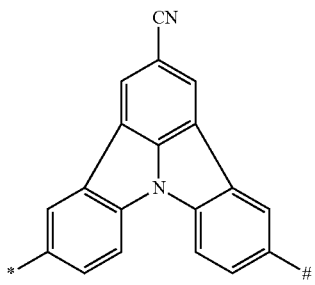
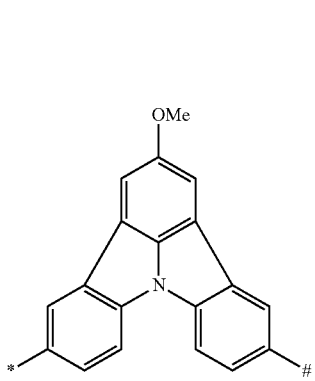
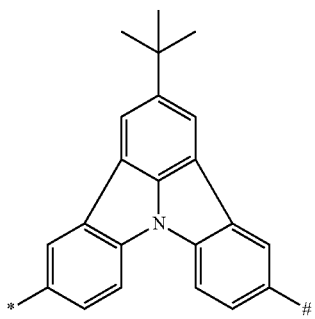
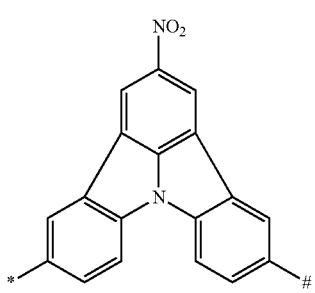
Specific examples of the compound represented by the general formula (1) are shown below, but the present invention is not limited thereto.

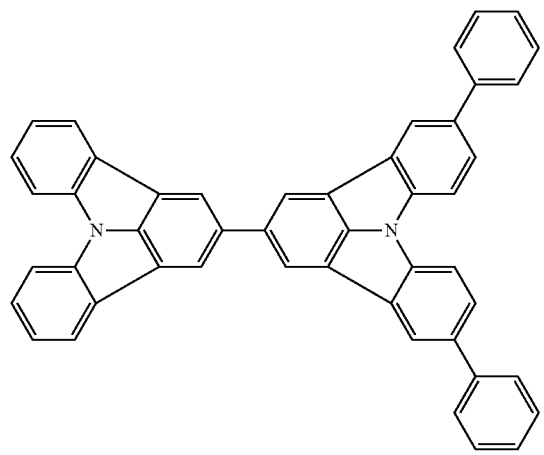
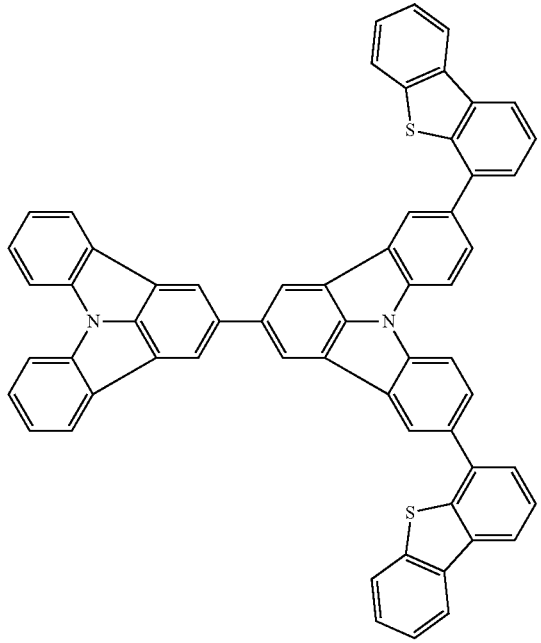
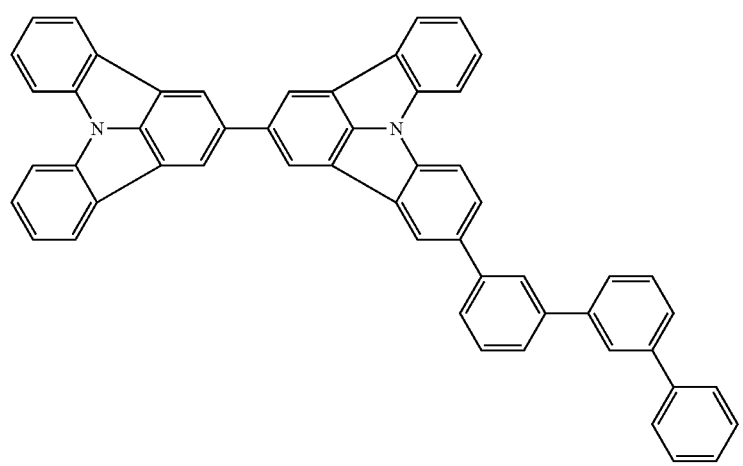
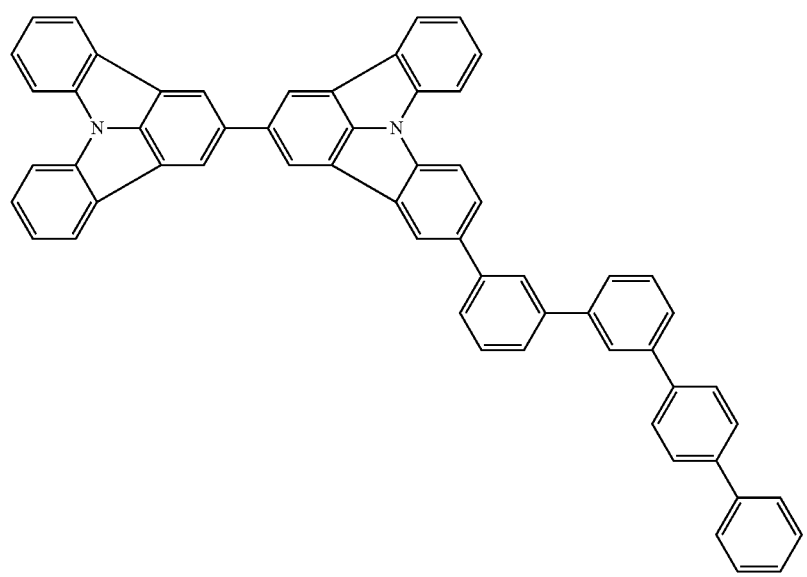

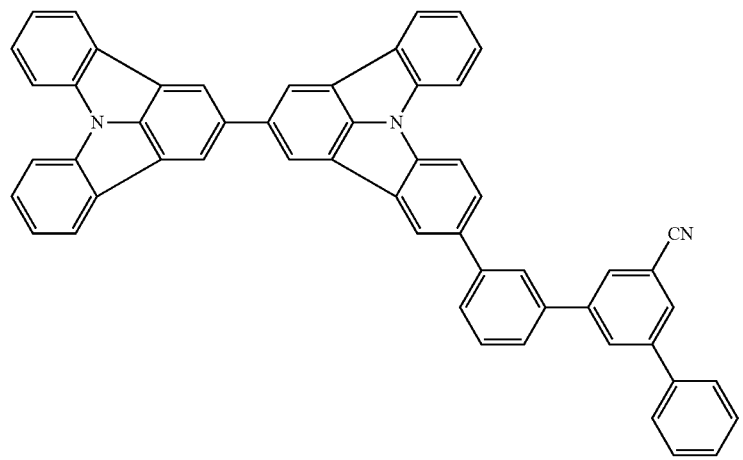
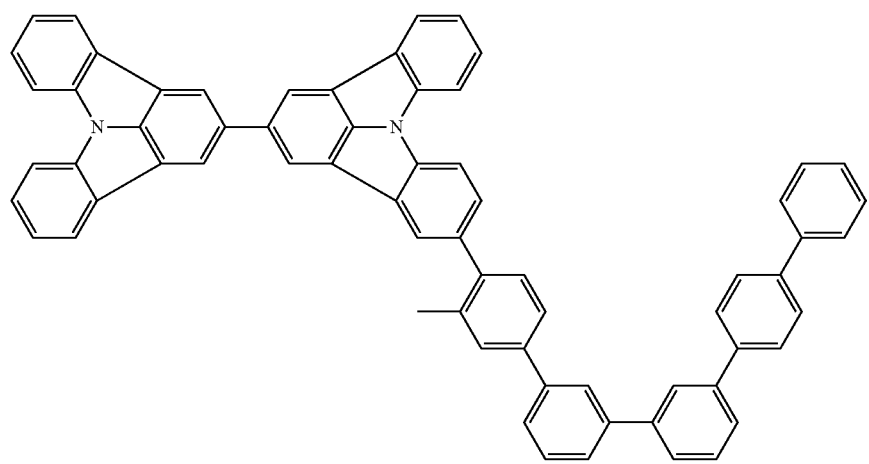
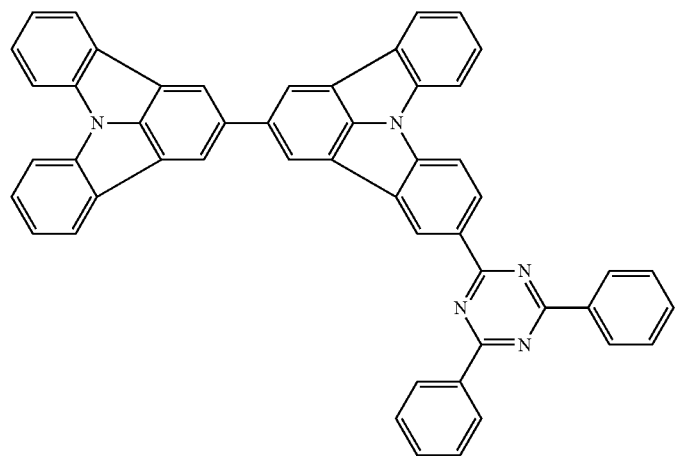

-continued
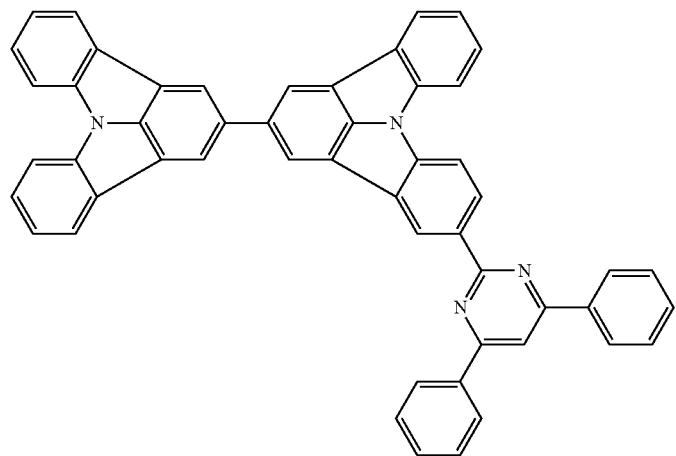
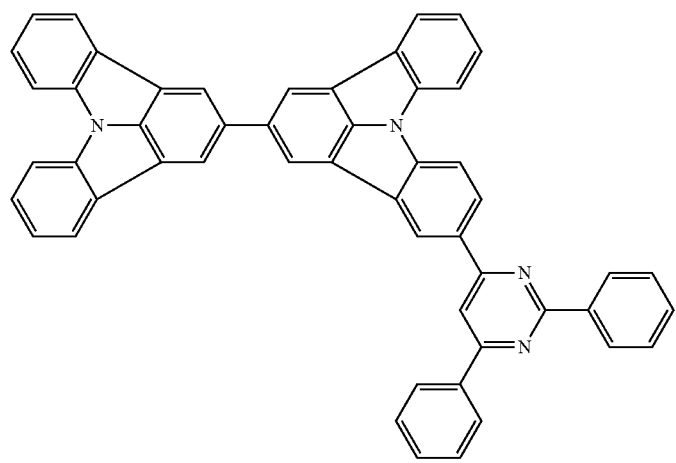
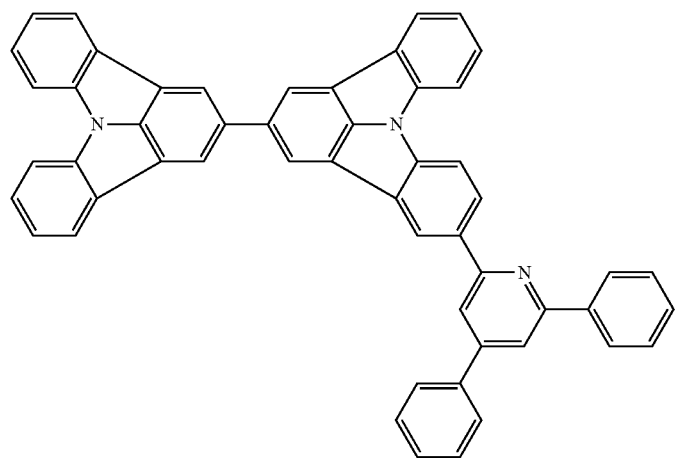

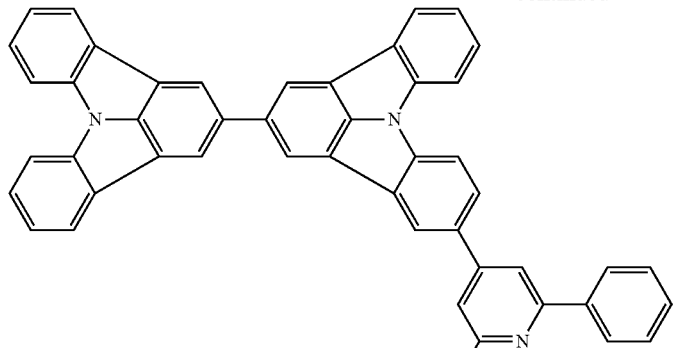
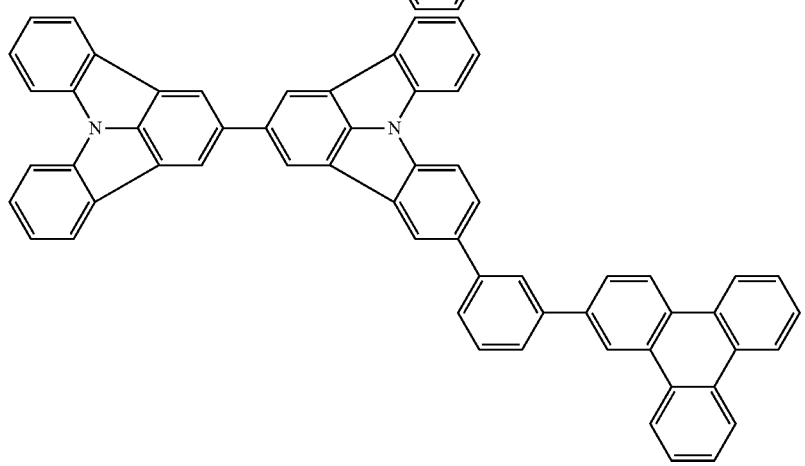
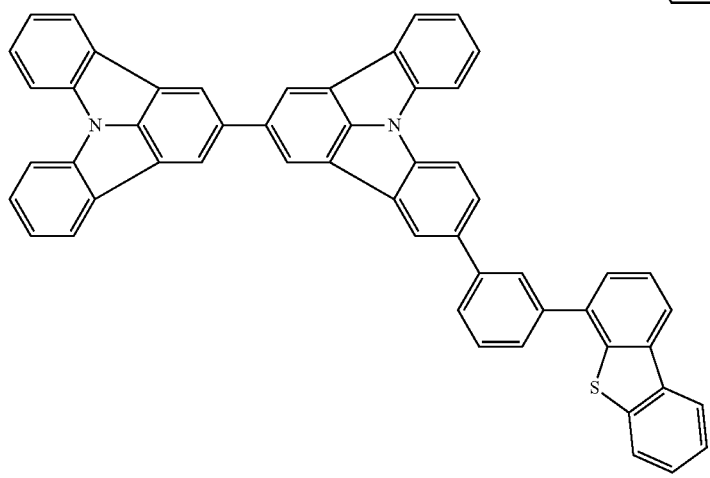
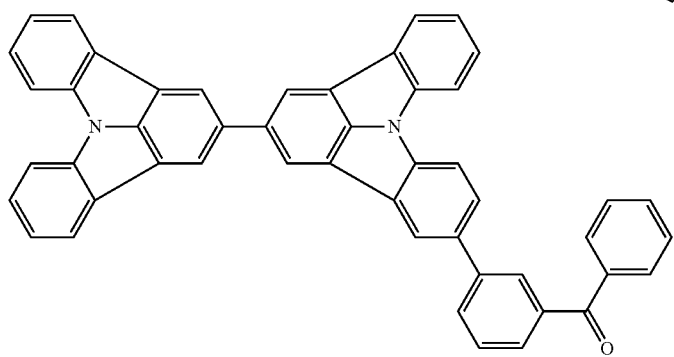

-continued
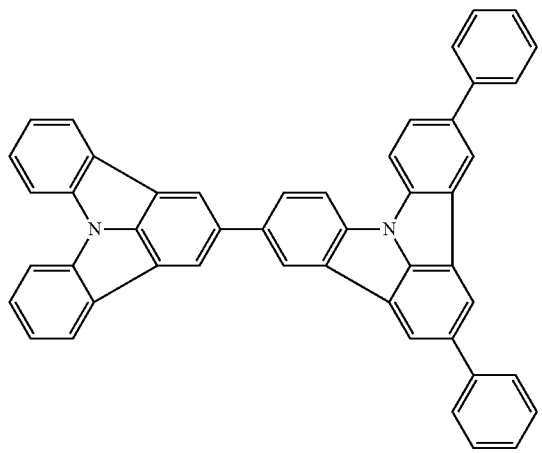
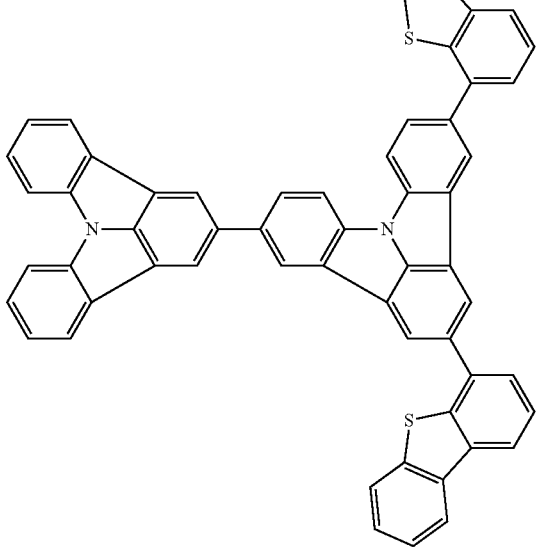
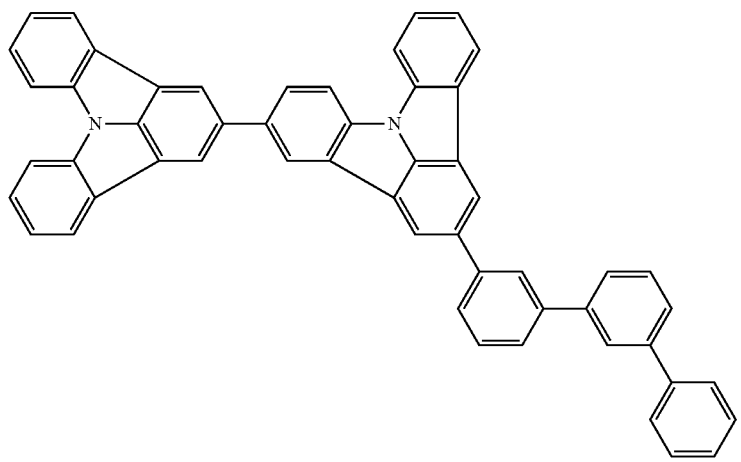
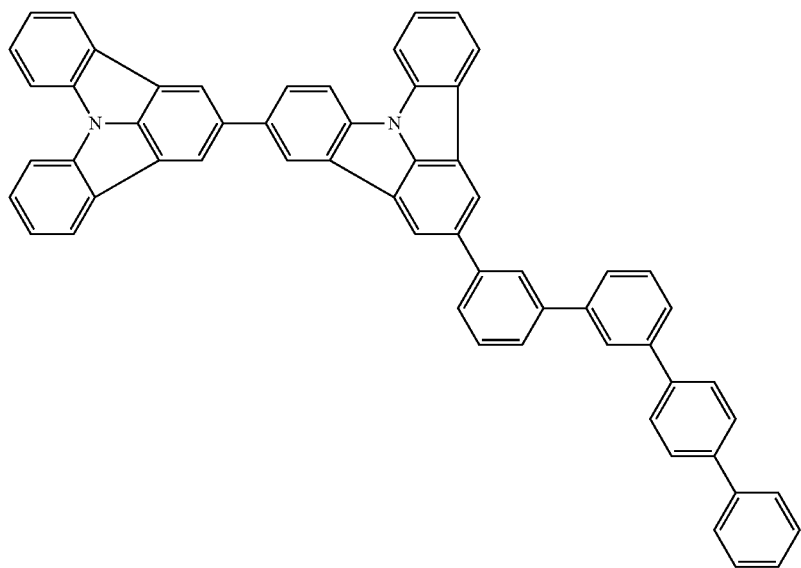

-continued
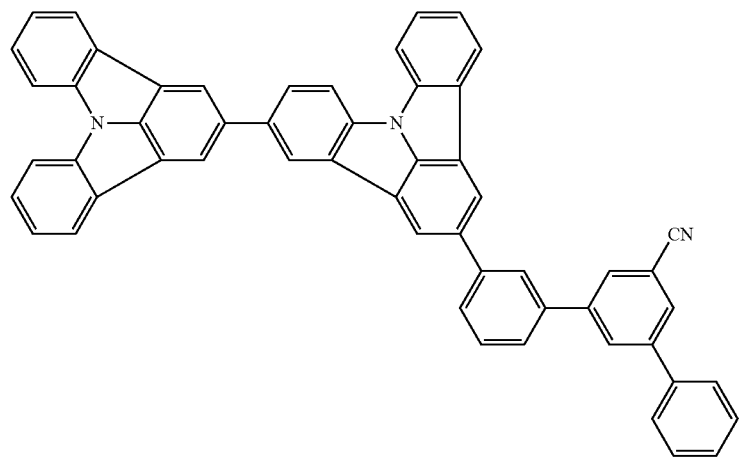
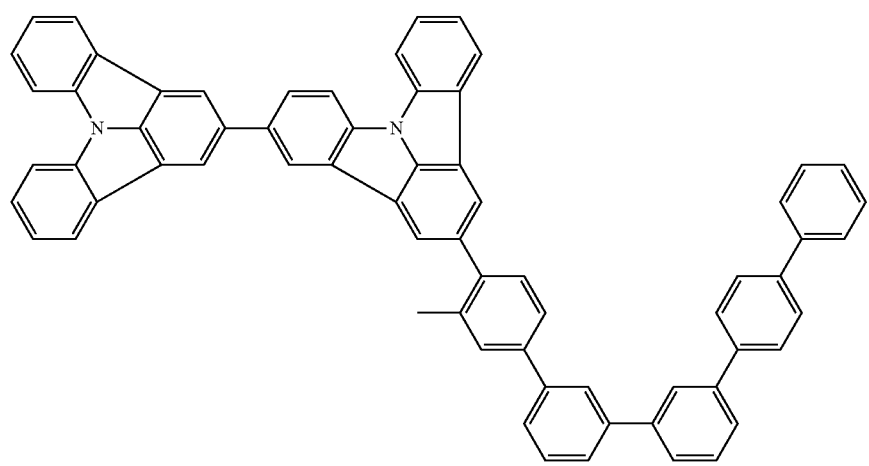
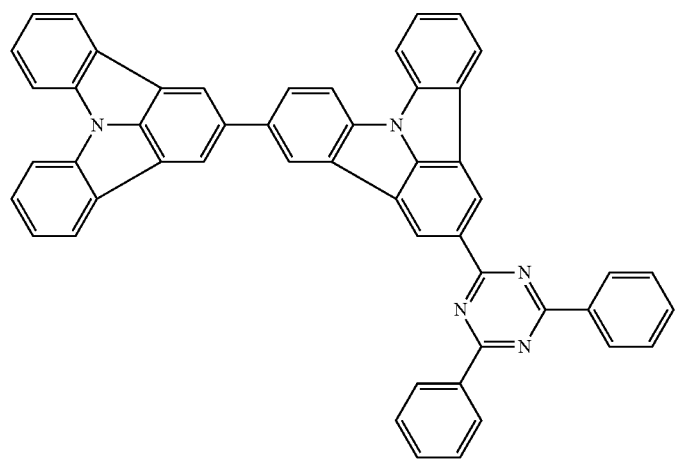

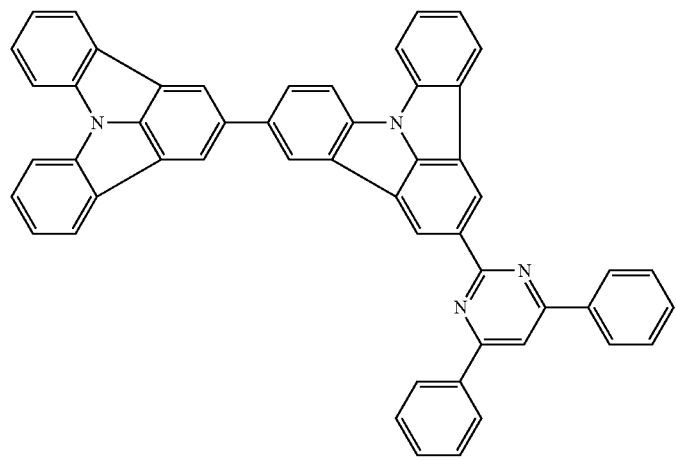
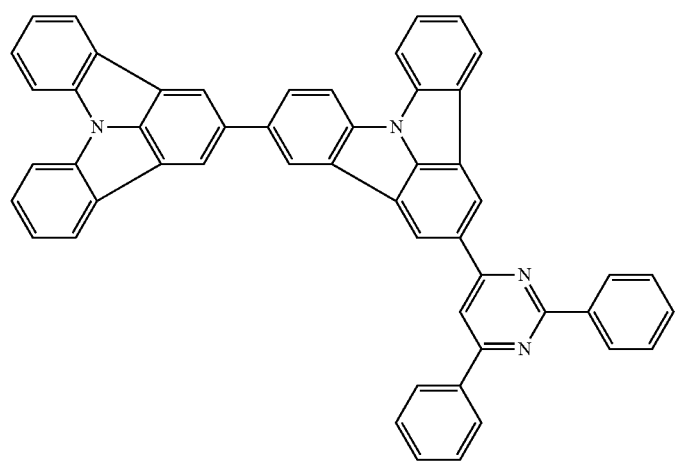
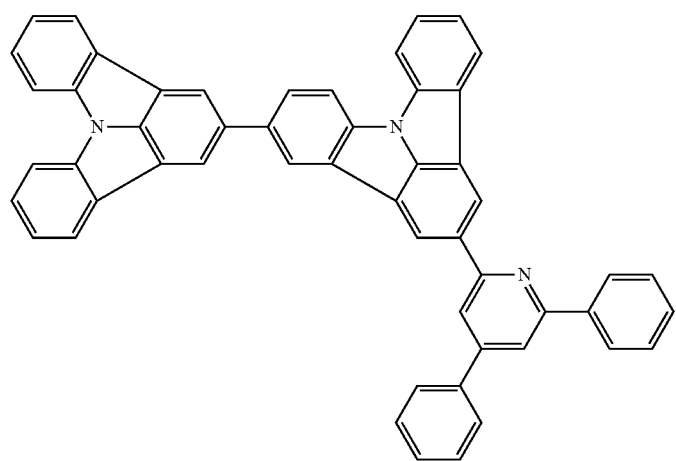

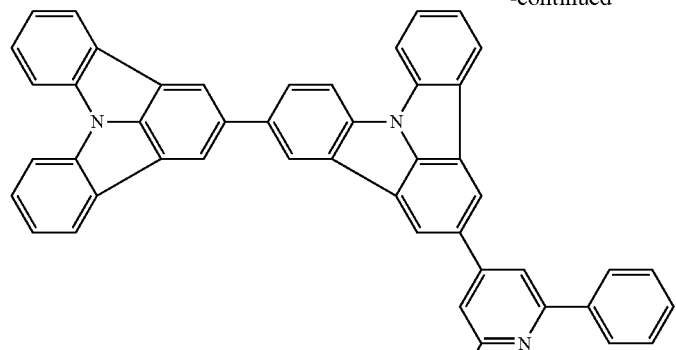
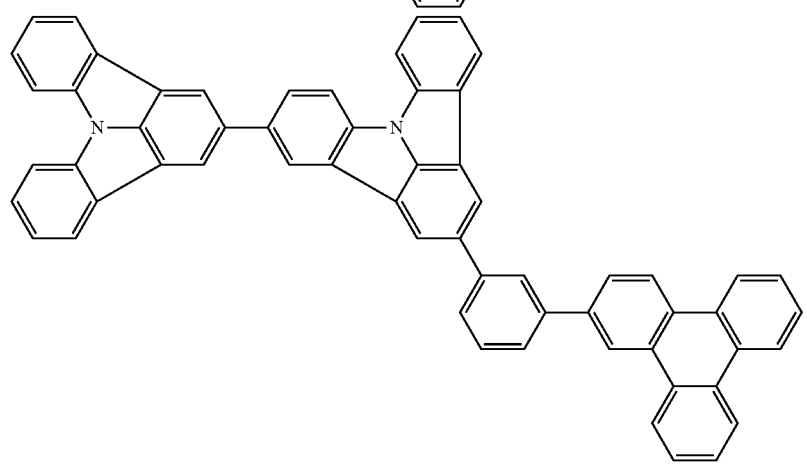
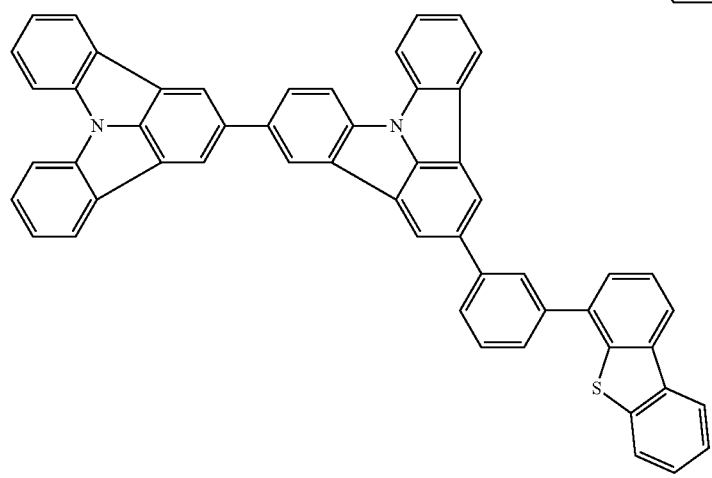
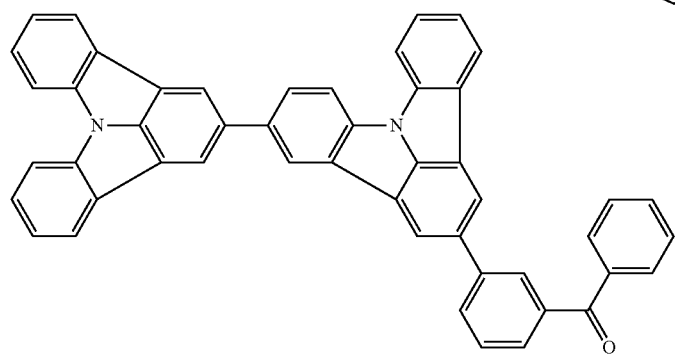

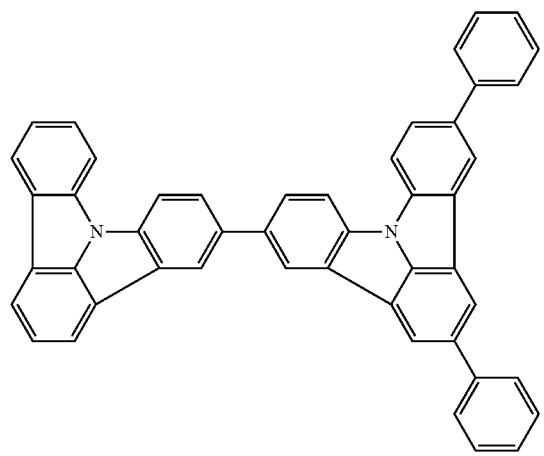
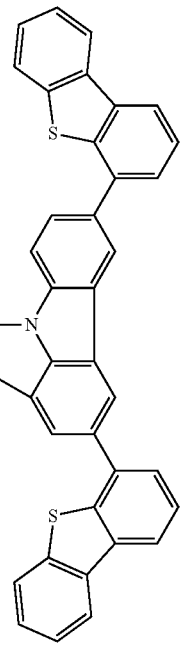
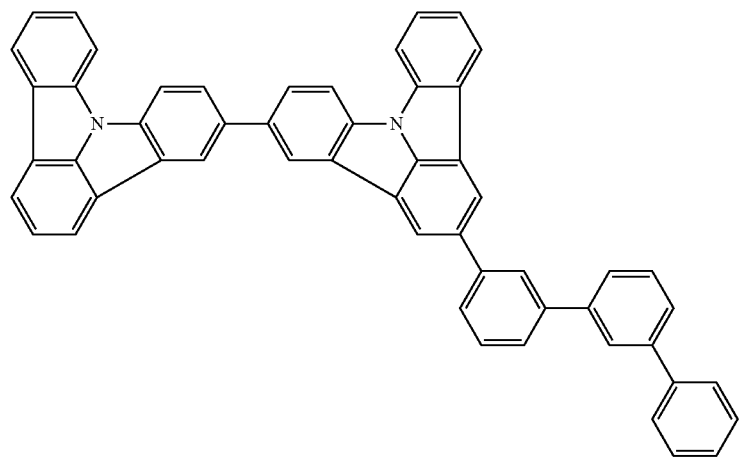
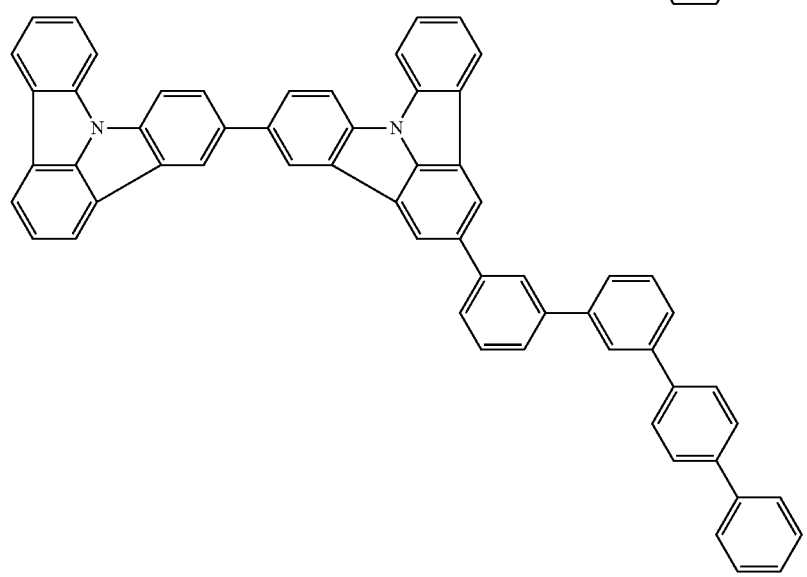

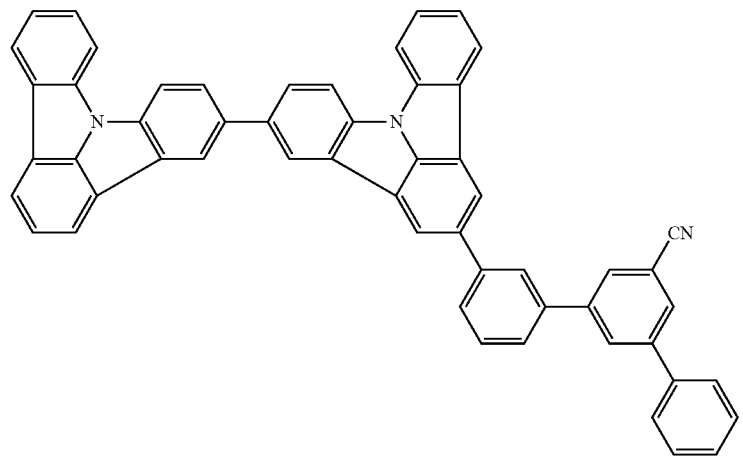
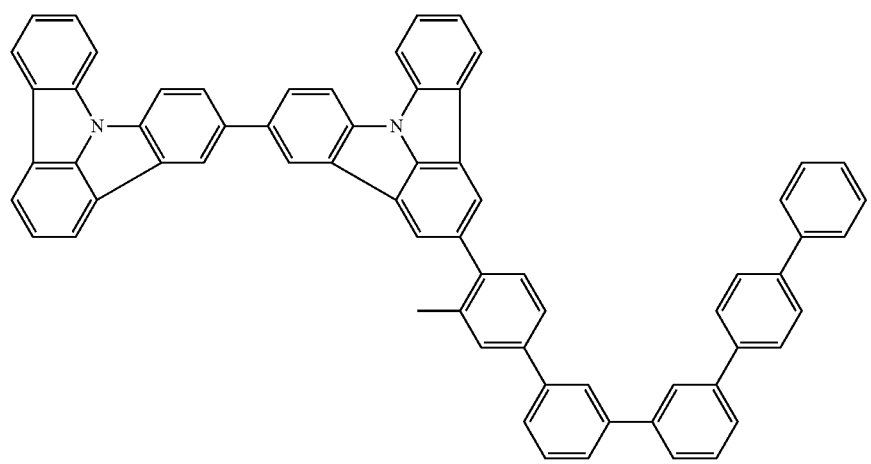
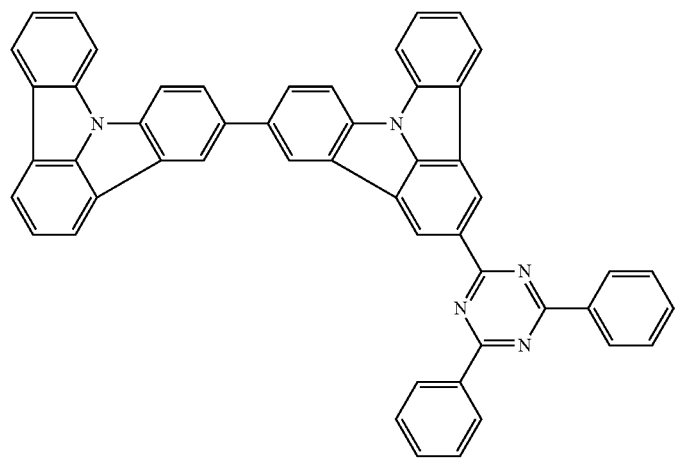

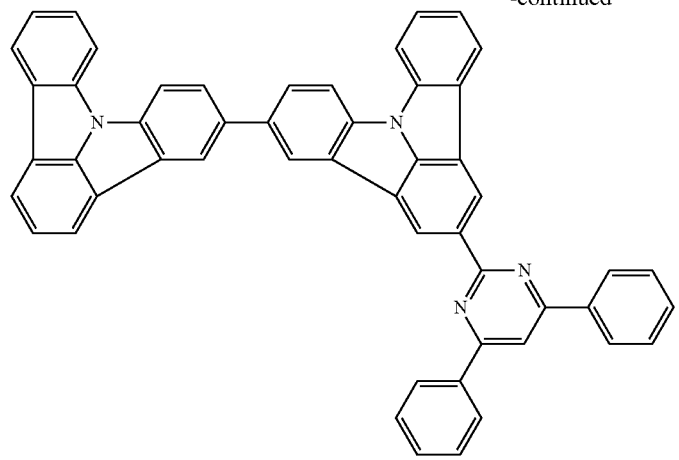
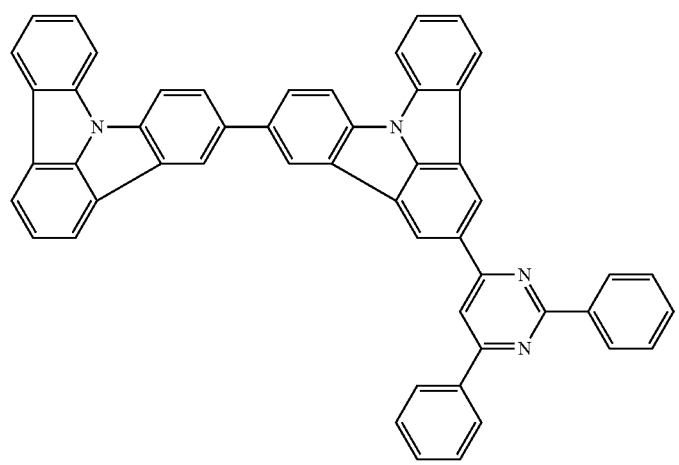
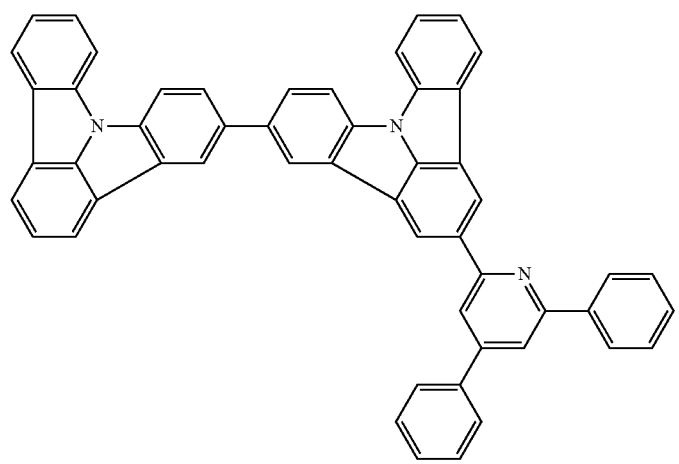

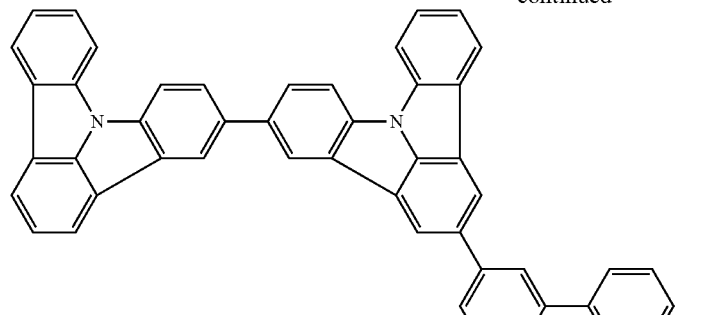
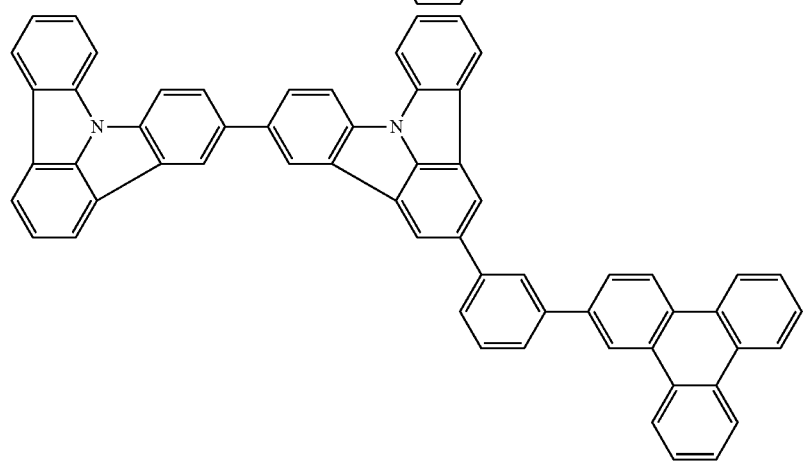
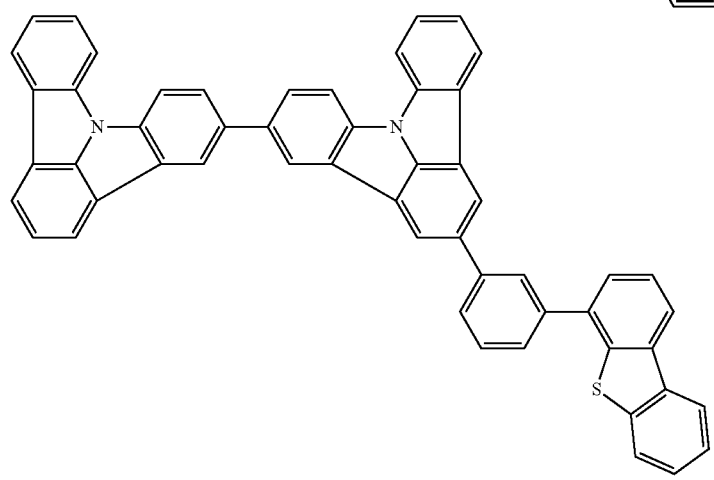
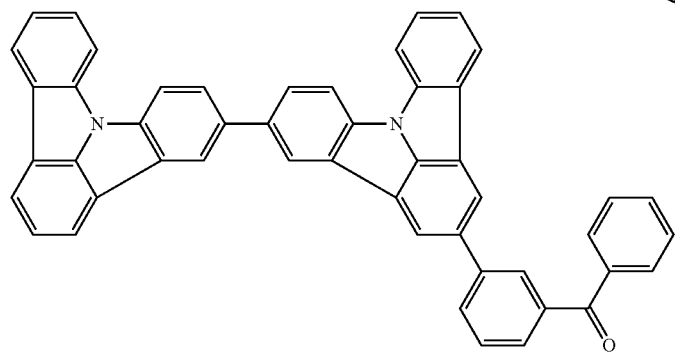

-continued
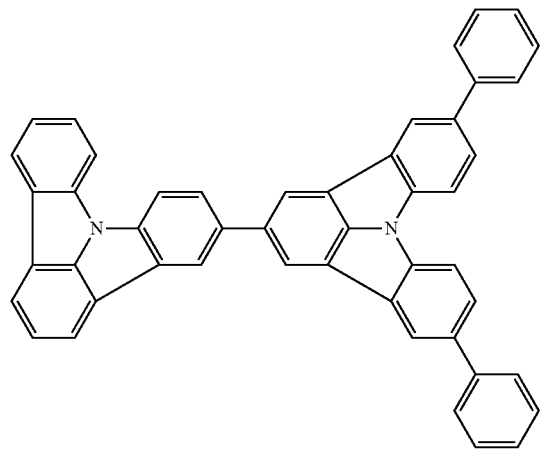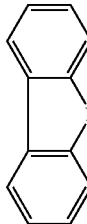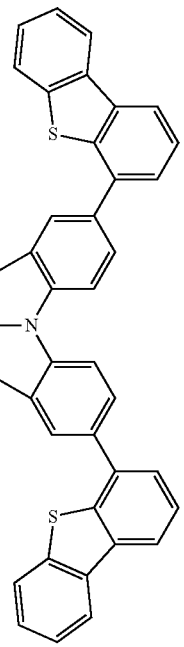
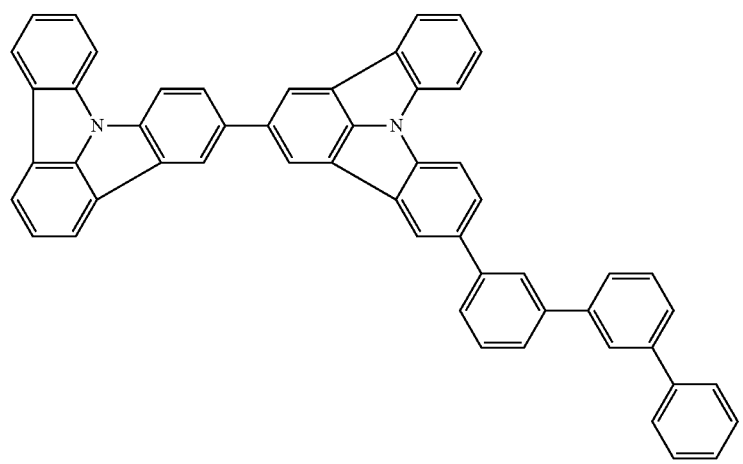
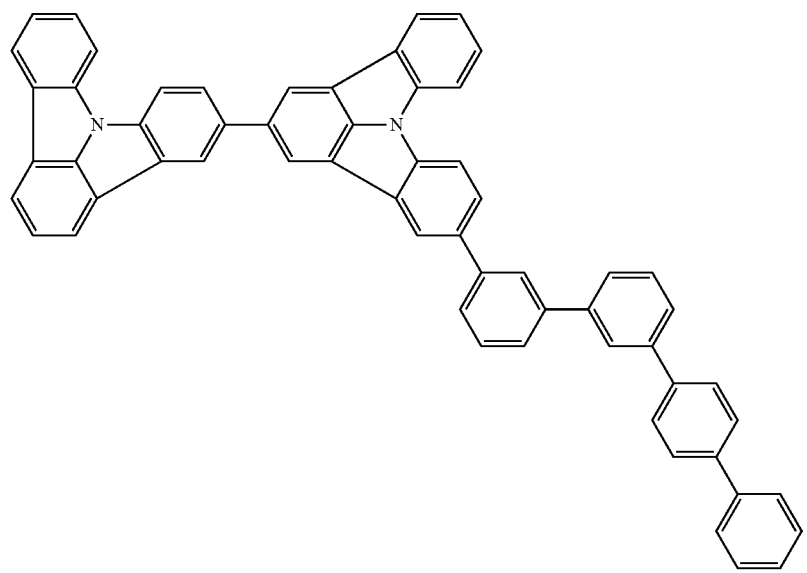

-continued
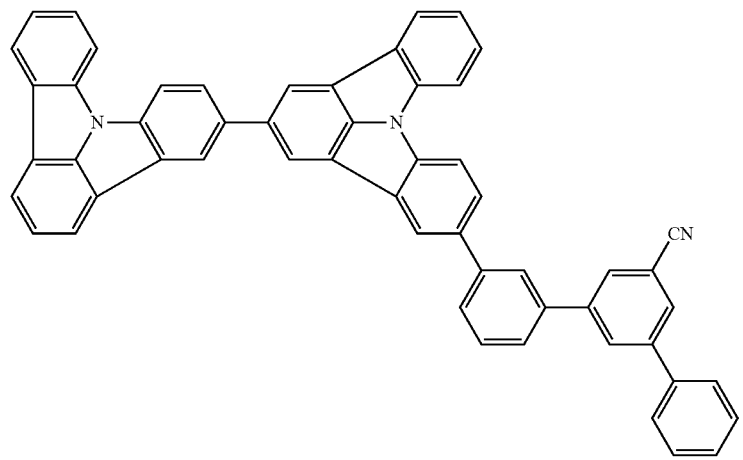
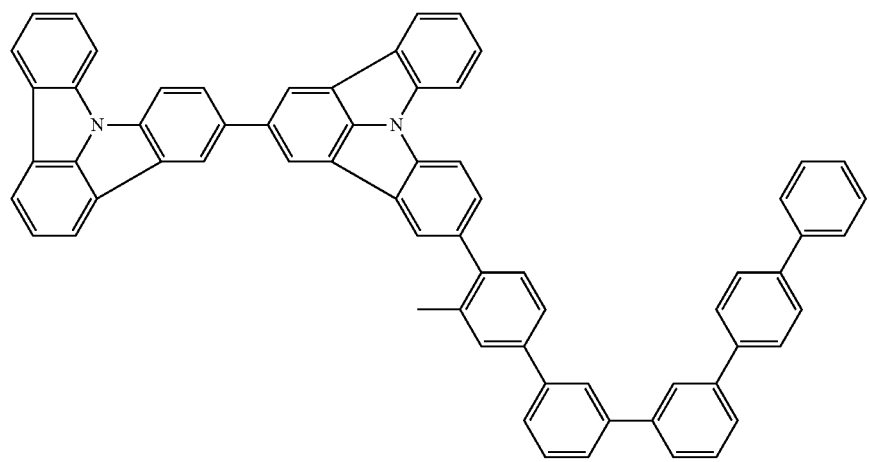
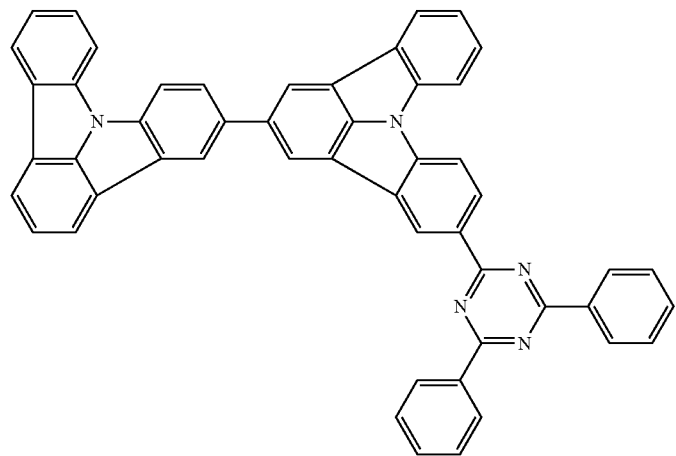

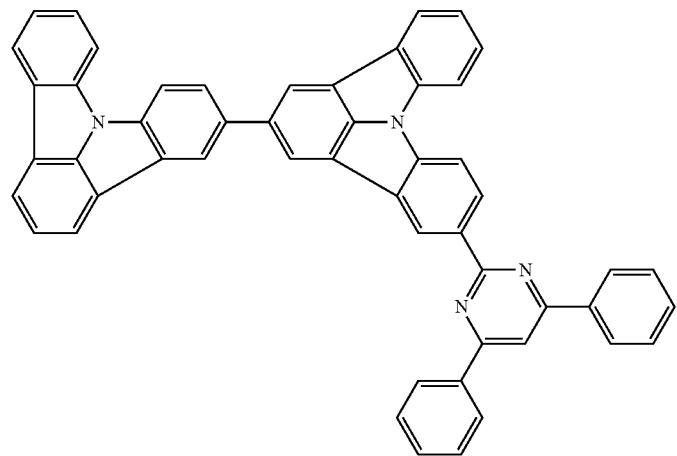
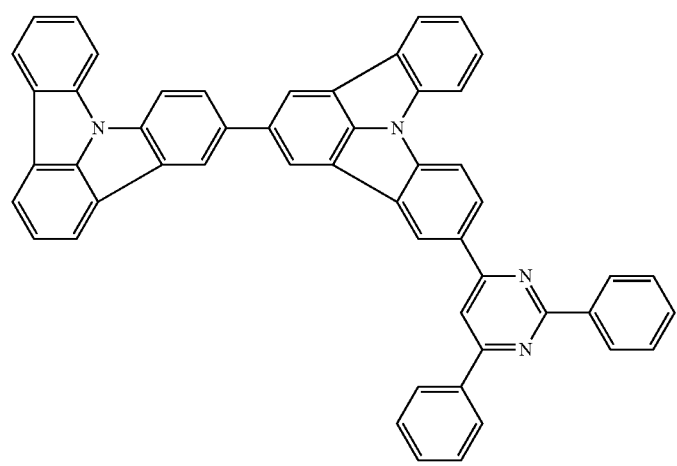
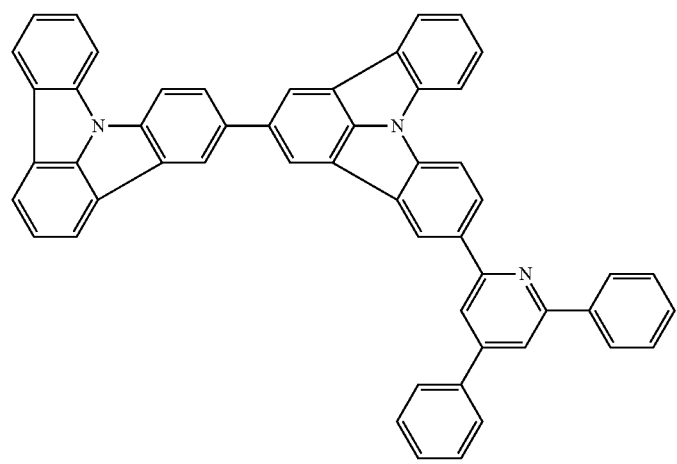

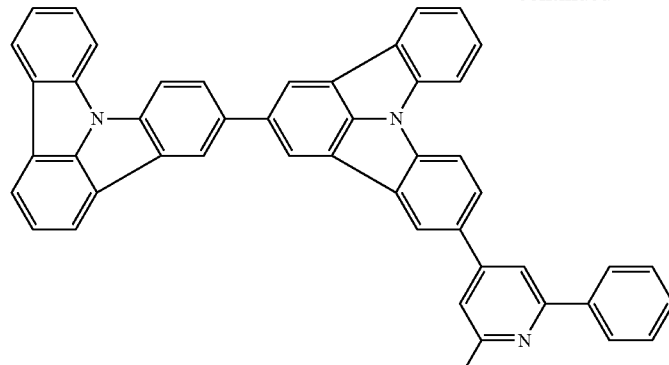
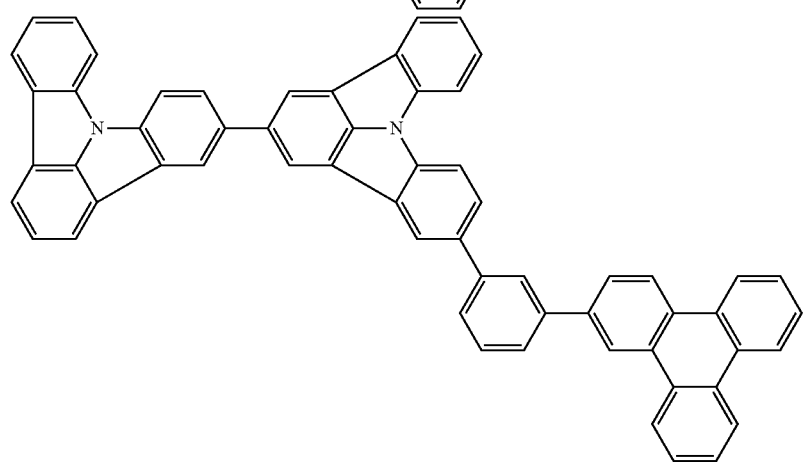
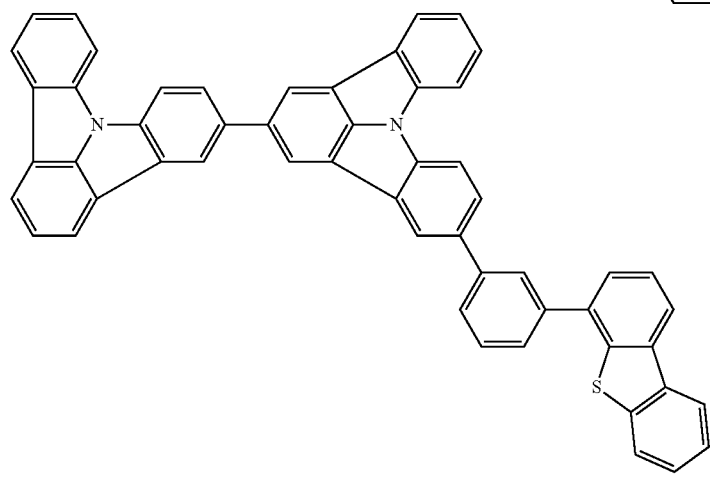
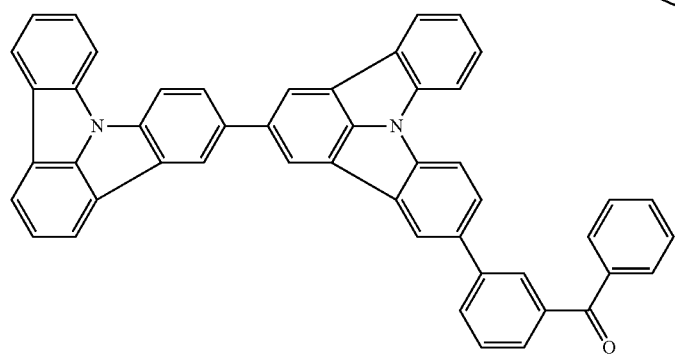

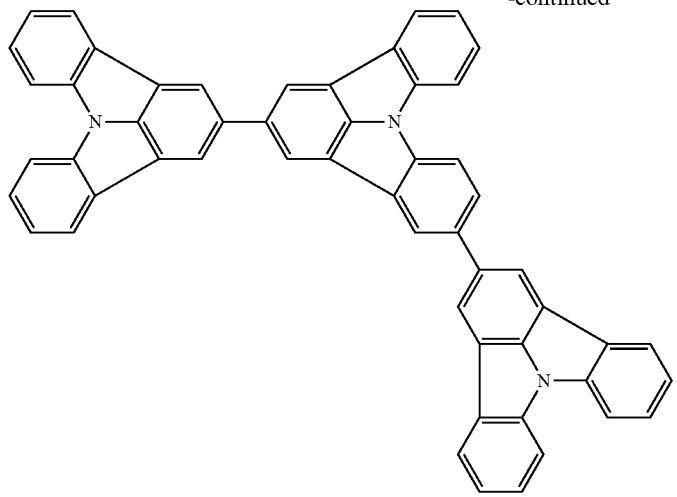
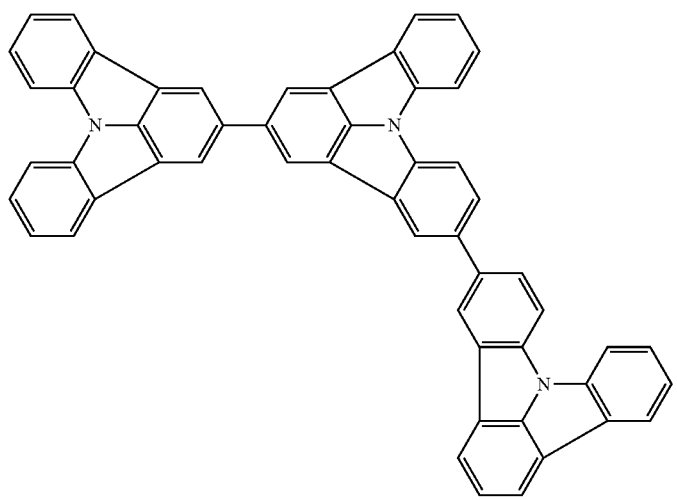
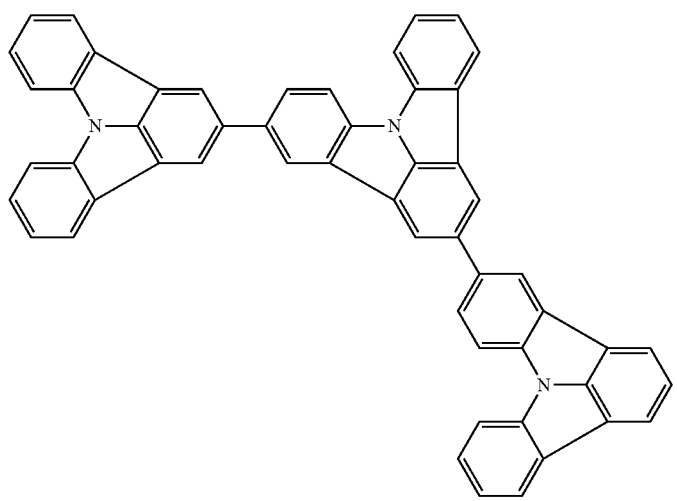

-continued
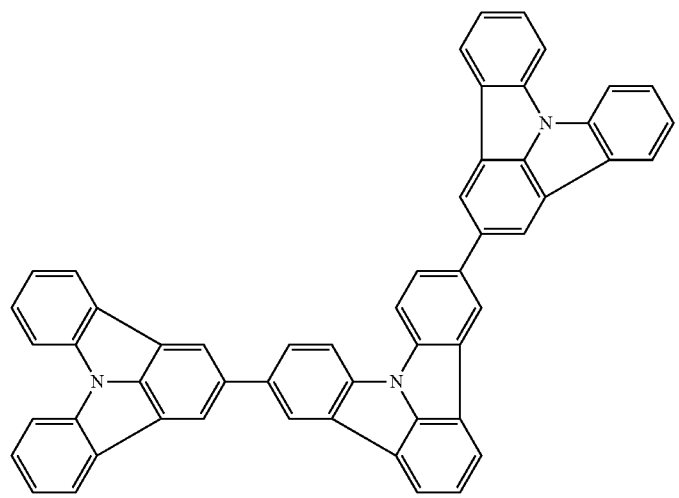
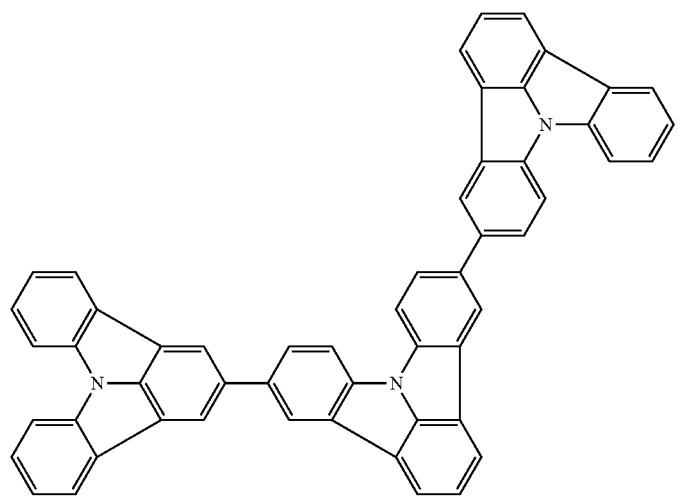
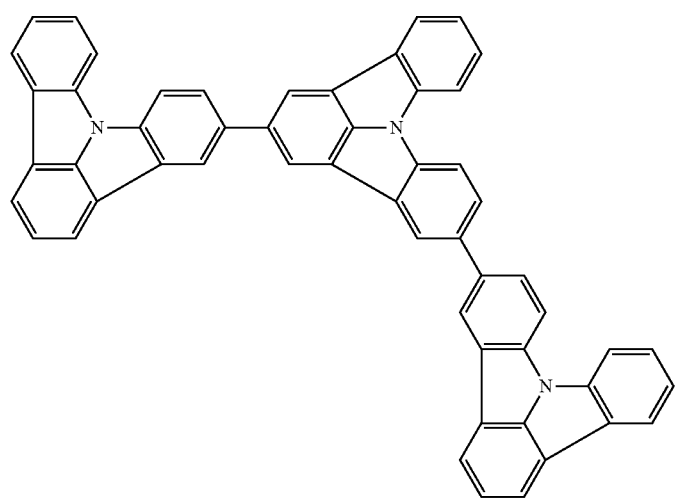

-continued
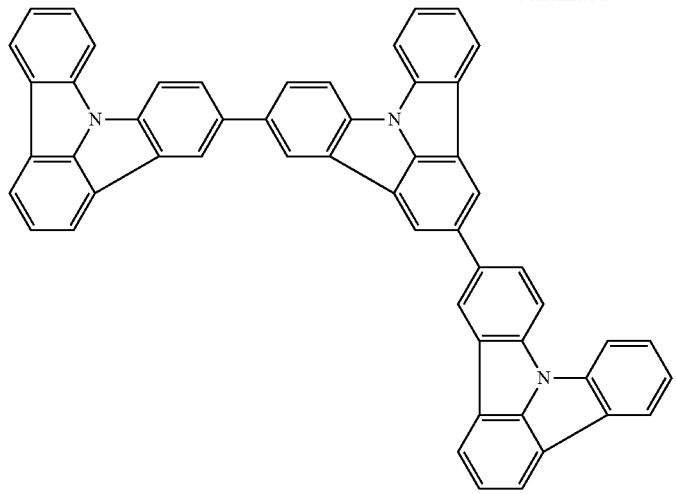
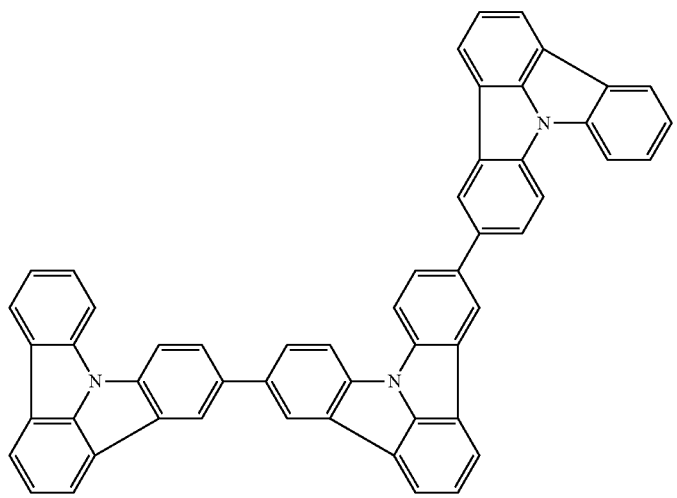
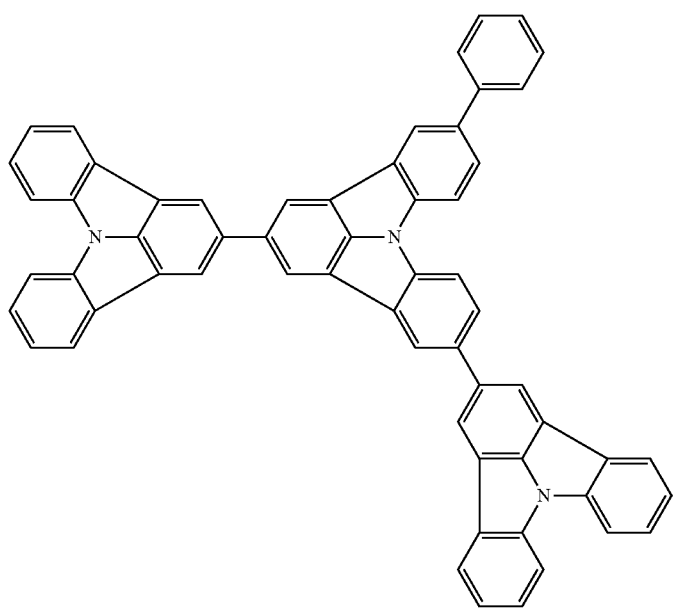

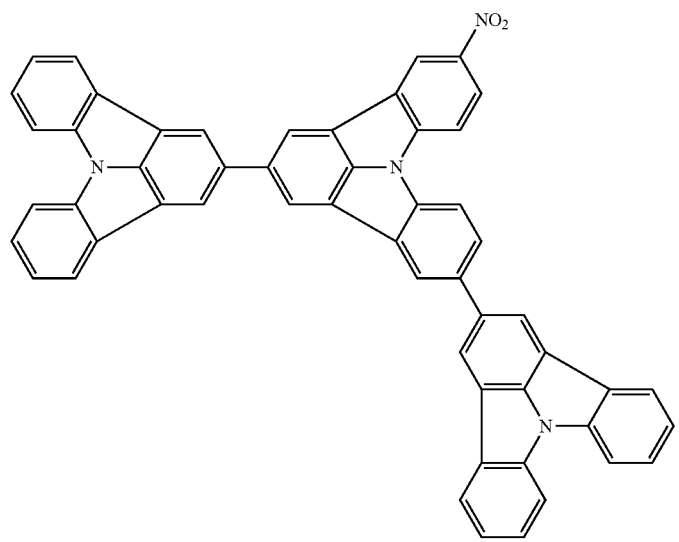
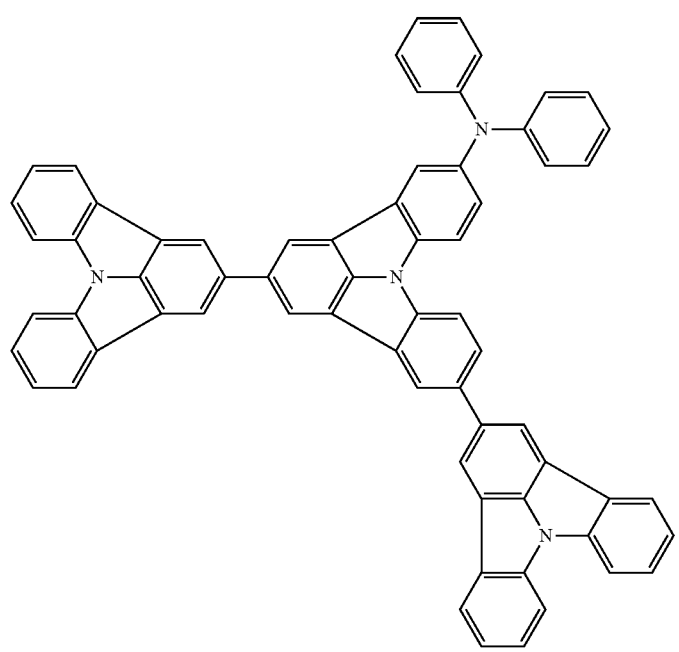

-continued
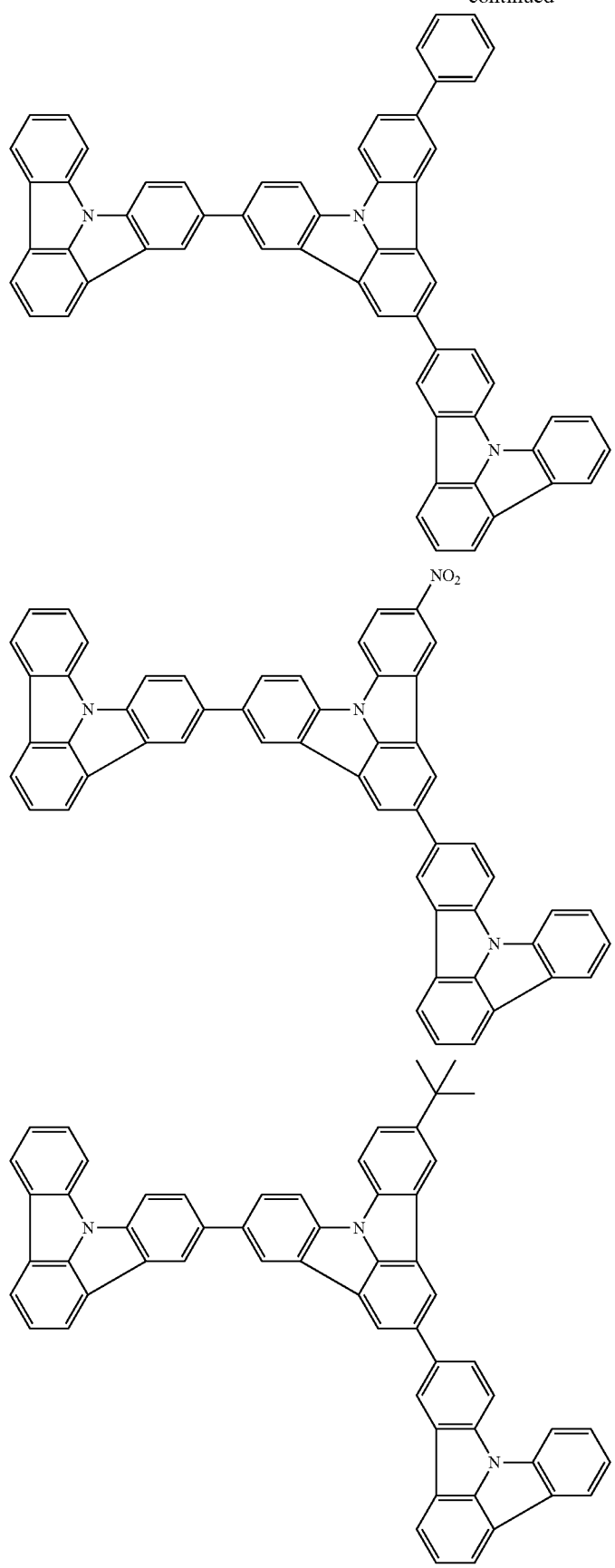

-continued

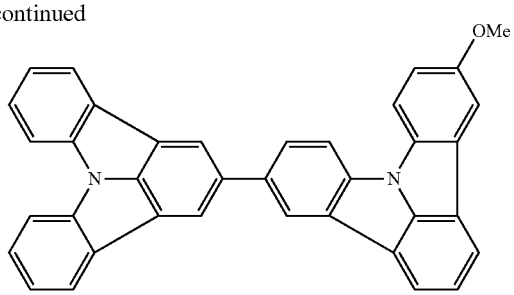

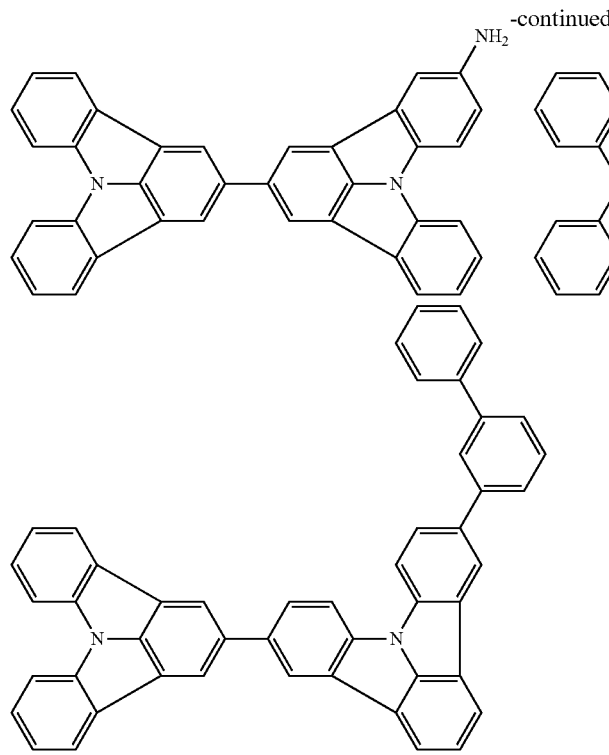

In the present invention, the compound represented by the general formula (1) is not limited in its use and can be contained in any one of the organic layers. With regard to the layer into which the compound represented by the general formula (1) is introduced, the compound is preferably contained in any one of the above-described light emitting layer, a layer between the light emitting layer and the cathode (in particular, a layer adjacent to the light emitting layer), and a layer between the light emitting layer and the anode, more preferably contained in any one of the light emitting layer, an electron transporting layer, an electron injecting layer, an exciton blocking layer, a hole blocking layer and an electron blocking layer, or in plural layers thereof, still more preferably contained in any one of the light emitting layer, an electron transporting layer, a hole transporting layer and an electron blocking layer, and especially preferably contained in the light emitting layer and/or a hole transporting layer. The compound represented by the general formula (1) may be used in plural layers of the forgoing layers. For example, the compound may be used in both of the light emitting layer and an electron transporting layer, or in both of the light emitting layer and a hole transporting layer.

(II) Phosphorescence Emitting Material

In the present invention, the light emitting layer preferably contains at least one phosphorescence emitting material. In the present invention, in addition to the phosphorescence emitting material, a fluorescence emitting material or a phosphorescence emitting material that is different from the phosphorescence emitting material contained in the light emitting layer can be used as the light emitting material.

The fluorescence emitting material or the phosphorescence emitting material is described in detail in, for example, paragraphs [0100] to [0164] of JP-A-2008-270736, paragraphs [0088] to [0090] of JP-A-2007-266458, and the matters described in these patent applications may be applied to the present invention.

Examples of the phosphorescence emitting material usable in the present invention include, phosphorescence emitting compounds described in, for example, U.S. Pat. No. 6,303, 238B1, U.S. Pat. No. 6,097,147, WO 00/57676, WO 00/70655, WO 01/08230, WO 01/39234A2, WO 01/41512A1, WO 02/02714A2, WO 02/15645A1, WO 02/44189A1, WO 05/19373A2, JP-A-2001-247859, JP-A-2002-302671, JP-A-2002-117978, JP-A-2003-133074, JP-A-2002-235076, JP-A-2003-123982, JP-A-2002-170684, EP 1211257, JP-A-2002-226495, JP-A-2002-234894, JP-A-2001-247859, JP-A-2001-298470, JP-A-2002-173674, JP-A-2002-203678, JP-A-2002-203679, JP-A-2004-357791, JP-A-2006-256999, JP-A-2007-19462, JP-A-2007-84635, JP-A-2007-96259, etc., and among others, more preferred examples of the light emitting material include phosphorescence emitting metal complex compounds such as iridium (Ir) complex, platinum (Pt) complex, Cu complex, Re complex, W complex, Rh complex, Ru complex, Pd complex, Os complex, Eu complex, Tb complex, Gd complex, Dy complex, Ce complex, etc. Especially preferred light emitting material is iridium (Ir) complex, platinum (Pt) complex, or Re complex, and among them, iridium (Ir) complex, platinum (Pt) complex or Re complex containing at least one coordination form from among metal-carbon bond, metal-nitrogen bond, metal-oxygen bond and metal-sulfur bond. Furthermore, in terms of luminous efficiency, driving durability, chromaticity, and the like, iridium (Ir) complex and platinum (Pt) complex are especially preferred, and iridium (Ir) complex is most preferred.

These phosphorescence emitting metal complex compounds are, in the light emitting layer, preferably contained together with the compound represented by the general formula (1).

As the phosphorescence emitting material contained in the light emitting layer, iridium (Ir) complex represented by the general formula (E-1) described below, or platinum (Pt) complex is preferably used. Iridium (Ir) complex represented by the general formula (E-1) is described below.

Iridium (Ir) complex represented by the general formula (E-1) is described.

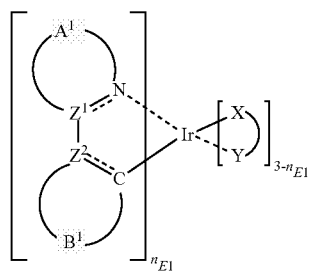

(E-1)

In the general formula (E-1), $Z^1$ and $Z^2$ each independently represent a carbon atom or a nitrogen atom. $A_1$ represents an atomic group that together with $Z^1$ and a nitrogen atom forms a 5- or 6-membered hetero ring. $B_1$ represents an atomic group that together with $Z^2$ and a carbon atom forms a 5- or 6-membered ring. $Z^1$ and $Z^2$ each independently represent a carbon atom or a nitrogen atom. (X—Y) represents a monoanionic bidentate ligand. $n_{E1}$ represents an integer of 1 to 3.

$Z^1$ and $Z^2$ each are preferably a carbon atom. $n_{E1}$ is preferably 2 or 3, and in this case, two or three ligands each containing $Z^1$, $Z^2$, $A_1$ and $B_1$ will exist, but the ligands may be the same as or different from one another.

Examples of the 5- of 6-membered hetero ring containing $A_1$, $Z^1$ and a nitrogen atom include a pyridine ring, a pyrimidine ring, a pyrazine ring, a triazine ring, a imidazole ring, a pyrazole ring, a oxazole ring, a thiazole ring, a triazole ring, a oxadiazole ring, a thiadiazole ring, etc. The 5- or 6-membered hetero ring formed of $A_1$, $Z^1$ and a nitrogen atom may have a substituent.

Examples of the 5- or 6-membered ring formed of $B_1$, $Z^2$ and a carbon atom include a benzene ring, a pyridine ring, a pyrimidine ring, a pyrazine ring, a pyridazine ring, a triazine ring, an imidazole ring, a pyrazole ring, an oxazole ring, a thiazole ring, a triazole ring, an oxadiazole ring, a thiadiazole ring, a thiophene ring, a furan ring, a pyrrole ring, etc. The 5- or 6-membered ring formed of $B_1$, $Z^2$ and a carbon atom may have a substituent.

As the substituent, the Substituent Group A is exemplified. The substituents may form a ring together with each other. Examples of the thus formed ring include an unsaturated 4- to 7-membered ring, a benzene ring, a pyridine ring, a pyrazine ring, a pyridazine ring, a pyrimidine ring, an imidazole ring, an oxazole ring, a thiazole ring, a pyrazole ring, a thiophene ring, a furan ring, etc. The thus formed ring may have a substituent, and may form a further ring via a substituent on the formed ring. In addition, a substituent on the 5- or 6-membered hetero ring formed of the $A_1$, $Z^1$ and a nitrogen atom and a substituent on the 5- or 6-membered ring formed of the $B_1$, $Z^2$ and a carbon atom may be connected together to form a fused ring similar to one described above. A further ring may be formed via a substituent on the formed ring.

Examples of the ligand represented by (X—Y) include various known ligands used in conventionally known metal complexes such as, for example, ligands described in "Photochemistry and Photophysics of Coordination Compounds" (written by H. Yersin, Springer-Verlag (1987)), nitrogen-containing heteroaryl ligands and diketone ligands, and preferred are the following general formula (1-1) to (1-39), more preferred are the general formula (1-1), (1-4), (1-15), (1-16), (1-7), (1-18), (1-19), (1-22), (1-25), (1-28), (1-29), (1-36) and (1-39). The present invention is however not limited thereto.

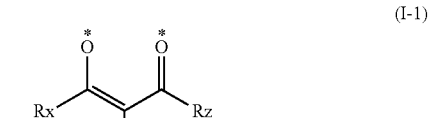

(I-1)

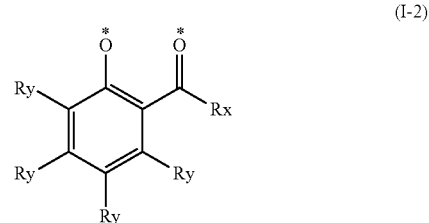

(I-2)

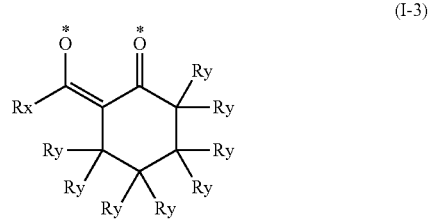

(I-3)

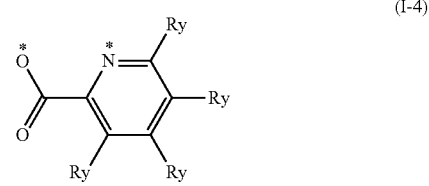

(I-4)

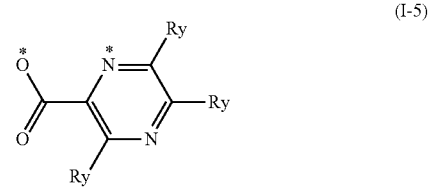

(I-5)

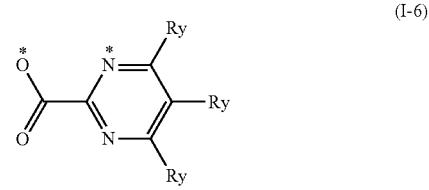

(I-6)

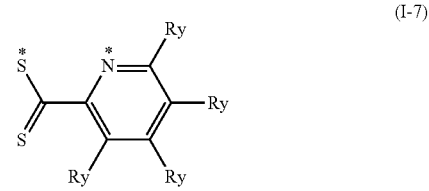

(I-7)

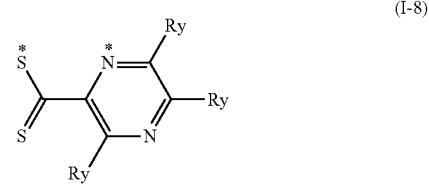

(I-8)

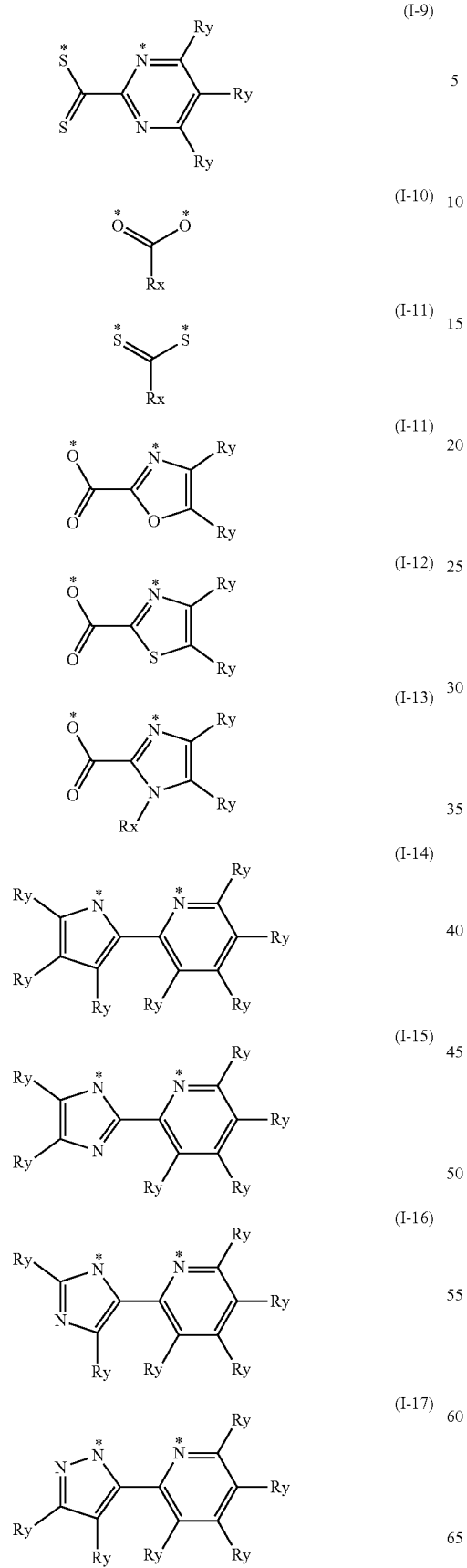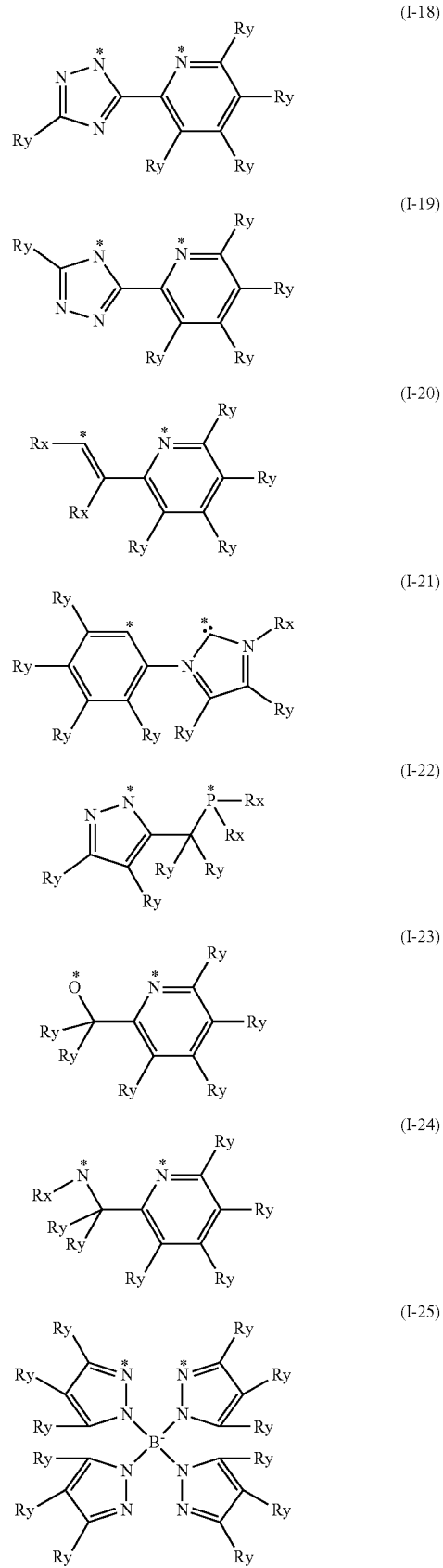

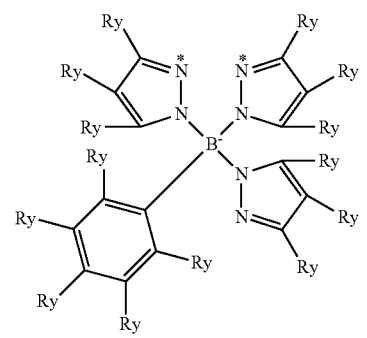 (I-26)
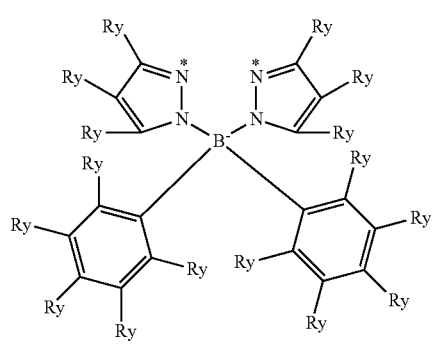 (I-27)
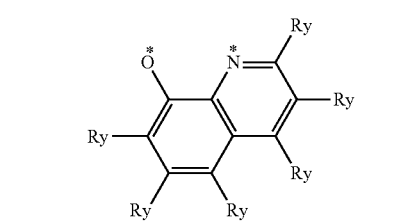 (I-28)
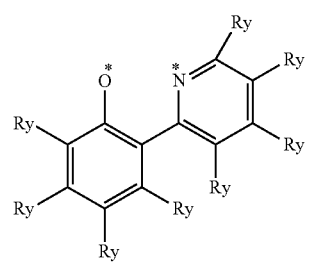 (I-29)
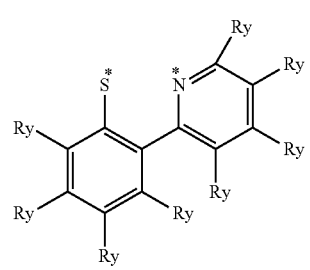 (I-30)
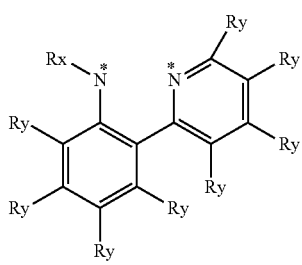 (I-31)
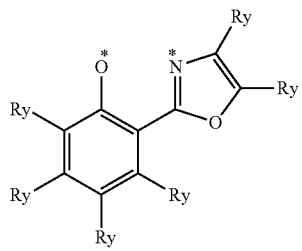 (I-32)
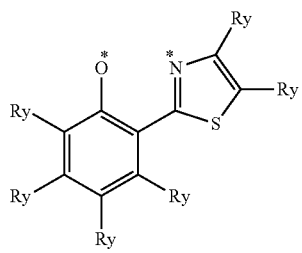 (I-33)
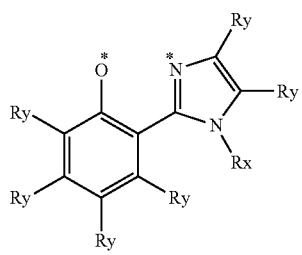 (I-34)
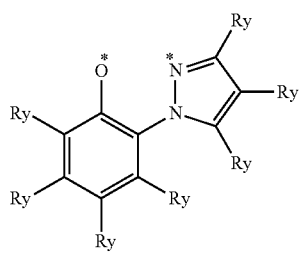 (I-35)
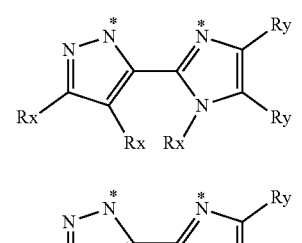 (I-36)
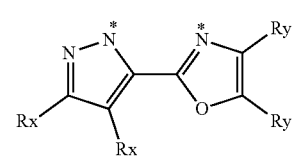 (I-37)

(I-38)

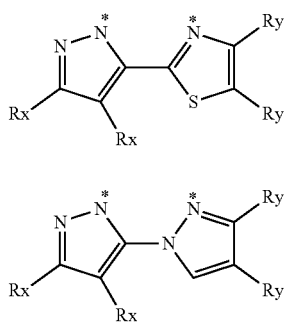

(I-39)

(E-3)

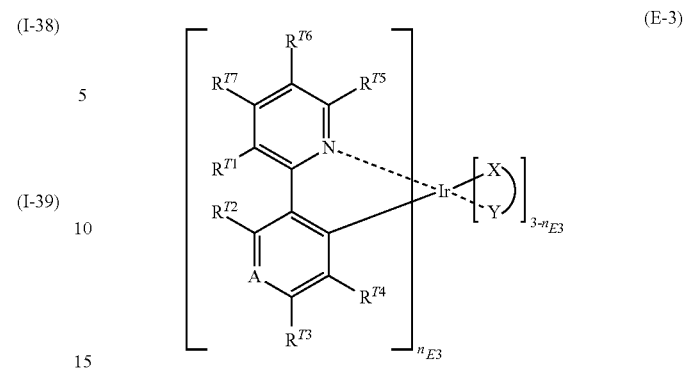

* represents a coordination site to the iridium (Ir) in the general formula (E-1). Rx, Ry and Rz each independently represent a hydrogen atom or a substituent. Examples of the substituent include substituents selected from the Substituent Group A. Rx and Rz preferably each independently represent an alkyl group, a perfluoroalkyl group or an aryl group. Ry is preferably any one of a hydrogen atom, an alkyl group, a perfluoroalkyl group, a fluorine atom, a cyano group and an aryl group. The plural Rxs and Rys present in one ligand may be the same as or different from one another.

The complex having such a ligand can be synthesized in a similar manner to a known example of the synthesis, by using a corresponding ligand precursor.

A preferred embodiment of the iridium (Ir) complex represented by the general formula (E-1) is the iridium (Ir) complex represented by the following general formula (E-2).

General Formula (E-2)

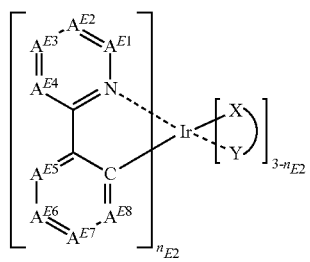

(E-2)

In the general formula (E-2), $A^{E1}$ to $A^{E8}$ each independently represent a nitrogen atom or C—$R^E$. $R^E$ represents a hydrogen atom or a substituent. As the substituent, one exemplified above as the Substituent Group A may be applied. $R^E$s may be connected to each other to form a ring. Examples of the formed ring include those similar to the fused rings described above in the general formula (E-1). (X—Y) and $n_{E2}$ have the same definitions as (X—Y) and $n_{E1}$ in the general formula (E-1), and a preferred ranges thereof are the same as described above. When $n_{E2}$ is 2 or 3, two or three ligands each containing $A^{E1}$ to $A^{E8}$ will exist, but the ligands may be the same as or different from one another.

A preferred embodiment of the compound represented by the general formula (E-2) is a compound represented by the following general formula (E-3).

In the general formula (E-3), $R^{T1}$, $R^{T2}$, $R^{T3}$, $R^{T4}$, $R^{T5}$, $R^{T6}$ and $R^{T7}$ have the same definition as the above $R^E$. A represents CR'''' or a nitrogen atom and R'''' has the same definition as the above $R^E$. Any adjacent two of $R^{T1}$ to $R^{T7}$ and R'''' may be bound to each other to form a fused 4- to 7-membered ring. The fused 4- to 7-membered ring is cycloalkene, cycloalkadiene, aryl or heteroaryl, and the fused 4- to 7-membered ring may further have a substituent represented by the Substituent Group A. (X—Y) and $n_{E3}$ have the same definitions as (X—Y) and $n_{E1}$ in the general formula (E-1), and the preferred ranges thereof are also the same as described above. When $n_{E3}$ is 2 or 3, two or three ligands each containing $R^{T1}$, $R^{T2}$, $R^{T3}$, $R^{T4}$, $R^{T5}$, $R^{T6}$, $R^{T7}$ and A will exist, but the ligands are the same as or different from one another.

A preferred range of A and $R^{T1}$ to $R^{T7}$ varies depending on the luminescent color required according to the use. The preferred range is described for three different regions of the intended luminescent color: blue to light blue, green to yellow, and yellowish orange to red, but not limited to these descriptions.

In order to obtain a yellowish orange to red luminescent color, the compound represented by the general formula (E-1) is preferably a compound represented by the following general formula (E-4), the following general formula (E-5) or the following general formula (E-6) below.

General Formula (E-4)

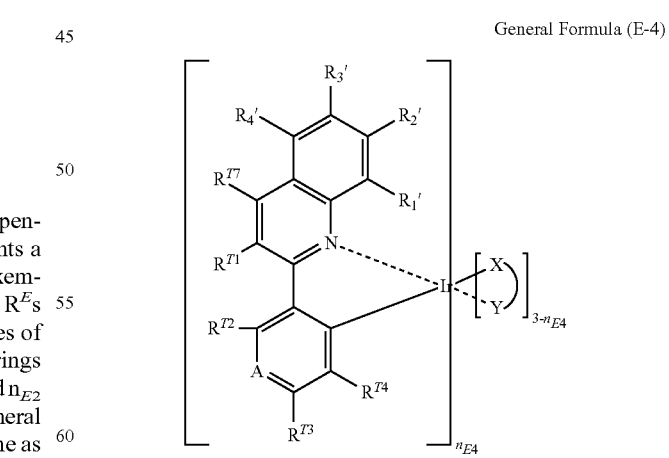

$R^{T1}$ to $R^{T4}$, $R^{T7}$, A (CR'''' or a nitrogen atom), (X—Y) and $n_{E4}$ in the general formula (E-4) have the same definitions as $R^{T1}$ to $R^{T4}$, $R^{T7}$, A, (X—Y) and $n_{E3}$ in the general formula (E-3). $R_1'$ to $R_4'$ have the same definitions as the above-described $R^E$.

Any adjacent two of $R^{T1}$ to $R^{T4}$, $R^{T7}$, $R_1'$ to $R_4'$ and R'''' may be bound to each other to form a fused 4- to 7-membered ring, the fused 4- to 7-membered ring is cycloalkene, cycloalkadiene, aryl or heteroaryl, and the fused 4- to 7-membered ring may further have a substituent represented by the Substituent Group A.

When $n_{E4}$ is 2 or 3, two or three ligands each containing $R^{T1}$ to $R^{T4}$, $R^{T7}$, A and $R_1'$ to $R_4'$ will exist, but the ligands are the same as or different from one another.

$R_1'$ to $R_4'$ are each preferably a hydrogen atom, a fluorine atom, an alkyl group or an aryl group. It is preferred that while A represents CR'''', zero to three of $R^{T1}$ to $R^{T4}$, $R^{T7}$ and R'''' each represent an alkyl group or a phenyl group, and all the remaining groups thereof each are a hydrogen atom.

Specific examples of the compound represented by the general formula (E-4) are listed below, but the compound is not limited thereto.

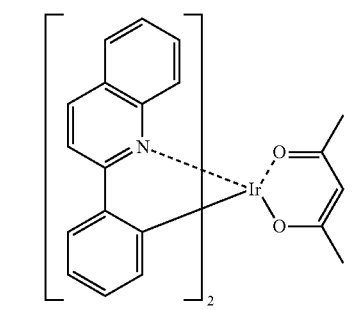

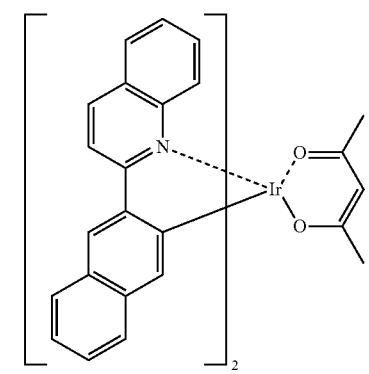

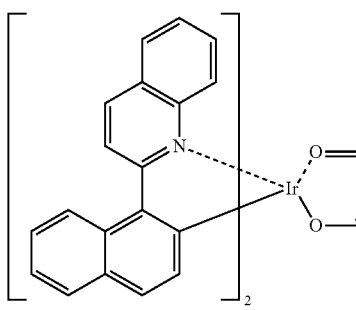

-continued

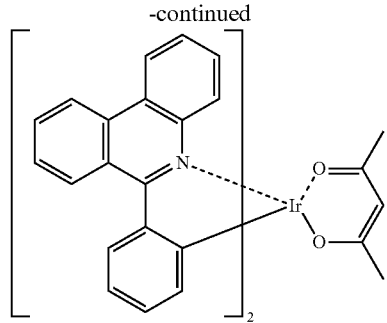

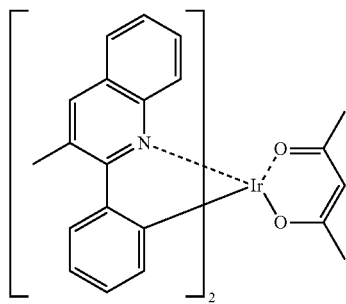

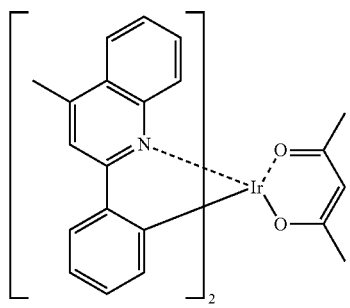

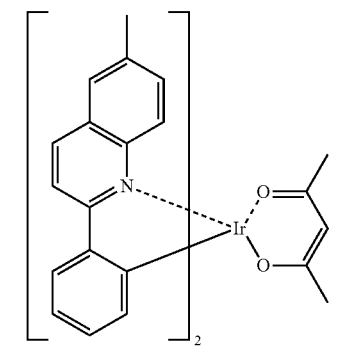

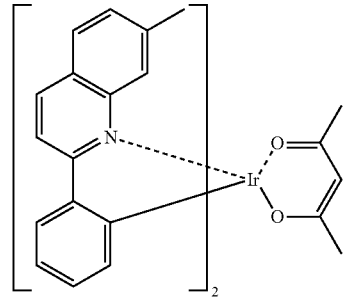

101
-continued
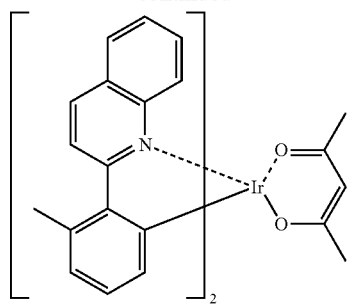
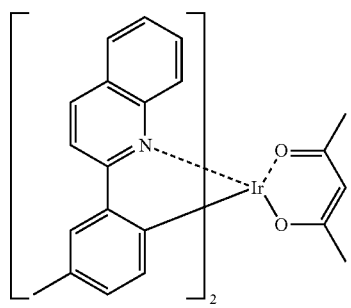
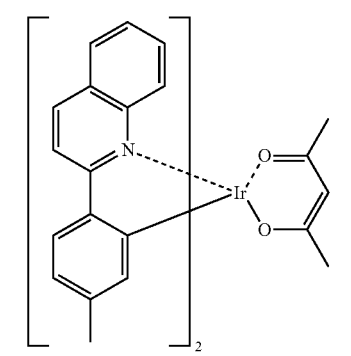
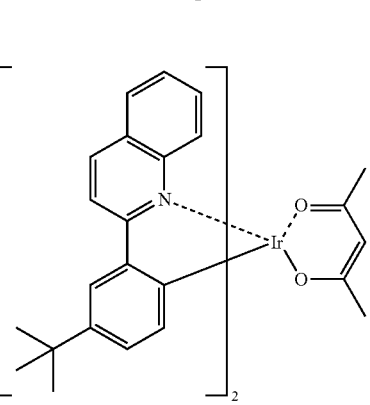
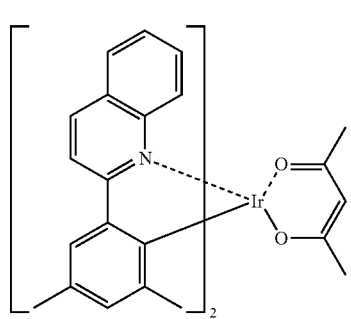
102
-continued
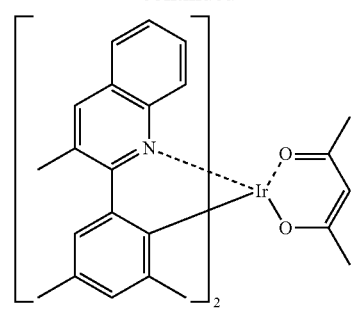
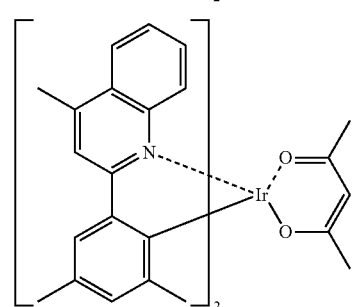
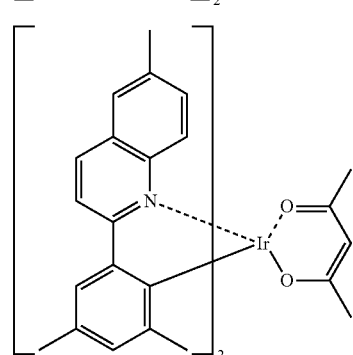
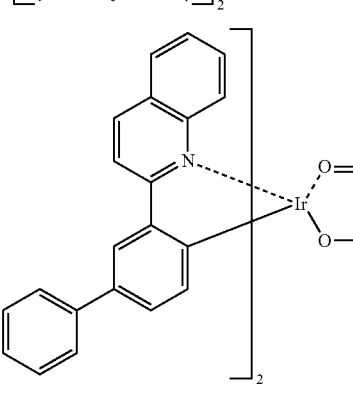
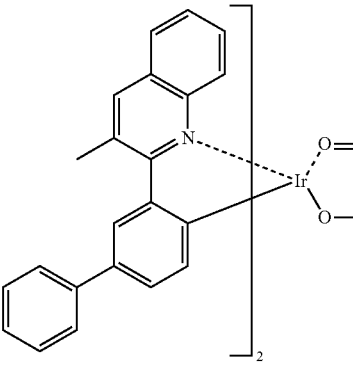

-continued
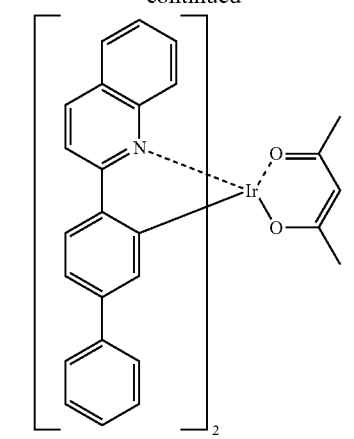
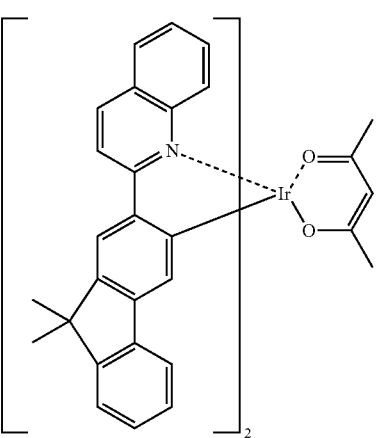
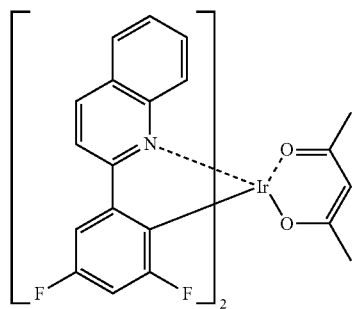
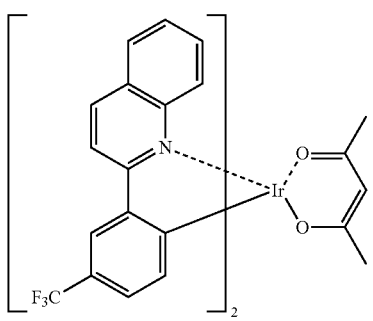
-continued
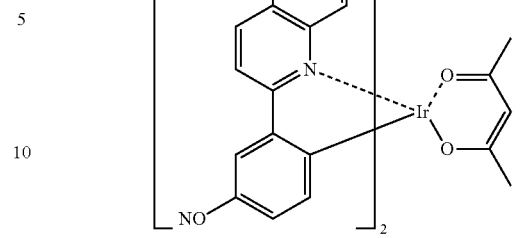
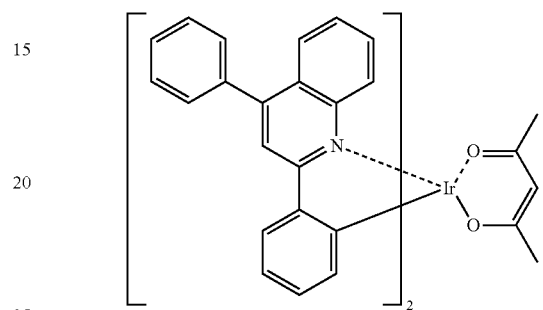
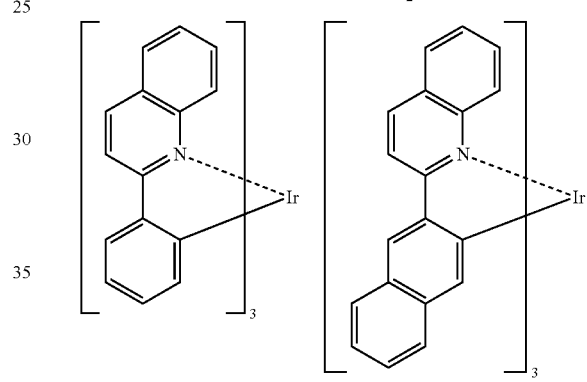
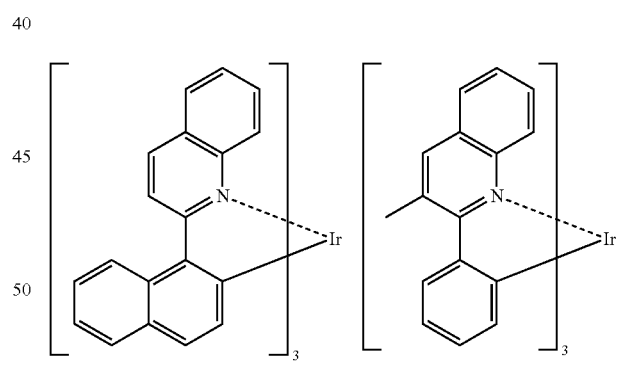
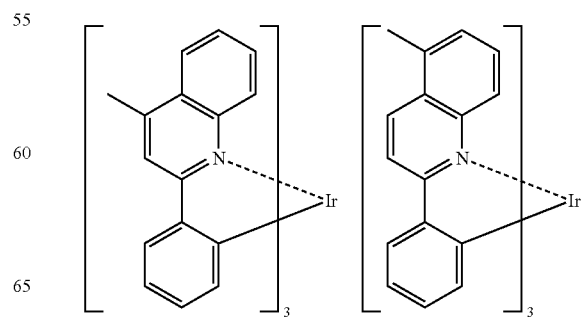

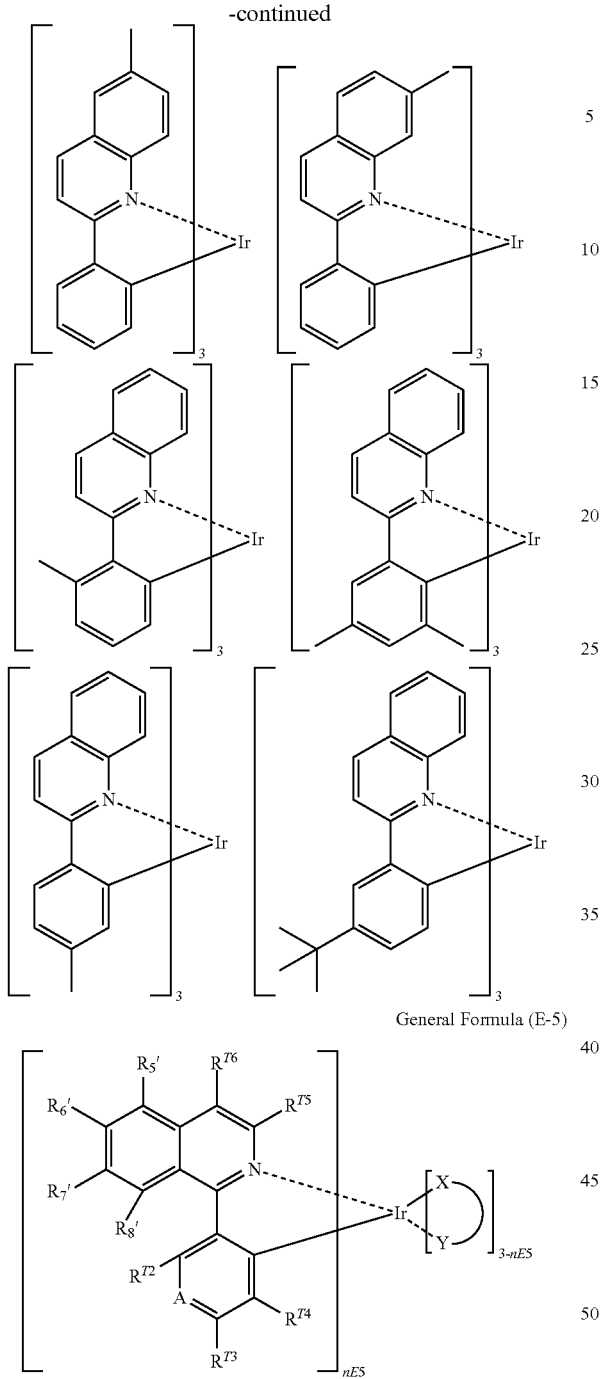

General Formula (E-5)

$R^{T2}$ to $R^{T6}$, A (CR'''' or a nitrogen atom), (X—Y) and $n_{E5}$ in the general formula (E-5) have the same definitions as $R^{T2}$ to $R^{T6}$, A, (X—Y) and $n_{E3}$ in the general formula (E-3). $R_5'$ to $R_8'$ are the same definitions as $R_1'$ to $R_4'$ in the general formula (E-4).

Any adjacent two of $R^{T2}$ to $R^{T6}$, $R_5'$ to $R_8'$, R'''' may be bound to each other to form a fused 4- to 7-membered ring, the fused 4- to 7-membered ring is cycloalkene, cycloalkadiene, aryl or heteroaryl, and the fused 4- to 7-membered ring may further have a substituent represented by the Substituent Group A.

When $n_{E5}$ is 2 or 3, two or three ligands each containing $R^{T2}$ to $R^{T6}$, A and $R_5'$ to $R_8'$ will exist, but the ligands may be the same as or different from one another.

In addition, preferred ranges of $R_5'$ to $R_8'$ are the same as the preferred ranges of $R_1'$ to $R_4'$ in the general formula (E-4). It is preferred that while A represents CR'''', zero to three of $R^{T2}$ to $R^{T6}$, R'''', and $R_5'$ to $R_8'$ are each an alkyl group or a phenyl group, and all the remaining groups are each a hydrogen atom.

Specific preferred examples of the compound represented by the general formula (E-5) are listed below, but the compound is not limited thereto.

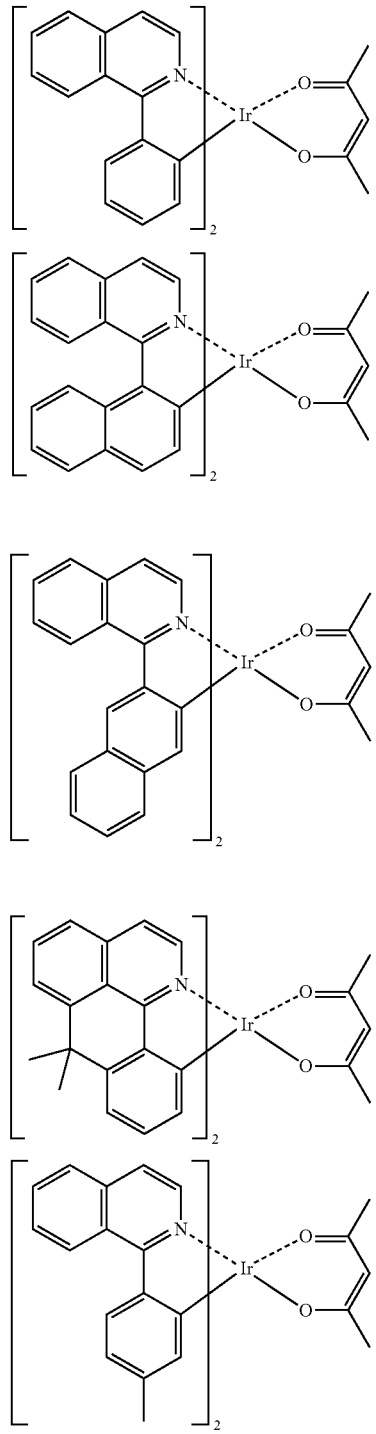

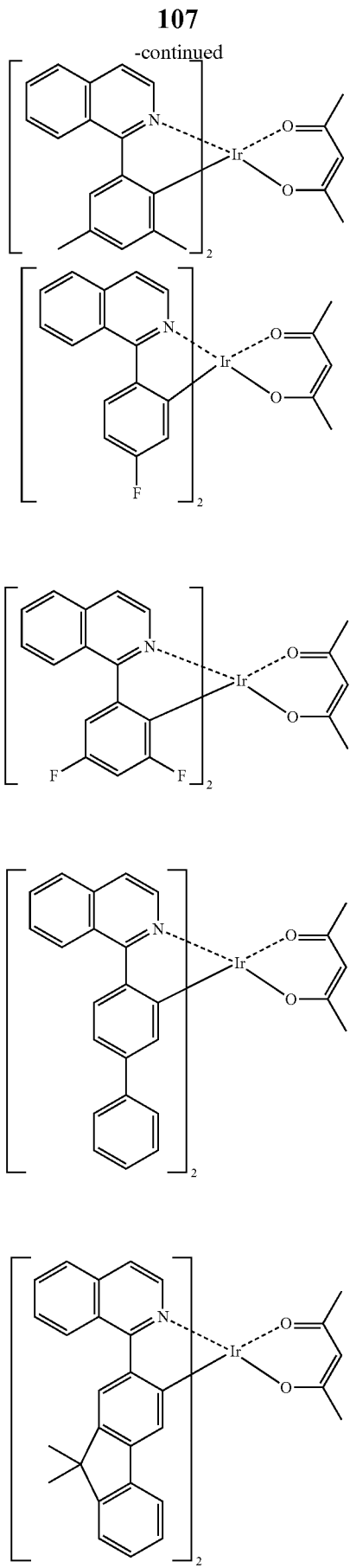
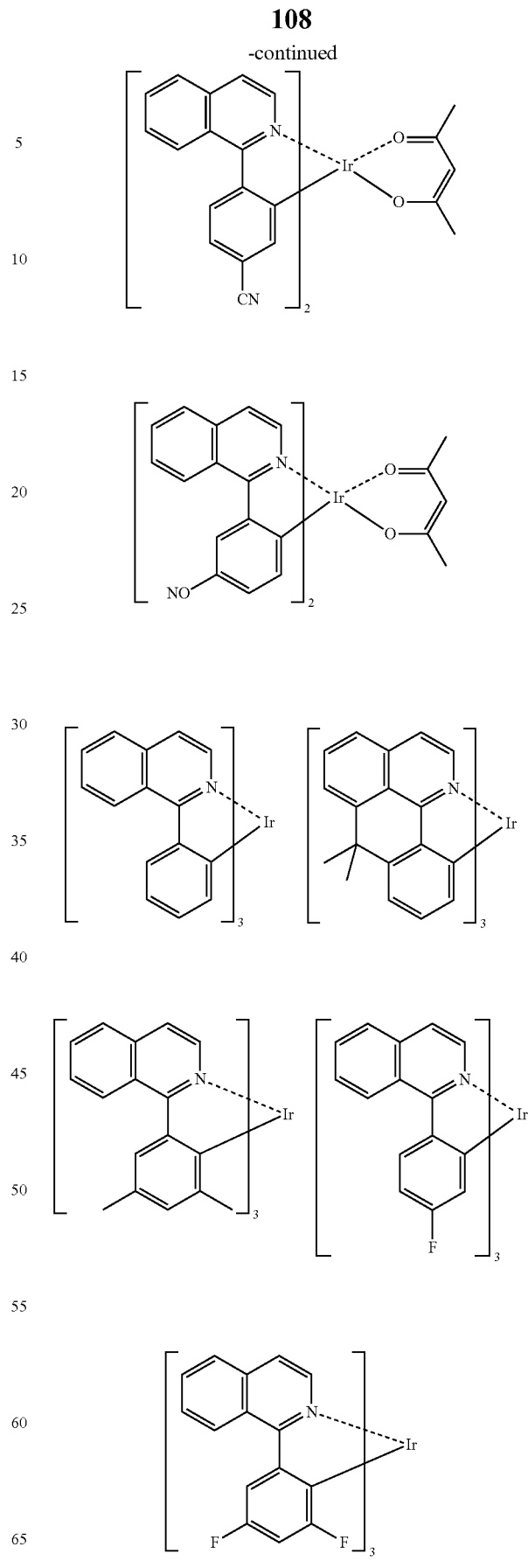

General Formula (E-6)

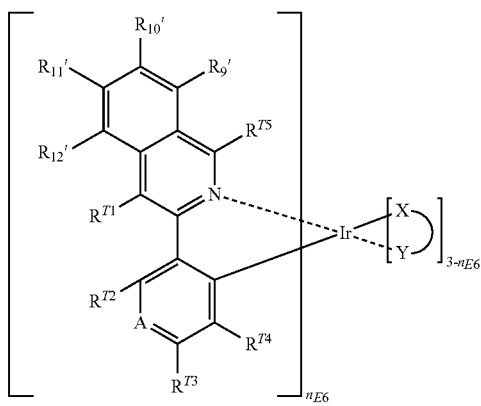

$R^{T1}$ to $R^{T5}$, A (CR'''' or a nitrogen atom), (X—Y) and $n_{E6}$ in the general formula (E-6) have the same definitions as $R^{T1}$ to $R^{T5}$, A, (X—Y) and $n_{E3}$ in the general formula (E-3). $R_9'$ to $R_{12}'$ have the same definitions as $R_1'$ to $R_4'$ in the general formula (E-4).

Any adjacent two of $R^{T1}$ to $R^{T5}$, $R_9'$ to $R_{12}'$ and R'''' may be bound to each other to form a fused 4- to 7-membered ring, the fused 4- to 7-membered ring is cycloalkene, cycloalkadiene, aryl or heteroaryl, and the fused 4- to 7-membered ring may further have a substituent represented by the Substituent Group A.

When $n_{E6}$ is 2 or 3, two or three ligands each containing $R^{T1}$ to $R^{T5}$, A and $R_9'$ to $R_{12}'$ will exist, but the ligands may be the same as or different from one another.

Preferred ranges of $R_9'$ to $R_{12}'$ are the same as the preferred ranges of $R_1'$ to $R_4'$ in the general formula (E-4). It is preferred that while A represents CR'''', zero to three of $R^{T1}$ to $R^{T5}$, R'''', and $R_9'$ to $R_{12}'$ each represent an alkyl group or a phenyl, and all the remaining groups thereof are each a hydrogen atom.

Specific preferred examples of the compound represented by the general formula (E-6) are listed below, but the compound is not limited thereto.

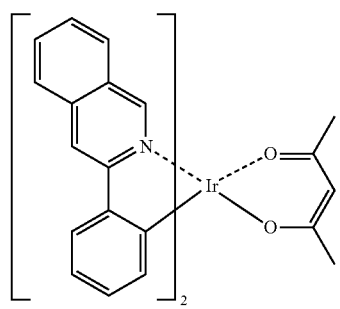

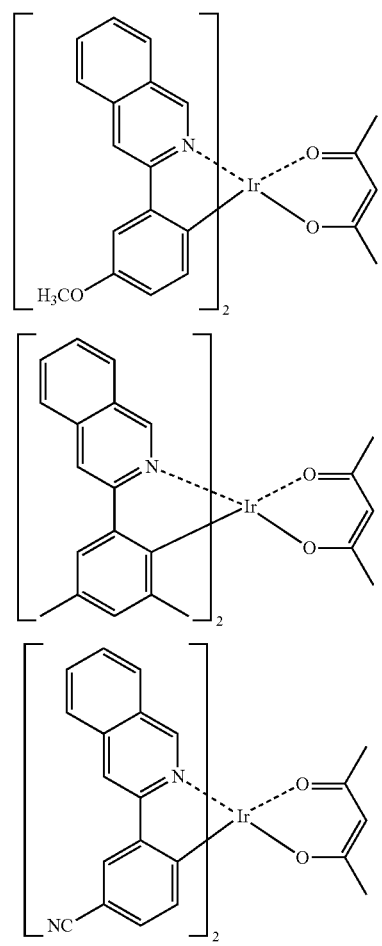

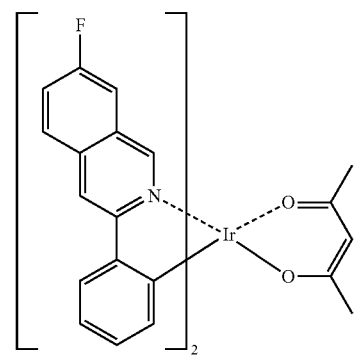

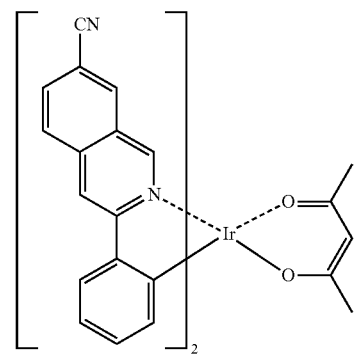

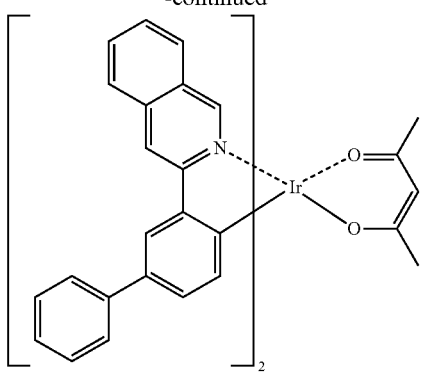
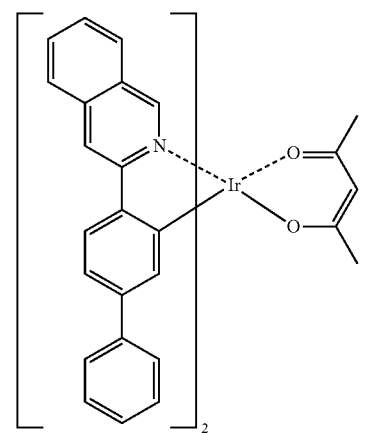
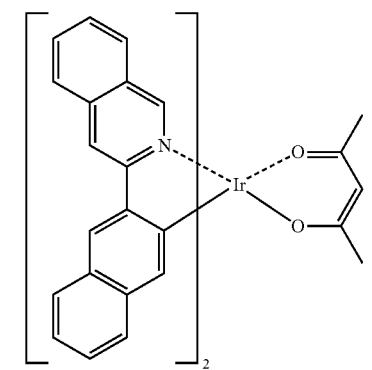
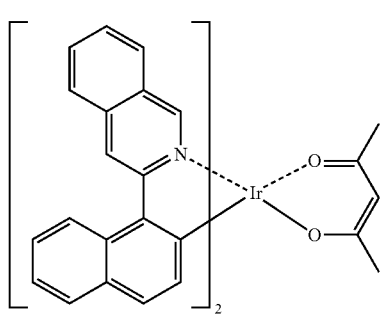
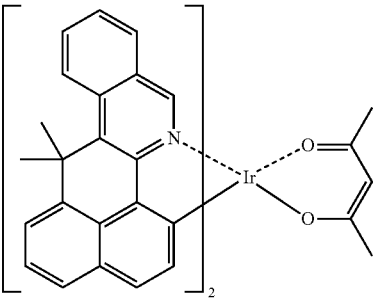
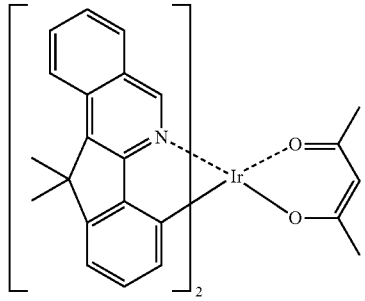
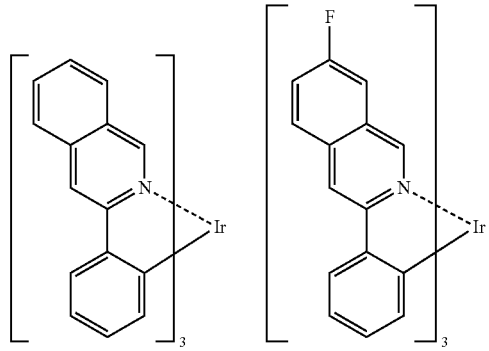
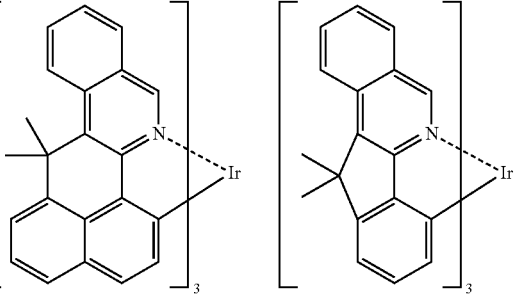
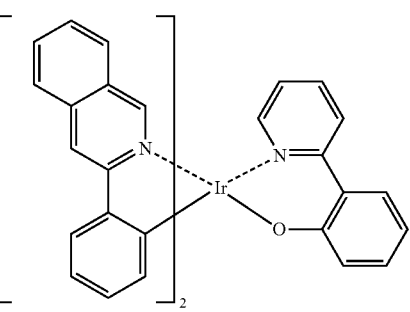
In order to obtain a green to yellow luminescent color, the compound represented by the general formula (E-1) described above is preferably a compound represented by the following general formula (E-7).

General Formula (E-7)

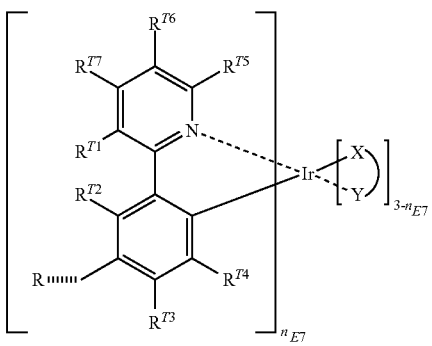

In the general formula (E-7), $R^{T1}$, $R^{T2}$, $R^{T3}$, $R^{T4}$, $R^{T5}$, $R^{T6}$, $R^{T7}$, R'''' (X—Y) and $n_{E3}$ have the same definitions as $R^{T1}$, $R^{T2}$, $R^{T3}$, $R^{T4}$, $R^{T5}$, $R^{T6}$, $R^{T7}$, R'''', (X—Y) and $n_{E3}$ in the general formula (E-3). Any adjacent two of $R^{T1}$ to $R^{T7}$, and R'''' may be bound to each other to form a fused 4- to 7-membered ring, the fused 4- to 7-membered ring is cycloalkene, cycloalkadiene, aryl or heteroaryl, the fused 4- to 7-membered ring may further have a substituent represented by the Substituent Group A.

When $n_{E7}$ is 2 or 3, two or three ligands containing $R^{T1}$, $R^{T2}$, $R^{T3}$, $R^{T4}$, $R^{T5}$, $R^{T6}$, $R^{T7}$ and R'''' will exist, the ligands are the same as or different from one another.

$R^{T1}$, $R^{T2}$, $R^{T3}$, $R^{T4}$, $R^{T5}$, $R^{T6}$, $R^{T7}$ and R'''' each are preferably a hydrogen atom, a fluorine atom, an alkyl group, an aryl group, a heteroaryl group or a cyano group.

$n_{E7}$ is preferably 3, and in addition, the general formula (E-7) is preferably a compound represented by the general formula (E-7-1).

General Formula (E-7-1)

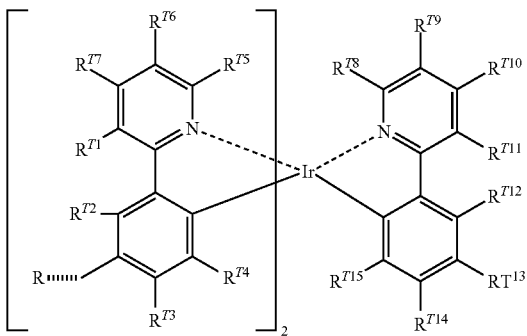

In the general formula (E-7-1), $R^{T1}$, $R^{T2}$, $R^{T3}$, $R^{T4}$, $R^{T5}$, $R^{T6}$, $R^{T7}$ and R'''' have the same definitions as $R^{T1}$, $R^{T2}$, $R^{T3}$, $R^{T4}$, $R^{T5}$, $R^{T6}$, $R^{T7}$ and R'''' in the general formula (E-7), and the preferred ranges thereof are also the same. $R^{T8}$ to $R^{T15}$ have the same definitions as $R^{T1}$, $R^{T2}$, $R^{T3}$, $R^{T4}$, $R^{T5}$, $R^{T6}$, $R^{T7}$, R'''', and the preferred ranges thereof are also the same. However, the phenylpyridine ligand containing $R^{T1}$, $R^{T2}$, $R^{T3}$, $R^{T4}$, $R^{T5}$, $R^{T6}$, $R^{T7}$ and R'''' and the phenylpyridine ligand containing $R^{T8}$ to $R^{T15}$ are different from each other.

In order to obtain a luminescent color closer to green among the green to yellow luminescent colors, it is preferred that $R^{T1}$, $R^{T2}$, $R^{T3}$, $R^{T4}$, $R^{T5}$, $R^{T6}$, $R^{T7}$ and R'''' each are a hydrogen atom, a fluorine atom, an alkyl group or a cyano group, and it is more preferred that one to three of the $R^{T1}$, $R^{T3}$, $R^{T4}$ and R'''' each are an alkyl group. $R^{T8}$ to $R^{T11}$ each are preferably a hydrogen atom or an alkyl group. $R^{T12}$ to $R^{T15}$ each are preferably a hydrogen atom, an alkyl group, a cyano group or an aryl group. The substituted position by the alkyl group, the cyano group or the aryl group is preferably on $R^{T13}$ or $R^{T14}$. The aryl group may further have a substituent, or may form a fused ring via a substituent.

In order to obtain a luminescent color closer to yellow among the green to yellow luminescent colors, it is preferred that $R^{T1}$, $R^{T2}$, $R^{T3}$, $R^{T4}$, $R^{T5}$, $R^{T6}$, $R^{T7}$ and R'''' each are a hydrogen atom and an alkyl group, and it is more preferred that one to three of the $R^{T1}$, $R^{T5}$, $R^{T4}$, R'''' each are an alkyl group. It is more preferred that at least one of $R^{T8}$ to $R^{T11}$ is an aryl group, it is still more preferred that any one of $R^{T9}$ and $R^{T10}$ is an aryl group and the remaining one is a hydrogen atom or an alkyl group. The aryl group may further have a substituent or may form a fused ring via a substituent.

The general formula (E-7-1) may also preferably include a partial structure represented by the general formula (E-7-2) in the general formula (E-7-1). When having the general formula (E-7-2), the effects such as decrease of voltage and enhancement of durability are sometimes exhibited significantly.

lp;2p

General Formula (E-7-2)

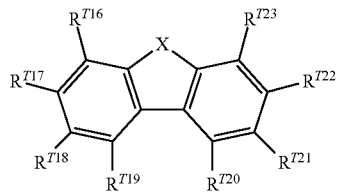

In the general formula (E-7-2), X is —O—, —S—, —NR$^{T24}$—, —CR$^{T25}$R$^{T26}$— or —SiR$^{T27}$R$^{T28}$—, and any one of $R^{T16}$ to $R^{T28}$ is bound to a part of the general formula (E-7-1) via a single bond or via a substituent.

In the general formula (E-7-2), any one of $R^{T16}$ to $R^{T28}$ is preferably bound to a part of the general formula (E-7-1) via a single bond or via an aryl group. In the case where a luminescent color closer to green is desired, the bond to a part of the general formula (E-7-1) is made preferably on $R^{T13}$ or $R^{T14}$ and more preferably on $R^{T13}$. In the case where a luminescent color closer to yellow is desired, the bond is made on $R^{T9}$ or $R^{T10}$.

X is preferably —O—, —S—, —NR$^{T24}$— or —CR$^{T25}$R$^{T26}$—, and more preferably —O— or —S—.

When X is —O— or —S—, X is preferably bound to a part of the general formula (E-7-1) via a single bond at the position of $R^{T16}$, and when X is —NR$^{T24}$—, X is preferably bound to a part of the general formula (E-7-1) via a single bond at the position of $R^{T18}$ or $R^{T24}$, and when X is —CR$^{T25}$R$^{T26}$—, X is preferably bound to a part of the general formula (E-7-1) via a single bond at the position of $R^{T17}$.

Specific preferred examples of the compound represented by the general formula (E-7) are listed below, but the compound is not limited thereto.

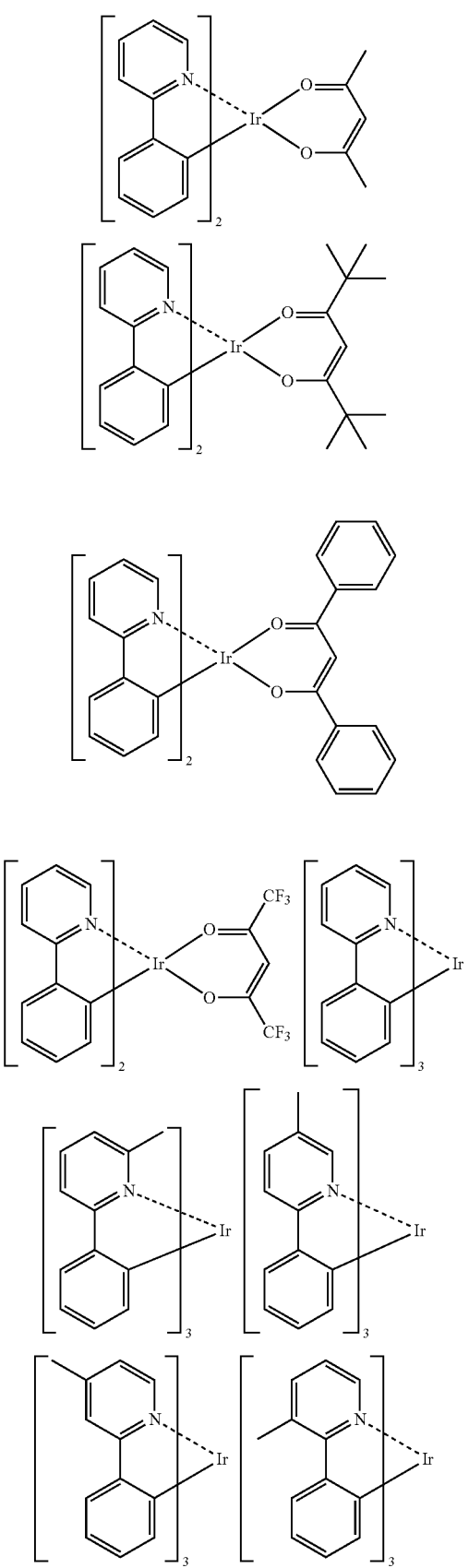
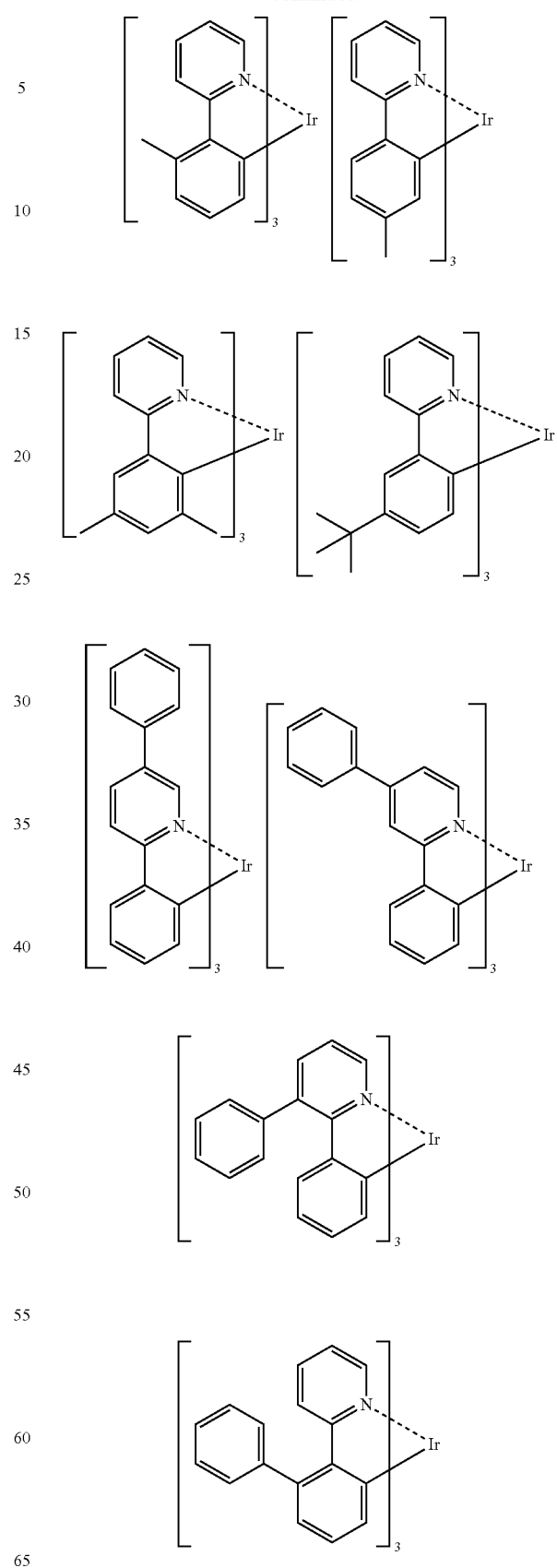

117
-continued
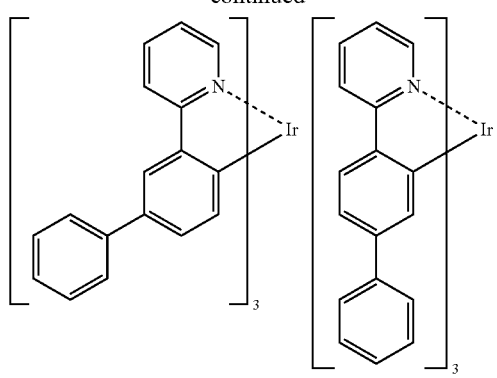
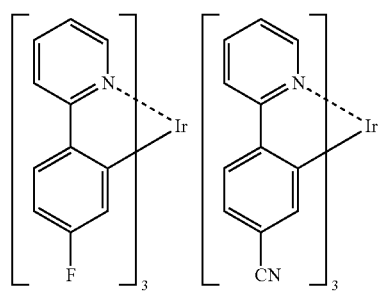
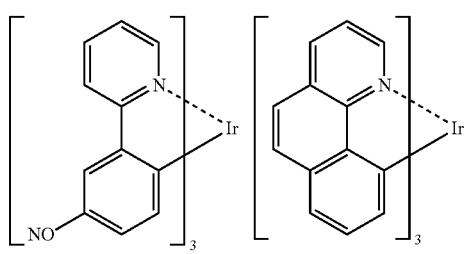
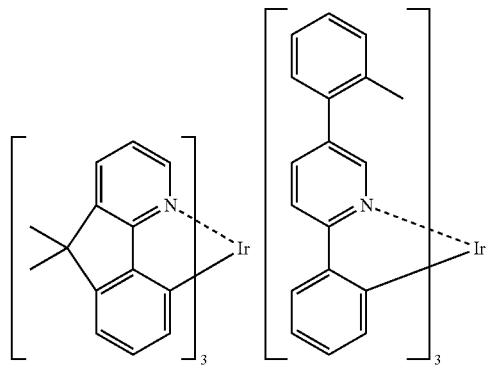
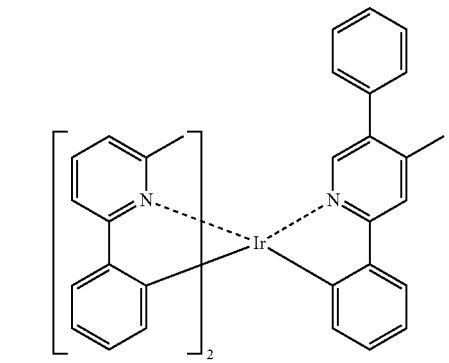
118
-continued
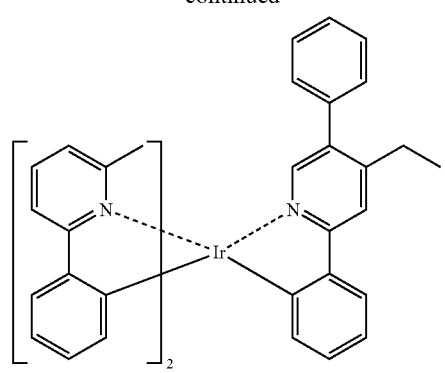
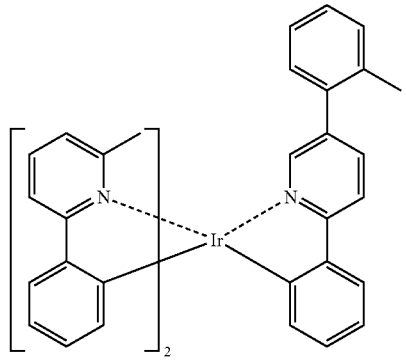
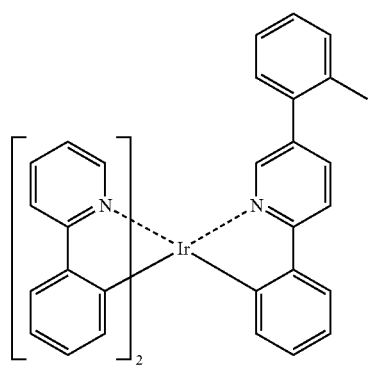
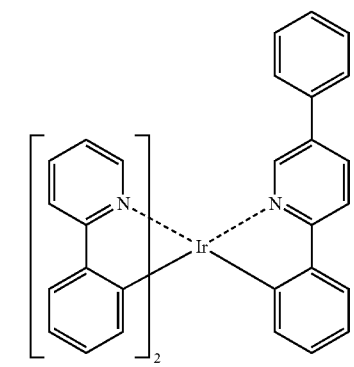

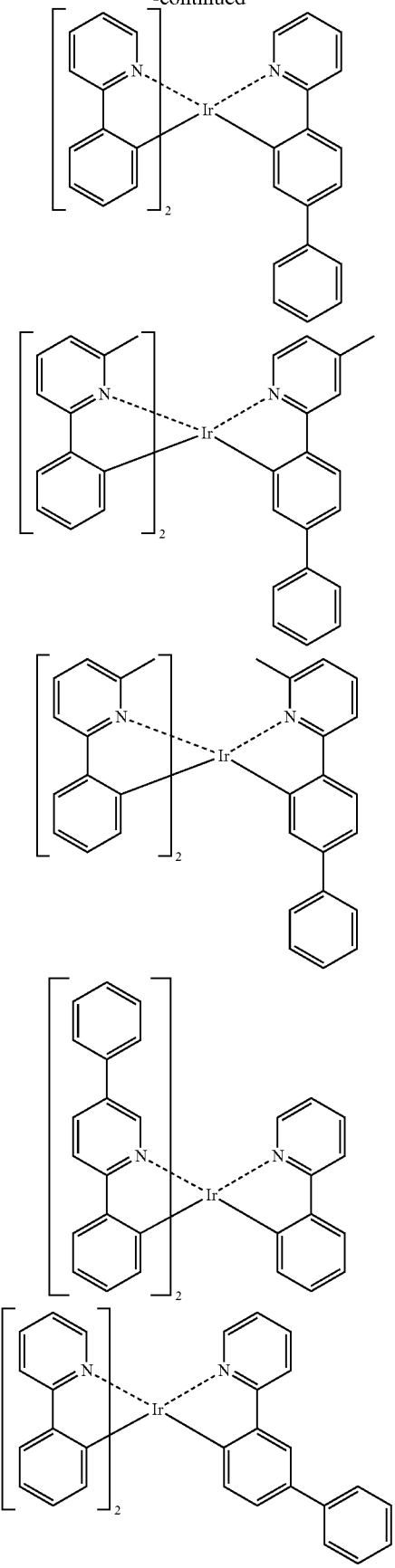

121
-continued
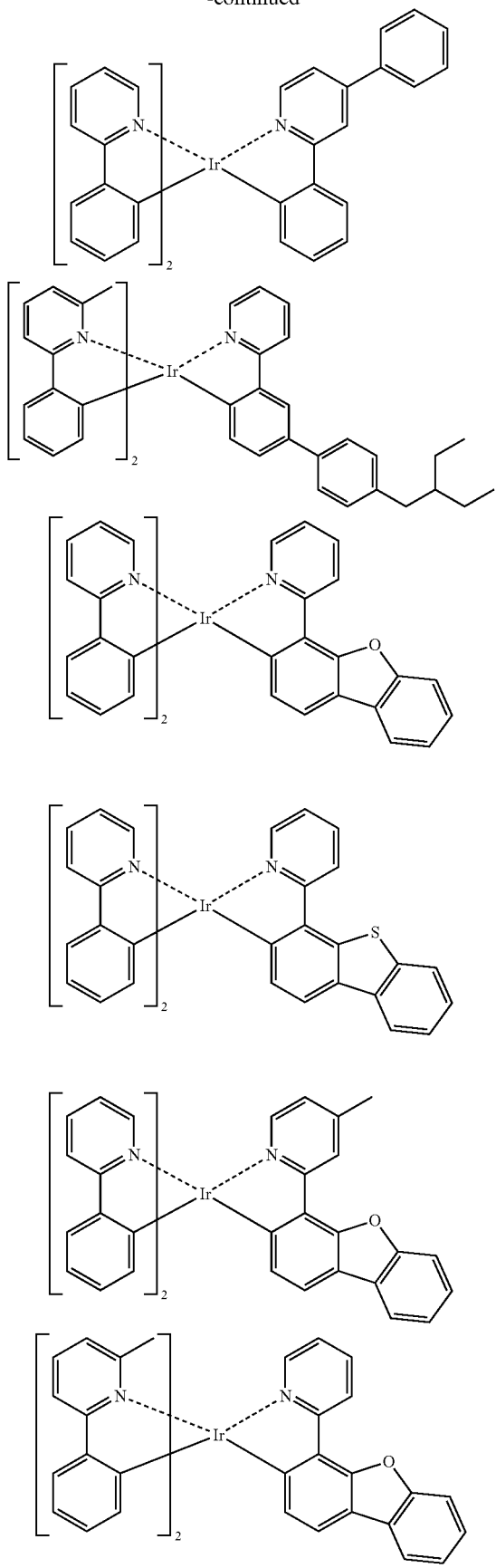
122
-continued
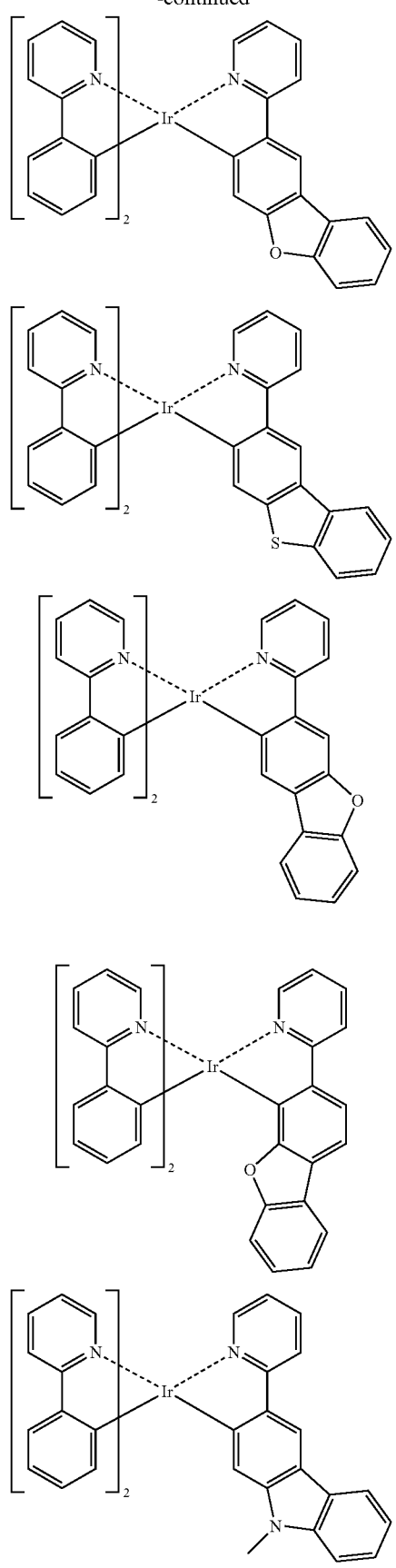

123
-continued
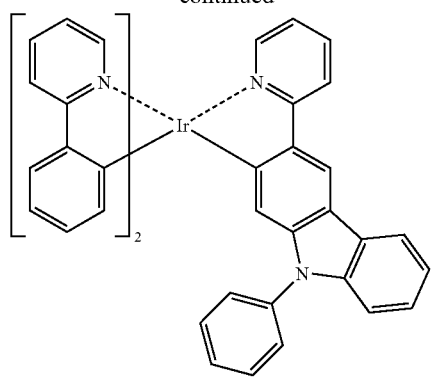
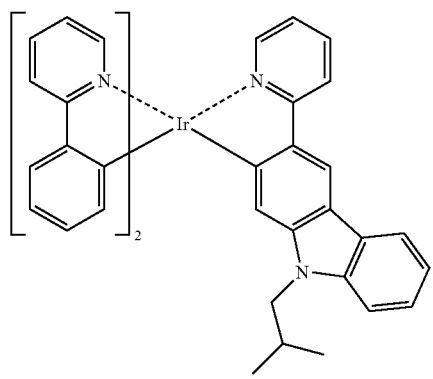
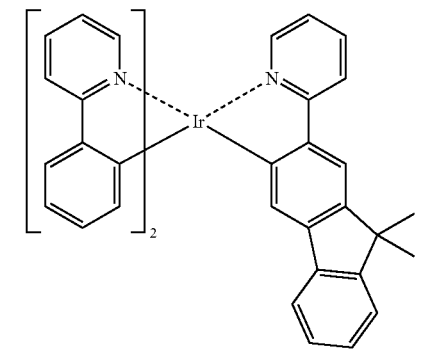
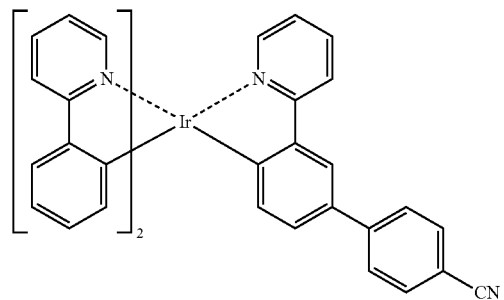
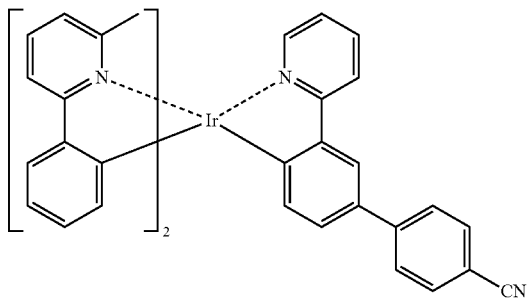
124
-continued
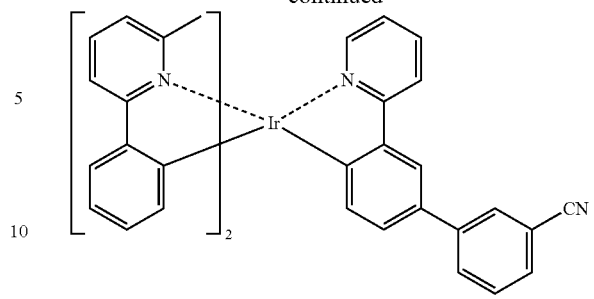
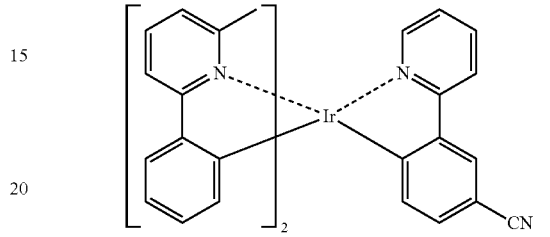
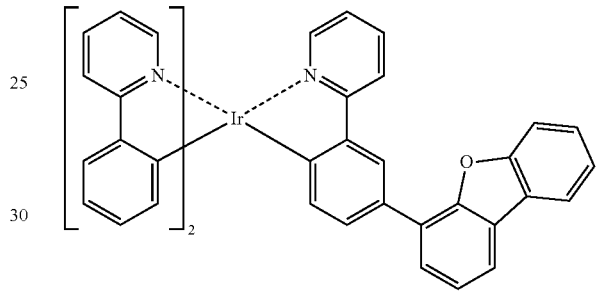
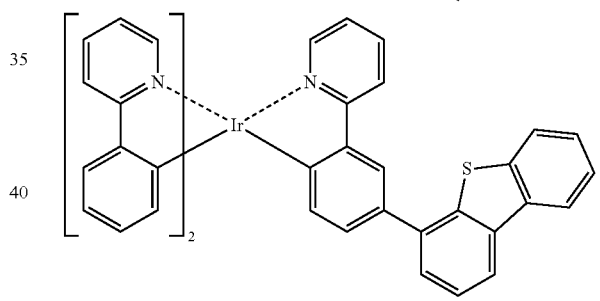
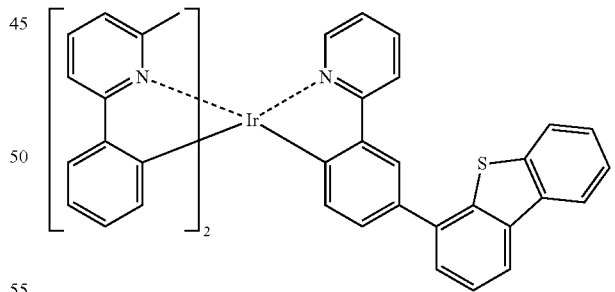
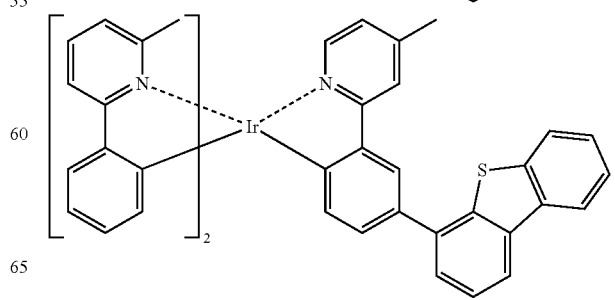

125
-continued
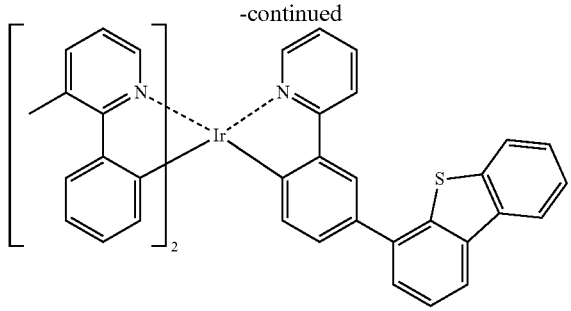
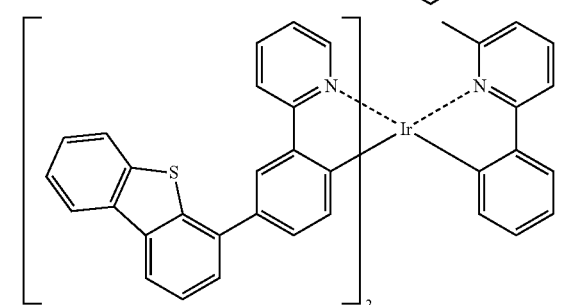
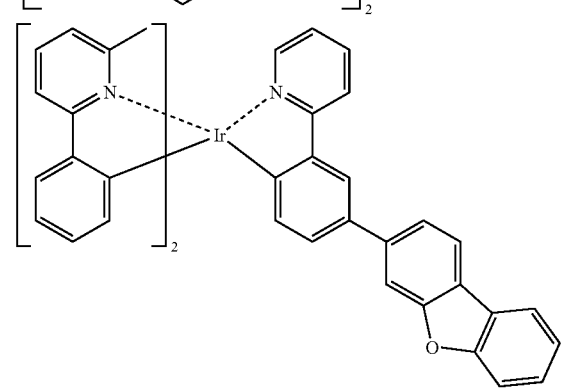
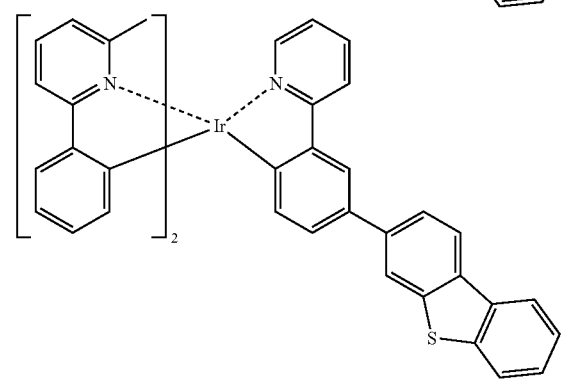
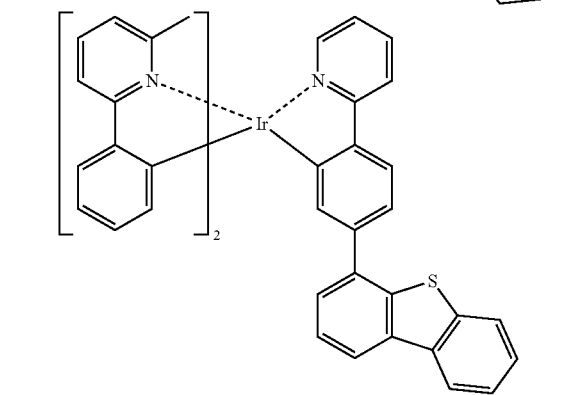
126
-continued
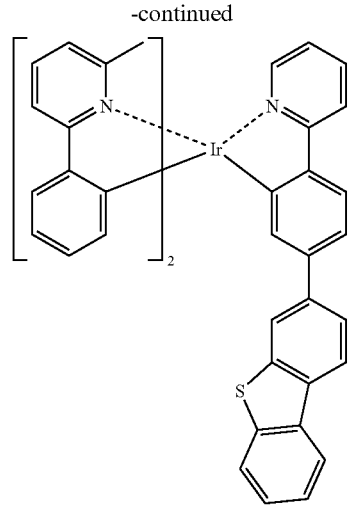
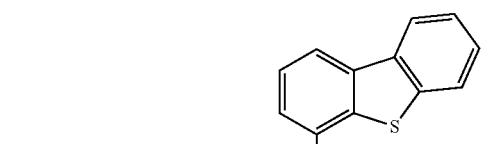
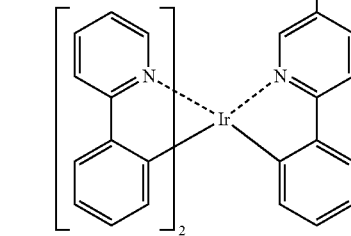
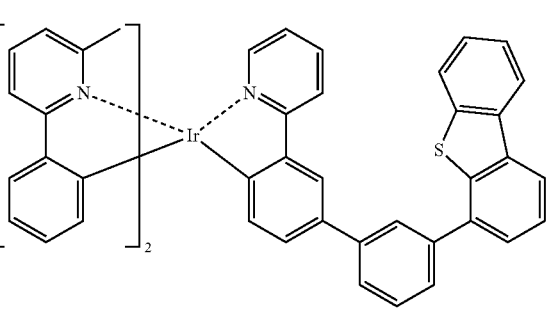

-continued

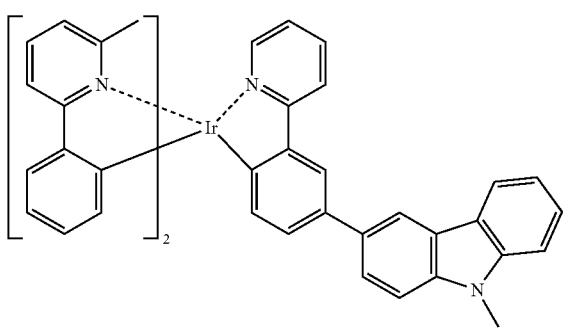

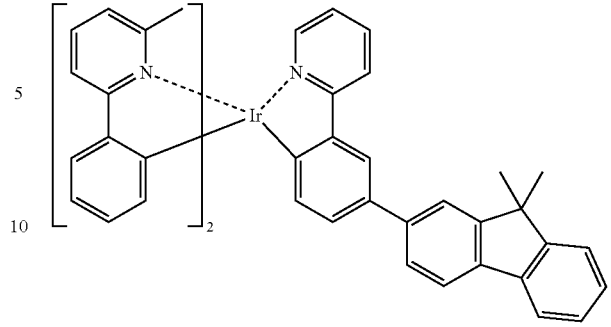

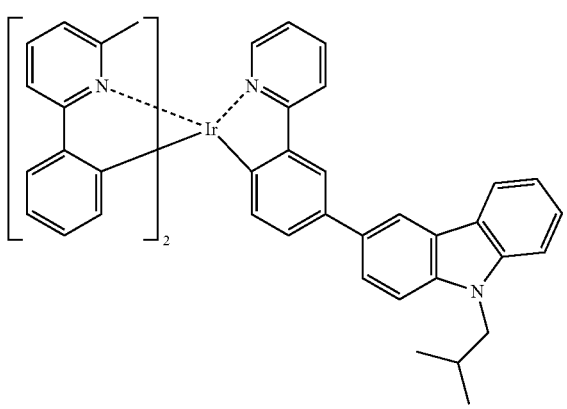

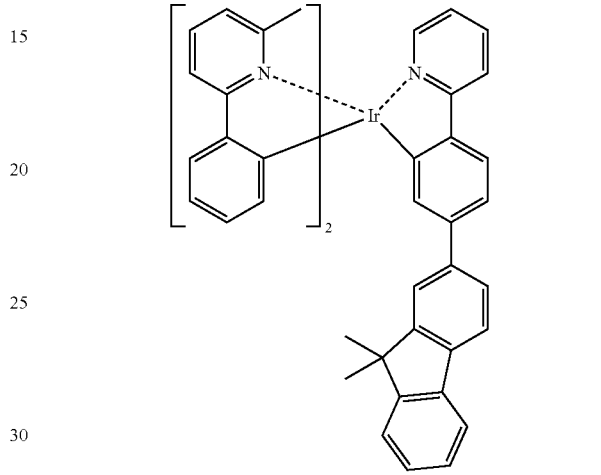

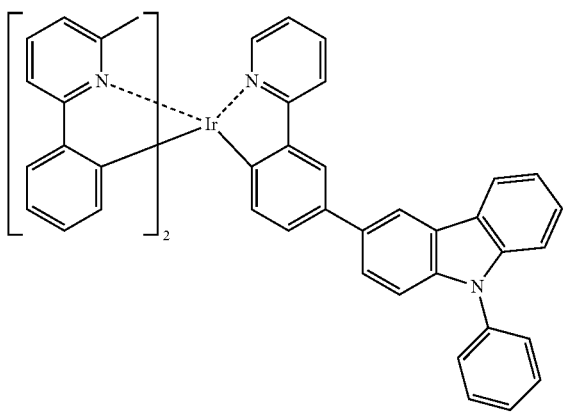

In order to obtain a blue to light blue luminescent color, the compound represented by the general formula (E-1) is preferably a compound represented by the following general formula (E-8) or the following general formula (E-9).

General Formula (E-8)

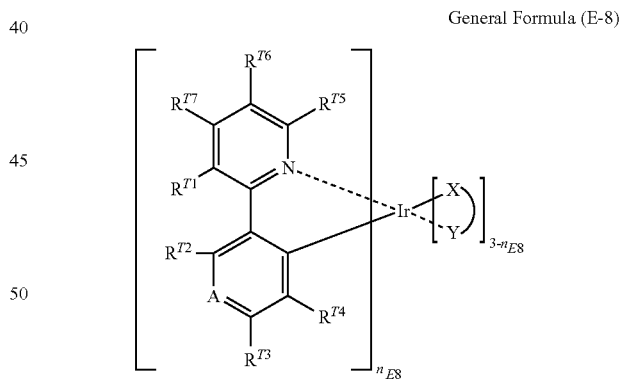

$R^{T1}$, $R^{T2}$, $R^{T3}$, $R^{T4}$, $R^{T5}$, $R^{T6}$, $R^{T7}$, A (CR'''' or a nitrogen atom), (X—Y) and $n_{E8}$ in the general formula (E-8) have the same definitions as $R^{T1}$, $R^{T2}$, $R^{T3}$, $R^{T4}$, $R^{T5}$, $R^{T6}$, $R^{T7}$, X, (X—Y), $n_{E3}$ in the general formula (E-3).

$R^{T1}$, $R^{T5}$ to $R^{T7}$ in the general formula (E-8) each are more preferably a hydrogen atom, an alkyl group or an aryl group. $R^{T2}$ to $R^{T4}$ each are preferably a hydrogen atom, a fluorine atom or a cyano group. A is preferably a CR'''' wherein R'''' is a fluorine atom or a cyano group, or a nitrogen atom. $n_{E8}$ is preferably 2 or 3. (X—Y) has the same definition as (X—Y) in the general formula (E-1), and the preferred range thereof is also the same.

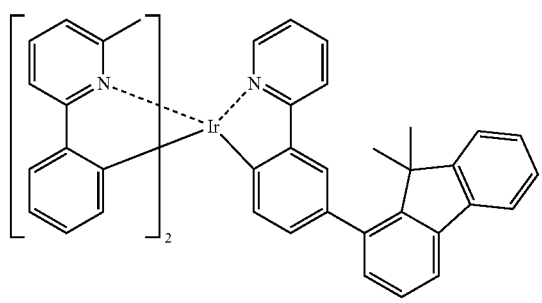

Specific preferred examples of the compound represented by the general formula (E-8) are listed below, but the compound is not limited thereto.
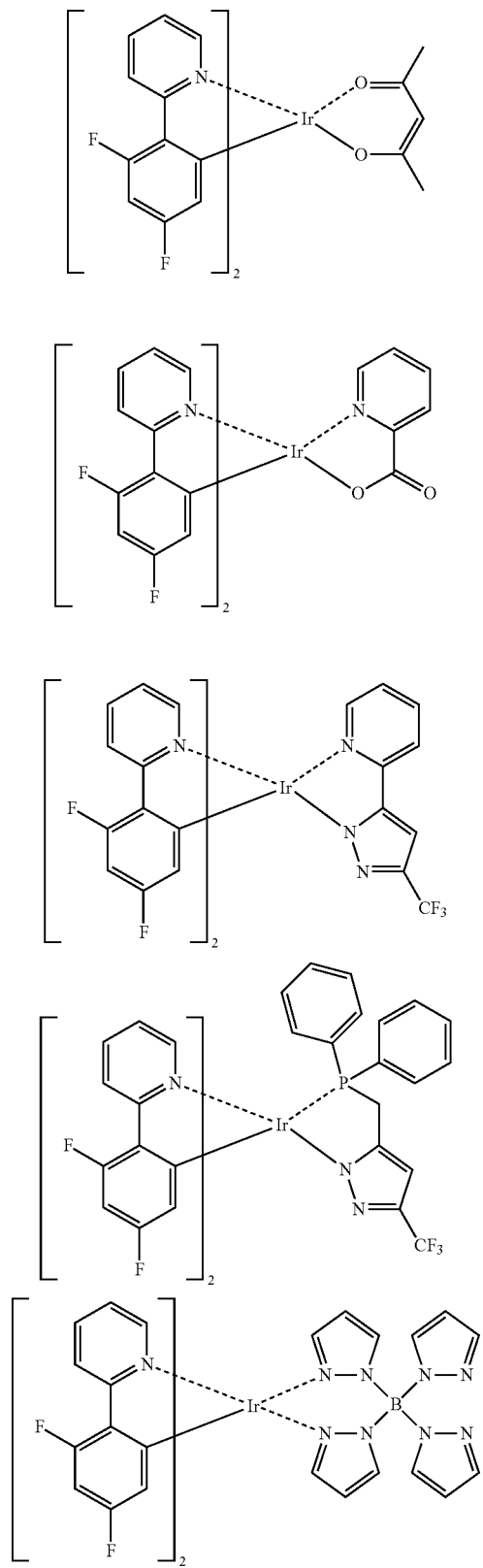

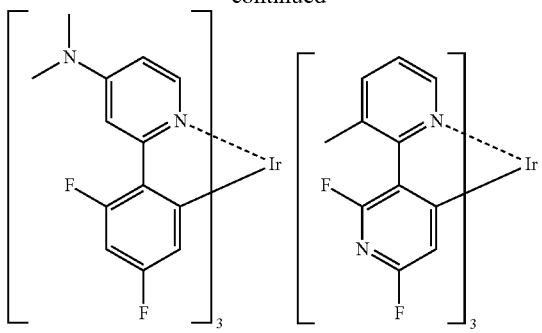
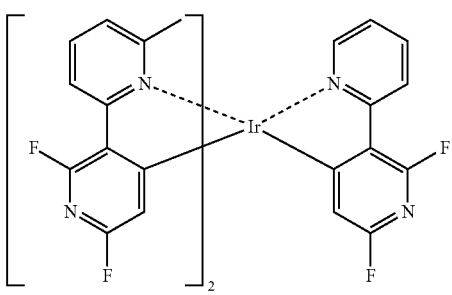
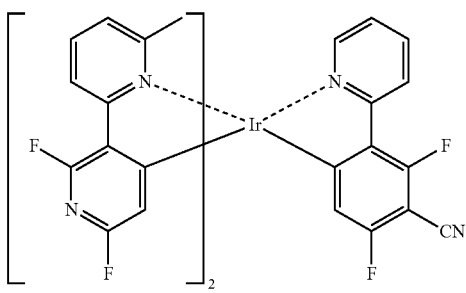
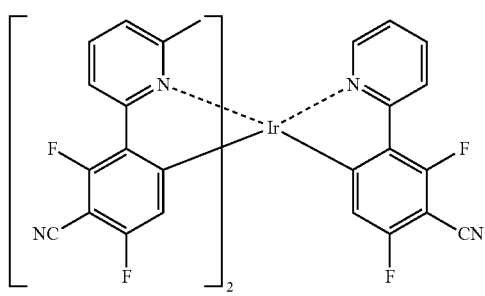
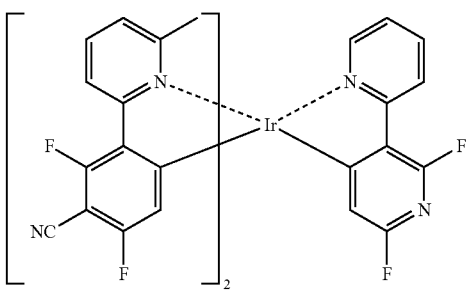

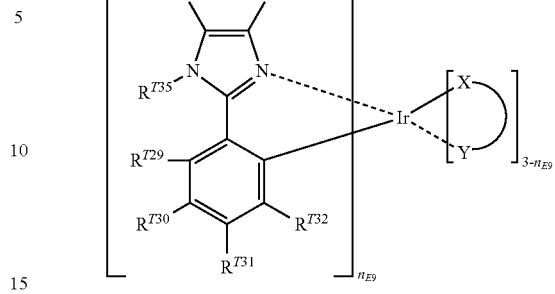

General Formula (E-9)

In the general formula (E-9), $R^{T29}$ to $R^{T34}$, (X—Y) and $n_{E8}$ have the same definitions as $R^{T1}$ to $R^{T6}$, (X—Y) and $n_{E3}$ in the general formula (E-3). $R^{T35}$ represents a substituent, and as the substituent, the Substituent Group B is exemplified. Any adjacent two of $R^{T29}$ to $R^{T35}$ may be bound to each other to form a fused 4- or 7-membered ring, the fused 4- or 7-membered ring is cycloalkene, cycloalkadiene, aryl or heteroaryl, and the fused 4- or 7-membered ring may further have a substituent represented by the Substituent Group A.

When $n_{E7}$ is 2 or 3, two or three ligands each containing $R^{T1}$, $R^{T2}$, $R^{T3}$, $R^{T4}$, $R^{T5}$, $R^{T6}$, $R^{T7}$, and R"" will exist, but the ligands are the same as or different from one another.

$R^{T29}$ to $R^{T34}$ each are preferably a hydrogen atom, an alkyl group, an aryl group or a cyano group. $R^{T35}$ is preferably an alkyl group or an aryl group. $R^{T35}$ is preferably connected to $R^{T29}$ to form a ring, $R^{T35}$ and $R^{T29}$ are preferably bound together via an aryl group to result in forming a nitrogen-containing 6-membered ring. The aryl group formed from $R^{T35}$ and $R^{T29}$ connected together may further have a substituent, and from the viewpoint of durability, the aryl group is preferably substituted with an alkyl group.

Specific preferred examples of the compound represented by the general formula (E-9) are listed below, but the compound is not limited thereto.

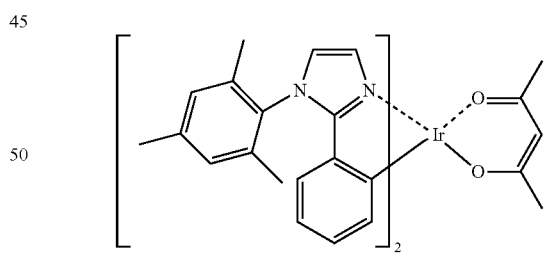
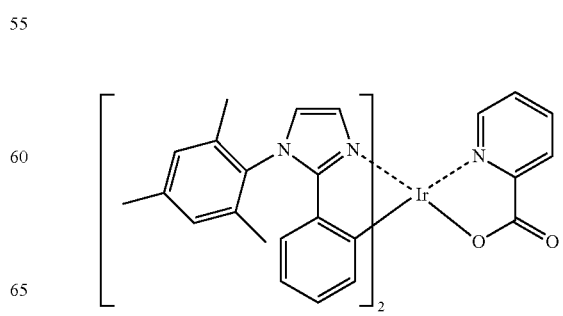

133
-continued
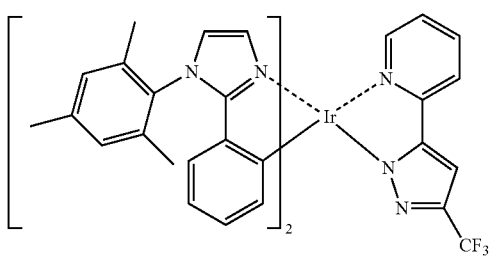
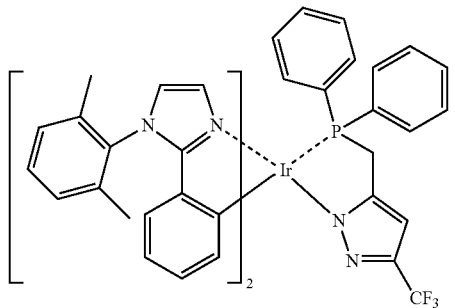
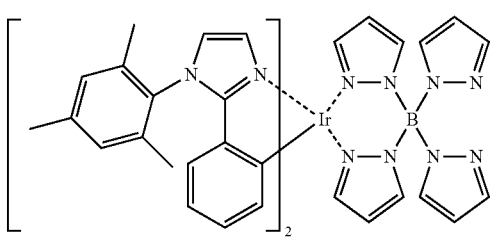
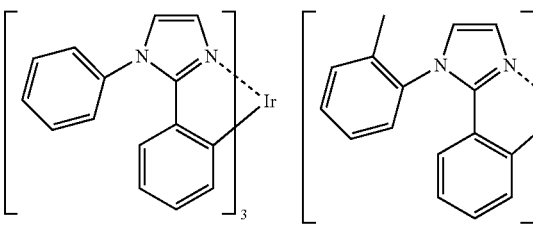
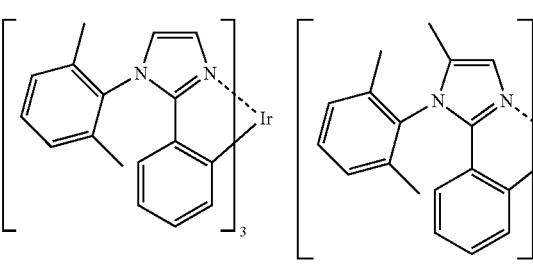
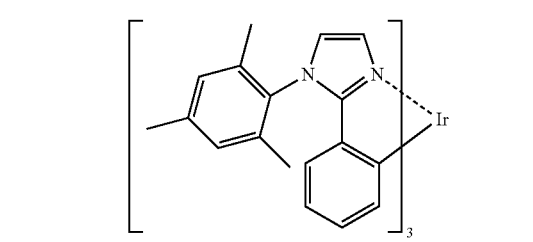
134
-continued
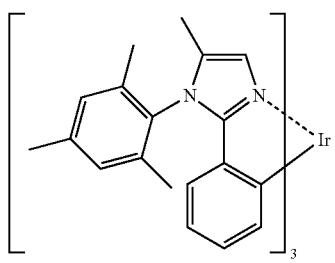
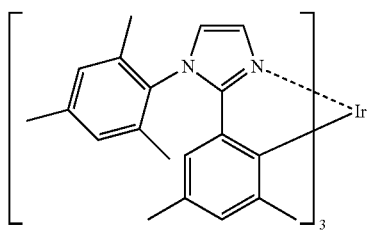
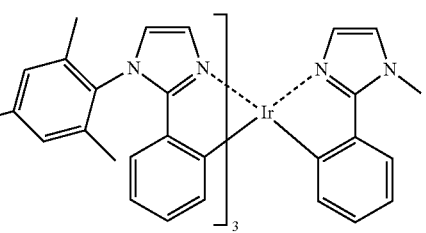
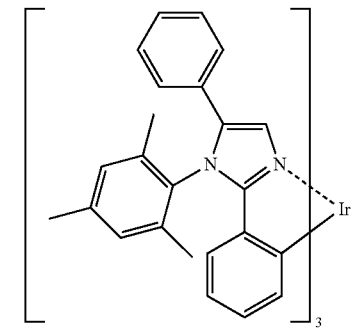
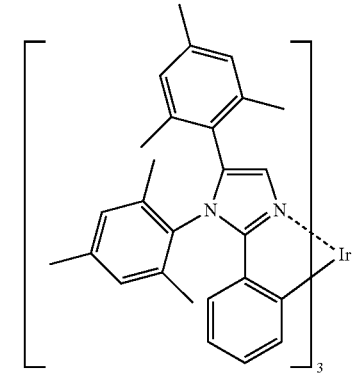

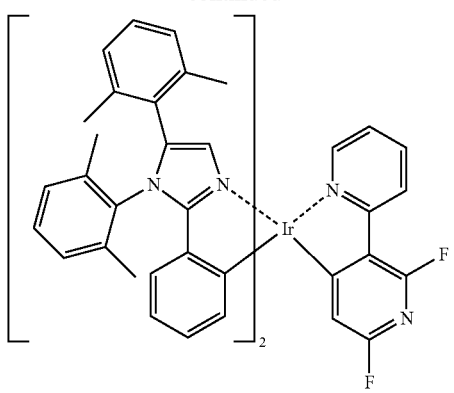
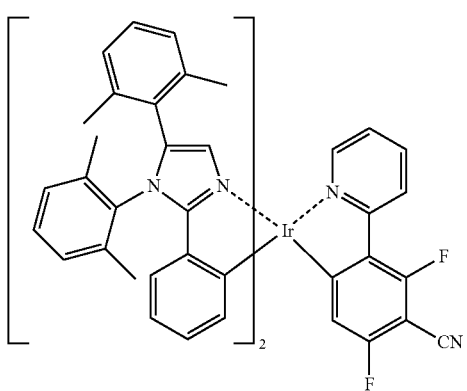
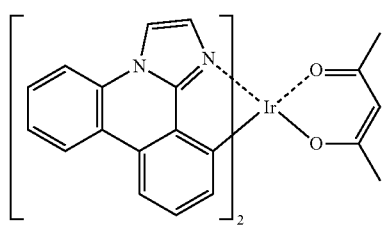
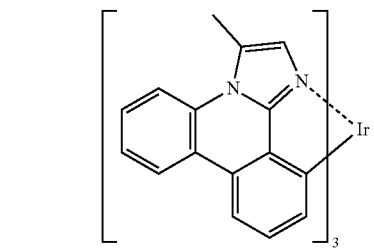
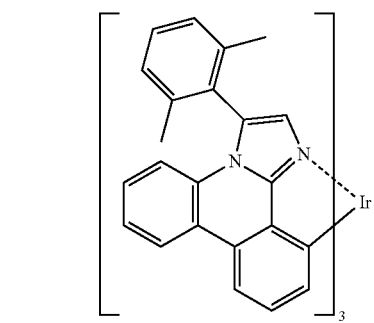
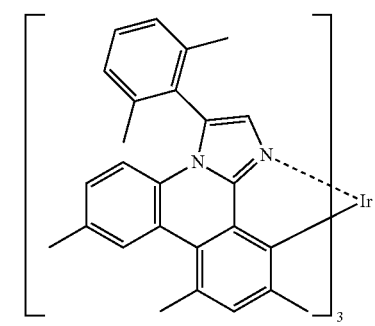
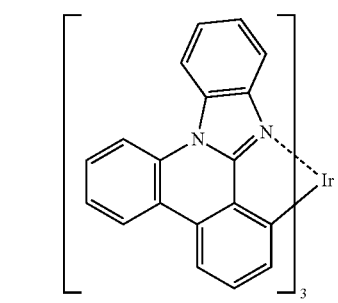
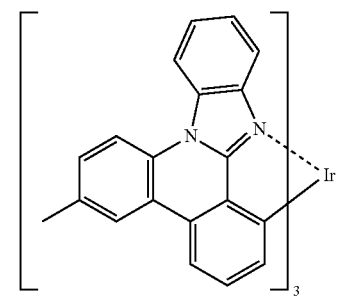

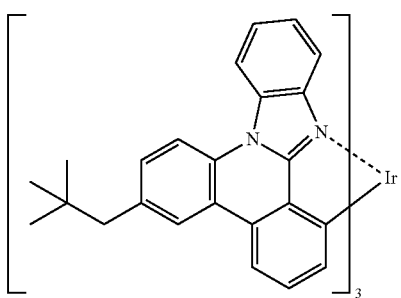
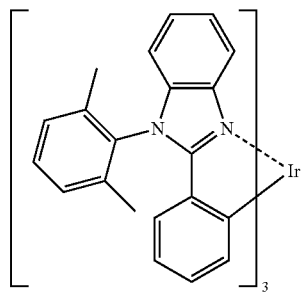
Specific preferred examples of the compound represented by the general formula (E-1) other than those shown above are listed below, but the compound is not limited thereto.
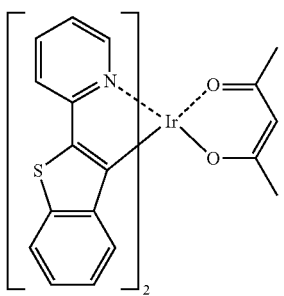
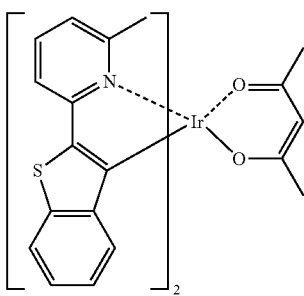
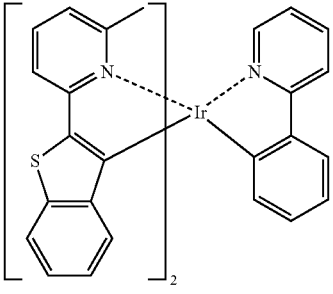
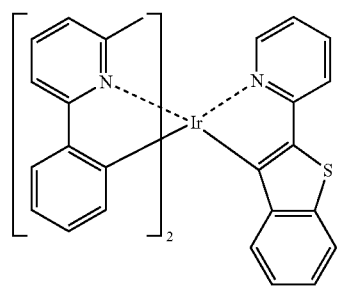
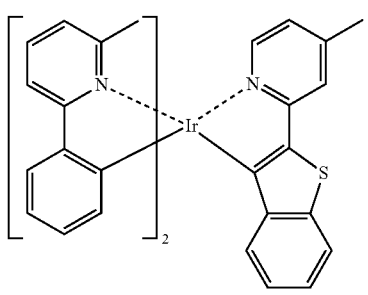
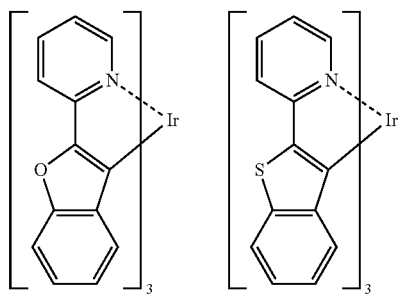
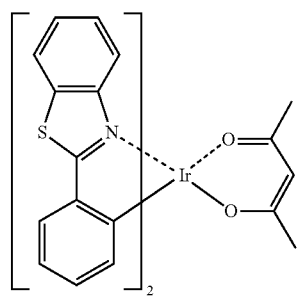
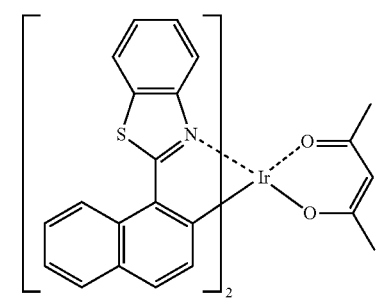

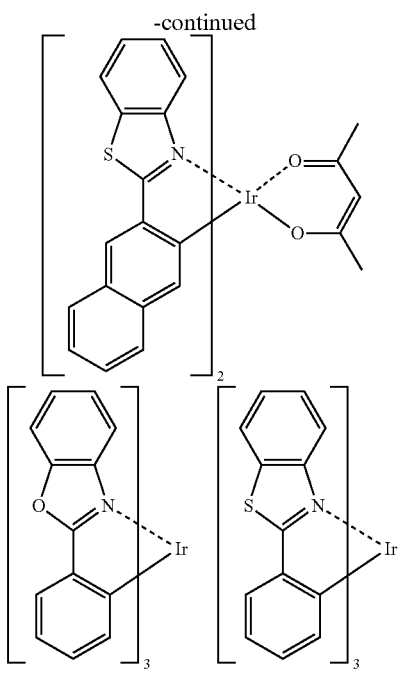

The above compound exemplified as the compound represented by the general formula (E-1) can be synthesized by various methods described in JP-A-2009-99783, U.S. Pat. No. 7,279,232, and the like. After the synthesis, the compound is purified by column chromatography, recrystallization, or the like, and thereafter purified by sublimation purification. By sublimation purification, it is possible not only to separate organic impurities but also to effectively remove the inorganic salts, remaining solvent, or the like.

Although the compound represented by the general formula (E-1) is preferably contained in the light emitting layer, the use thereof is not limited, and the compound may also be contained in any further layer of the organic layers.

The compound represented by the general formula (E-1) in the light emitting layer is contained in the light emitting layer generally in an amount of from 0.1% by mass to 50% by mass relative to the total mass of the compounds forming the light emitting layer, and from the viewpoint of durability and external quantum efficiency, the compound is preferably contained in an amount of from 0.2% by mass to 50% by mass, more preferably 0.3% by mass to 40% by mass, still more preferably from 0.4% by mass to 30% by mass, and especially preferably from 0.5% by mass to 20% by mass.

It is preferred in the present invention that the compound represented by any one of the general formulae (1-1) to (1-10) and the compound represented by any one of the general formulae (E-1) to (E-9) are used in combination in the light emitting layer.

Specific examples of the platinum (Pt) complex include a compound described in [0143] to [0152], [0157] to [0158], and [0162] to [0168] of JP-A-2005-310733, a compound described in [0065] to [0083] of JP-A-2006-256999, a compound described in [0065] to [0090] of JP-A-2006-93542, a compound described in [0063] to [0071] of JP-A-2007-73891, a compound described in [0079] to [0083] of JP-A-2007-324309, a compound described in [0065] to [0090] of JP-A-2006-93542, a compound described in [0055] to [0071] of JP-A-2007-96255 and a compound described in [0043] to [0046] of JP-A-2006-313796.

Although the above-mentioned phosphorescence emitting material is preferably contained in the light emitting layer, the use thereof is not limited and the material may also be contained in any further layer among the organic layers.

The phosphorescence emitting material in the light emitting layer is preferably contained in the light emitting layer generally in an amount of from 0.1% by mass to 50% by mass relative to the total mass of the compounds forming the light emitting layer, and from the viewpoint of durability and external quantum efficiency, the material is more preferably contained in an amount of from 1% by mass to 50% by mass, and especially preferably from 2% by mass to 40% by mass.

(III) Other Host Materials

Other host materials which can be used in the light emitting layer than the compound represented by the general formula (1) include a compound including the following structure as the partial structure therein:

aromatic hydrocarbon, pyrrole, indole, carbazole, azaindole, indolocarbazole, azacarbazole, triazole, oxazole, oxadiazole, pyrazole, imidazole, thiophene, polyarylalkane, pyrazoline, pyrazolone, phenylenediamine, arylamine, amino-substituted chalcone, styrylanthracene, hydrazone, stilbene, silazane, an aromatic tertiary amine compound, a styrylamine compound, a porphyrin-based compound, a polysilane-based compound, a poly(N-vinylcarbazole), an aniline-based copolymer, a thiophene oligomer, a polythiophene, and other conductive high molecular oligomers, organic silane, carbon film, pyridine, pyrimidine, triazine, fluorenone, anthraquinodimethane, anthrone, diphenylquinone, thiopyran dioxide, carbodiimide, fluorenylidenemethane, distyrylpyrazine, a fluorine-substituted aromatic compound, heterocyclic tetracarboxylic anhydride of naphthalene, perylene or the like, phthalocyanine, various metal complexes typified by a metal complex of an 8-quinolinol derivative, metal phthalocyanine and a metal complex having a benzoxazole or benzothiazole as a ligand, derivatives thereof (which may have a substituent or a fused ring), and the like.

(Other Layers)

The organic electroluminescent element according to the present invention may include layers other than the light emitting layer.

Examples of the organic layer other than the light emitting layer which may be included in the organic layer include a hole injecting layer, a hole transporting layer, a blocking layer (e.g., a hole blocking layer, an electron blocking layer, an exciton blocking layer, and the like), and an electron transporting layer. Specifically, examples of the layer configuration include those described below, but it should not be construed that the present invention is limited to these configurations.

Anode/hole transporting layer/light emitting layer/electron transporting layer/cathode Anode/hole transporting layer/light emitting layer/blocking layer/electron transporting layer/cathode Anode/hole transporting layer/light emitting layer/blocking layer/electron transporting layer/electron injecting layer/cathode Anode/hole injecting layer/hole transporting layer/light emitting layer/blocking layer/electron transporting layer/cathode Anode/hole injecting layer/hole transporting layer/light emitting layer/electron transporting layer/electron injecting layer/cathode Anode/hole injecting layer/hole transporting layer/light emitting layer/blocking layer/electron transporting layer/electron injecting layer/cathode Anode/hole injecting layer/hole transporting layer/blocking layer/light emitting layer/blocking layer/electron transporting layer/electron injecting layer/cathode The organic electroluminescent element according to the present invention preferably includes at least one (A) organic layer which is preferably disposed between the anode and the light emitting layer. Examples of the (A) organic layer which is preferably disposed between the anode and the light emitting layer include an hole injecting layer, a hole transporting layer, and an electron blocking layer from the anode side.

The organic electroluminescent element according to the present invention preferably includes at least one (B) organic layer which is preferably disposed between the cathode and the light emitting layer. Examples of the (B) organic layer which is preferably disposed between the cathode and the light emitting layer include an electron injecting layer, an electron transporting layer, and a hole blocking layer from the cathode side.

Specifically, an example of the preferred embodiments of the organic electroluminescent element according to the present invention is the embodiment shown in FIG. 1, in which a hole injecting layer 4, a hole transporting layer 5, a light emitting layer 6, a hole blocking layer 7, and an electron transporting layer 8 are laminated as the organic layer, in this order from the anode 3 side.

These layers other than the light emitting layer which the organic electroluminescent element according to the present invention may have are hereunder described.

(A) Organic Layer Preferably Disposed Between Anode and Light Emitting Layer:

First, the (A) organic layer preferably disposed between the anode and the light emitting layer is described.

(A-1) Hole Injecting Layer and Hole Transporting Layer:

The hole injecting layer and the hole transporting layer are layers having a function of receiving holes from the anode or the anode side and transporting them to the cathode side. The hole injecting material and the hole transporting material used in these layers may be either a low molecular compound or a high molecular compound.

For the hole injecting layer and the hole transporting layer, the matters described in paragraphs [0165] to [0167] of JP-A-2008-270736 can be applied to the present invention.

The hole injecting layer preferably contains an electron receiving dopant. By incorporating the electron receiving dopant into the hole injecting layer, for example, there are brought such effects that the hole injecting properties are enhanced; that the driving voltage is lowered; and that the efficiency is enhanced. The electron receiving dopant may be any one of organic materials or inorganic materials so long as the material is capable of withdrawing electrons from the material to be doped and generating radical cations, and examples thereof include a TCNQ compound such as tetracyanoquinodimethane (TCNQ) and tetrafluorotetracyanoquinodimethane ($F_4$-TCNQ), a hexaazatriphenylene compound such as hexacyanohexaazatriphenylene (HAT-CN), and molybdenum oxide. By interposing only the electron receiving dopant above, as a thin film, between the anode and the hole transporting layer, the same effect can be provided. In this case, this layer is referred to as a hole injecting layer. In addition, also by interposing the electron receiving dopant, as a thin film, between hole transporting layers, the same effect can be provided. In this case, one hole injecting layer or multiple hole infecting layers may be interposed between the hole transporting layers.

The electron receiving dopant in the hole injecting layer is preferably contained in an amount of from 0.01% by mass to 50% by mass, more preferably in an amount of from 0.1% by mass to 40% by mass, and more preferably in an amount of from 0.2% by mass to 30% by mass, relative to the total mass of the compounds forming the hole injecting layer. When used as a thin film, the thickness of the hole injecting layer is preferably from 1 nm to 50 nm, more preferably from 3 nm to 30 nm, and still more preferably from 5 nm to 20 nm.

(A-2) Electron Blocking Layer:

The electron blocking layer is a layer having a function of preventing the electrons, which have been transported from the cathode side to the light emitting layer, from passing through to the anode side. In the present invention, the electron blocking layer can be provided as an organic layer adjacent to the light emitting layer on the anode side.

As the organic compound constituting the electron blocking layer, for example, those exemplified above as the hole transporting material can be used.

The thickness of the electron blocking layer is preferably from 1 nm to 500 nm, more preferably from 3 nm to 200 nm, and still more preferably from 5 nm to 100 nm.

The electron blocking layer may have either a single layer structure composed of one or two or more kinds of materials selected from the above-exemplified materials or a multilayer structure composed of a plurality of layers having the same composition or different compositions.

In order to inhibit energy transfer of excitons generated in the light emitting layer to prevent degradation of luminous efficiency, $T_1$ energy in the film state of the organic compound constituting the electron blocking layer is preferably higher than the $T_1$ energy of the light emitting material.

(A-3) Material Especially Preferably Used in Organic Layer Preferably Disposed Between Anode and Light Emitting Layer:

[Compound Represented by General Formula (M-1)]

In the organic electroluminescent element according to the present invention, as a material especially preferably used in (A) the organic layer preferably disposed between the anode and the light emitting layer, at least one compound represented by the following general formula (M-1) may be exemplified.

The compound represented by the general formula (M-1) is preferably contained in an organic layer that is located between the light emitting layer and the anode and adjacent to the light emitting layer. The use thereof is however not limited and the compound may further be contained in any layer of the organic layers. The layer into which the compound represented by the general formula (M-1) is to be introduced may be any one of a light emitting layer, a hole injecting layer, a hole transporting layer, an electron transporting layer, an electron injecting layer and a charge blocking layer, or the compound may be contained in plural layers thereof.

The organic layer that is located between the light emitting layer and the anode and adjacent to the light emitting layer into which the compound represented by the general formula (M-1) is to be contained is more preferably an electron blocking layer or a hole transporting layer.

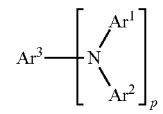

(M-1)

In the general formula (M-1), $Ar^1$ and $Ar^2$ each independently represent alkyl, aryl, heteroaryl, arylamino, alkylamino, morpholino, thiomorpholino, a 5- or 6-membered heterocycloalkyl containing one or more heteroatoms selected from N, O, and S, or a cycloalkyl, and may further have a substituent $Z^T$. $Ar^1$ and $Ar^2$ may be bound to each other via a single bond, alkylene, or alkenylene (regardless of presence or absence of a fused ring) to form a fused 5- to 9-membered ring.

$Ar^3$ represents P-valent alkyl, aryl, heteroaryl or arylamino, and may further have a substituent Z.

$Z^T$s each independently represent a halogen atom, —R", —OR", —N(R")$_2$, —SR", —C(O)R", —C(O)OR", —C(O)N(R")$_2$, —CN, —NO$_2$, —SO$_2$, —SOR", —SO$_2$R", or —SO$_3$R", R"s each independently represent a hydrogen atom, an alkyl group, a perhaloalkyl group, an alkenyl group, an alkynyl group, a heteroalkyl group, an aryl group or a heteroaryl group.

p is an integer of 1 to 4, and when p is 2 or more, $Ar^1$s and $Ar^2$s may be respectively the same as or different from each other.

An another preferred embodiment of the compound represented by the general formula (M-1) is the case of being represented by the general formula (M-2).

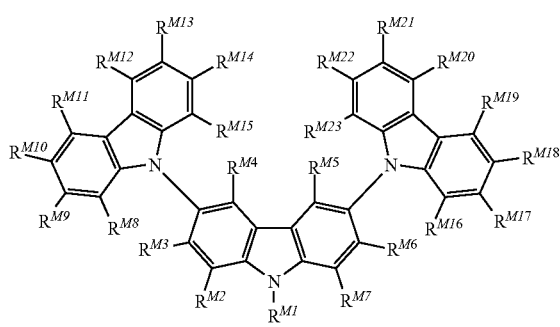

(M-2)

In the general formula (M-2), $R^{M1}$ represents an alkyl group, an aryl group or a heteroaryl group.

$R^{M2}$ to $R^{M23}$ each independently represent a hydrogen atom, an alkyl group, an aryl group, a heteroaryl group, an alkoxy group, an aryloxy group, an amino group, a silyl group, a cyano group, a nitro group or a fluorine atom.

In the general formula (M-2), $R^{M1}$ represents an alkyl group (preferably having from 1 to 8 carbon atoms), an aryl group (preferably having from 6 to 30 carbon atoms), or a heteroaryl group (preferably having from 4 to 12 carbon atoms), and these groups may have the above-described substituent $Z^T$. $R^{M1}$ is preferably an aryl group or a heteroaryl group, and more preferably an aryl group. Examples of a preferred substituent in the case where the aryl group of $R^{M1}$ has a substituent include an alkyl group, a halogen atom, a cyano group, an aryl group and an alkoxy group, more preferably an alkyl group, a halogen atom, a cyano group or an aryl group, and still more preferably an alkyl group, a cyano group or an aryl group. The aryl group of $R^{M1}$ is preferably a phenyl group which may have a substituent $Z^T$, more preferably a phenyl group which may have an alkyl group or a cyano group.

$R^{M2}$ to $R^{M23}$ each independently represent a hydrogen atom, an alkyl group (preferably having from 1 to 8 carbon atoms), an aryl group (preferably having from 6 to 30 carbon atoms), a heteroaryl group (preferably having from 4 to 12 carbon atoms), an alkoxy group (preferably having from 1 to 8 carbon atoms), an aryloxy group (preferably having from 6 to 30 carbon atoms), an amino group (preferably having from 0 to 24 carbon atoms), a silyl group (preferably having from 0 to 18 carbon atoms), a cyano group, a nitro group, or a fluorine atom, and these groups may have the above-described substituent $Z^T$.

$R^{M2}$, $R^{M7}$, $R^{M8}$, $R^{M15}$, $R^{M16}$ and $R^{M23}$ each are preferably a hydrogen atom, or an alkyl group or an aryl group which may have a substituent $Z^T$, and more preferably a hydrogen atom.

$R^{M4}$, $R^{M5}$, $R^{M11}$, $R^{M12}$, $R^{M19}$ and $R^{M20}$ each are preferably a hydrogen atom, an alkyl group or an aryl group which may have a substituent $Z^T$, or a fluorine atom, and more preferably a hydrogen atom.

$R^{M6}$, $R^{M9}$, $R^{M14}$, $R^{M17}$ and $R^{M22}$ each are preferably a hydrogen atom, an alkyl group or an aryl group which may have a substituent $Z^T$, a fluorine atom, or a cyano group, more preferably a hydrogen atom or an alkyl group which may have a substituent $Z^T$, and still more preferably a hydrogen atom.

$R^{M10}$, $R^{M13}$, $R^{M18}$ and $R^{M21}$ each are preferably a hydrogen atom, an alkyl group, an aryl group, a heteroaryl group or an amino group which may have a substituent $Z^T$, a nitro group, a fluorine atom, or a cyano group, more preferably a hydrogen atom, an alkyl group or an aryl group which may have a substituent $Z^T$, a nitro group, a fluorine atom, or a cyano group, and still more preferably a hydrogen atom, or an alkyl group which may have a substituent $Z^T$. As the substituent in the case where the alkyl group has a substituent, a fluorine atom is preferred, and the carbon number in the alkyl group that may have a substituent $Z^T$ is preferably from 1 to 6, and more preferably from 1 to 4.

Another preferred embodiment of the compound represented by the general formula (M-1) is the case of being represented by the following general formula (M-3).

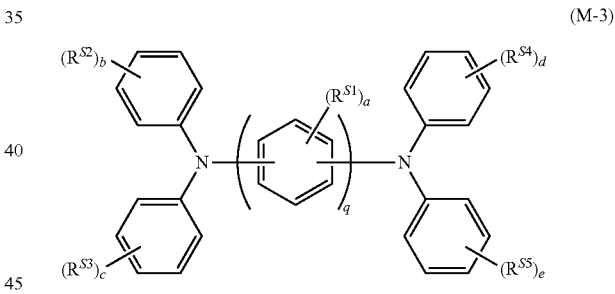

(M-3)

In the general formula (M-3), $R^{S1}$ to $R^{S5}$ each independently represent an alkyl group, a cycloalkyl group, an alkenyl group, an alkynyl group, —CN, a perfluoroalkyl group, a trifluorovinyl group, —CO$_2$R, —C(O)R, —NR$_2$, —NO$_2$, —OR, a halogen atom, an aryl group or a heteroaryl group, and may further have a substituent $Z^T$. Rs each independently represent a hydrogen atom, an alkyl group, a perhaloalkyl group, an alkenyl group, an alkynyl group, a heteroalkyl group, an aryl group or a heteroaryl group. When plural $R^{S1}$ to $R^{S5}$ exist, those groups may be bound to each other to form a ring, and may further have a substituent $Z^T$.

a represents an integer of from 0 to 4, and when plural $R^{S1}$s exist, the $R^{S1}$s may be the same as or different from one another, and may be bound to each other to form a ring. b to e each independently represent an integer of 0 to 5, and when plural groups exist for each $R^{S2}$ to $R^{S5}$, the groups may be the same as or different from one another, and any two thereof may be bound together to from a ring.

q is an integer of 1 to 5, and when q is 2 or more, the plural $R^{S1}$s may be the same as or different from one another, and may be bound together to form a ring.

The alkyl group may have a substituent, and may be saturated or unsaturated, and as the group that may be the substituent, the above-described $Z^T$ may be exemplified. The alkyl group represented by $R^{S1}$ to $R^{S5}$ is preferably an alkyl group having a total carbon number of from 1 to 8, and more preferably an alkyl group having a total carbon number of from 1 to 6, including, for example, a methyl group, an ethyl group, an i-propyl group, a cyclohexyl group and a t-butyl group.

The cycloalkyl group may have a substituent, and may be saturated or unsaturated, and as the group that may be the substitute, the above-described substituent $Z^T$ may be exemplified. The cycloalkyl group represented by $R^{S1}$ to $R^{S5}$ is preferably a cycloalkyl group having from 4 to 7 ring members, more preferably a cycloalkyl group having a total carbon number of from 5 to 6, including, for example, a cyclopenthyl group and a cyclohexyl group.

The alkenyl group represented by $R^{S1}$ to $R^{S5}$ preferably has from 2 to 30 carbon atoms, more preferably has from 2 to 20 carbon atoms, and especially preferably has from 2 to 10 carbon atoms, including, for example, vinyl, allyl, 1-propenyl, 1-isopropenyl, 1-butenyl, 2-butenyl, 3-pentenyl, etc.

The alkynyl group represented by $R^{S1}$ to $R^{S5}$ has from 2 to 30 carbon atoms, more preferably has from 2 to 20 carbon atoms, and especially preferably has from 2 to 10 carbon atoms, including, for example, ethynyl, propargyl, 1-propynyl, 3-pentynyl, etc.

The perfluoroalkyl group represented by $R^{S1}$ to $R^{S5}$ includes a group obtained by replacing all the hydrogen atoms in the above-mentioned alkyl group with fluorine atoms.

The aryl group represented by $R^{S1}$ to $R^{S5}$ is preferably a substituted or unsubstituted aryl group having from 6 to 30 carbon atoms, including, for example, a phenyl group, a tolyl group, a biphenyl group, a terphenyl group, etc.

The heteroaryl group represented by $R^{S1}$ to $R^{S5}$ is preferably a heteroaryl group having from 5 to 8 carbon atoms, more preferably a substituted or unsubstituted 5- or 6-membered heteroaryl group, including, for example, a pyridyl group, a pyrazinyl group, a pyridazinyl group, a pyrimidinyl group, a triazinyl group, a quinolinyl group, an isoquinolinyl group, a quinazolinyl group, a cinnolinyl group, a phthalazinyl group, a quinoxalinyl group, a pyrrolyl group, an indolyl group, a furyl group, a benzofuryl group, a thienyl group, a benzothienyl group, a pyrazolyl group, an imidazolyl group, a benzimidazolyl group, a triazolyl group, an oxazolyl group, a benzoxazolyl group, a thiazolyl group, a benzothiazolyl group, an isothiazolyl group, a benzisothiazolyl group, a thiadiazolyl group, an isoxazolyl group, a benzisoxazolyl group, a pyrrolidinyl group, a piperidinyl group, a piperazinyl group, an imidazolidinyl group, a thiazolinyl group, a sulfolanyl group, a carbazolyl group, a dibenzofuryl group, a dibenzothienyl group, a pyridoindolyl group, etc. Preferred examples are a pyridyl group, a pyrimidinyl group, an imidazolyl group and a thienyl group, and more preferred examples are a pyridyl group and a pyrimidinyl group.

$R^{S1}$ to $R^{S5}$ each are preferably a hydrogen atom, an alkyl group, a cyano group, a trifluoromethyl group, a perfluoroalkyl group, a dialkylamino group, a fluoro group, an aryl group or a heteroaryl group, more preferably a hydrogen atom, an alkyl group, a cyano group, a trifluoromethyl group, a fluoro group or an aryl group, and still more preferably a hydrogen atom, an alkyl group or an aryl group. The substituent $Z^T$ is preferably an alkyl group, an alkoxy group, a fluoro group, a cyano group or a dialkylamino group, and more preferably a hydrogen atom or an alkyl group.

Any two of $R^{S1}$ to $R^{S5}$ may be bound to each other to form a fused 4- to 7-membered ring, the fused 4- to 7-membered ring is cycloalkyl, aryl or heteroaryl, and the fused 4- to 7-membered ring may further have a substituent $Z^T$. The definitions and the preferred ranges of the formed cycloalkyl, aryl and heteroaryl are the same as the cycloalkyl group, the aryl group and the heteroaryl group defined in $R^{S1}$ to $R^{S5}$.

In the case where the compound represented by the general formula (M-1) is used in a hole transporting layer, the compound represented by the general formula (M-1) is preferably contained in an amount of from 50 to 100% by mass, more preferably contained in an amount of from 80 to 100% by mass, and especially preferably contained in an amount of from 95 to 100% by mass.

In addition, when the compound represented by the general formula (M-1) is used in plural organic layers, it is preferred that the compound is contained in each layer in the foregoing amount.

Only one kind of the compound represented by the general formula (M-1) may be contained, in any one of organic layers, or plural compounds represented by the general formula (M-1) may be contained in combination of any proportion thereof.

The thickness of the hole transporting layer containing the compound represented by the general formula (M-1) is preferably from 1 nm to 500 nm, more preferably from 3 nm to 200 nm, and still more preferably from 5 nm to 100 nm. In addition, the hole transporting layer is preferably provided in contact with the light emitting layer.

The minimum excited triplet ($T_1$) energy in the film state of the compound represented by the general formula (M-1) is preferably 1.77 eV (40 kcal/mol) or higher and 3.51 eV (81 kcal/mol) or lower, and more preferably 2.39 eV (55 kcal/mol) or higher and 3.25 eV (75 kcal/mol) or lower. In the organic electroluminescent element according to the present invention, it is preferred that $T_1$ energy of the compound represented by the general formula (M-1) is higher than $T_1$ energy of the above-mentioned phosphorescence emitting material, from the viewpoint of luminous efficiency. In particular when the luminescent color from the organic electroluminescent element is green (the emission peak wavelength is 490 to 580 nm), from the viewpoint of luminous efficiency, $T_1$ energy is more preferably 2.39 eV (55 kcal/mol) or higher and 2.82 eV (65 kcal/mol) or lower.

The hydrogen atoms constituting the general formula (M-1) include hydrogen isotopes (deuterium and the like). In this case, all the hydrogen atoms in the compound may be replaced by the hydrogen isotope atoms, or the compound may be a mixture in which a part of the compound contains some hydrogen isotopes.

The compound represented by the general formula (M-1) can be synthesized by combining various known synthetic methods. Most commonly, for the carbazole compound, a synthetic method may be exemplified in which a fused compound of an arylhydradine and a cyclohexane derivative is subjected to the Aza-Cope rearrangement reaction, and thereafter converted into an aromatic compound by dehydrogenating (written by L. F. Tieze and Th. Eicher, translated by Takano and Ogasawara, Seimitsu Yuuki Gousei, p 339 (Nankodo)). For a coupling reaction of the resulting carbazole compound with a halogenated aryl compound using a palladium catalyst, a method is exemplified which is described in Tetrahedron Letters, vol. 39, p 617 (1998), vol. 39, p 2367 (1998), vol. 40, p 6393 (1999), etc. The reaction temperature and the reaction time are not particularly limited and the conditions described in the above documents may be applied.

The compound represented by the general formula (M-1) is preferably formed into a thin film by a vacuum vapor deposition process, but a wet process such as a solution coating can be suitably used. The molecular weight of the compound is preferably 2000 or less, more preferably 1200 or less, and especially preferably 800 or less, from the viewpoint of applicability to the vapor deposition and solubility. In terms of the applicability to the vapor deposition, too small molecular weight causes decrease of the vapor pressure, thereby inhibiting the conversion from the vapor phase to the solid phase, so that it become difficult to form the organic layer. Accordingly, the molecular weight is preferably 250 or more, and especially preferably 300 or more.

Specific examples of the compound represented by the general formula (M-1) are shown below, but the present invention is not limited thereto.

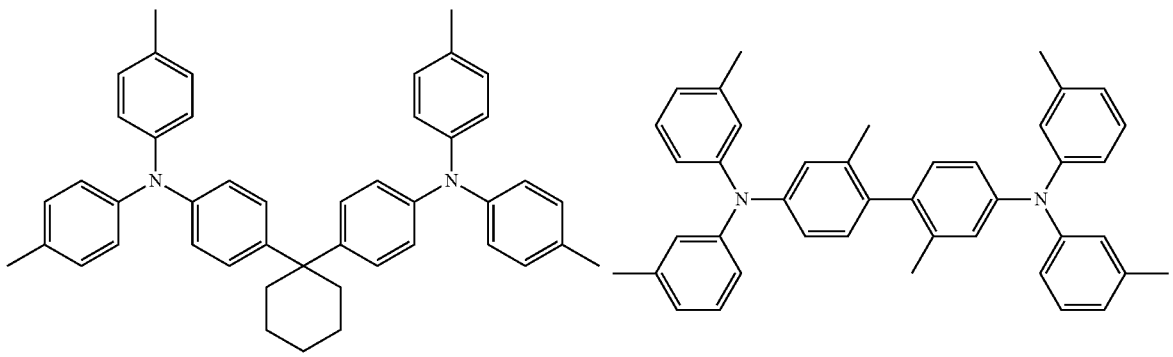

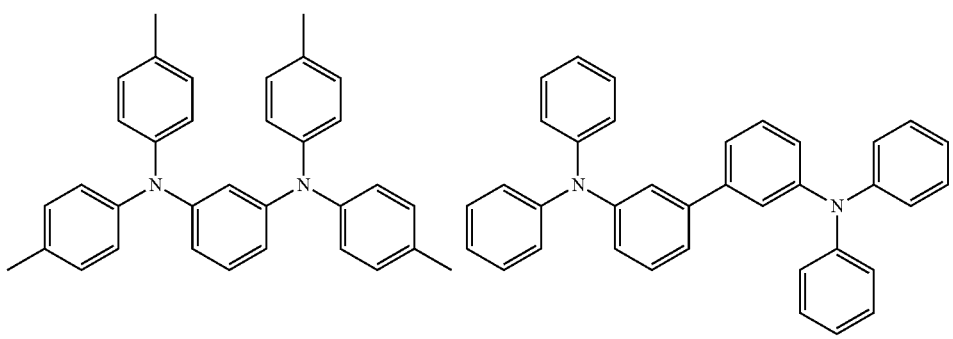

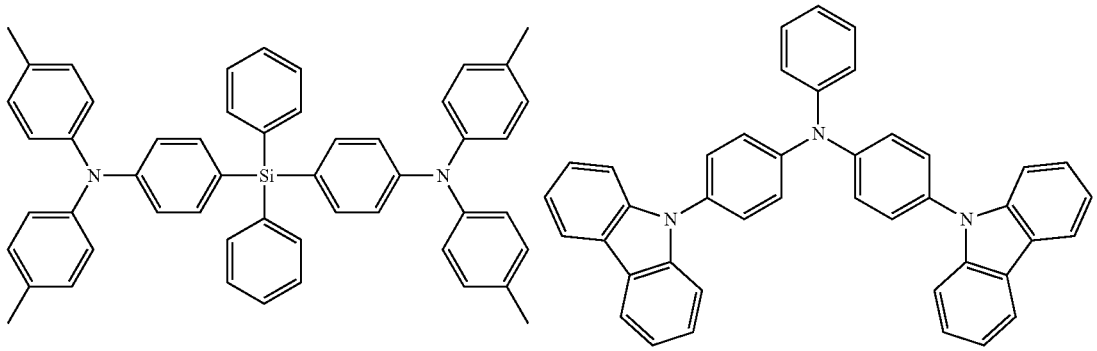

-continued
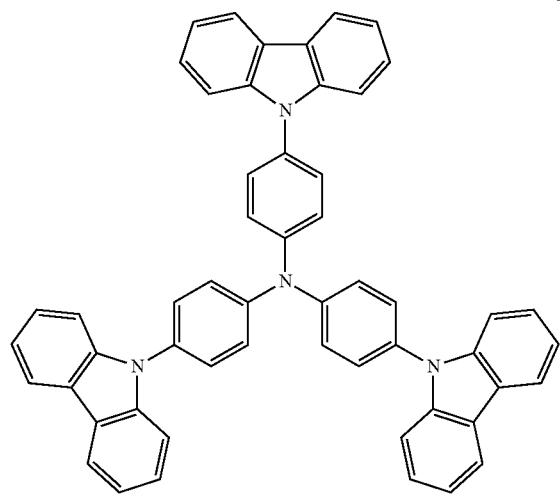
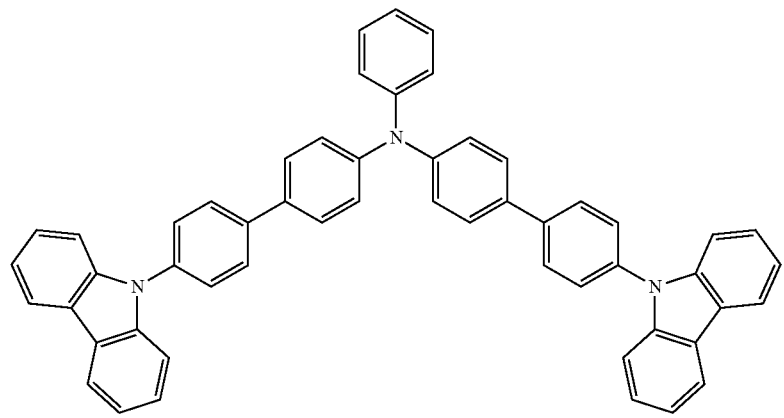
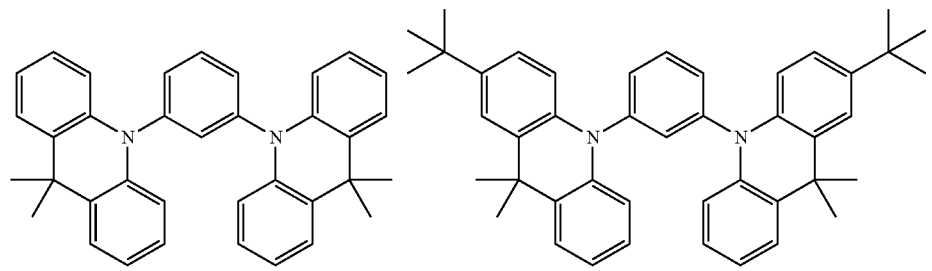
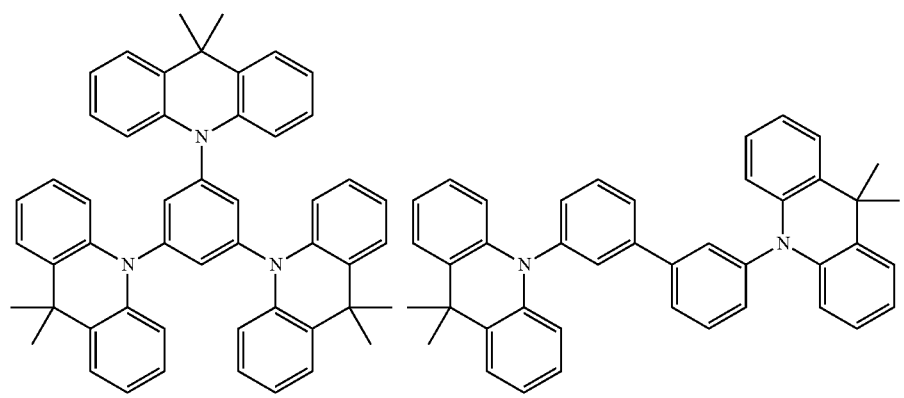

151 152
-continued
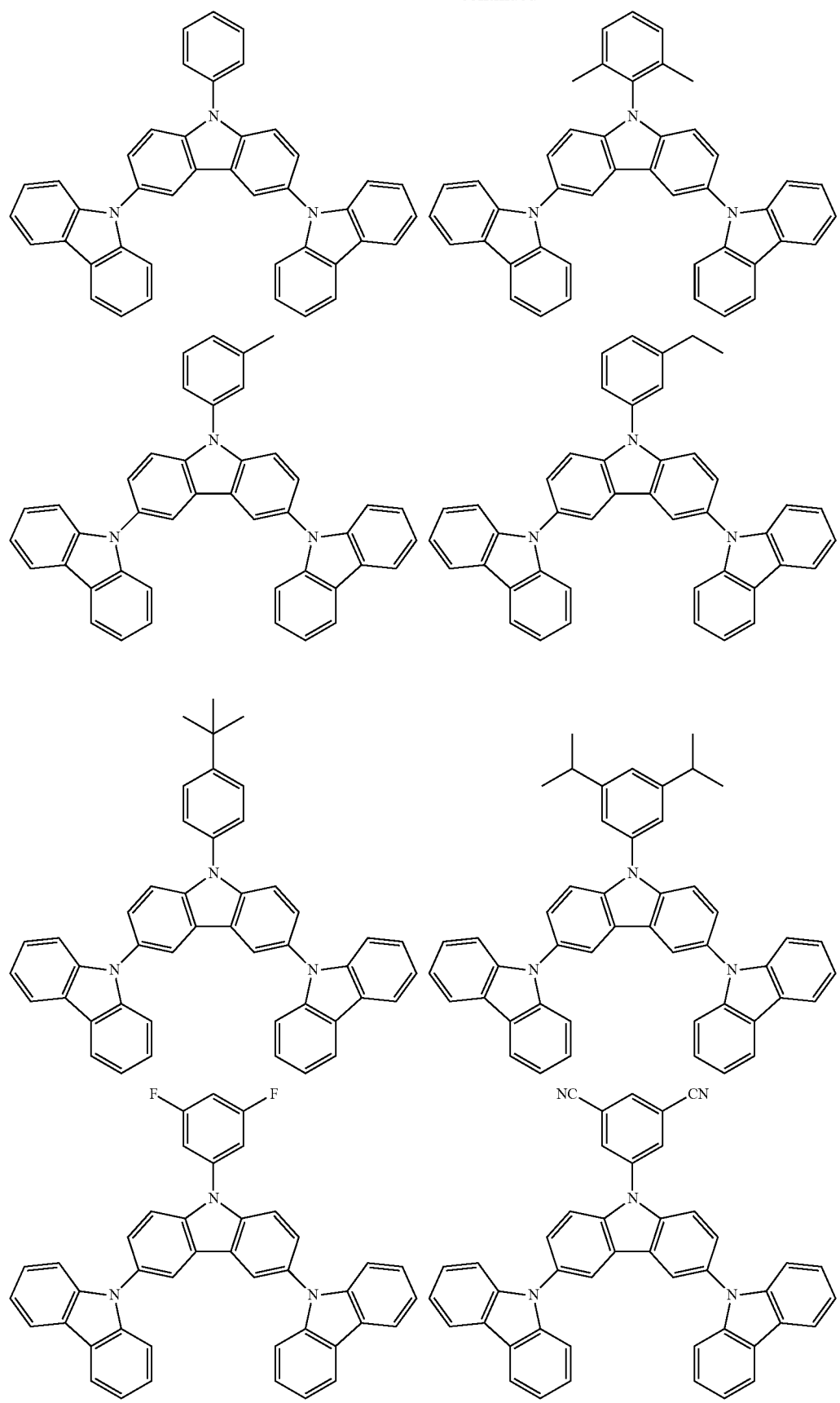

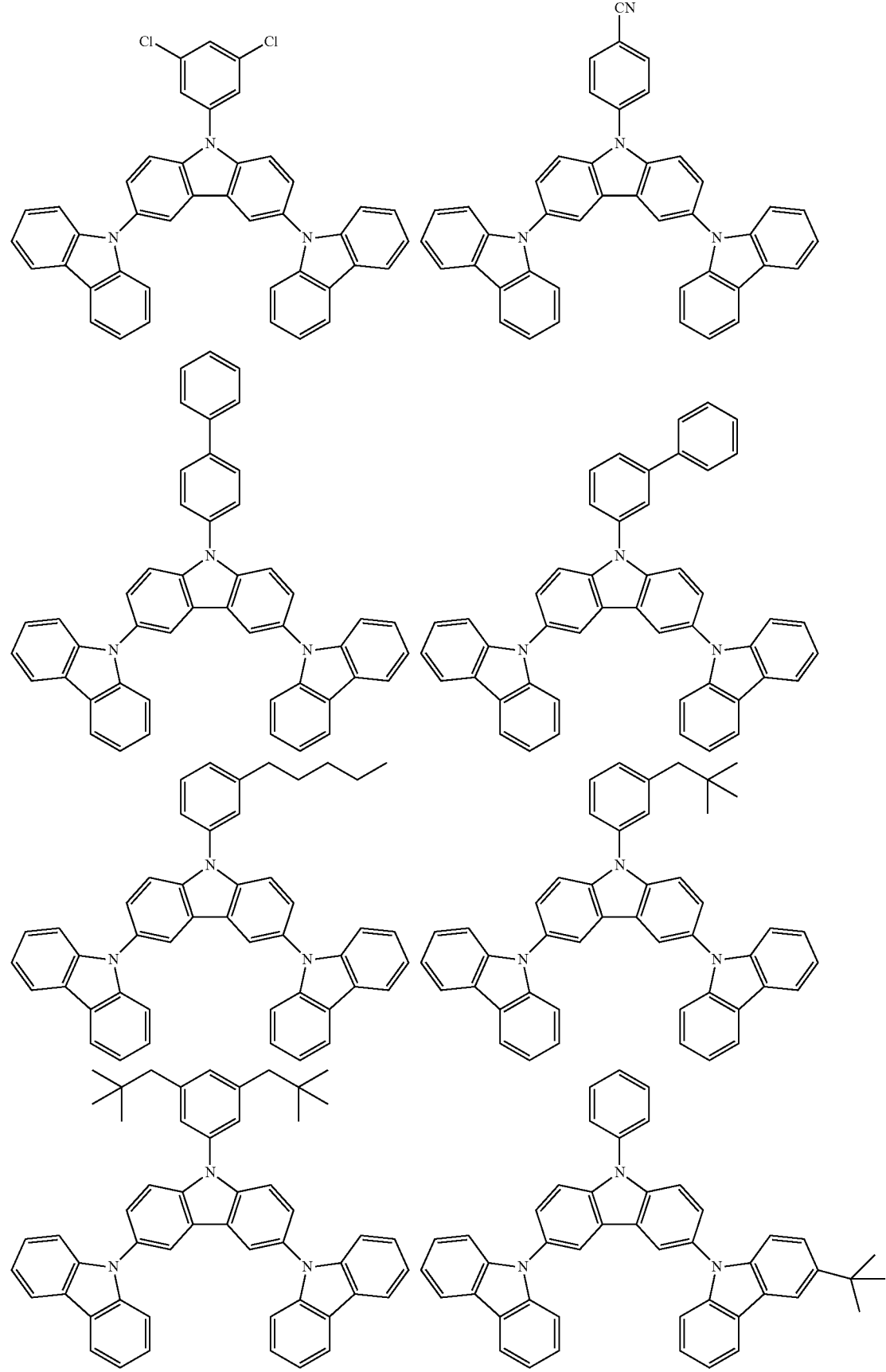

-continued
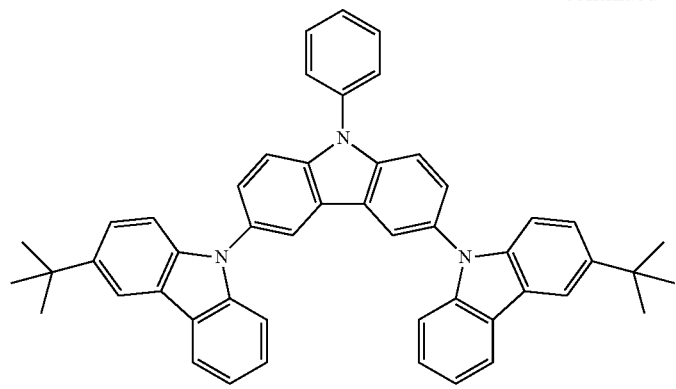
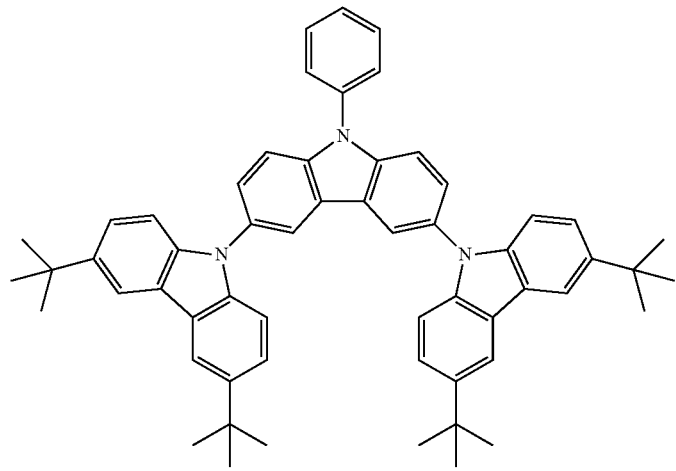
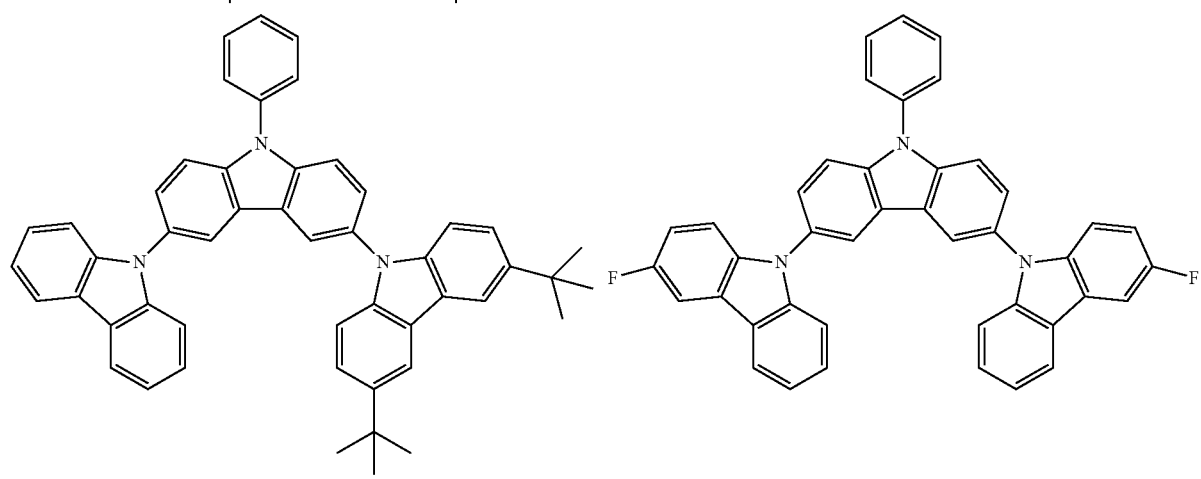
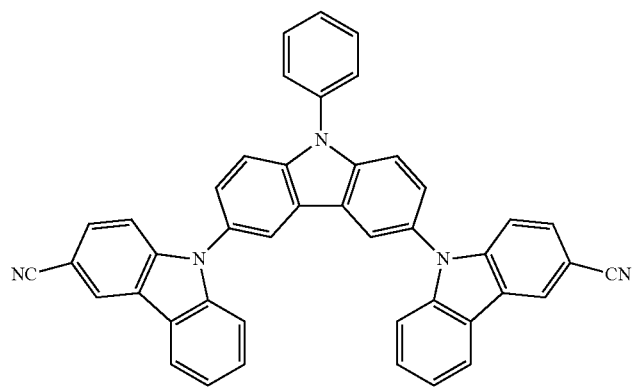

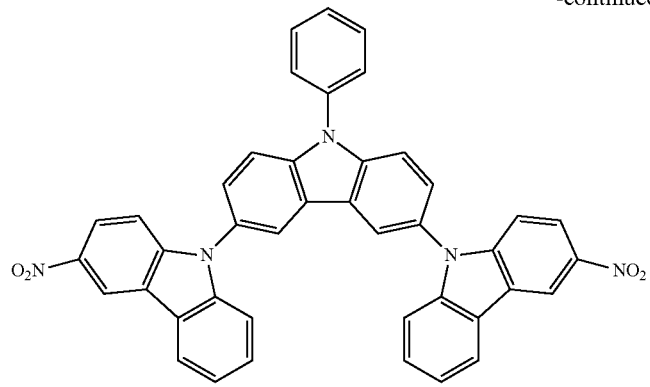
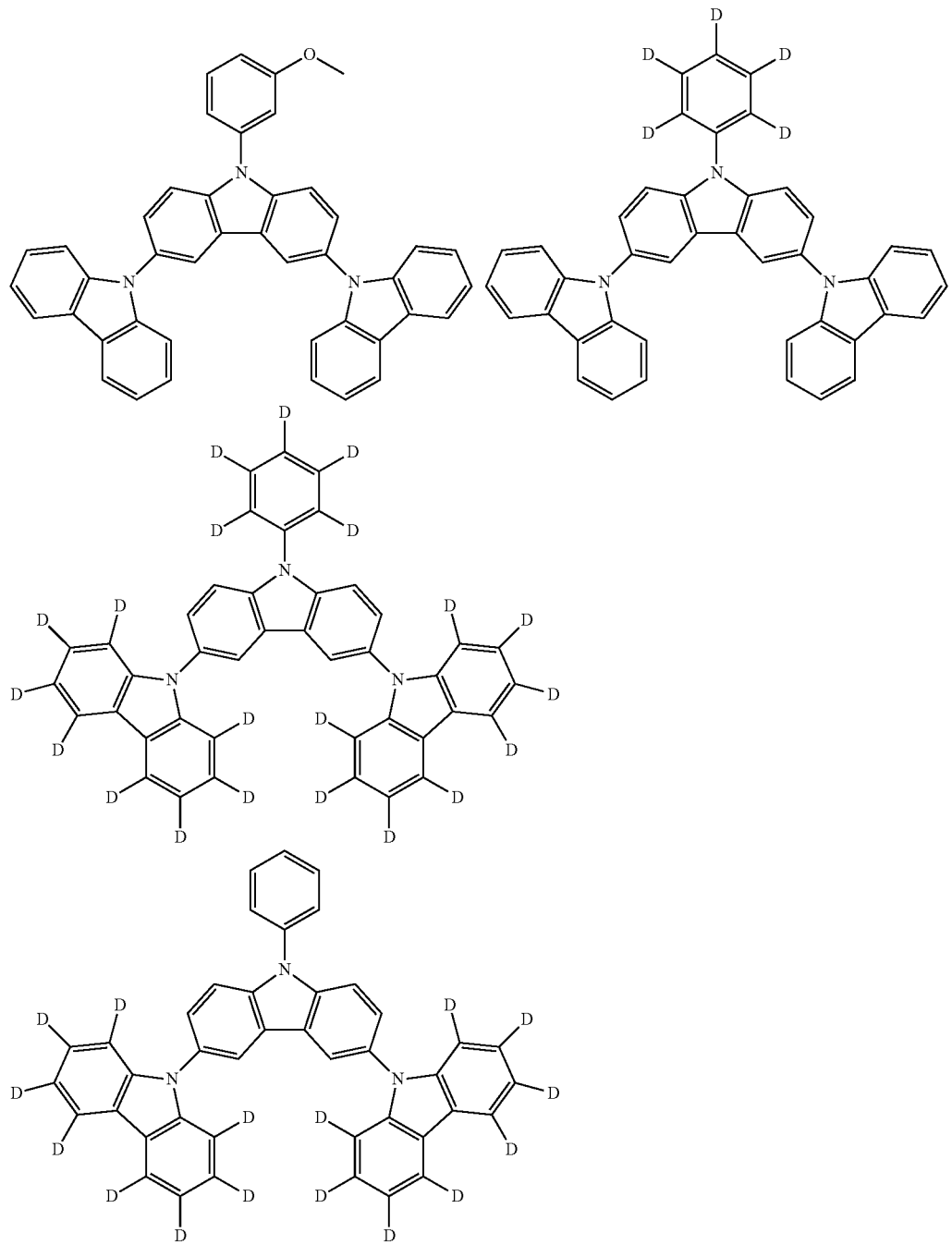

-continued
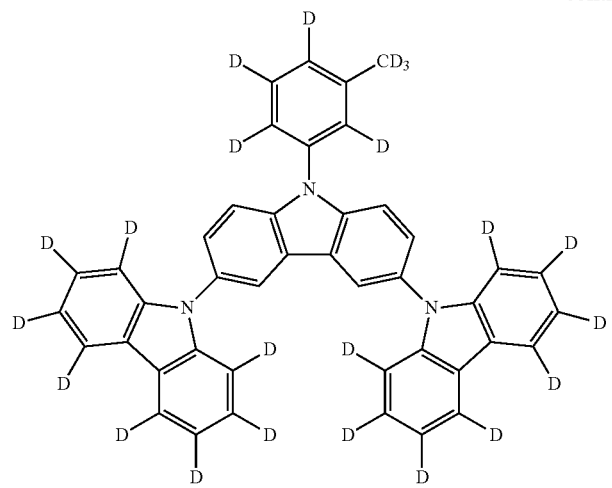
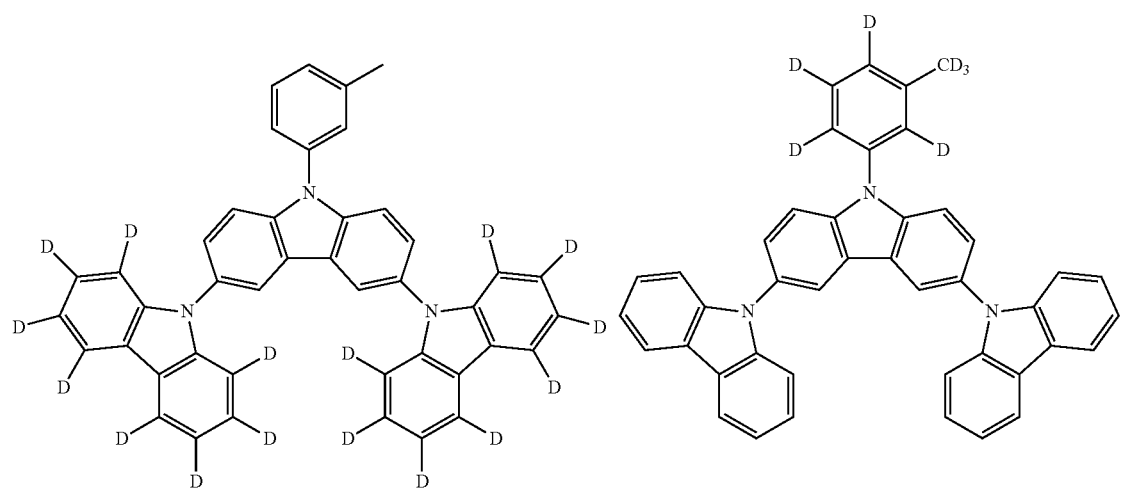
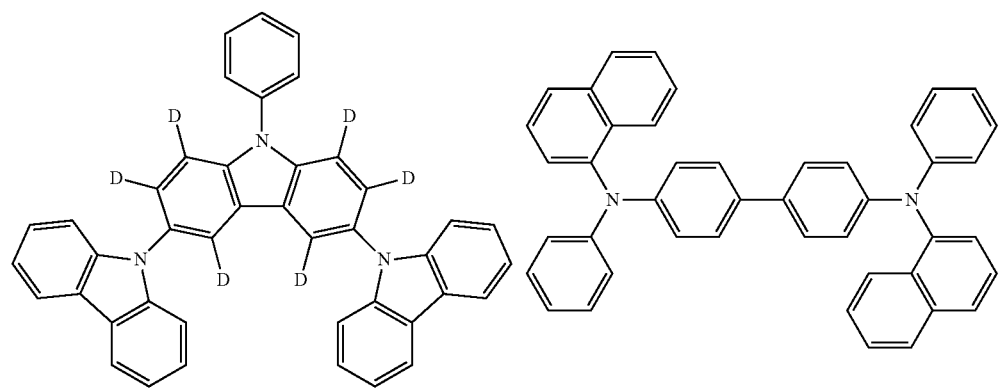

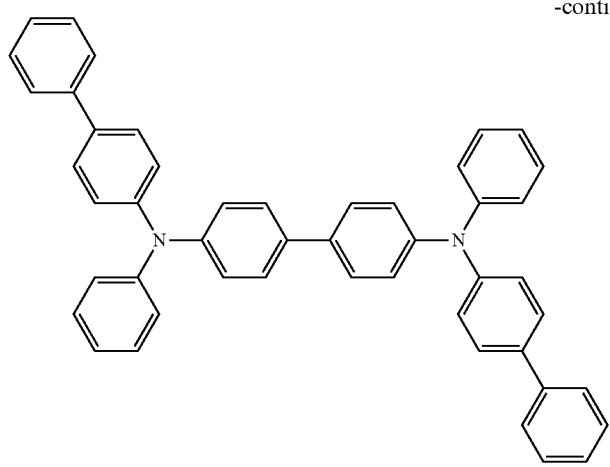
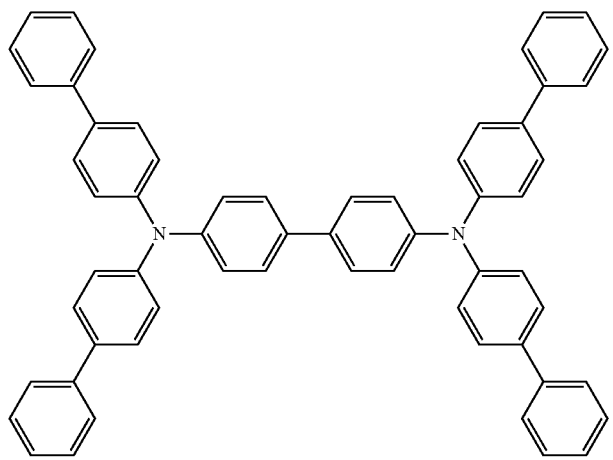
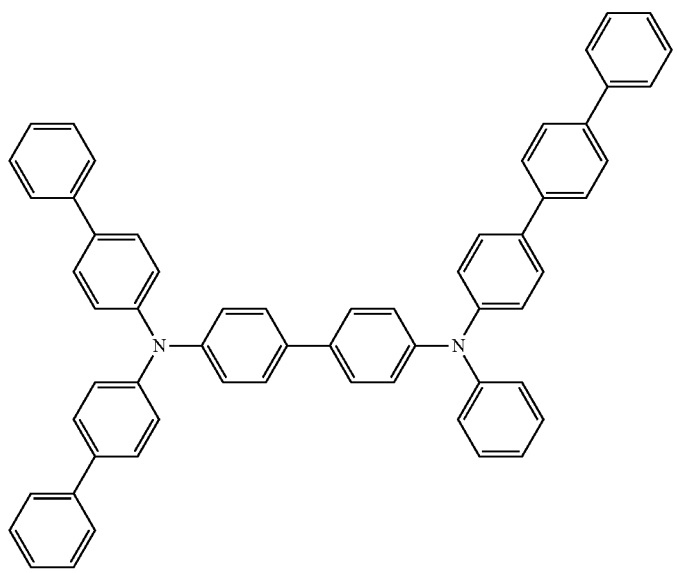

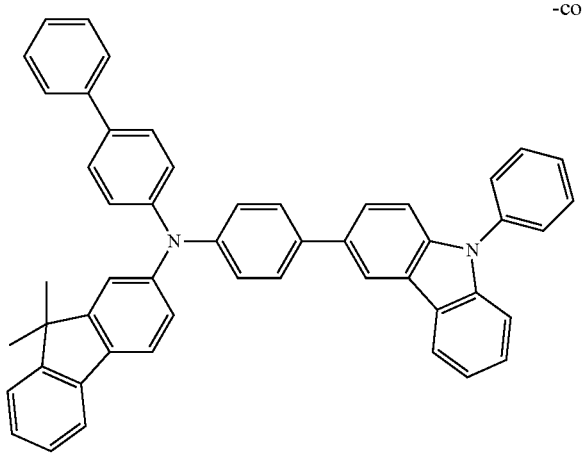
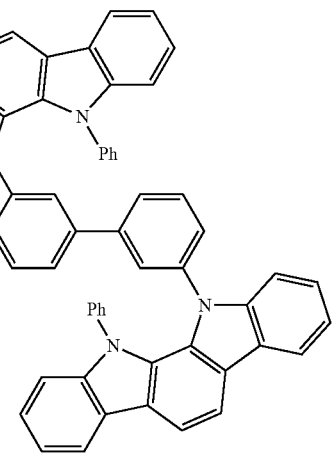

(B) Organic Layer Preferably Disposed Between Cathode and Light Emitting Layer:

Next, the (B) organic layer preferably disposed between the cathode and the light emitting layer is described.

(B-1) Electron Injecting Layer and Electron Transporting Layer:

The electron injecting layer and the electron transporting layer are layers having a function of receiving electrons from the cathode or the cathode side and transporting them to the anode side. The electron injecting material and the electron transporting material used in these layers may be either a low-molecular compound or a high-molecular compound.

As the electron transporting material, for example, the compound represented by the general formula (1) can be used. As other electron transporting materials, any one of compounds selected from pyridine derivatives, quinoline derivatives, pyrimidine derivatives, pyrazine derivatives, phthalazine derivatives, phenanthroline derivatives, triazine derivatives, triazole derivatives, oxazole derivatives, oxadiazole derivatives, imidazole derivatives, benzimidazole derivatives, imidazopyridine derivatives, fluorenone derivatives, anthraquinodimethane derivatives, anthrone derivatives, diphenylquinone derivatives, thiopyranedioxide derivatives, carbodiimide derivatives, fluorenylidenemethane derivatives, distyrylpyrazine derivatives, aromatic ring tetracarboxylic acid anhydrides of naphthalene, parylene and the like, phthalocyanine derivatives, various metal complexes typified by metal complexes of 8-quinolinol derivatives, metal phthalocyanine and metal complexes having benzoxazole or benzothiazole as a ligand thereof, organic silane derivatives typified by silole, and hydrocarbon compounds with fused rings such as naphthalene, anthracene, phenanthrene, triphenylene and pyrene is preferred. Any one of compounds selected from pyridine derivatives, benzimidazole derivatives, imidazopyridine derivatives, metal complexes, and hydrocarbon compounds with fused rings are more preferred.

From the viewpoint of decreasing the driving voltage, the thickness of each of the electron injecting layer and the electron transporting layer is preferably not more than 500 nm.

The thickness of the electron transporting layer is preferably from 1 nm to 500 nm, more preferably from 5 nm to 200 nm, and still more preferably from 10 nm to 100 nm. In addition, the thickness of the electron injecting layer is preferably from 0.1 nm to 200 nm, more preferably from 0.2 nm to 100 nm, and still more preferably from 0.5 nm to 50 nm.

The electron injecting layer and the electron transporting layer may have either a single layer structure composed of one or two or more kinds of materials selected from the above-exemplified materials or a multilayer structure composed of a plurality of layers having the same composition or different compositions.

The electron injecting layer preferably contains an electron donating dopant. By incorporating the electron donating dopant into the electron injecting layer, for example, there are brought such effects that the electron injecting properties are enhanced; that the driving voltage is lowered; and that the efficiency is enhanced. The electron donating dopant may be any one of organic materials and inorganic materials as long as it is capable of giving electrons to the material to be doped and generating radical anions. Examples thereof include dihydroimidazole compounds such as tetrathiafulvalene (TTF), tetrathianaphthacene (TTT), and bis-[1,3-diethyl-2-methyl-1,2-dihydrobenzimidazolyl], lithium, and cesium.

The electron donating dopant in the electron injecting layer is contained in the amount of preferably from 0.01% by mass to 50% by mass, more preferably from 0.1% by mass to 40% by mass, and still more preferably from 0.5% by mass to 30% by mass relative to the total mass of the compounds forming the electron injecting layer.

(B-2) Hole Blocking Layer:

The hole blocking layer is a layer having a function of preventing holes, which have been transported from the anode side to the light emitting layer, from passing through to the cathode side. In the present invention, the hole blocking layer can be provided as an organic layer adjacent to the light emitting layer on the cathode side.

In order to inhibit the energy transfer of excitons generated in the light emitting layer to prevent degradation of luminous efficiency, $T_1$ energy in the film state of the organic compound constituting the hole blocking layer is preferably higher than the $T_1$ energy of the light emitting material.

As an example of the organic compound constituting the hole blocking layer, for example, the compound represented by the general formula (1) can be used.

Examples of the organic compounds constituting the hole blocking layer, other than the compound represented by the general formula (1), include aluminum complexes such as aluminum (III) tris-8-hydroxyquinoline (abbreviated as "Alq") and aluminum (III) bis(2-methyl-8-quinolinato) 4-phenylphenolate (abbreviated as "Balq"), triazole derivatives, and phenanthroline derivatives such as 2,9-dimethyl-4, 7-diphenyl-1,10-phenanthroline (abbreviated as "BCP"). In the present invention, the function of the hole blocking layer is not limited to the function of actually blocking the holes, and the hole blocking layer may have a function to prevent the excitons in the light emitting layer from diffusing to the electron transporting layer, or a function to block quenching due to energy transfer. The compound represented by the general formula (1) is preferably applied to the hole blocking layer.

The thickness of the hole blocking layer is preferably from 1 nm to 500 nm, more preferably from 3 nm to 100 nm, and still more preferably from 5 nm to 50 nm.

The hole blocking layer may have either a single layer structure composed of one or more materials selected from the above-exemplified materials or a multilayer structure composed of a plurality of layers having the same composition or different compositions.

The material which is used in the hole blocking layer preferably has higher $T_1$ energy than that of the phosphorescence emitting material in view of color purity, luminous efficiency, and driving durability.

(B-3) Material Especially Preferably Used in Organic Layer, which is Preferably Disposed Between Cathode and Light Emitting Layer:

For the organic electroluminescent element according to the present invention, examples of the material which is especially preferably used in the materials for the (B) organic layer preferably disposed between the cathode and the light emitting layer include the compound represented by the general formula (1), an aromatic hydrocarbon compound (in particular, a compound represented by the following general formula ($T_p$-1)), and a compound represented by the following general formula (O-1).

The aromatic hydrocarbon compound and a compound represented by the general formula (O-1) are hereunder described.

[Aromatic Hydrocarbon Compound]

The aromatic hydrocarbon compound is preferably contained in an organic layer that is located between the light emitting layer and the cathode and adjacent to the light emitting layer, but is not limited in the use and may be further contained in any layer of the organic layers. The layer into which the aromatic hydrocarbon compound is introduced is any one of a light emitting layer, a hole injecting layer, a hole transporting layer, an electron transporting layer, an electron injecting layer, an exciton blocking layer and a charge blocking layer, or the compound may be contained in plural layers.

The organic layer that is located between the light emitting layer and the cathode and adjacent to the light emitting layer, into which the aromatic hydrocarbon compound is to be contained, is preferably a blocking layer (hole blocking layer, exciton blocking layer) or an electron transporting layer, and more preferably an electron transporting layer.

In the case where the aromatic hydrocarbon compound is contained in a layer other than the light emitting layer, the compound is preferably contained in an amount of from 70 to 100% by mass, and more preferably 85 to 100% by mass. In the case where the aromatic hydrocarbon compound is contained in the light emitting layer, the compound is preferably contained in an amount of from 0.1 to 99% by mass %, more preferably contained in an amount of from 1 to 95% by mass, and more preferably contained in an amount of from 10 to 95% by mass, relative to the total mass of the light emitting layer.

As the aromatic hydrocarbon compound, a hydrocarbon compound which has a molecular weight ranging from 400 to 1200 and has a fused polycyclic skeleton having a total carbon number of from 13 to 22 is preferably used. The fused polycyclic skeleton having a total carbon number of from 13 to 22 is preferably any one of fluorene, anthracene, phenanthrene, tetracene, chrysene, pentacene, pyrene, perylene and triphenylene, more preferably, from the viewpoint of the $T_1$, a fluorene, triphenylene and phenanthrene, still more preferably, from the viewpoint of compound stability and electron injecting and transporting properties, triphenylene, and especially preferably a compound represented by the following general formula (Tp-1).

The hydrocarbon compound represented by the general formula (Tp-1) preferably has a molecular weight ranging from 400 to 1200, more preferably from 400 to 1100, and still more preferably from 400 to 1000. When the molecular weight is 400 or more, an amorphous thin film of good quality can be formed, and the molecular weight of 1200 or less is preferred in terms of solubility in solvent and applicability to sublimation and vapor deposition.

The hydrocarbon compound represented by the general formula (Tp-1) is not limited in the use, and may be contained not only in the organic layer adjacent to the light emitting layer but in any layer in the organic layers.

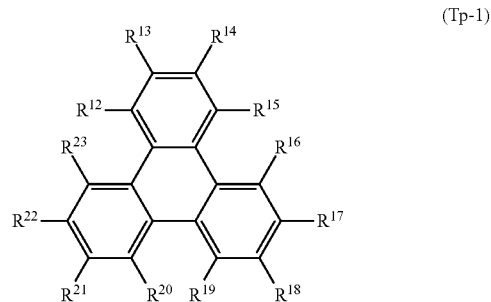

(Tp-1)

In the general formula (Tp-1), $R^{12}$ to $R^{23}$ each independently represent a hydrogen atom, an alkyl group, a phenyl group, a fluorenyl group, a naphthyl group or a triphenylenyl group (these groups may be further substituted with an alkyl group, a phenyl group, a fluorenyl group, a naphthyl group or a triphenylenyl group), provided that not all of $R^{12}$ to $R^{23}$ are a hydrogen atom.

Examples of the alkyl group represented by $R^{12}$ to $R^{23}$ include a substituted or unsubstituted, for example, methyl group, ethyl group, isopropyl group, n-butyl group, tert-butyl group, n-octyl group, n-decyl group, n-hexadecyl group, cyclopropyl group, cyclopentyl group, cyclohexyl group, etc., preferably a methyl group, ethyl group, isopropyl group, tert-butyl group and cyclohexyl group, and more preferably a methyl group, ethyl group and tert-butyl group.

$R^{12}$ to $R^{23}$ is preferably a phenyl group, a fluorenyl group, a naphthyl group or a triphenylenyl group, which may be substituted with an alkyl group having from 1 to 4 carbon atoms, a phenyl group, a fluorenyl group, a naphthyl group or a triphenylenyl group (which may be further substituted with an alkyl group, a phenyl group, a fluorenyl group, a naphthyl group or a triphenylenyl group).

$R^{12}$ to $R^{23}$ is preferably a benzene ring which may be substituted with a phenyl group, a fluorenyl group, a naphthyl group or a triphenylenyl group (which may further substituted with an alkyl group, a phenyl group, a fluorenyl group, a naphthyl group or a triphenylenyl group.

The total number of the aryl ring in the general formula (Tp-1) is preferably 2 to 8, and more preferably 3 to 5. When the aryl ring number is in this range, it is possible to form an amorphous thin film of high quality and to achieve good solubility in solvent and good applicability to sublimation and vapor deposition.

$R^{12}$ to $R^{23}$ preferably each independently have a total carbon number of from 20 to 50, and more preferably a total carbon number of from 20 to 36. When the total carbon number is in this range, it is possible to form an amorphous thin film of high quality and to achieve good solubility in solvent and good applicability to sublimation and deposition.

The hydrocarbon compound represented by the general formula (Tp-1) is preferably a hydrocarbon compound represented by the following general formula (Tp-2).

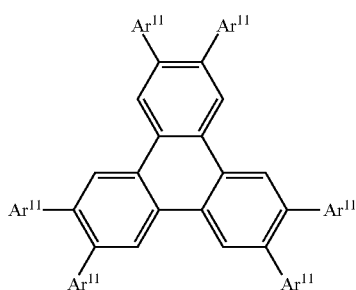

(Tp-2)

In the general formula (Tp-2), plural $Ar^{11}$s are the same, and each represent an alkyl group, a phenyl group, a fluorenyl group, naphthyl group or a triphenylenyl group (these groups may be further substituted with an alkyl group, a phenyl group, a fluorenyl group, a naphthyl group or a triphenylenyl group).

The hydrogen atom, the alkyl group, a phenyl group, a fluorenyl group, a naphthyl group or a triphenylenyl group that $Ar^{11}$ represents (these groups may be further substituted with an alkyl group, a phenyl group, a fluorenyl group, a naphthyl group or a triphenylenyl group) has the same definitions as enumerated for $R^{12}$ to $R^{23}$, and preferred ones are also the same.

The hydrocarbon compound represented by the general formula (Tp-1) is also preferably a hydrocarbon compound represented by the following general formula (Tp-3).

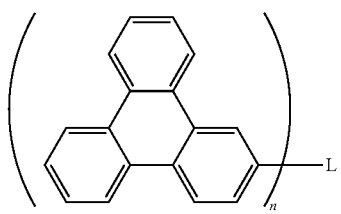

General Formula (Tp-3)

In the general formula (Tp-3), L represents an alkyl group, a phenyl group, a fluorenyl group, a naphthyl group or a triphenylenyl group (these groups may be further substituted with an alkyl group, a phenyl group, a fluorenyl group, a naphthyl group or a triphenylenyl group), or an n-valent linking group formed by combining these groups. n represents an integer of from 2 to 6.

An alkyl group, a phenyl group, a fluorenyl group, a naphthyl group or a triphenylenyl group which forms the n-valent linking group represented by L has the same definitions as enumerated for $R^{12}$ to $R^{23}$.

L is preferably a benzene ring or a fluorene ring which may be substituted by an alkyl group or a benzene ring, or an n-valent linking group formed by combining these groups.

Specific preferred examples of L are listed below, but L is not limited thereto. In the specific examples, the group is bound at * to a triphenylene ring.

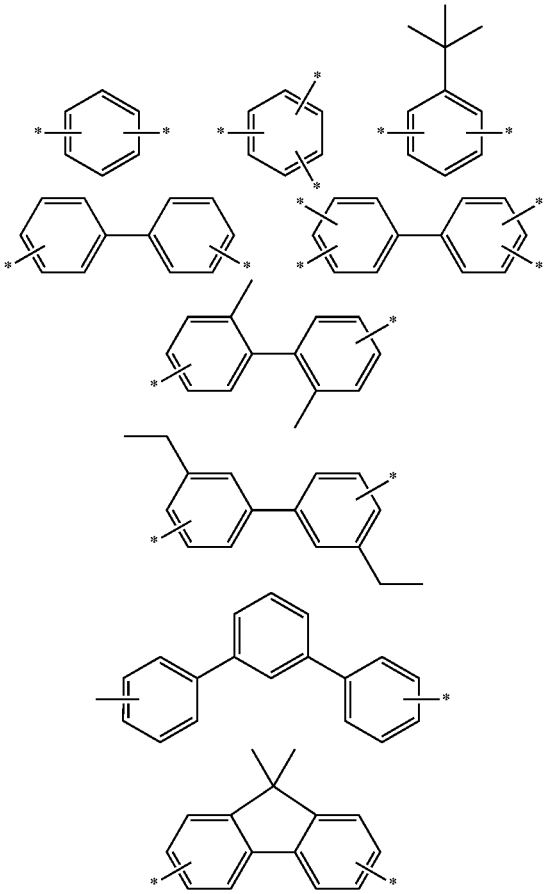

n is preferably from 2 to 5, and more preferably from 2 to 4.

The compound represented by the general formula (Tp-1) is preferably a compound represented by the following general formula (Tp-4).

General Formula (Tp-4)

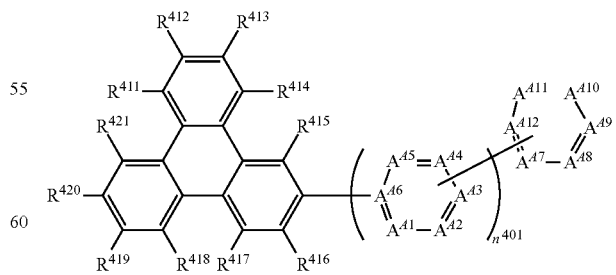

(in the general formula (Tp-4), $A^{41}$ to $A^{412}$ each independently represent $CR^{400}$ or a nitrogen atom. $n^{401}$ represents an integer of from 0 to 8. When $n^{401}$ is 0, the ring represented by $A^{41}$ to $A^{46}$ represents a single bond between the triphenylene ring and the ring represented by $A^{47}$ to $A^{412}$. When $n^{401}$ is from 2 to 6, the plural rings represented by $A^{41}$ to $A^{46}$ may be different for each appearance, and the plural linking modes between the rings may be different for each appearance.)

Incidentally, in the present invention, the hydrogen atoms in the description of the general formula (Tp-4) include isotopes (deuterium atom, and the like), and any atoms constituting the further substituent also include the isotopes thereof.

In the general formula (Tp-4), $R^{411}$ to $R^{421}$ each independently represent a hydrogen atom, an alkyl group, a phenyl group, a fluorenyl group, a naphthyl group or a triphenylenyl group (which may be further substituted with an alkyl group, a phenyl group, a fluorenyl group, a naphthyl group or a triphenylenyl group).

$R^{411}$ to $R^{421}$ each are preferably a hydrogen atom, an alkyl group having from 1 to 4 carbon atoms, a phenyl group, a fluorenyl group, a naphthyl group or a triphenylenyl group (which may be further substituted with an alkyl group, a phenyl group, a fluorenyl group, a naphthyl group or a triphenylenyl group), more preferably a hydrogen atom, a phenyl group (the phenyl group may be substituted with an alkyl group, a phenyl group, a fluorenyl group, a naphthyl group or a triphenylenyl group), and especially preferably a hydrogen atom.

$A^{41}$ to $A^{412}$ each are preferably $CR^{400}$.

In the general formula (Tp-4), the substituent represented by $R^{400}$ preferably represents a hydrogen atom, an alkyl group having from 1 to 4 carbon atoms, a phenyl group, a fluorenyl group, a naphthyl group or a triphenylenyl group (which may be further substituted with an alkyl group, a phenyl group, a fluorenyl group, a naphthyl group or a triphenylenyl group). The plural $R^{400}$s may be different from each other.

Preferably, $R^{400}$ is preferably a hydrogen atom, an alkyl group having from 1 to 4 carbon atoms, a phenyl group, a fluorenyl group, a naphthyl group or a triphenylenyl group (which may be further substituted with an alkyl group, a phenyl group, a fluorenyl group, a naphthyl group or a triphenylenyl group), more preferably a hydrogen atom, an alkyl group having from 1 to 4 carbon atoms, a phenyl group (the phenyl group may be substituted with an alkyl group, a phenyl group, a fluorenyl group, a naphthyl group or a triphenylenyl group), and especially preferably a hydrogen atom, an alkyl group having from 1 to 4 carbon atoms, a phenyl group (the phenyl group may be substituted with an alkyl group, a phenyl group, a fluorenyl group, a naphthyl group or a triphenylenyl group).

$n^{401}$ is preferably an integer of from 0 to 5, more preferably an integer of from 1 to 5, and especially preferably from 2 to 4.

$n^{401}$ is an integer of 1 or more; and when the linking position to the ring represented by $A^{47}$ to $A^{412}$ is $A^{43}$, from the viewpoint of luminous efficiency, the substituent represented by $A^{44}$ or $A^{45}$ is $CR^{400}$; and $R^{400}$ is preferably an alkyl group having from 1 to 4 carbon atoms or a phenyl group, more preferably an alkyl group having from 1 to 4 carbon atoms, and especially preferably a methyl group.

In the general formula (Tp-4), among the 6-membered aromatic rings constituted of $A^{41}$ to $A^{412}$, the number of the ring containing a nitrogen atom is preferably at most one, and more preferably zero. In the general formula (Tp-4), the connection of the 6-membered aromatic rings constituted of $A^{41}$ to $A^{412}$ has no restriction, but the rings preferably are connected on meta- or para-positions. Furthermore, with regard to the compound represented by the general formula (Tp-4), the number of the aromatic rings which are sequentially connected on their para-positions is preferably three or less, including the phenyl ring which is a partial structure of the fused ring constituting the triphenylene ring.

In the case where the hydrocarbon compound represented by the general formula (Tp-1) is used in a host material of a light emitting layer or in a charge transporting material of a layer adjacent to the light emitting layer, in an organic electroluminescent element, when the energy gap in the thin film state (in the case of the light emitting material being a phosphorescence emitting material, which is the minimum excited triplet ($T_1$) energy in the thin film state) is larger than in the light emission material, the quench of the light emission is prevented, which is advantageous in enhancing the efficiency. On the other hand, from the viewpoint of chemical stability of the compound, it is preferred that an energy gap and $T_1$ energy are not too large. The $T_1$ energy in the film state of the hydrocarbon compound represented by the general formula (Tp-1) is preferably 1.77 eV (40 kcal/mol) or higher and 3.51 eV (81 kcal/mol) or lower, and more preferably 2.39 eV (55 kcal/mol) or higher and 3.25 eV (75 kcal/mol) or lower. In the organic electroluminescent element according to the present invention, it is preferred from the viewpoint of luminous efficiency that the $T_1$ energy of the compound represented by the general formula (Tp-1) is higher than the $T_1$ energy of the above-mentioned phosphorescence emitting material. In particular, in the case where the luminescent color from the organic electroluminescent element is green (the emission peak wavelength is from 490 to 580 nm), it is more preferred from the viewpoint of luminous efficiency that the $T_1$ energy is 2.39 eV (55 kcal/mol) or higher and 2.82 eV (65 kcal/mol) or lower.

The $T_1$ energy of the hydrocarbon compound represented by the general formula (Tp-1) can be determined by the same method as in the explanation of the general formula (1) described above.

From the viewpoint of stable operation of the organic electroluminescent element, when being driven at a high temperature, or against the heat generation during the element driving, the glass transition temperature (Tg) of the hydrocarbon compound according to the present invention is preferably 80° C. or higher and 400° C. or lower, more preferably 100° C. or higher and 400° C. or lower, and still more preferably 120° C. or higher and 400° C. or lower.

Specific examples of the hydrocarbon compound characterized by being represented by the general formula (Tp-1) are listed below, but the hydrocarbon compound used in the present invention is not to be limited thereto.

171　　　　　　　　　　　　　　　　　　　　172
Tph-1　　　　　　　　　　　　　　　　　　　Tph-2
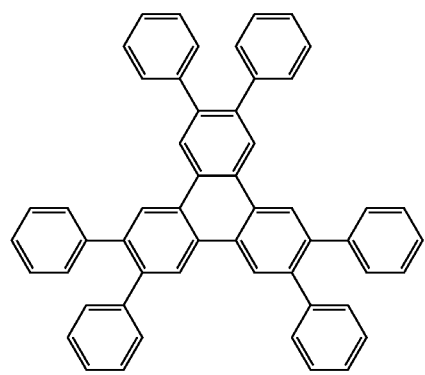
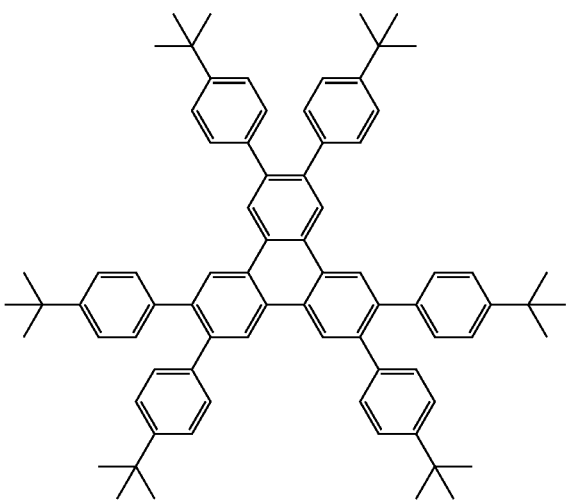
Tph-3　　　　　　　　　　　　　　　　　　　Tph-4
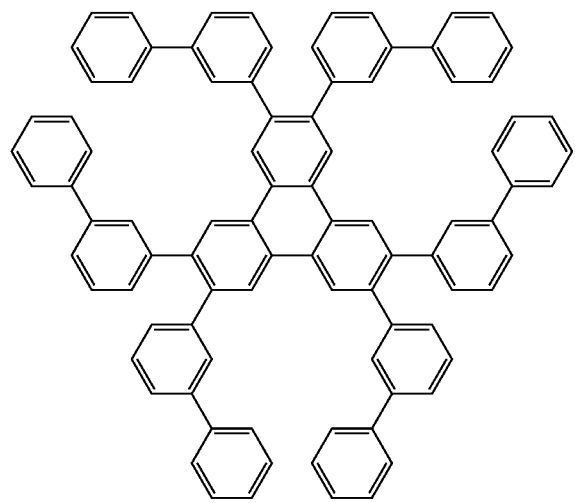
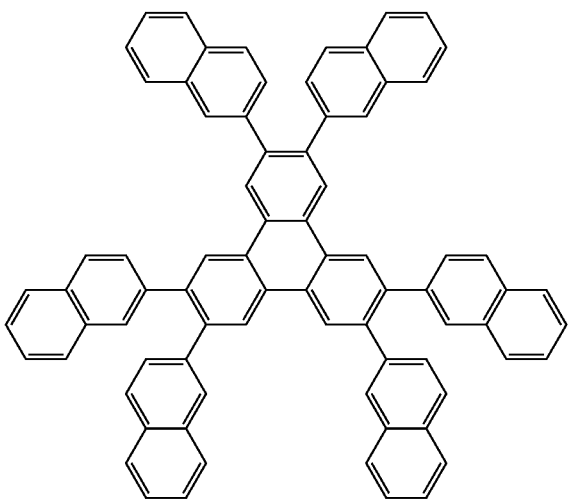
TpH-5
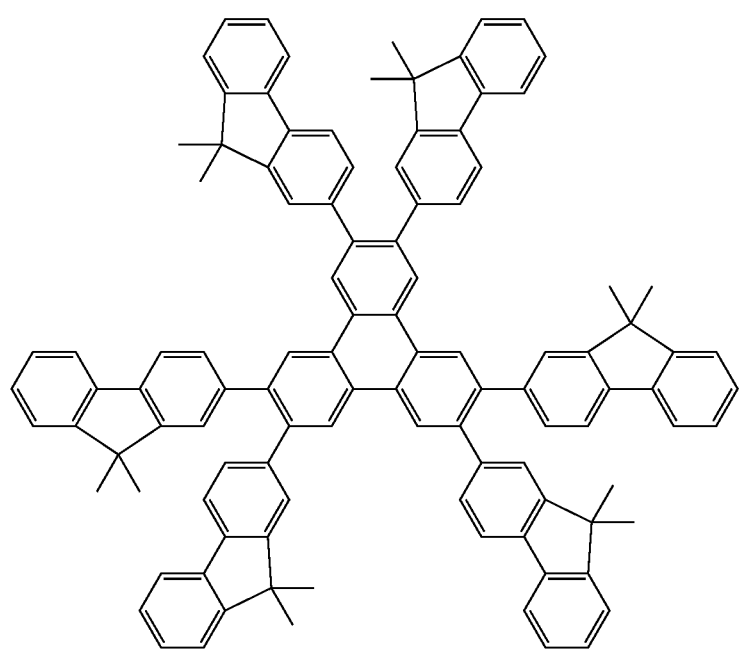

TpH-6
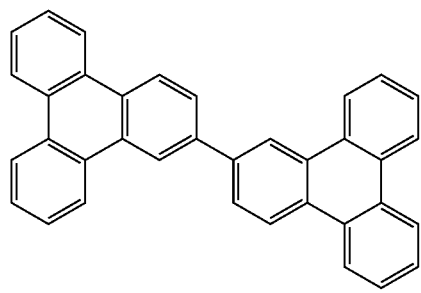
TpH-7
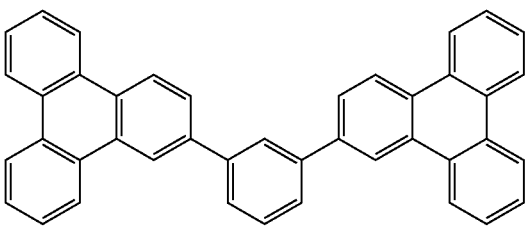
TpH-8
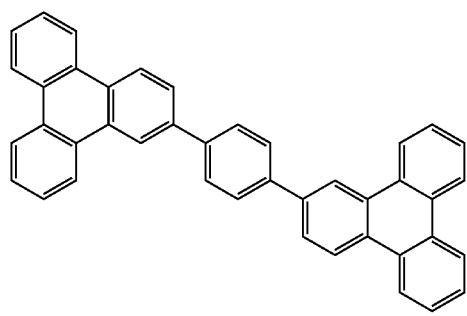
TpH-9
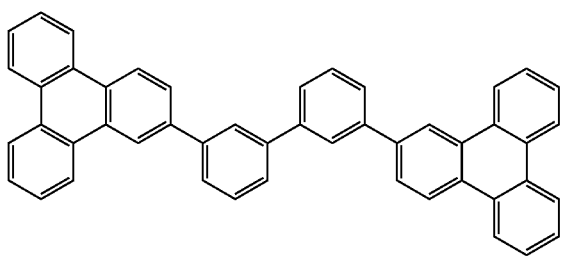
TpH-10
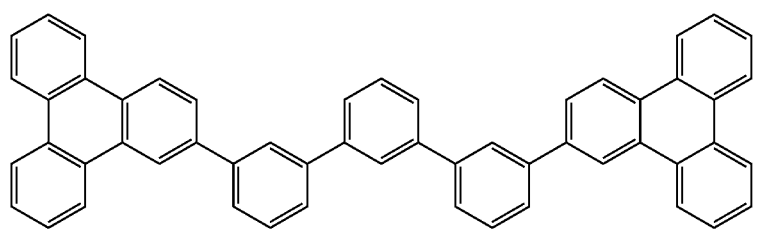
TpH-11
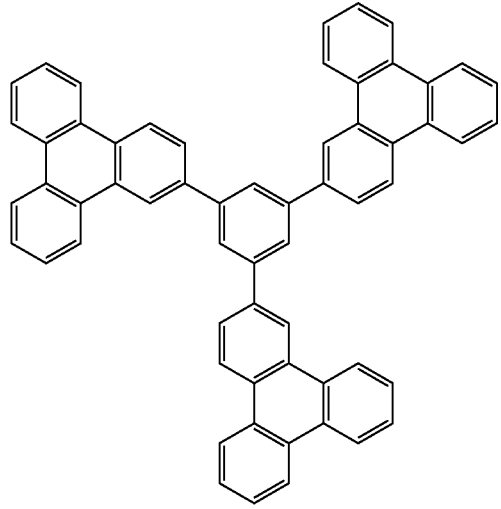
TpH-12
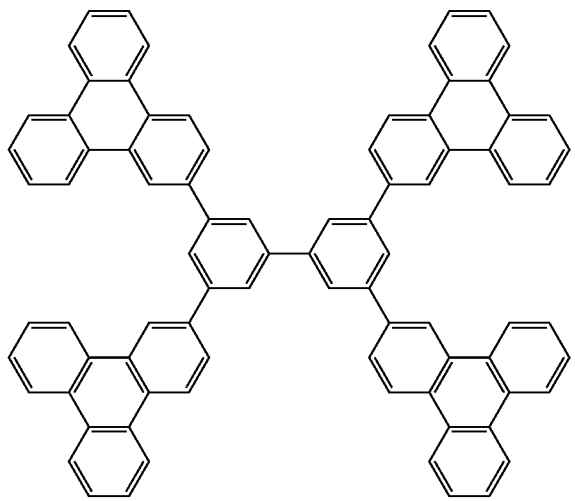

-continued
TpH-13
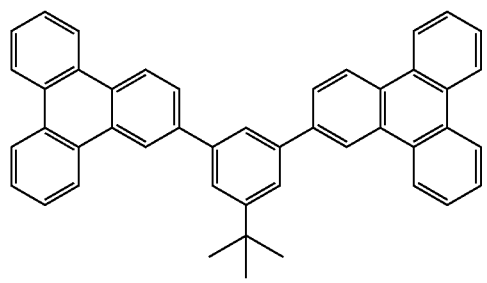
TpH-14
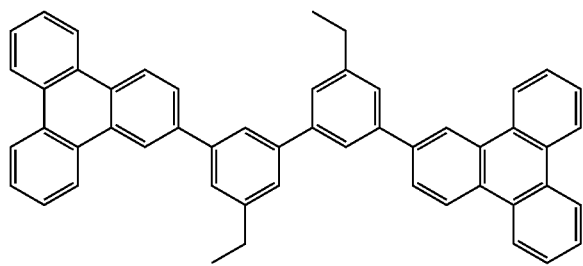
TpH-15
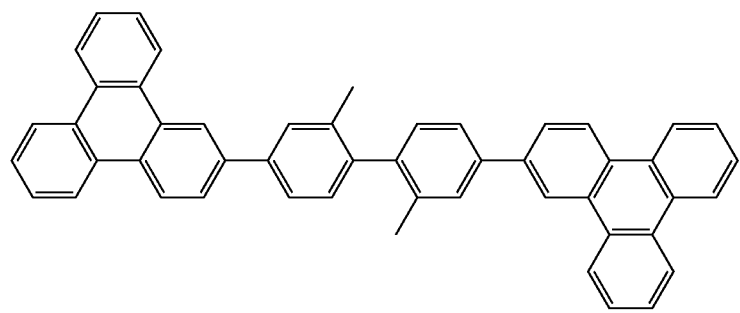
TpH-16
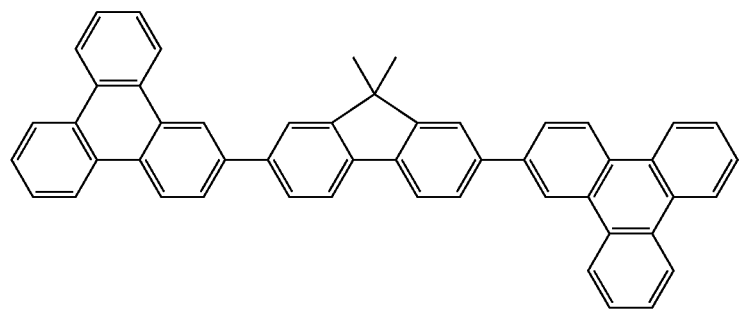
TpH-17
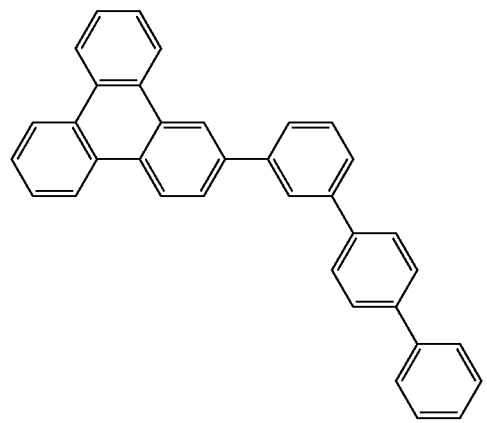
TpH-18
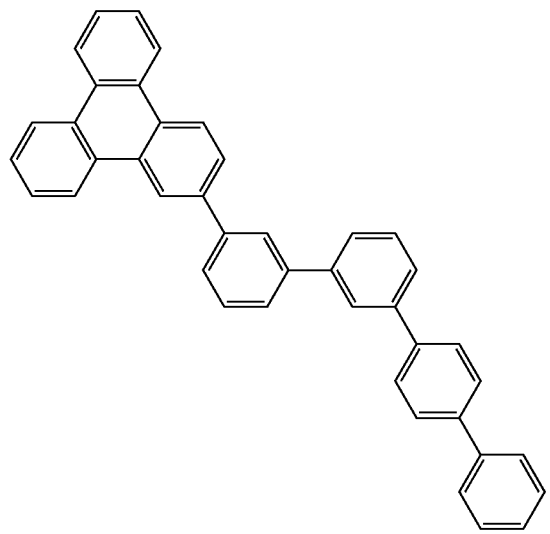

-continued
TpH-19
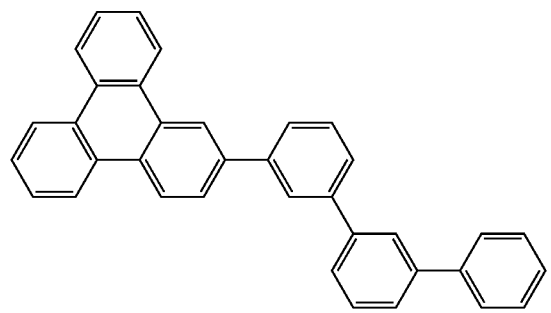
TpH-20
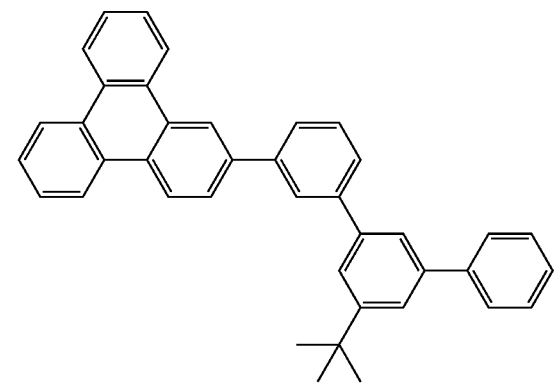
TpH-21
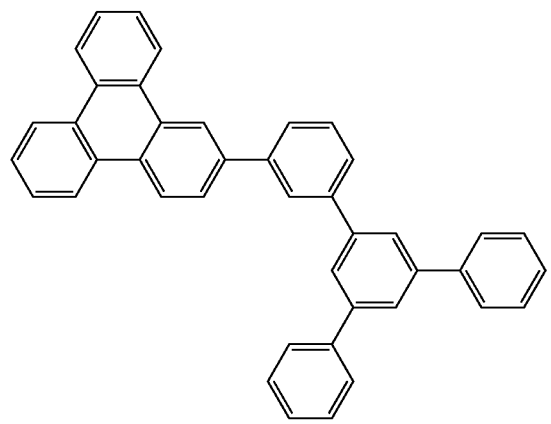
TpH-22
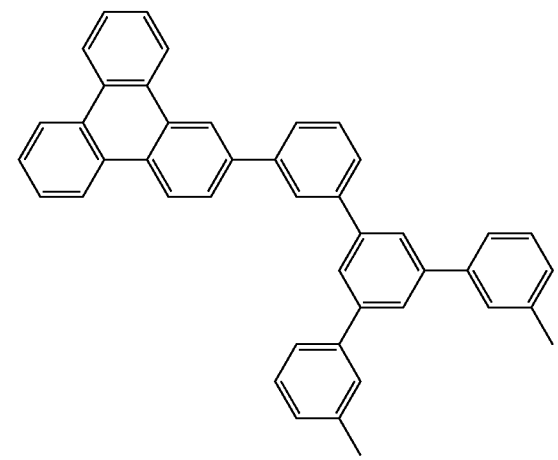
TpH-23
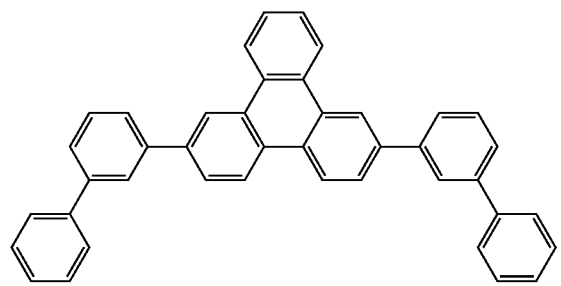
TpH-24
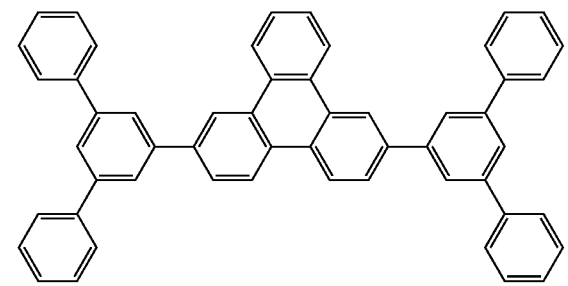
TpH-25
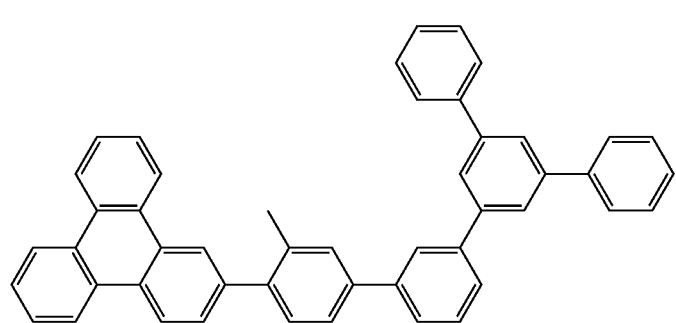

TpH-26

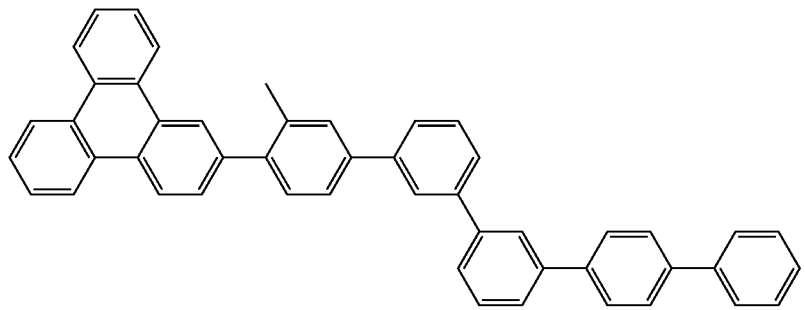

The above-exemplified compounds as the hydrocarbon compound represented by general formula (Tp-1) can be synthesized by the methods described in WO 05/013388, WO 06/130598, WO 09/021,107, US 2009/0009065, WO 09/008, 311, and WO 04/018587.

After the synthesis, it is preferred that the product is purified by column chromatography, recrystallization, and the like, and then purified by sublimation purification. By sublimation purification, it is possible not only to separate the organic impurities but also to effectively remove the inorganic salts, remaining solvent, etc.

[Compound Represented by the General Formula (O-1)]

As a material especially preferably used for the material of the (B) organic layer which is preferably disposed between the cathode and the light emitting layer, the compound represented by the following general formula (O-1) is preferably used, from the viewpoint of efficiency and driving voltage of the organic electroluminescent element. The general formula (O-1) is hereunder described.

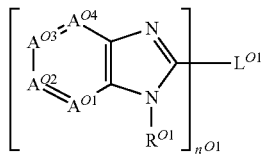

(O-1)

In the general formula (O-1), $R^{O1}$ represents an alkyl group, an aryl group, or a heteroaryl group. $A^{O1}$ to $A^{O4}$ each independently represent C—$R^4$ or a nitrogen atom. $R^4$ represents a hydrogen atom, an alkyl group, an aryl group or a heteroaryl group, and plural $R^4$s may be the same as or different from each other. $L^{O1}$ represents a divalent to hexavalent linking group composed of an aryl ring or a heteroaryl ring. $n^{O1}$ represents an integer of from 2 to 6.

$R^{O1}$ represents an alkyl group (preferably having from 1 to 8 carbon atoms), an aryl group (preferably having from 6 to 30 carbon atoms), or a heteroaryl group (preferably having from 4 to 12 carbon atoms), which may have a substituent selected from the above-described Substituent Group A. $R^{O1}$ is preferably an aryl group or a heteroaryl group, and more preferably an aryl group. Preferred examples of the substituent in the case where the aryl group of $R^{O1}$ has a substituent include an alkyl group, an aryl group, and a cyano group. Among them, an alkyl group or an aryl group are more preferred, with an aryl group being still more preferred. In the case where the aryl group of $R^{O1}$ has plural substituents, the plural substituents may be bound to each other to form a 5- or 6-membered ring. The aryl group of $R^{O1}$ is preferably a phenyl group which may have a substituent selected from the Substituent Group A, more preferably a phenyl group which may be substituted with an alkyl group or an aryl group, and still more preferably an unsubstituted phenyl group or a 2-phenylphenyl group.

$A^{O1}$ to $A^{O4}$ each independently represent C—$R^4$ or a nitrogen atom. It is preferred that from zero to two of $A^{O1}$ to $A^{O4}$ are a nitrogen atom; and it is more preferred that zero or one of $A^{O1}$ to $A^{O4}$ is a nitrogen atom. It is preferred that all of $A^{O1}$ to $A^{O4}$ are C—$R^4$, or $A^{O1}$ is a nitrogen atom, and $A^{O2}$ to $A^{O4}$ are C—$R^4$; it is more preferred that $A^{O1}$ is a nitrogen atom, and $A^{O2}$ to $A^{O4}$ are C—$R^4$; and it is still more preferred that $A^{O1}$ is a nitrogen atom, $A^{O2}$ to $A^{O4}$ are C—$R^4$, and $R^4$s are all a hydrogen atom.

$R^4$ represents a hydrogen atom, an alkyl group (preferably having from 1 to 8 carbon atoms), an aryl group (preferably having from 6 to 30 carbon atoms), or a heteroaryl group (preferably having from 4 to carbon atoms), and may have a substituent selected from the above-described Substituent Group $Z^T$. In addition, plural $R^4$s may be the same as or different from one another. $R^4$ is preferably a hydrogen atom or an alkyl group, and more preferably a hydrogen atom.

$L^{O1}$ represents a divalent to hexavalent linking group composed of an aryl ring (preferably having from 6 to 30 carbon atoms) or a heteroaryl ring (preferably having from 4 to 12 carbon atoms). $L^{O1}$ is preferably an arylene group, a heteroarylene group, an aryltriyl group, or a heteroaryltriyl group, more preferably a phenylene group, a biphenylene group, or a benzenetriyl group, and still more preferably a biphenylene group or a benzenetriyl group. $L^{O1}$ may have a substituent selected from the above-described Substituent Group $Z^T$, and in the case where $L^{O1}$ has a substituent, the substituent is preferably an alkyl group, an aryl group, or a cyano group. Specific examples of $L^{O1}$ include the following.

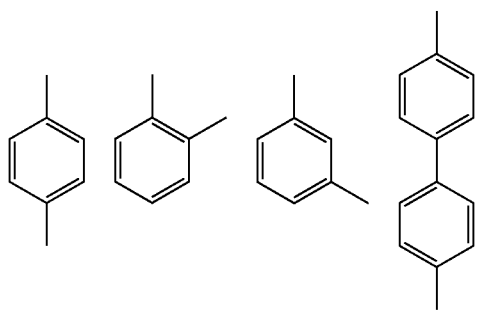

-continued

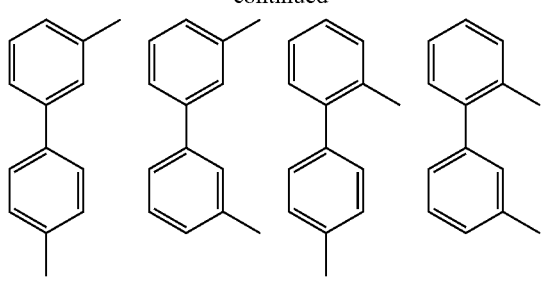
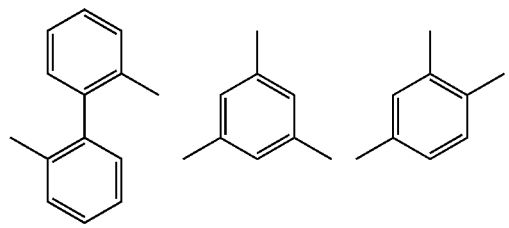
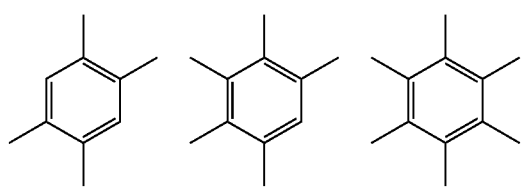
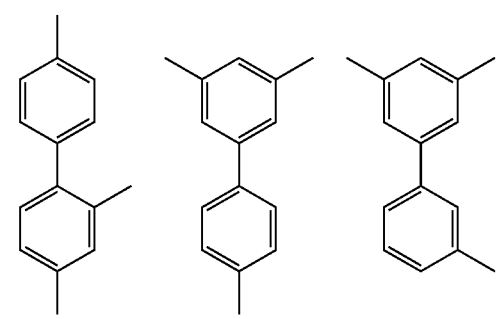
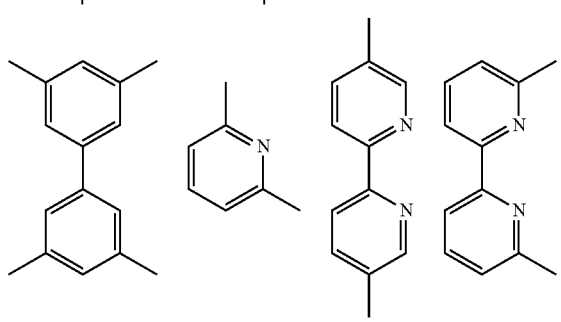
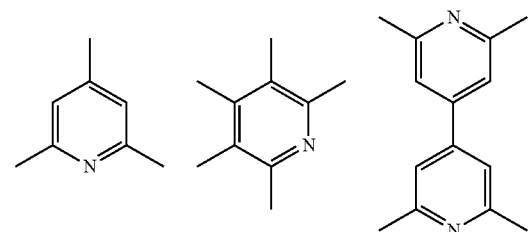

-continued

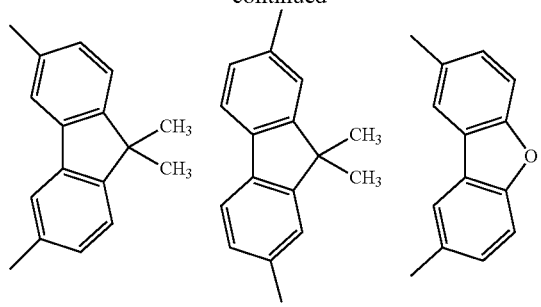
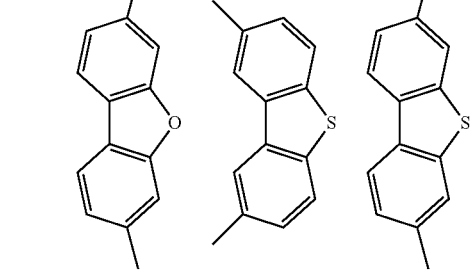
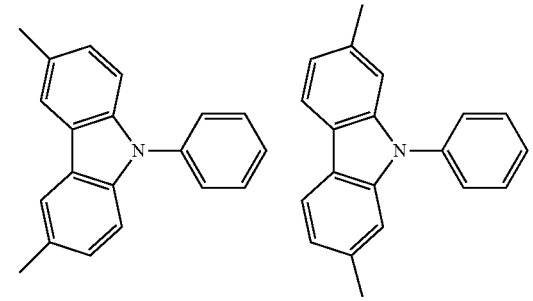

$n^{O1}$ represents an integer of from 2 to 6, preferably an integer of from 2 to 4, and more preferably 2 or 3. $n^{O1}$ is most preferably 3 from the viewpoint of efficiency of the organic electroluminescent element, or $n^{O1}$ is most preferably 2 from the viewpoint of durability of the organic electroluminescent element.

The compound represented by the general formula (O-1) is preferably a compound represented by the following general formula (O-2).

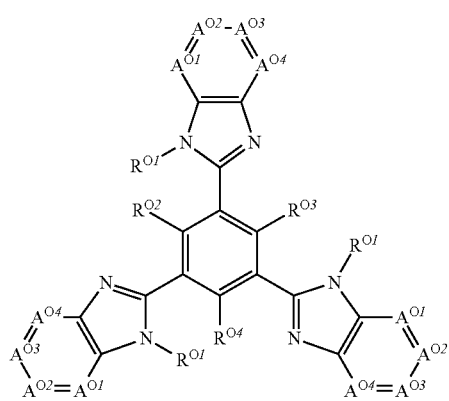

(O-2)

In the general formula (O-2), $R^{O1}$s each independently represent an alkyl group, an aryl group or a heteroaryl group. $R^{O2}$ to $R^{O4}$ each independently represent a hydrogen atom, an alkyl group, an aryl group or a heteroaryl group. $A^{O1}$ to $A^{O4}$ each independently represent C—$R^4$ or a nitrogen atom. $R^4$ represents a hydrogen atom, an alkyl group, an aryl group or a heteroaryl group, and the plural $R^4$s may be the same as or different from one another.

$R^{O1}$ and $A^{O1}$ to $A^{O4}$ have the same definitions as $R^{O1}$ and $A^{O1}$ to $A^{O4}$ in the general formula (O-1) described above, and the preferred ranges thereof are also the same.

$R^{O2}$ to $R^{O4}$ each independently represent a hydrogen atom, an alkyl group (preferably having 1 to 8 carbon atoms), an aryl group (preferably having 6 to 30 carbon atoms), or a heteroaryl group (preferably having 4 to 12 carbon atoms), and these groups may have a substituent selected from the Substituent Group A described above. $R^{O2}$ to $R^{O4}$ are preferably a hydrogen atom, an alkyl group or an aryl group, more preferably a hydrogen atom or an aryl group, and most preferably a hydrogen atom.

The glass transition temperature (Tg) of the compound represented by the general formula (O-1) is preferably from 100° C. to 400° C., more preferably from 120° C. to 400° C., still more preferably from 140° C. to 400° C., from the viewpoint of stability at the time of storage at a high temperature, or stable operation during driving at a high temperature or against heat generation during driving.

Specific examples of the compound represented by the general formula (O-1) are hereunder described, but the compound used in the present invention is not limited thereto.

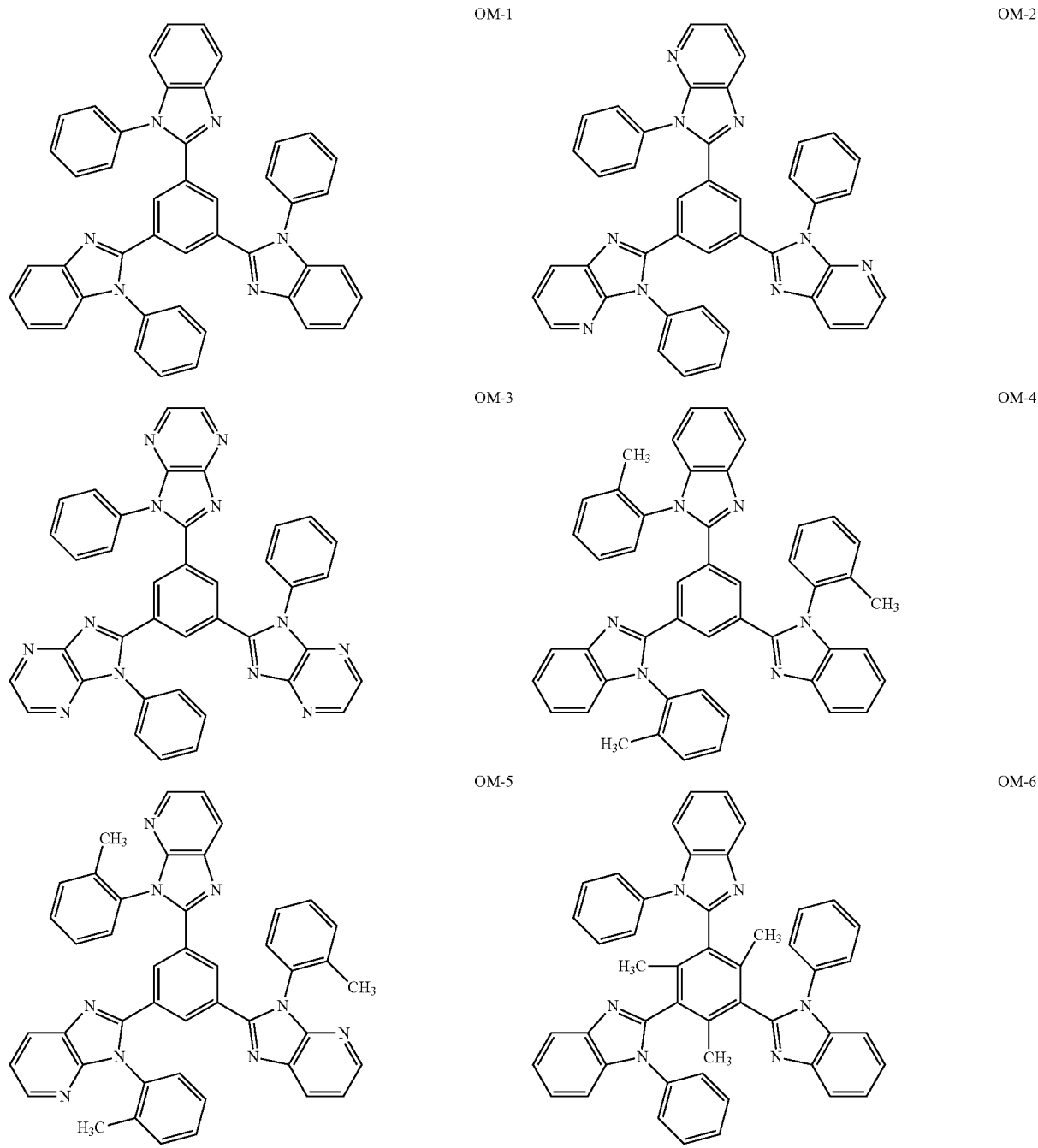

-continued
OM-7
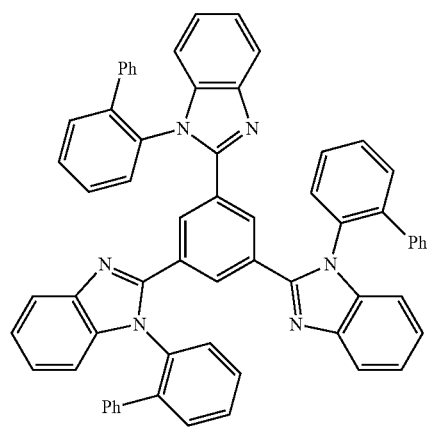
OM-8
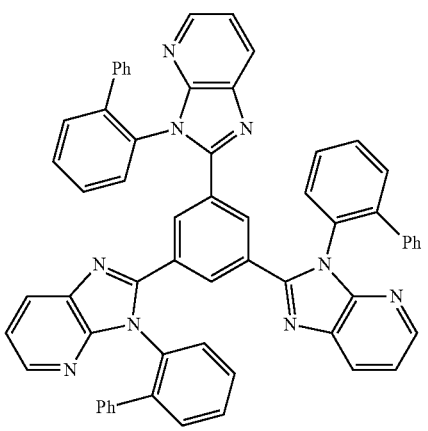
OM-9
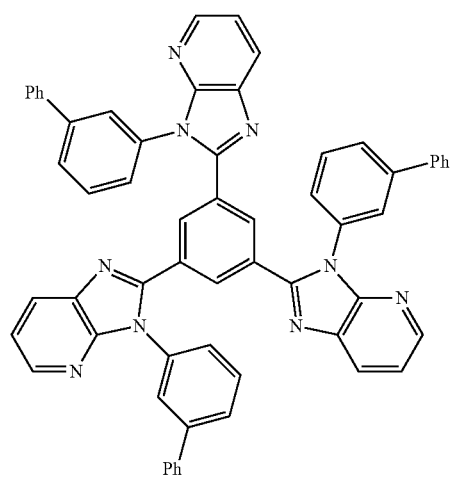
OM-10
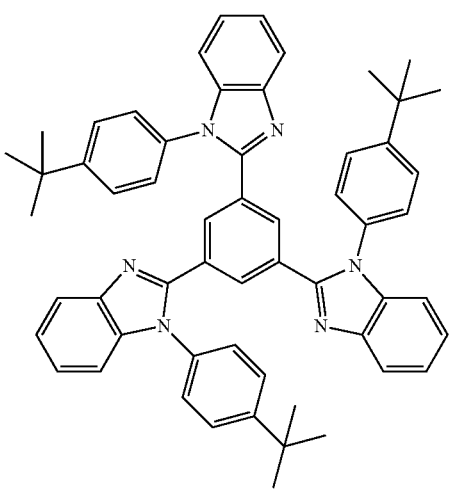
OM-11
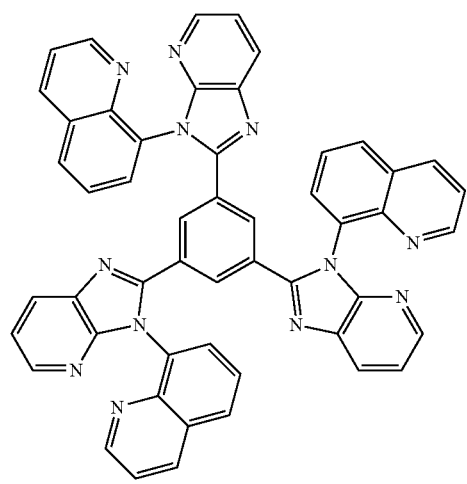
OM-12
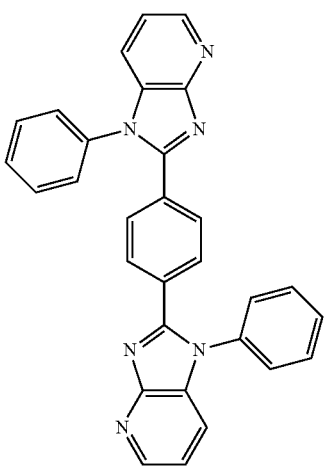

-continued
OM-13
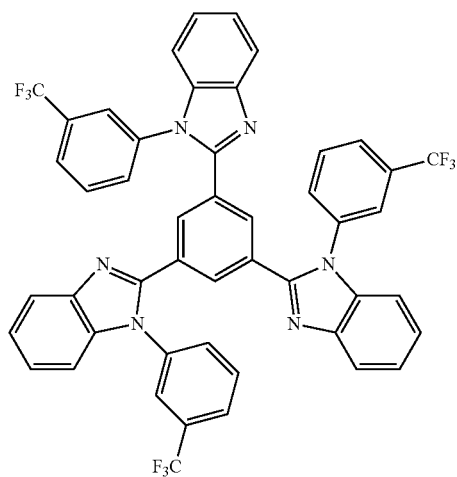
OM-14
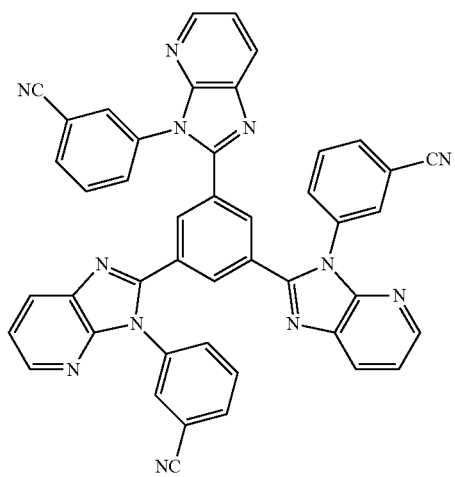
OM-15
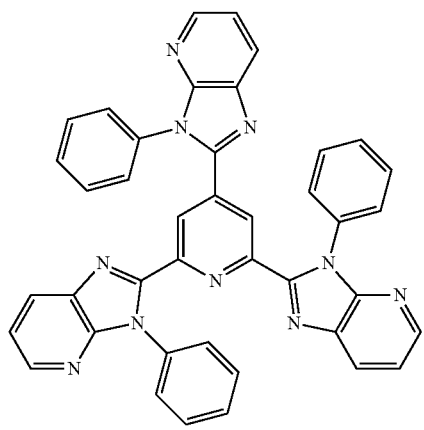
OM-16
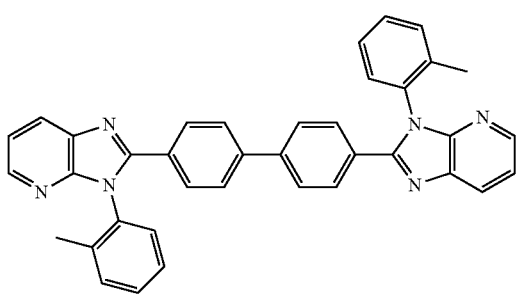
OM-17
OM-18
OM-19
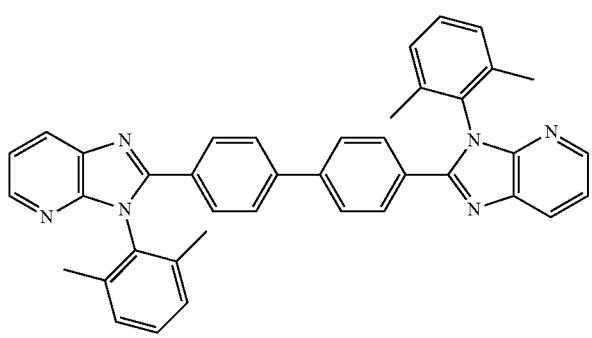
OM-20
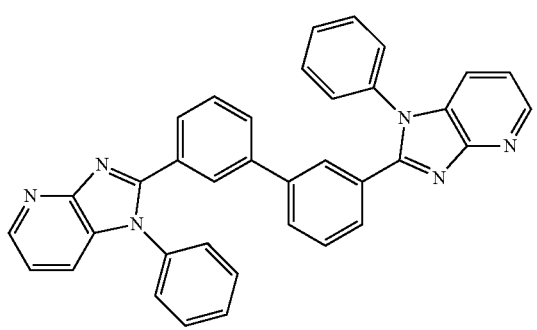

-continued

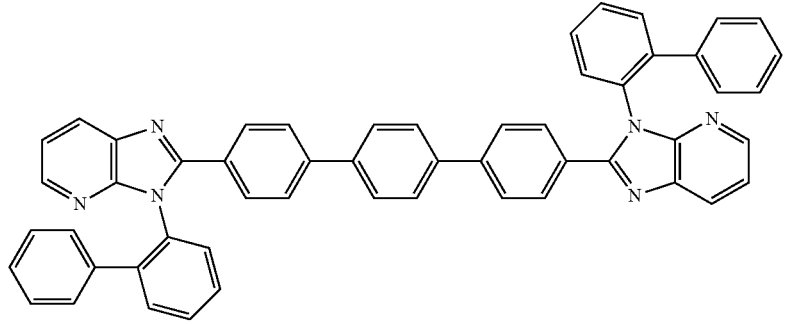

OM-21

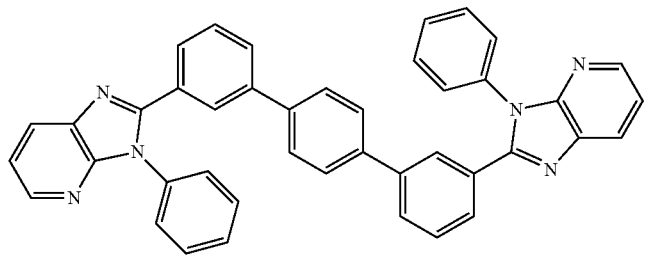

OM-22

The compound represented by the general formula (O-1) can be synthesized by the method described in JP-A-2001-335776. After the synthesis, it is preferred that the product is purified by column chromatography, recrystallization, reprecipitation, and then purified by sublimation purification. By sublimation purification, it is possible not only to separate organic impurities but also to effectively remove inorganic salts, remaining solvent, moisture, or the like.

In the organic electroluminescent element according to the present invention, the compound represented by the general formula (O-1) is preferably contained in an organic layer between the light emitting layer and the cathode, and more preferably contained a layer adjacent to the light emitting layer on the cathode side.

(Method for Forming Organic Layer)

The organic layers in the organic electroluminescent element according to the present invention can be suitably formed by any of dry film forming methods such as a deposition method and a sputtering method, wet type film forming methods (solution coating methods) such as a transfer method, a printing method, a spin coating method, and a bar coating method.

In the organic electroluminescent element according to the present invention, the light emitting layer is preferably formed through a vacuum deposition process. In addition, in the organic electroluminescent element according to the present invention, it is also preferred that the light emitting layer is formed through a wet process.

<Substrate>

The organic electroluminescent element according to the present invention has a substrate.

The substrate used in the present invention is preferably a substrate that does not scatter or decay light emitted from the organic layer. In the case of an organic material, those having excellent heat resistance, dimensional stability, solvent resistance, electrical insulating properties, and processability are preferred.

<Electrodes>

The organic electroluminescent element according to the present invention has a pair of electrodes including an anode and a cathode, disposed on the substrate.

In view of the properties of the light emitting element, at least one electrode of a pair of electrodes, the anode and the cathode, is preferably transparent or semi-transparent.

(Anode)

The anode may be usually one having a function as an electrode of supplying holes into an organic layer, and is not particularly limited in terms of its shape, structure, size, or the like. Further, depending on the use and purpose of the light emitting element, the anode can be suitably selected from the known electrode materials. As described above, the anode is usually provided as a transparent anode.

(Cathode)

The cathode may be usually one having a function as an electrode of injecting electrons to an organic layer, and is not particularly limited in terms of its shape, structure, size, or the like. Further, depending on the use and purpose of the light emitting element, the cathode can be suitably selected from the known electrode materials.

<Protective Layer>

In the present invention, the entirety of the organic electroluminescent element may be protected by a protective layer.

For the protective layer, the detailed description in paragraphs [0169] to [0170] of JP-A-2008-270736 can be applied to the present invention. Incidentally, the materials for the protective layer may be either an inorganic material or an organic material.

<Sealing Enclosure>

For the organic electroluminescent element according to the present invention, the entirety of the element may be sealed using a sealing enclosure.

For the sealing enclosure, the detailed description in paragraph [0171] of JP-A-2008-270736 can be applied to the present invention.

<Driving Method>

The organic electroluminescent element according to the present invention can emit light by applying a direct current (it may include an alternate current component, if desired) voltage (usually from 2 volts to 15 volts) or a direct current between the anode and the cathode.

As a driving method of the organic electroluminescent element according to the present invention, driving methods described in JP-A-2-148687, JP-A-6-301355, JP-A-5-29080, JP-A-7-134558, JP-A-8-234685, and JP-A-8-241047, Japanese Patent No. 2784615, and U.S. Pat. Nos. 5,828,429 and 6,023,308 can be applied.

The external quantum efficiency of the organic electroluminescent element according to the present invention is preferably 7% or more, and more preferably 10% or more. As for the numerical value of the external quantum efficiency, a maximum value of the external quantum efficiency obtained when the organic electroluminescent element is driven at 20° C., or a value of the external quantum efficiency in the vicinity of from 300 to 400 cd/m² obtained when the element is driven at 20° C. can be employed.

The internal quantum efficiency of the organic electroluminescent element according to the present invention is preferably 30% or more, more preferably 50% or more, and still more preferably 70% or more. The internal quantum efficiency of the element is calculated by dividing the external quantum efficiency by the light extraction efficiency. Though the light extraction efficiency in usual organic EL elements is about 20%, by adjusting the shape of a substrate, the shape of an electrode, the film thickness of an organic layer, the film thickness of an inorganic layer, the refractive index of an organic layer, the refractive index of an inorganic layer, or the like, it is possible to increase the light extraction efficiency to 20% or more.

<Light Emitting Wavelength>

The organic electroluminescent element according to the present invention has no limitation in its light emitting wavelength, and may be used for red light emission, green light emission, or blue light emission among the three primary colors of light. Among others, the organic electroluminescent element according to the present invention preferably have a emission peak wavelength of 400 to 700 nm from the viewpoint of luminous efficiency in view of the minimum excision triplet ($T_1$) energy of the compound represented by the general formula (1).

In specific, in the organic electroluminescent element according to the present invention, in the case of using the compound represented by the general formula (1) as a host material of the light emitting layer, or as an electron transporting material of the electron transporting layer or the hole blocking layer, the emission peak wavelength of the guest material is preferably from 400 to 700 nm, more preferably from 450 to 650 nm, and especially preferably from 480 to 550 nm.

<Use of Organic Electroluminescent Element According to the Present Invention>

The organic electroluminescent element according to the present invention can be suitably used for display elements, displays, backlights, electrophotography, illumination light sources, recording light sources, exposure light sources, readout light sources, signs, billboards, interior decorations, optical communications, and the like. In particular, it is preferably used for devices to be driven in a region of high-intensity luminescence, such as a light emitting device, an illumination device, and a display device.

EXAMPLES

The present invention is hereunder described in more detail with reference to the following Examples. The materials, use amounts, ratios, treatment details, treatment procedures, and the like shown in the following Examples can be appropriately modified so far as the gist of the present invention is not deviated. Accordingly, it should not be construed that the scope of the present invention is limited to the specific examples shown below.

Synthesis Example

Synthesis of Compounds 1, 2 and 3

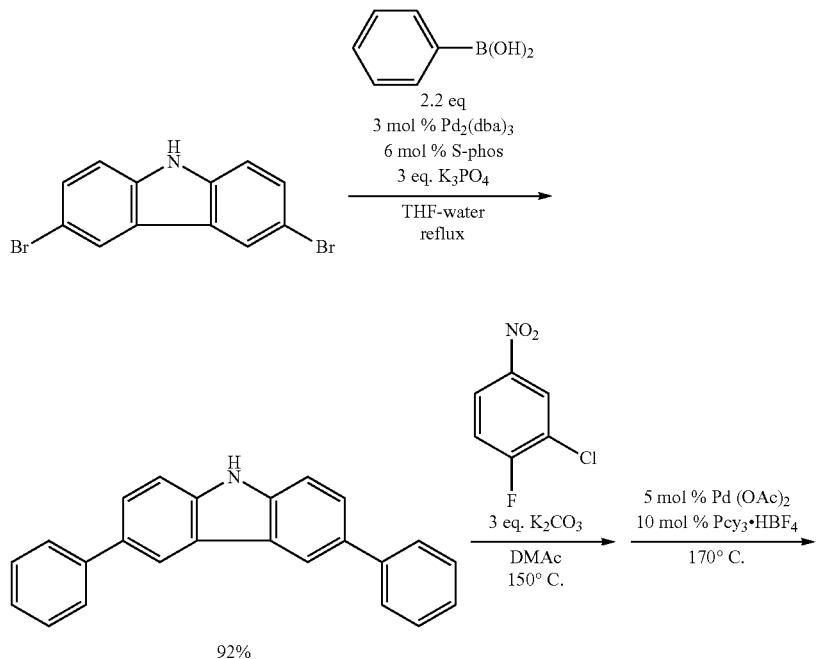

-continued
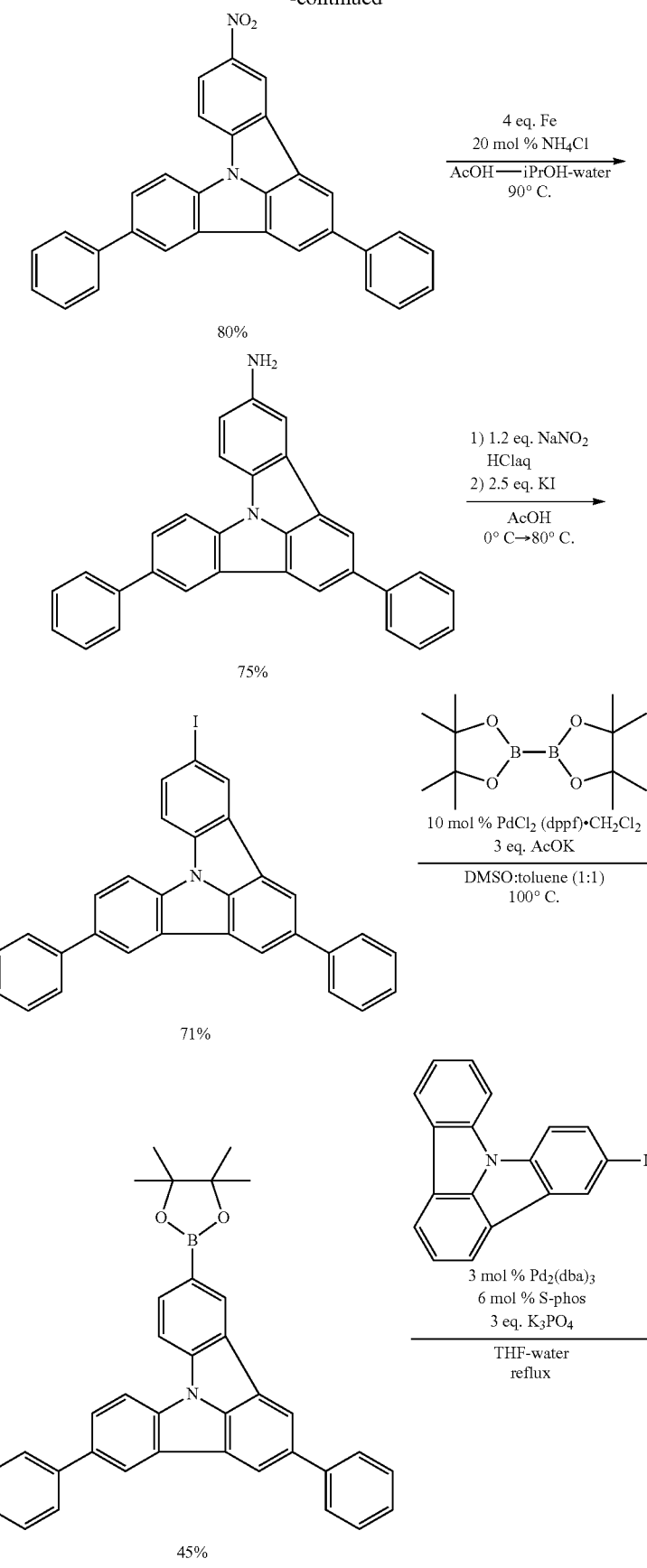

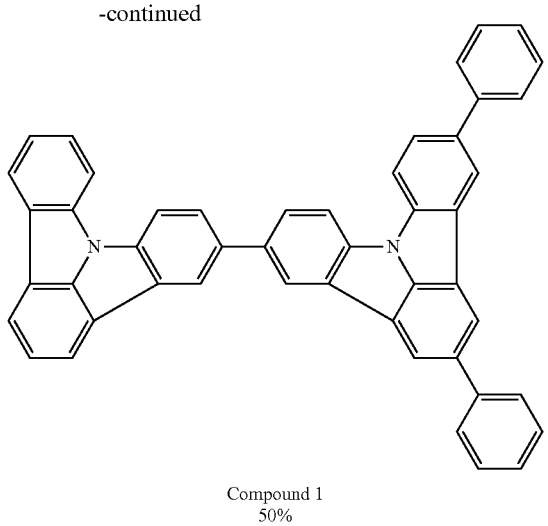
Compound 1
50%
(Synthesis scheme of Compound 2)
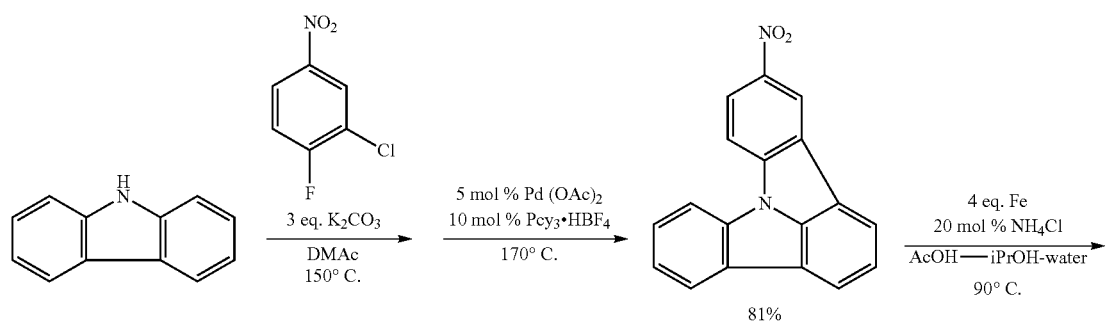
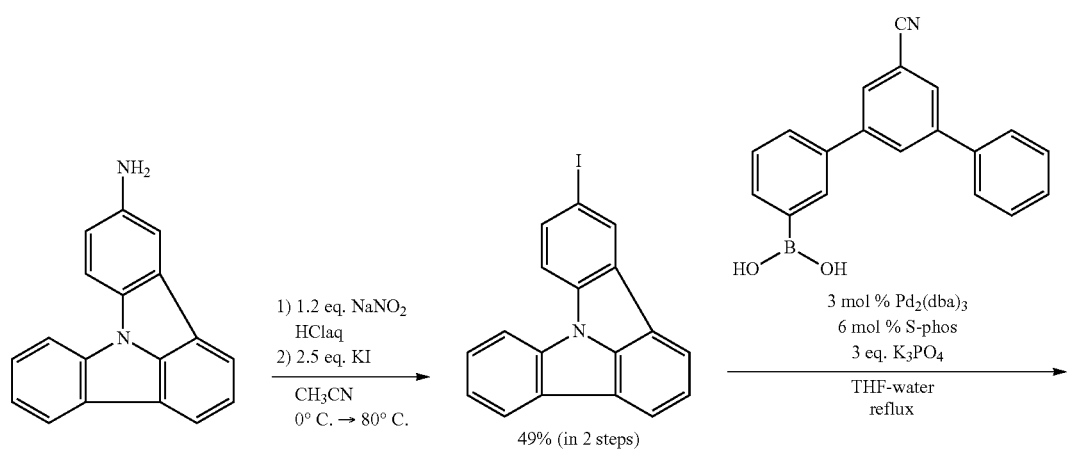

-continued
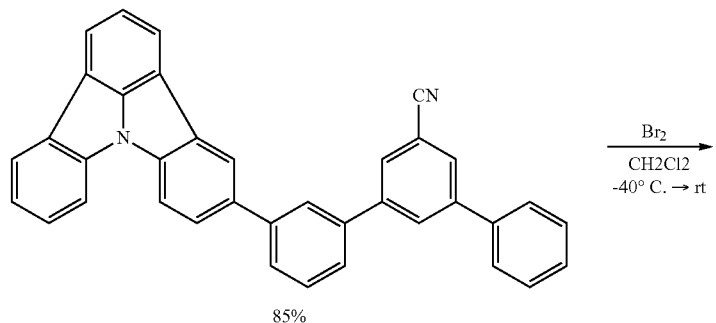
85%
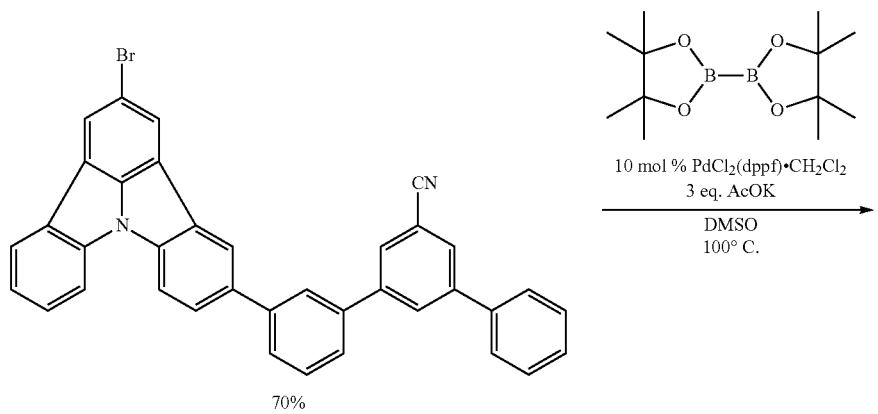
70%
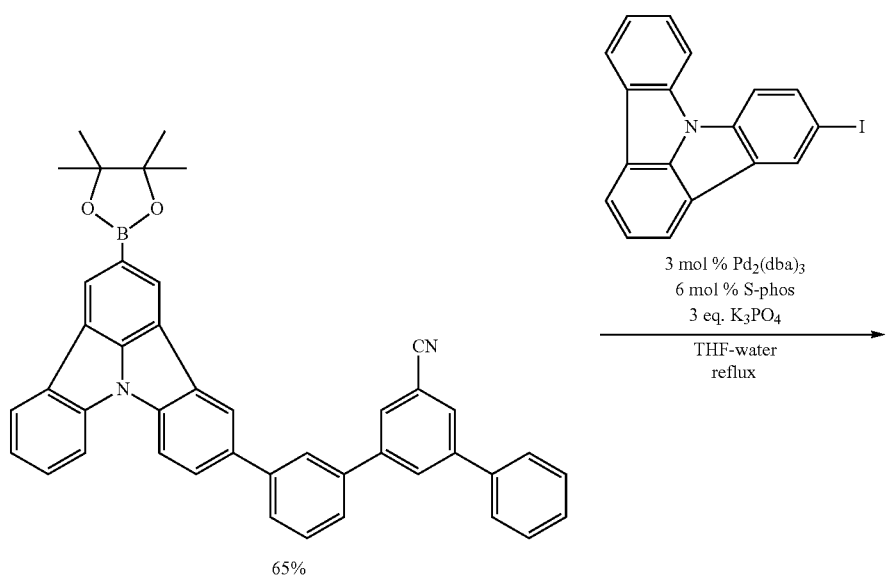
65%

-continued
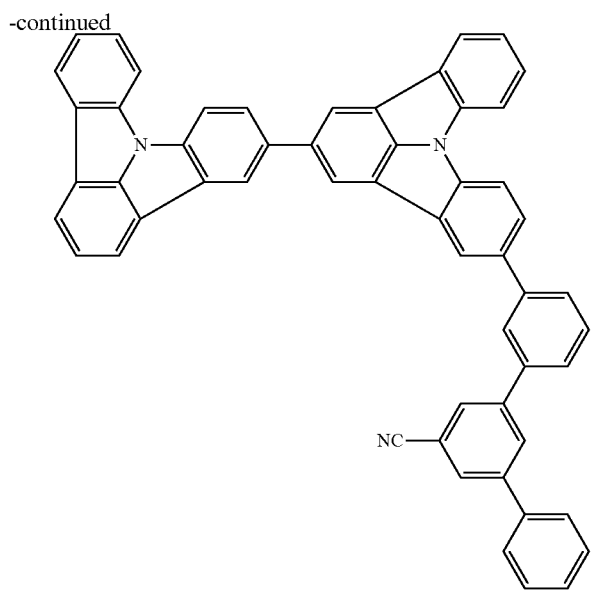
Compound 2
58%
(Synthesis scheme of Compound 3)
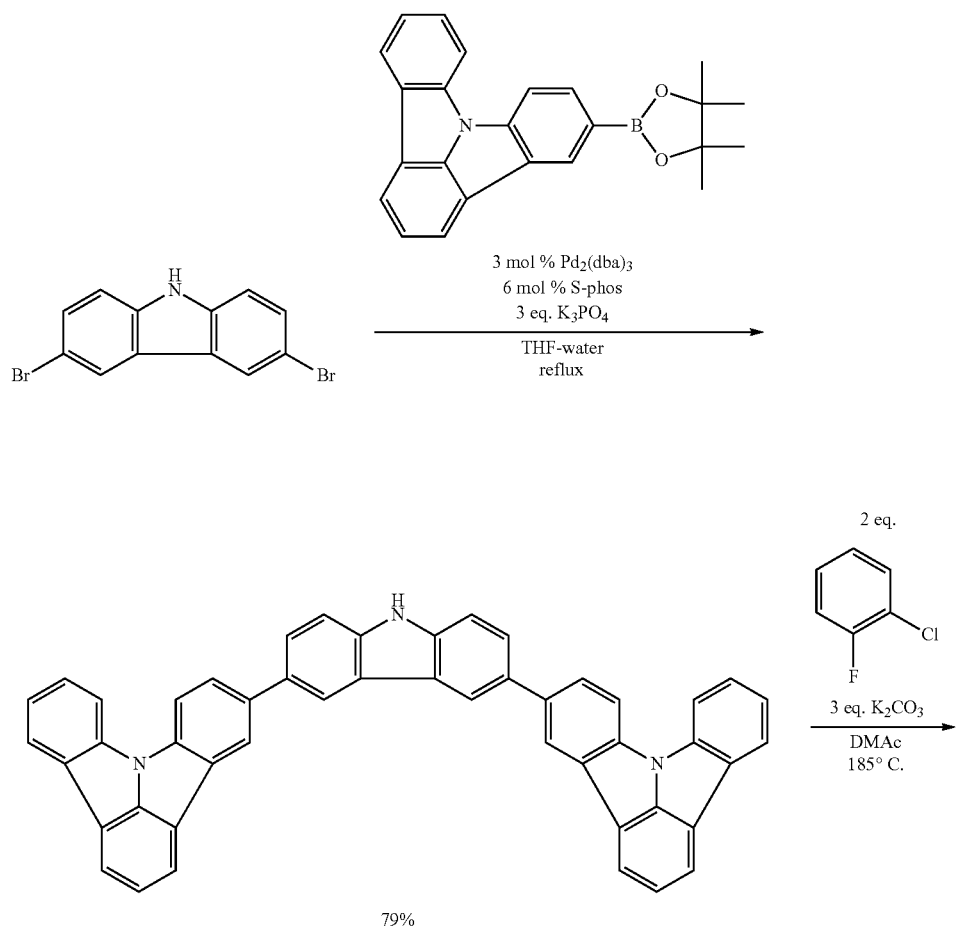
79%

-continued

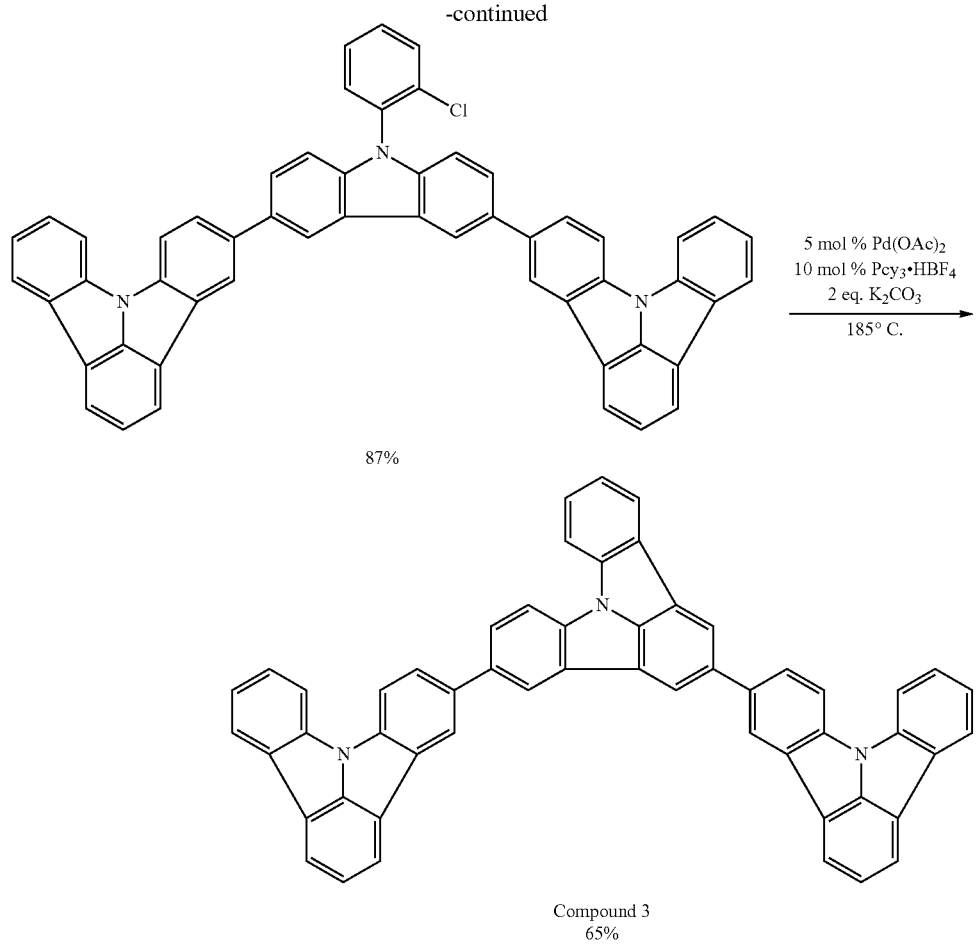

Compound 3
65%

Compounds 1, 2 and 3 were synthesized according to the above scheme. Other compounds can be synthesized through the similar procedure to the above.

Figure 4:
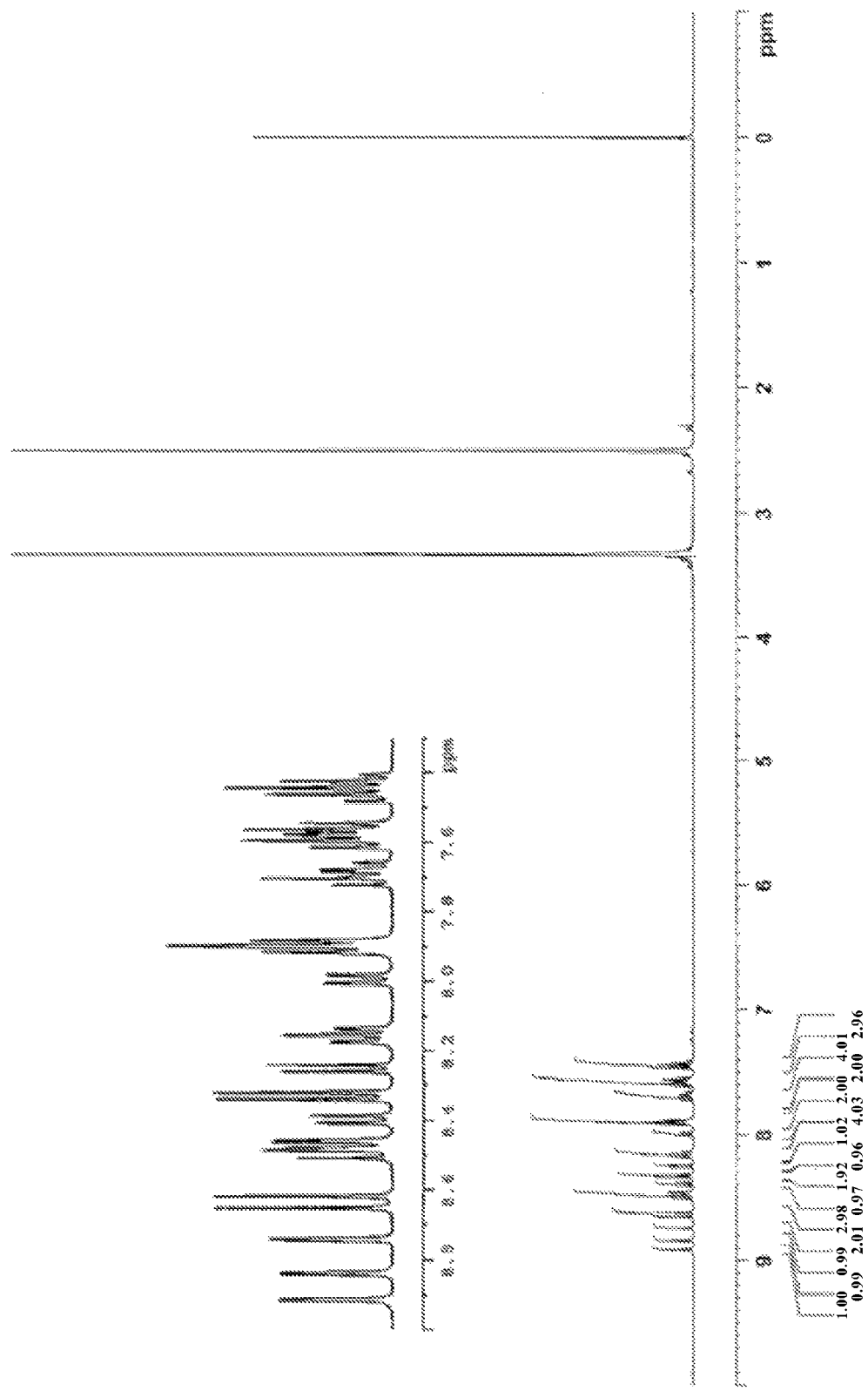
FIG. 4 It is a $^1$H-NMR chart of Compound 1 which can be preferably used in the present invention.
Figure 5:
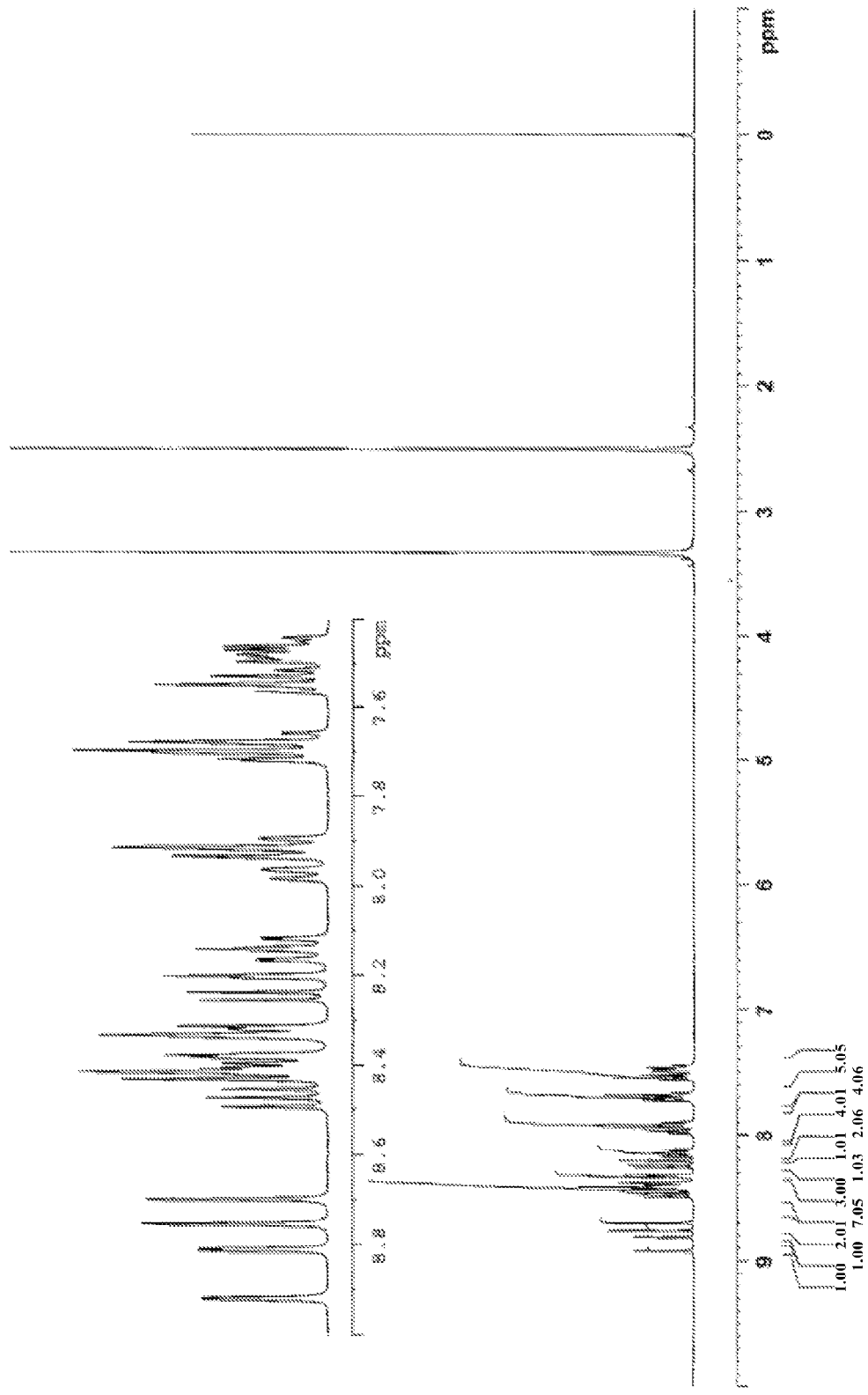
FIG. 5 It is a $^1$H-NMR chart of Compound 2 which can be preferably used in the present invention.

¹H-NMR data of thus synthesized Compounds 1 and 2 are shown in FIG. 4 and FIG. 5.

2. Fabrication and Evaluation of Element

Materials used for the fabrication of the elements were all subjected to sublimation purification. The compounds used in Comparative Examples and Examples are shown.

(Compound Group Used for Common Layer)

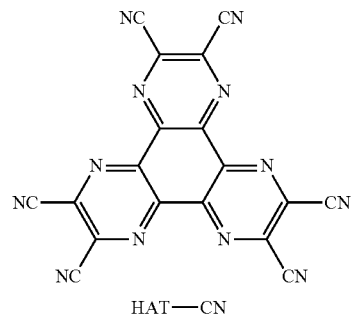

HAT—CN

-continued

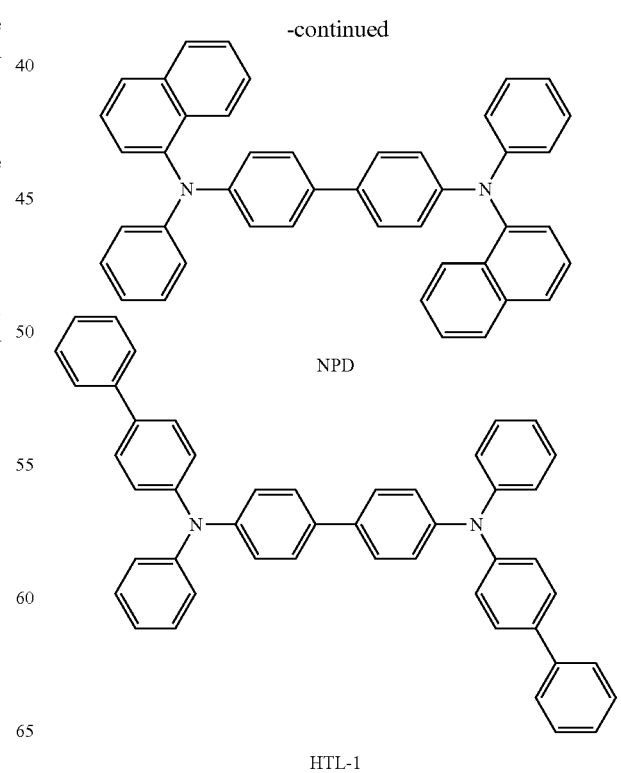

NPD

HTL-1

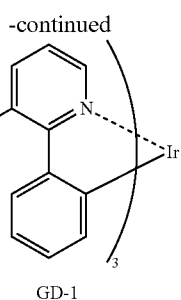
GD-1
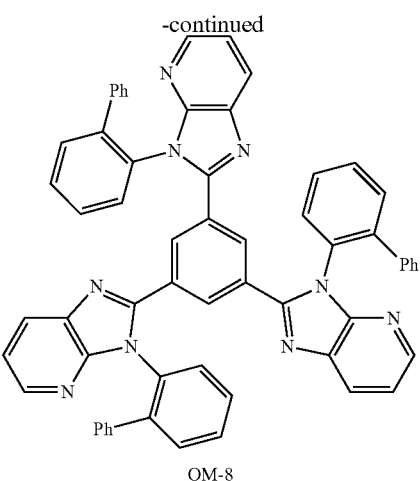
OM-8
(Comparative Compounds)
Comparative Compound 1 shown below is Compound 26 described in paragraph 0182 of JP-A-2010-87496.
Comparative Compounds 2 and 3 shown below are Compounds H7 and H8, respectively, described in WO 2011/088877.
GD-2
Comparative Compound 1
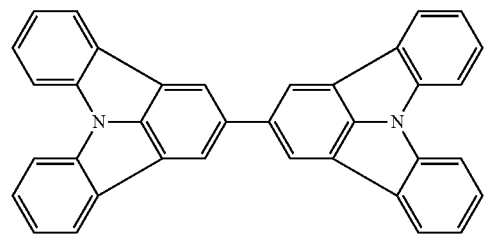
RD-1
Comparative Compound 2
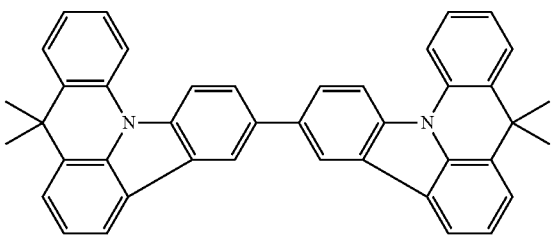
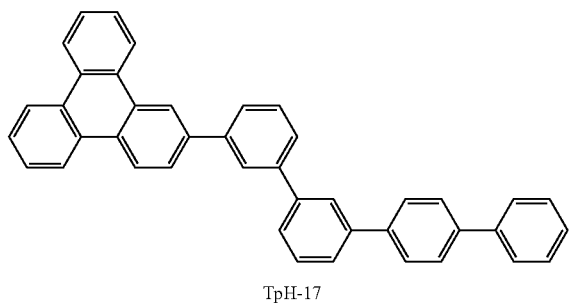
TpH-17
Comparative Compound 3
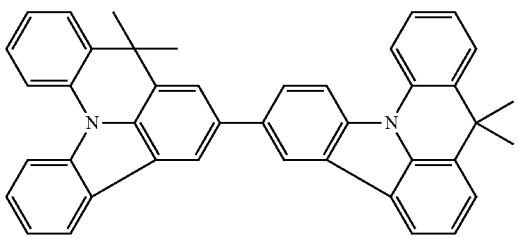
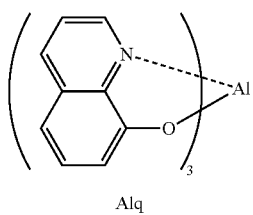
Alq (Compound Represented by the General Formula (1) Used in Examples)
Compound 1
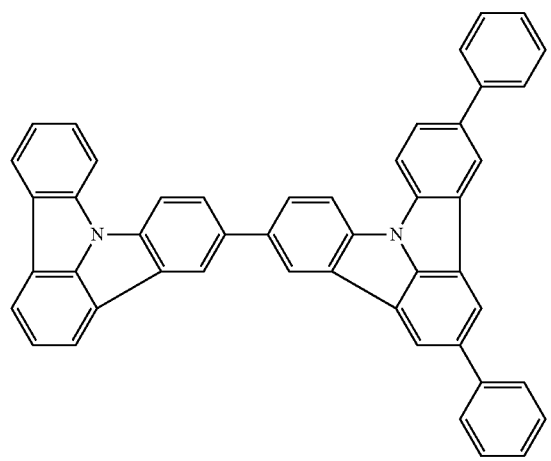
Compound 2
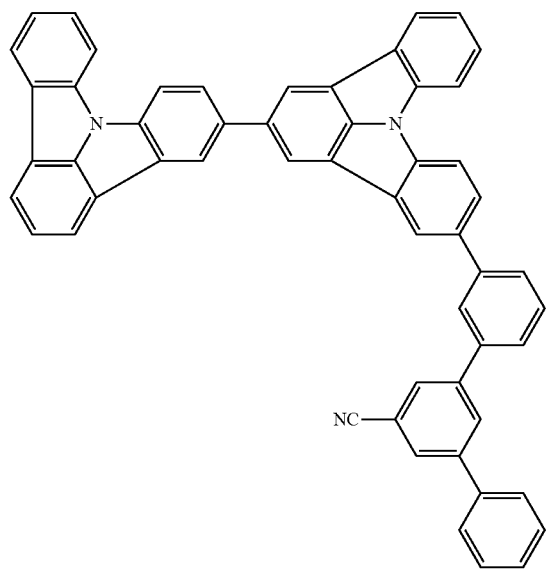
Compound 3
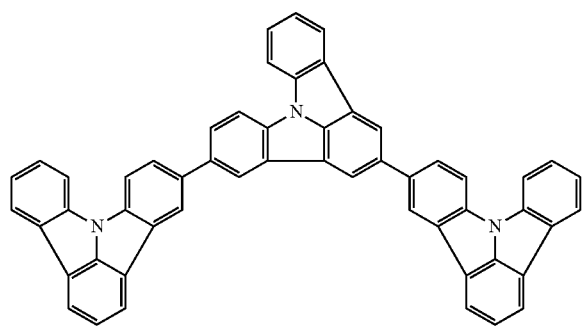
Compound 4
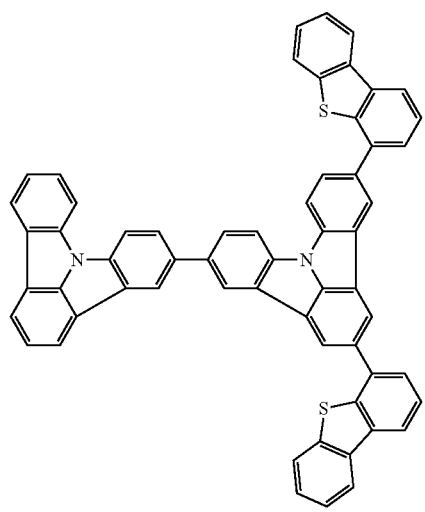

-continued
Compound 5
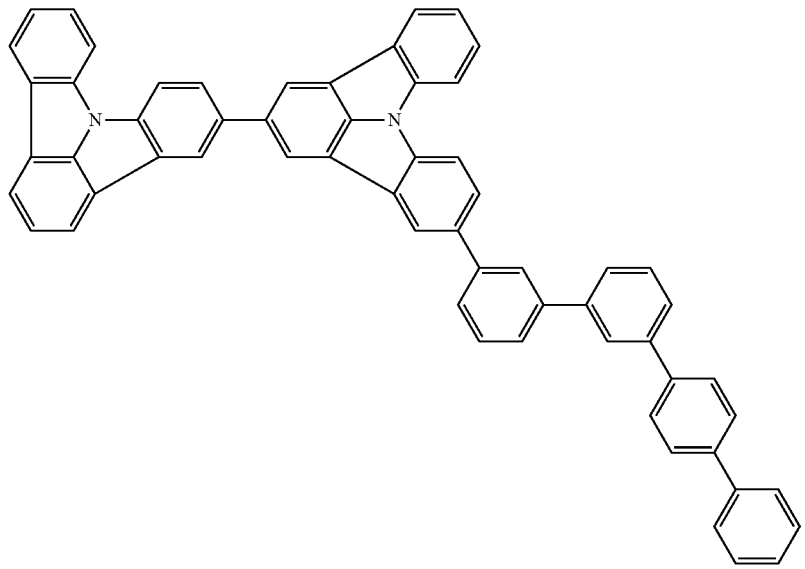
Compound 6
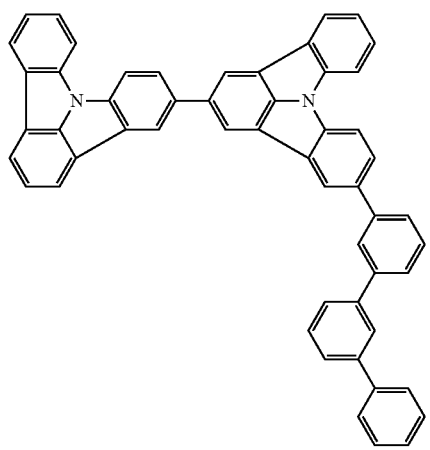
Compound 7
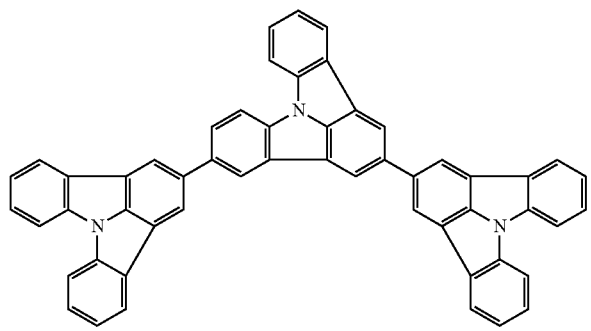
Compound 8
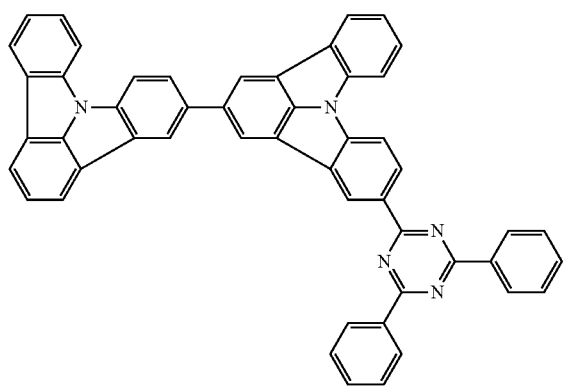
Compound 9
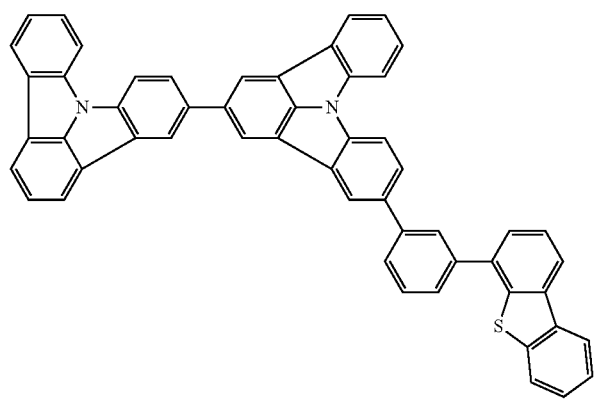

Compound 10

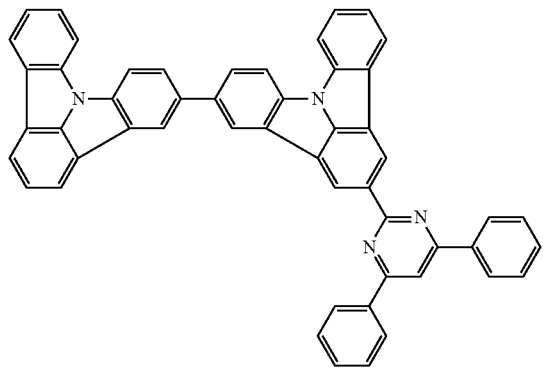

Compound 11

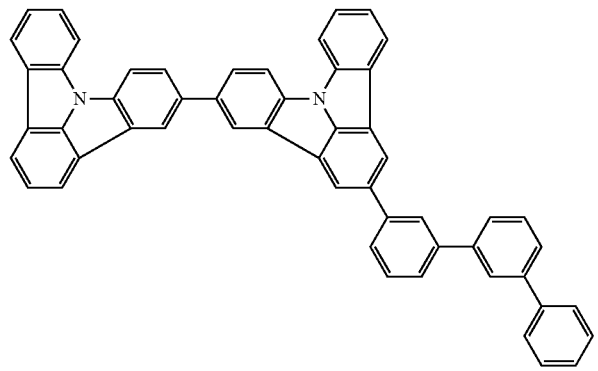

Compound 12

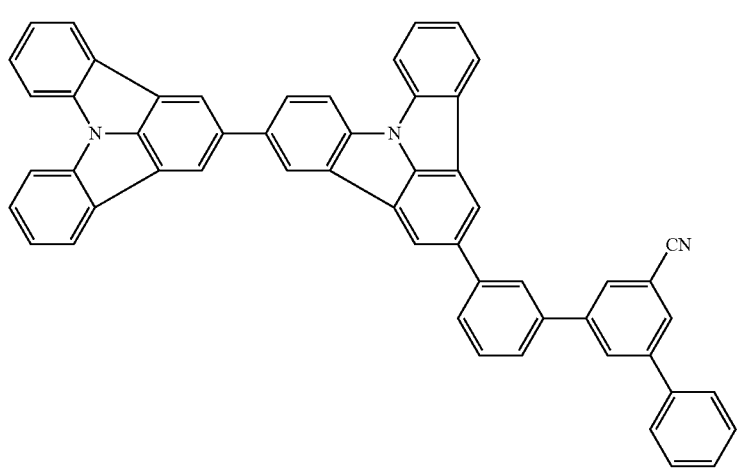

Compound 13

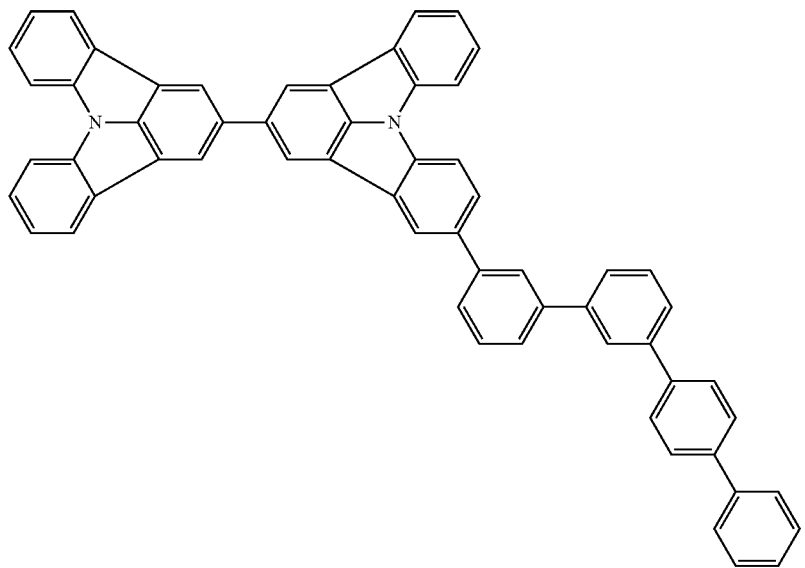

Comparative Example 1

Fabrication of Anode

A glass substrate (manufactured by Geomatec Co., Ltd., surface resistance: 10Ω/□) having a 0.5 mm-thick and 2.5 cm square ITO film thereon was put in a cleaning container. After ultrasonic cleaning in 2-propanol, the glass substrate was subjected to a UV-ozone treatment for 30 minutes.

This was used as the anode (ITO film, transparent anode).

(Lamination of Organic Layers)

On the anode obtained above, first to fifth organic layers are sequentially deposited using the following compounds by a vacuum deposition method. The compound structures used in respective layers are shown below together.

First layer: HAT-CN, film thickness: 10 nm

Second layer: NPD, film thickness: 30 nm

Third layer: Comparative Compound 1 (host material) and green phosphorescence emitting material GD-1 (guest material) (mass ratio: 85:15), film thickness: 30 nm Fourth layer: TpH-17, film thickness: 10 nm Fifth layer: Alq, film thickness: 40 nm First Layer:

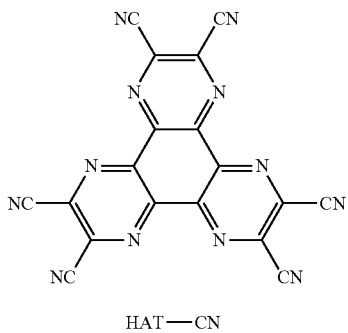

HAT—CN

Second Layer:

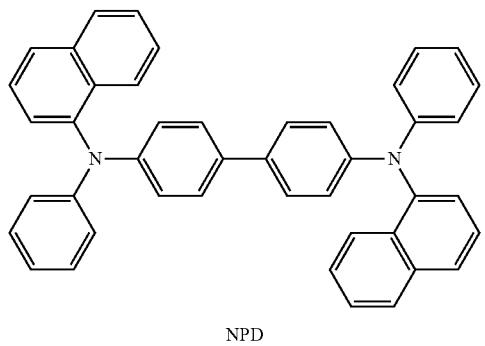 [SMILES: c1ccc(N(c2ccc(-c3ccc(N(c4ccccc4)c4cccc5ccccc45)cc3)cc2)c2cccc3ccccc23)cc1 ; "NPD"]

NPD

Third Layer:

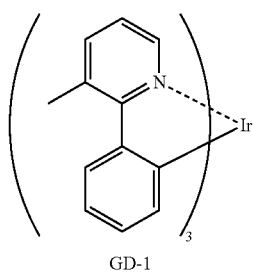

GD-1

Comparative Compound 1

Fourth Layer:

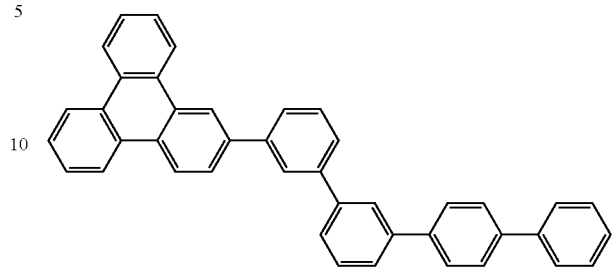

TpH-17

Fifth Layer:

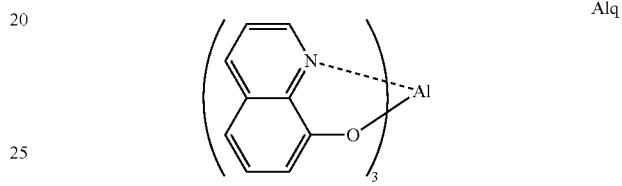

Alq (Fabrication of Cathode)

On the above-obtained lamination, 0.1 nm of lithium fluoride and 200 nm of metal aluminum were sequentially deposited to form a cathode.

(Fabrication of Organic Electroluminescence Device)

A lamination which includes the anode and the cathode, and the five organic layers disposed between the anode and the cathode was placed in a glove box purged with nitrogen gas without contact with atmospheric air, and sealed in a glass sealing can using an ultraviolet cure adhesive (XNR5516HV, manufactured by Nagase-Chiba, Ltd), to obtain an organic electroluminescent element of Comparative Example 1.

(Evaluation of Organic Electroluminescent Element)

(a) Durability

A DC voltage was applied to the organic electroluminescent element of Comparative Example 1 to allow the element to emit light continuously to attain the luminance of 5000 cd/m$^2$ at room temperature, and the time period required for the luminance to go down to 4000 cd/m$^2$ was measured. This time period was used as an index of the durability of the organic electroluminescent element.

In Table 1 shown below with respect to Examples and Comparative Examples described later, the durability of the organic electroluminescent element of Comparative Example 1 was taken as 100, and the element having a relative value of the durability lower than 100 was rated as "x (cross)", the element having that of 100 or higher and lower than 120 as "o (circle)", and the element having that of 120 or higher as "oo (double circle)".

Here, a larger durability value is more preferred. For a practical use, the evaluation result is required to be "o" or "oo".

(b) Voltage Rise Rate

In the organic electroluminescent element of Comparative Example 1 which was used in the durability evaluation described above, the voltage at the time when the initial luminance was 5000 cd/m$^2$ is taken as V1 (V), the voltage at the time of 500 hours after that is taken as V2 (V), and the difference between these voltages is defined as ΔV. That is, ΔV=V2−V1.

Incidentally, in Table 1 shown below with respect to Examples and Comparative Examples described later, ΔV of Comparative Example 1 was taken as 100, and the element having a relative value of the voltage of 100 or higher was rated as "x (cross)", the element having that of 95 or higher and lower than 100 as "Δ (triangle)", the element having that of 90 or higher and lower than 95 as "o (circle)", and the element having that of lower than 90 as "oo (double circle)".

Here, a smaller value of the voltage rise rate is more preferred. For a practical use, the evaluation result is required to be "o" or "oo".

(c) Driving Voltage

A DC voltage was applied to the organic electroluminescent element to allow the element to emit light to attain the luminance of 3500 cd/m$^2$. The voltage applied at this time was used as an index of the evaluation of the driving voltage. In Examples A1 to A13 and Comparative Examples 1 to 3, the results were shown in Table 1 below in which the case of the driving voltage being lower than 6 V was rated as "oo", the case of the driving voltage being 6 V or higher and lower than 7 V was rated as "o", and the case of the driving voltage being 7 V or higher was rated as "x". Here, a smaller value of the driving voltage is more preferred.

Examples A1 to A13 and Comparative Examples 2 and 3

The organic electroluminescent elements in Examples A1 to A13 and Comparative Examples 2 and 3 were obtained by the same procedure as in Comparative Example 1, except that the compound represented by the general formula (1) or Comparative Compound 2 or 3 was used in place of Comparative Compound 1 as the host material for the third layer in the organic layers.

For thus obtained organic electroluminescent elements in Examples and Comparative Examples, the durability, the voltage rise rate and the driving voltage were measured by the same procedure as in Comparative Example 1, and evaluated by the same procedure as in Example 1.

TABLE 1

| | Host material | Durability | Voltage rise rate | Driving voltage |
|---|---|---|---|---|
| Comparative Example 1 | Comparative Compound 1 | — | — | o |
| Comparative Example 2 | Comparative Compound 2 | x | x | oo |
| Comparative Example 3 | Comparative Compound 3 | x | Δ | oo |
| Example A1 | Compound 1 | o | o | oo |
| Example A2 | Compound 2 | oo | oo | oo |
| Example A3 | Compound 3 | oo | oo | oo |
| Example A4 | Compound 4 | oo | o | o |
| Example A5 | Compound 5 | oo | oo | oo |
| Example A6 | Compound 6 | oo | oo | oo |
| Example A7 | Compound 7 | oo | o | oo |
| Example A8 | Compound 8 | oo | oo | oo |
| Example A9 | Compound 9 | oo | oo | oo |
| Example A10 | Compound 10 | o | oo | oo |
| Example A11 | Compound 11 | oo | oo | o |
| Example A12 | Compound 12 | oo | oo | oo |
| Example A13 | Compound 13 | oo | o | o |

Comparative Example 4

The organic electroluminescent element of Comparative Example 4 was fabricated by the same procedure as in Comparative Example 1, except that, for the organic layers, NPD used in the second layer was changed to HTL-1, GD-1 used in the third layer to GD-2, TpH-17 used in the fourth layer to OM-8, and Alq used in the fifth layer to OM-8. The configuration of the organic layers in Comparative Example 4 is shown below.

First layer: LG101, film thickness: 10 nm
Second layer: HTL-1, film thickness: 30 nm
Third layer: Comparative Compound 1 (host material) and green phosphorescence emitting material GD-2 (guest material) (mass ratio: 85:15), film thickness: 30 nm
Fourth layer: OM-8, film thickness: 10 nm
Fifth layer: OM-8, film thickness: 40 nm

Examples B1 to B13 and Comparative Examples 5 and 6

The organic electroluminescent elements of Examples B1 to B4 and Comparative Examples 5 and 6 were obtained by the same procedure as in Comparative Example 4, except that the compound represented by the general formula (1) or Comparative Compound 2 or 3 was used in place of Comparative Compound 1 as the material for the third layer in the organic layers in Comparative Example 4.

For the thus obtained organic electroluminescent element in Examples B1 to B13 and Comparative Examples 4 to 6, the durability, the voltage rise rate and the driving voltage were measured by the same procedure as in Comparative Example 1 and evaluated by the same procedure as in Example 1. However, in Examples and Comparative Examples shown in Table 2, relative evaluations were performed by taking the evaluation results of the durability and voltage rise rate of the organic electroluminescent element of Comparative Example 4 each as 100. In addition, for the driving voltage, the case of the driving voltage being lower than 5.5 V was rated as "oo", the case of the driving voltage being 5.5 V or higher and lower than 6.5 V was rated as "o", and the case of the driving voltage being 6.5 V or higher was rated as "x", to perform the evaluation. The results are shown in Table 2.

TABLE 2

| | Host material | Durability | Voltage rise rate | Driving voltage |
|---|---|---|---|---|
| Comparative Example 4 | Comparative Compound 1 | — | — | o |
| Comparative Example 5 | Comparative Compound 2 | x | x | oo |
| Comparative Example 6 | Comparative Compound 3 | x | Δ | oo |
| Example B1 | Compound 1 | o | o | oo |
| Example B2 | Compound 2 | oo | oo | oo |
| Example B3 | Compound 3 | oo | oo | oo |
| Example B4 | Compound 4 | oo | o | o |
| Example B5 | Compound 5 | oo | oo | oo |
| Example B6 | Compound 6 | oo | oo | oo |
| Example B7 | Compound 7 | oo | o | oo |
| Example B8 | Compound 8 | oo | oo | oo |
| Example B9 | Compound 9 | oo | oo | oo |
| Example B10 | Compound 10 | o | oo | oo |
| Example B11 | Compound 11 | oo | oo | o |
| Example B12 | Compound 12 | oo | oo | oo |
| Example B13 | Compound 13 | oo | o | o |

Comparative Example 7

The organic electroluminescent element of Comparative Example 7 was fabricated by the same procedure as in Comparative Example 1, except that, for the organic layers, LG101 used in the first layer was changed to GD-1, GD-1 used in the third layer to a red phosphorescence emitting material RD-1, and TpH-17 used in the fourth layer to Alq. The configuration of the organic layers in Comparative Example 7 is shown below.

First layer: GD-1, film thickness: 10 nm
Second layer: NPD, film thickness: 30 nm
Third layer: Comparative Compound 1 (host material) and red phosphorescence emitting material RD-1 (guest material) (mass ratio: 90:10), film thick thickness: 30 nm
Fourth layer: Alq, film thickness: 10 nm
Fifth: Alq, film thickness: 40 nm

Examples C1 to C9 and Comparative Examples 8 and 9

The organic electroluminescent elements of Examples C1 to C9 and Comparative Examples 8 and 9 were obtained by the same procedure as in Comparative Example 7, except that, as the material for the third layer in the organic layers in Comparative Example 7, the compound represented by the general formula (1) or Comparative Compound 2 or 3 was used in place of Comparative Compound 1.

For the thus obtained organic electroluminescent elements of Examples C1 to C3 and Comparative Examples 7 to 9, the durability, the voltage rise rate and the driving voltage were measured by the same procedure as in Comparative Example 1 and evaluated by the same procedure as in Example 1. In Examples and Comparative Examples shown in Table 3 below, relative evaluations were performed by taking the evaluation results of the durability and the voltage rise rate of the organic electroluminescent element of Comparative Example 7 each as 100. The case of the driving voltage being lower than 6 V was rated as "oo", the case of the driving voltage being 6 V or higher and lower than 7 V was rated as "o", and the case of the driving voltage being 7 V or higher was rated as "x", to perform the evaluation. The results are shown in Table 3 below.

TABLE 3

| | Host material | Durability | Voltage rise rate | Driving voltage |
|---|---|---|---|---|
| Comparative Example 7 | Comparative Compound 1 | — | — | o |
| Comparative Example 8 | Comparative Compound 2 | x | x | oo |
| Comparative Example 9 | Comparative Compound 3 | x | Δ | oo |
| Example C1 | Compound 2 | oo | oo | oo |
| Example C2 | Compound 3 | oo | oo | oo |
| Example C3 | Compound 4 | oo | o | o |
| Example C4 | Compound 5 | oo | oo | oo |
| Example C5 | Compound 7 | oo | o | oo |
| Example C6 | Compound 8 | o | oo | oo |
| Example C7 | Compound 9 | oo | oo | o |
| Example C8 | Compound 12 | oo | oo | oo |
| Example C9 | Compound 13 | oo | o | o |

From Table 1 to Table 3 above, the organic electroluminescent element in each of Examples in which the compound represented by the general formula (1) was used as the host material of the light emitting layer is superior in driving voltage, exhibits suppressed elevation in driving voltage associated with the driving, and has a good durability.

On the other hand, the organic electroluminescent element in each of Comparative Examples in which Comparative Compounds 1 to 3 are respectively used as the host material of the light emitting layer initially exhibits good driving voltage but the elevation of the driving voltage associated with the driving is not suppressed and the durability is also inferior.

DESCRIPTION OF REFERENCE NUMERALS AND SIGNS

2 Substrate
3 Anode
4 Hole injecting layer
5 Hole transporting layer
6 Light emitting layer
7 Hole blocking layer
8 Electron transporting layer
9 Cathode
10 Organic electroluminescent element (Organic EL element)
11 Organic layer
12 Protective layer
14 Adhesive layer
16 Sealing enclosure
20 Light emitting device
30 Light scattering member
30A Light incidence plane
30B Light output plane
31 Transparent substrate
32 Fine particle
40 Illumination device

What is claimed:

1. An organic electroluminescent element comprising: a substrate; a pair of electrodes including an anode and a cathode, disposed on the substrate; and at least one organic layer(s) including a light emitting layer, disposed between the electrodes, characterized in that at least one layer of the organic layer(s) contains a compound represented by the following general formula (1):

General Formula (1)

wherein: A is a monovalent group represented by the following general formula (2); D is a monovalent group represented by the following general formula (3); B is a divalent group represented by the following general formula (4); and n represents 0 or 1, provided that in the case where n is 0, A and D are not symmetrical about a point to each other, including the binding sites;

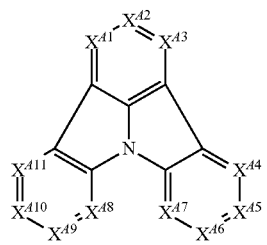

General Formula (2)

wherein: one of $X^{A1}$ to $X^{A11}$ represents C-*, the others of $X^{A1}$ to $X^{A11}$ each independently represent C—$R^4$ or a nitrogen atom; * represents a binding site to D when n is 0, and represents a binding site to B when n is 1; and $R^4$ represents a hydrogen atom or a substituent, and the plural $R^A$s may be the same as or different from one another)

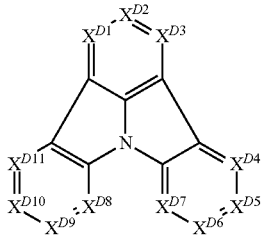

General Formula (3)

wherein: one of $X^{D1}$ to $X^{D11}$ represents C-#, the others of $X^{D1}$ to $X^{D11}$ each independently represent C—$R^D$ or a nitrogen atom; # represents a binding site to A when n is 0 and represents a binding site to B when n is 1; and $R^D$ represents a hydrogen atom or a substituent, and the plural $R^D$s may be the same as or different from one another;

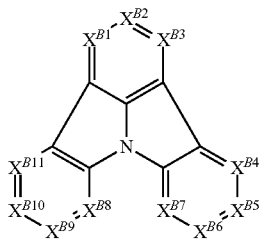

General Formula (4)

wherein: one of $X^{B1}$ to $X^{B11}$ represents C-*, another one of $X^{B1}$ to $X^{B11}$ represents C-#, and the others of $X^{B1}$ to $X^{B11}$ each independently represent C—$R^B$ or a nitrogen atom; * represents a binding site to A; # represents a binding site to D; and $R^B$ represents a hydrogen atom or a substituent, and the plural $R^B$s may be the same as or different from one another.

2. The organic electroluminescent element according to claim 1, wherein, in the general formula (2), one of $X^{A1}$ to $X^{A11}$ represents C-*, the others of $X^{A1}$ to $X^{A11}$ each independently represent C—$R^A$, and $R^A$ represents a hydrogen atom or a substituent.

3. The organic electroluminescent element according to claim 1, wherein, in the general formula (3), one of $X^{D1}$ to $X^{D11}$ represents C-#, the others of $X^{D1}$ to $X^{D11}$ each independently represent C—$R^D$, and $R^D$ represents a hydrogen atom or a substituent.

4. The organic electroluminescent element according to claim 1 wherein, in the compound represented by the general formula (1), the A is a group represented by the following general formula (5), the D is a group represented by the following general formula (6), and the B is a group represented by the following general formula (7):

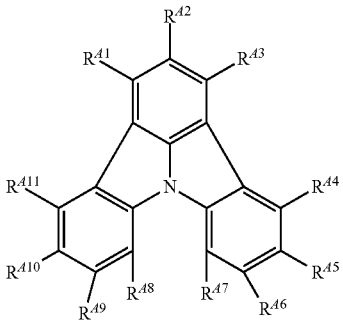

General Formula (5)

wherein: one of $R^{A1}$ to $R^{A11}$ represents a binding site to D when n is 0, and represents a binding site to B when n is 1, $R^{A1}$ to $R^{A11}$ that are not binding sites to B or D each independently represent a hydrogen atom or a substituent;

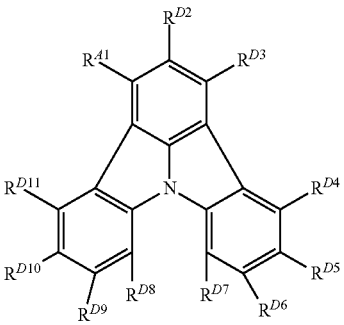

General Formula (6)

wherein: one of $R^{D1}$ to $R^{D11}$ represents a binding site to A when n is 0, and represents a binding site to B when n is 1, and $R^{D1}$ to $R^{D11}$ that are not binding sites to A or B each independently represent a hydrogen atom or a substituent;

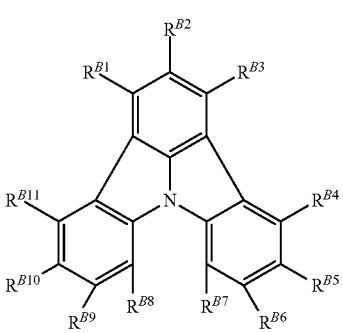

General Formula (7)

wherein: one of $R^{B1}$ to $R^{B11}$ represents a binding site to A, another one represents a binding site to D, $R^{B1}$ to $R^{B11}$ that are not binding sites to A or D each independently represent a hydrogen atom or a substituent.

5. The organic electroluminescent element according to claim 4, wherein, in the general formula (5), anyone of $R^{A2}$, $R^{A5}$ and $R^{A10}$ represents a binding site to D when n is 0, and represents a binding site to B when n is 1.

6. The organic electroluminescent element according to claim 4, wherein, in the general formula (6), anyone of $R^{D2}$, $R^{D5}$ and $R^{D10}$ represents a binding site to A when n is 0, and represents a binding site to B when n is 1.

7. The organic electroluminescent element according to claim 4 wherein, in the general formula (7), $R^{B2}$ represents a binding site to A or a binding site to C, and $R^{B5}$ or $R^{B10}$ represents the remaining one of the binding site to A and the binding site to C.

8. The organic electroluminescent element according to claim 4 wherein, in the general formula (6), at least one of $R^{D2}$, $R^{D5}$ and $R^{D10}$ each independently represents a substituted or unsubstituted aryl group (provided that an aryl group further having an aryl group as a substituent is excluded), a substituted or unsubstituted heteroaryl group, or a substituted or unsubstituted oligoaryl group having 2 to 5 rings.

9. The organic electroluminescent element according to claim 4 wherein, in the general formula (5), all of $R^{A1}$ to $R^{A11}$ that are not binding sites to B or D each represent a hydrogen atom.

10. The organic electroluminescent element according to claim 1 wherein, in the general formula (1), n is 0.

11. The organic electroluminescent element according to claim 1 wherein the light emitting layer contains at least one kind of phosphorescence emitting material.

12. The organic electroluminescent element according to claim 11, wherein the phosphorescence emitting material is an iridium complex represented by the following general formula (E-1):

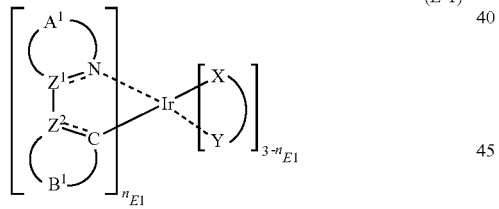
(E-1)

wherein: $Z^1$ and $Z^2$ each independently represent a carbon atom or a nitrogen atom;

$A^1$ represents an atomic group which together with $Z^1$ and a nitrogen atom forms a 5- or 6-membered hetero ring;

$B^1$ represents an atomic group which together with $Z^2$ and a carbon atom forms a 5- or 6-membered ring;

(X—Y) represents a mono-anionic bidentate ligand; and $n_{E1}$ represents an integer of 1 to 3.

13. The organic electroluminescent element according to claim 12, wherein the iridium complex represented by the general formula (E-1) is represented by the following general formula (E-2.

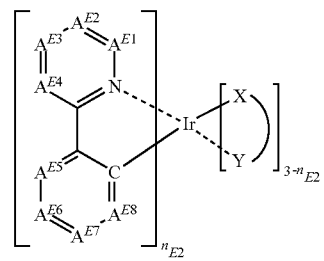
(E-2)

wherein: $A^{E1}$ to $A^{E8}$ each independently represent a nitrogen atom or C—$R^E$; $R^E$ represents a hydrogen atom or a substituent; (X—Y) represents a mono-anionic bidentate ligand; and $n_{E2}$ represents an integer of 1 to 3.

14. The organic electroluminescent element according to claim 1, wherein the light emitting layer contains the compound represented by the general formula (1).

15. A light emitting device using the organic electroluminescent element of claim 1.

16. A display device using the organic electroluminescent element of claim 1.

17. An illumination device using the organic electroluminescent element of claim 1.

18. A compound represented by the following general formula (1):

General Formula (1)

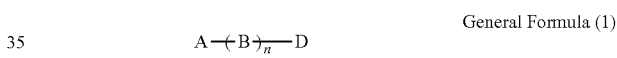

wherein: A is a monovalent group represented by the following general formula (2); D is a monovalent group represented by the following general formula (3); B is a divalent group represented by the following general formula (4); and n represents 0 or 1, provided that in the case where n is 0, A and D are not symmetrical about a point to each other, including the binding sites;

General Formula (2)

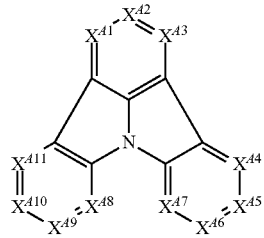

wherein: one of $X^{A1}$ to $X^{A11}$ represents C-*, the others of $X^{A1}$ to $X^{A11}$ each independently represent C—$R^A$ or a nitrogen atom; * represents a binding site to D when n is 0, and represents a binding site to B when n is 1; and $R^A$ represents a hydrogen atom or a substituent, and the plural $R^A$s may be the same as or different from one another;

General Formula (3)

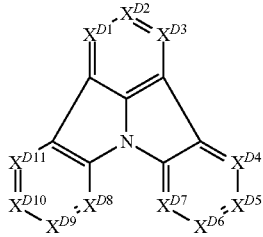

wherein: one of $X^{D1}$ to $X^{D11}$ represents C-#, the others of $X^{D1}$ to $X^{D11}$ each independently represent C—$R^D$ or a nitrogen atom; # represents a binding site to A when n is 0 and represents a binding site to B when n is 1; and $R^D$ represents a hydrogen atom or a substituent, and the plural $R^D$s may be the same as or different from one another;

General Formula (4)

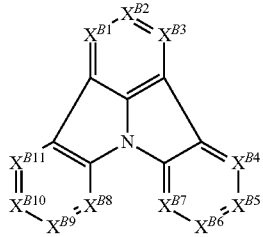

wherein: one of $X^{B1}$ to $X^{B11}$ represents C-*, another one of $X^{B1}$ to $X^{B11}$ represents C-#, and the others of $X^{B1}$ to $X^{B11}$ each independently represent C—$R^B$ or a nitrogen atom; * represents a binding site to A, # represents a binding site to D; and $R^B$ represents a hydrogen atom or a substituent, and the plural $R^B$s may be the same as or different from one another.

19. The compound according to claim 18 wherein, in the general formula (2), one of $X^{A1}$ to $X^{A11}$ represents C-*, the others of $X^{A1}$ to $X^{A11}$ each independently represent C—$R^A$, and $R^A$ represents a hydrogen atom or a substituent.

20. The compound according to claim 18 wherein, in the general formula (3), one of $X^{D1}$ to $X^{D11}$ represents C-#, the others of $X^{D1}$ to $X^{D11}$ each independently represent C—$R^D$, and $R^D$ represents a hydrogen atom or a substituent.

21. The compound according to claim 18 wherein, in the compound represented by the general formula (1), the A is a group represented by the following general formula (5), the D is a group represented by the following general formula (6), and the B is a group represented by the following general formula (7):

General Formula (5)

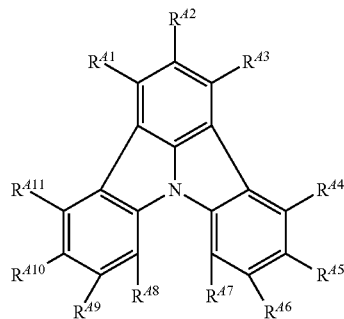

wherein: one of $R^{A1}$ to $R^{A11}$ represents a binding site to D when n is 0, and represents a binding site to B when n is 1, $R^{A1}$ to $R^{A11}$ that are not binding sites to B or D each independently represent a hydrogen atom or a substituent;

General Formula (6)

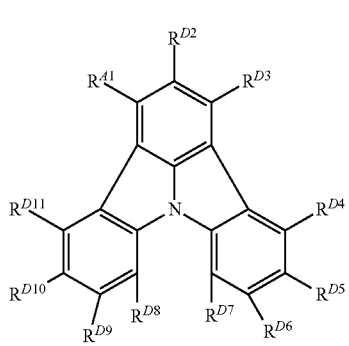

wherein: one of $R^{D1}$ to $R^{D11}$ represents a binding site to A when n is 0, and represents a binding site to B when n is 1, and $R^{D1}$ to $R^{D11}$ that are not a binding site to A or B each independently represent a hydrogen atom or a substituent;

General Formula (7)

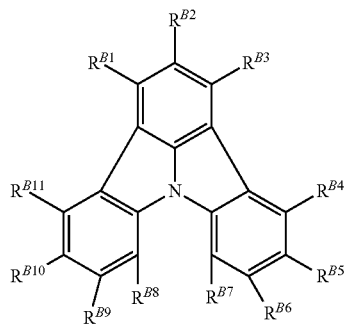

wherein: one of $R^{B1}$ to $R^{B11}$ represents a binding site to A, another one represents a binding site to D, $R^{B1}$ to $R^{B11}$ that are not binding sites to A or D each independently represent a hydrogen atom or a substituent.

22. The compound according to claim 21, wherein, in the general formula (5), anyone of $R^{A2}$, $R^{A5}$ and $R^{A10}$ represents a binding site to D when n is 0, and represents a binding site to B when n is 1.

23. The compound according to claim 21, wherein, in the general formula (6), anyone of $R^{D2}$, $R^{D5}$ and $R^{D10}$ represents a binding site to A when n is 0, and represents a binding site to B when n is 1.

24. The compound according to claim 21 wherein, in the general formula (7), $R^{B2}$ represents a binding site to A or a binding site to C, and $R^{B5}$ or $R^{B10}$ represents the remaining one of the binding site to A and the binding site to C.

25. The compound according to claim 21 wherein, in the general formula (6), at least one of $R^{D2}$, $R^{D5}$ and $R^{D10}$ each independently represents a substituted or unsubstituted aryl group (provided that an aryl group further having an aryl group as a substituent is excluded), a substituted or unsubstituted heteroaryl group, or a substituted or unsubstituted oligoaryl group having 2 to 5 rings.

26. The compound according to claim 21 wherein, in the general formula (5), all of $R^{41}$ to $R^{411}$ that are not binding sites to B or D each represent a hydrogen atom.

27. The compound according to claim 18 wherein, in the general formula (1), n is 0.

* * * * *